US007915625B2

(12) United States Patent
Karino et al.

(10) Patent No.: US 7,915,625 B2
(45) Date of Patent: Mar. 29, 2011

(54) SEMICONDUCTOR LIGHT EMITTING DEVICE

(75) Inventors: Sachio Karino, Miyagi (JP); Eiji Takase, Miyagi (JP); Makoto Oogane, Kanagawa (JP); Tsuyoshi Nagatake, Kanagawa (JP); Michiru Kamada, Miyagi (JP); Hironobu Narui, Kanagawa (JP); Nobukata Okano, Kanagawa (JP)

(73) Assignee: Sony Corporation, Tokyo (JP)

( * ) Notice: Subject to any disclaimer, the term of this patent is extended or adjusted under 35 U.S.C. 154(b) by 288 days.

(21) Appl. No.: 12/208,855

(22) Filed: Sep. 11, 2008

(65) Prior Publication Data
US 2009/0072266 A1 Mar. 19, 2009

(30) Foreign Application Priority Data
Sep. 14, 2007 (JP) ................................. 2007-239800

(51) Int. Cl.
H01L 33/00 (2010.01)
(52) U.S. Cl. ..... 257/94; 257/96; 257/102; 257/E33.006; 257/E33.011; 372/43.01; 372/46.01
(58) Field of Classification Search ............ 257/94, 257/96, 102, E33.006, E33.011; 372/43.01, 372/46.01
See application file for complete search history.

(56) References Cited

U.S. PATENT DOCUMENTS

| 5,311,533 | A  | * | 5/1994  | Stutius et al.   | 372/46.01 |
|-----------|----|---|---------|------------------|-----------|
| 5,379,314 | A  | * | 1/1995  | Nemoto et al.    | 372/46.01 |
| 5,854,089 | A  | * | 12/1998 | Nakatsu          | 438/41    |
| 6,768,759 | B2 | * | 7/2004  | Honkawa et al.   | 372/46.01 |
| 2002/0159493 | A1 | * | 10/2002 | Honkawa et al. | 372/46  |
| 2005/0201443 | A1 | * | 9/2005  | Hayashi et al. | 372/69  |
| 2006/0243992 | A1 | * | 11/2006 | Ikoma et al.   | 257/94  |
| 2008/0283852 | A1 | * | 11/2008 | Tsuji et al.   | 257/94  |
| 2009/0072253 | A1 | * | 3/2009  | Karino et al.  | 257/94  |
| 2010/0019255 | A1 | * | 1/2010  | Karino et al.  | 257/94  |

FOREIGN PATENT DOCUMENTS

JP 2990837 10/1999
JP 3399018 2/2003

* cited by examiner

Primary Examiner — Victor Mandala
(74) Attorney, Agent, or Firm — SNR Denton US LLP

(57) ABSTRACT

Disclosed herein is a semiconductor light emitting device including: a light emitting part formed of a multilayer structure arising from sequential stacking of a first compound semiconductor layer, an active layer, and a second compound semiconductor layer; a current block layer; and a burying layer, wherein a planar shape of the active layer is a strip shape in which a width of a center part is smaller than a width of both end parts, the current block layer is composed of third and fourth compound semiconductor layers, the burying layer is formed of a multilayer structure arising from sequential stacking of a first burying layer and a second burying layer, and an impurity for causing the second burying layer is such that a substitution site of the impurity in the second burying layer does not compete with a substitution site of an impurity in the third compound semiconductor layer.

25 Claims, 43 Drawing Sheets

[(1-A)-TH MODE, (2-A)-TH MODE, (4-A)-TH MODE]
[BOTH END PARTS OF LIGHT EMITTING PART]

[(1-A)-TH MODE, (2-A)-TH MODE, (4-A)-TH MODE]
[CENTER PART OF LIGHT EMITTING PART]

[(1-B)-TH MODE, (2-B)-TH MODE]
[BOTH END PARTS OF LIGHT EMITTING PART]

[(1-B)-TH MODE, (2-B)-TH MODE]
[CENTER PART OF LIGHT EMITTING PART]

[(1-C)-TH MODE, (2-C)-TH MODE, (4-A)-TH MODE]
[BOTH END PARTS OF LIGHT EMITTING PART]

[(1-C)-TH MODE, (2-C)-TH MODE, (4-A)-TH MODE]
[CENTER PART OF LIGHT EMITTING PART]

[(1-D)-TH MODE, (2-D)-TH MODE]
[BOTH END PARTS OF LIGHT EMITTING PART]

[(1-D)-TH MODE, (2-D)-TH MODE]
[CENTER PART OF LIGHT EMITTING PART]

[(1-a)-TH MODE, (3-a)-TH MODE, (4-a)-TH MODE]
[BOTH END PARTS OF LIGHT EMITTING PART]

[(1-a)-TH MODE, (3-a)-TH MODE, (4-a)-TH MODE]
[CENTER PART OF LIGHT EMITTING PART]

[(1-b)-TH MODE, (3-b)-TH MODE]
[BOTH END PARTS OF LIGHT EMITTING PART]

[(1-b)-TH MODE, (3-b)-TH MODE]
[CENTER PART OF LIGHT EMITTING PART]

[(1-c)-TH MODE, (3-c)-TH MODE, (4-a)-TH MODE]
[BOTH END PARTS OF LIGHT EMITTING PART]

[(1-c)-TH MODE, (3-c)-TH MODE, (4-a)-TH MODE]
[CENTER PART OF LIGHT EMITTING PART]

[(1-d)-TH MODE, (3-d)-TH MODE]
[BOTH END PARTS OF LIGHT EMITTING PART]

[(1-d)-TH MODE, (3-d)-TH MODE]
[CENTER PART OF LIGHT EMITTING PART]

[(5-A-1)-TH MODE]
[BOTH END PARTS OF LIGHT EMITTING PART]

[(5-A-1)-TH MODE]
[CENTER PART OF LIGHT EMITTING PART]

[(5-A-2)-TH MODE]
[BOTH END PARTS OF LIGHT EMITTING PART]

[(5-A-2)-TH MODE]
[CENTER PART OF LIGHT EMITTING PART]

[(5-a-1)-TH MODE]
[BOTH END PARTS OF LIGHT EMITTING PART]

[(5-a-1)-TH MODE]
[CENTER PART OF LIGHT EMITTING PART]

[(5-a-2)-TH MODE]
[BOTH END PARTS OF LIGHT EMITTING PART]

[(5-a-2)-TH MODE]
[CENTER PART OF LIGHT EMITTING PART]

[(5-B-1)-TH MODE]
[BOTH END PARTS OF LIGHT EMITTING PART]

[(5-B-1)-TH MODE]
[CENTER PART OF LIGHT EMITTING PART]

[MODIFICATION OF (5-B-1)-TH MODE]
[BOTH END PARTS OF LIGHT EMITTING PART]

[MODIFICATION OF (5-B-1)-TH MODE]
[CENTER PART OF LIGHT EMITTING PART]

[(5-B-2)-TH MODE]
[BOTH END PARTS OF LIGHT EMITTING PART]

[(5-B-2)-TH MODE]
[CENTER PART OF LIGHT EMITTING PART]

[MODIFICATION OF (5-B-2)-TH MODE]
[BOTH END PARTS OF LIGHT EMITTING PART]

[MODIFICATION OF (5-B-2)-TH MODE]
[CENTER PART OF LIGHT EMITTING PART]

[(5-b-1)-TH MODE]
[BOTH END PARTS OF LIGHT EMITTING PART]

[(5-b-1)-TH MODE]
[CENTER PART OF LIGHT EMITTING PART]

[MODIFICATION OF (5-b-1)-TH MODE]
[BOTH END PARTS OF LIGHT EMITTING PART]

[MODIFICATION OF (5-b-1)-TH MODE]
[CENTER PART OF LIGHT EMITTING PART]

[(5-b-2)-TH MODE]
[BOTH END PARTS OF LIGHT EMITTING PART]

[(5-b-2)-TH MODE]
[CENTER PART OF LIGHT EMITTING PART]

[MODIFICATION OF (5-b-2)-TH MODE]
[BOTH END PARTS OF LIGHT EMITTING PART]

[MODIFICATION OF (5-b-2)-TH MODE]
[CENTER PART OF LIGHT EMITTING PART]

[(5-C-1)-TH MODE]
[BOTH END PARTS OF LIGHT EMITTING PART]

[(5-C-1)-TH MODE]
[CENTER PART OF LIGHT EMITTING PART]

[MODIFICATION OF (5-C-1)-TH MODE]
[BOTH END PARTS OF LIGHT EMITTING PART]

[MODIFICATION OF (5-C-1)-TH MODE]
[CENTER PART OF LIGHT EMITTING PART]

[(5-C-2)-TH MODE]
[BOTH END PARTS OF LIGHT EMITTING PART]

[(5-C-2)-TH MODE]
[CENTER PART OF LIGHT EMITTING PART]

[MODIFICATION OF (5-C-2)-TH MODE]
[BOTH END PARTS OF LIGHT EMITTING PART]

[MODIFICATION OF (5-C-2)-TH MODE]
[CENTER PART OF LIGHT EMITTING PART]

[(5-c-1)-TH MODE]
[BOTH END PARTS OF LIGHT EMITTING PART]

[(5-c-1)-TH MODE]
[CENTER PART OF LIGHT EMITTING PART]

[MODIFICATION OF (5-c-1)-TH MODE]
[BOTH END PARTS OF LIGHT EMITTING PART]

[MODIFICATION OF (5-c-1)-TH MODE]
[CENTER PART OF LIGHT EMITTING PART]

[(5-c-2)-TH MODE]
[BOTH END PARTS OF LIGHT EMITTING PART]

[(5-c-2)-TH MODE]
[CENTER PART OF LIGHT EMITTING PART]

[MODIFICATION OF (5-c-2)-TH MODE]
[BOTH END PARTS OF LIGHT EMITTING PART]

[MODIFICATION OF (5-c-2)-TH MODE]
[CENTER PART OF LIGHT EMITTING PART]

[STEP-100], [STEP-10]

[STEP-100], [STEP-10]

[STEP-120], [STEP-30]

[STEP-120], [STEP-30]

[STEP-120](CONTINUATION), [STEP-30](CONTINUATION)

[STEP-120](CONTINUATION), [STEP-30](CONTINUATION)

FIG.37 [STEP-130]

[STEP-130]

SEMICONDUCTOR LIGHT EMITTING DEVICE

CROSS REFERENCES TO RELATED APPLICATIONS

The present invention contains subject matter related to Japanese Patent Application JP 2007-239800 filed in the Japan Patent Office on Sep. 14, 2007, the entire contents of which being incorporated herein by reference.

BACKGROUND OF THE INVENTION

1. Field of the Invention

The present invention relates to semiconductor light emitting devices, and particularly to a semiconductor light emitting device in which a current block layer for current confinement is provided on the sides of a light emitting part.

2. Description of the Related Art

As a semiconductor laser having low threshold current $I_{th}$, a semiconductor laser having a separated double hetero junction (SDH) structure that can be formed through one time of an epitaxial growth step (hereinafter, referred to as an SDH semiconductor laser) is known from e.g. Japanese Patent No. 2990837.

For this SDH semiconductor laser, initially a projection part extending along the {110}A plane direction is formed on a substrate having the {100} plane as its major surface. Subsequently, through crystal growth over the major surface of this substrate, a light emitting part formed of a multilayer structure composed of compound semiconductor layers is formed on the {100} plane of the projection part (for convenience, referred to as the projection surface). The light emitting part is formed of e.g. a multilayer structure arising from sequential stacking of a first compound semiconductor layer of a first conductivity type, an active layer, and a second compound semiconductor layer of a second conductivity type. A sectional shape obtained when this light emitting part is cut along a virtual plane perpendicular to the extension direction of the projection part is e.g. a triangle, and the side surface (oblique surface) of the light emitting part is the {111}B plane. In general, the {111}B plane is known as a non-growth surface in MOCVD (Metal Organic Chemical Vapor Deposition, referred to also as MOVPE (Metal Organic Vapor Phase Deposition)), except for special crystal growth conditions. Therefore, in the case of the SDH semiconductor laser, after the light emitting part whose side surface is the {111}B plane is formed, "self growth stop" of the crystal growth of the light emitting part is kept even if the MOCVD is continued thereafter.

In the present specification, the crystal planes shown below are represented as the (hkl) plane and the (hk-l) plane, respectively, for convenience.

(hkl)plane
(hkl̄)plane

In addition, the directions shown below are represented as the [hkl] direction and the [hk-l] direction, respectively, for convenience.

[hkl]direction
[hkl̄]direction

On the other hand, the {100} plane part as the major surface of the substrate except the projection part (for convenience, referred to as the recess surface) does not involve a non-growth surface. Thus, if the MOCVD is continued, a compound semiconductor layer formed through crystal growth from the recess surface will completely cover the light emitting part in the self growth stop state in time. The compound semiconductor layer formed through crystal growth from the recess surface has, on the second compound semiconductor layer, a structure arising from sequential formation of a layer for adjustment of the current block layer position (hereinafter, referred to simply as the adjustment layer) a current block layer, and a burying layer. Controlling the thickness of the adjustment layer makes it possible to form a structure that permits current injection only to the active layer of the light emitting part through formation of the current block layer at an intermediate phase before the compound semiconductor layer formed through crystal growth from the recess surface covers the light emitting part (in particular, when the upper surface of the compound semiconductor layer is about to reach both the side surfaces of the active layer formed in the light emitting part).

In this manner, for the SDH semiconductor laser, the respective compound semiconductor layers can be formed based on one time of a crystal growth step. In addition, the active layer can be completely surrounded by compound semiconductor layers favorable for light confinement by selecting materials whose energy band gaps are sufficiently wider than that of the active layer, i.e., materials having lower refractive indexes, as the materials used for the compound semiconductor layers that vertically sandwich the active layer in the light emitting part (the first compound semiconductor layer and the second compound semiconductor layer) and the materials used for the current block layer, the burying layer, and the adjustment layer located outside the light emitting part. Due to this feature, the shape of a beam emitted from the semiconductor laser whose light emitting surface is the end surface of the projection part can be brought close to a perfect circle. That is, as the far field pattern (FFP), the following relationship can be achieved.

$$\theta_{//} \approx \theta_{\perp}$$

Furthermore, depending on e.g. the efficiency of coupling with a lens, it is often needed that the shape of a beam emitted from the semiconductor laser is an ellipse. For such a case, the $\theta_{//}$ of the FFP can be set small e.g. by employing a so-called flare-stripe structure, in which the width of the projection part near the ends of the projection part is increased (refer to e.g. Japanese Patent No. 3399018). Moreover, employing the flare-stripe structure can achieve high light output.

For the above-described SDH semiconductor laser, enhancement in the quality of the current block layer (the degree of suppression of current leakage) is a very important technical factor.

The outline of a method for manufacturing a related-art semiconductor laser having a flare-stripe structure will be described below.

[Step-10]

Initially, on the {100} crystal plane, e.g. the (100) crystal plane, of an n-GaAs substrate 10 as its major surface, a light emitting part forming region 11 that has a predetermined width and a substantially-stripe shape and extends along the [011]A direction is formed. The width direction of the light emitting part forming region 11 is parallel to the [0-11]B direction. In this way, the structure shown in FIG. 32A can be obtained. The light emitting part forming region 11 has the oblique surfaces (side surfaces) corresponding to the {111}B plane. The planar shape of the light emitting part forming region 11 is schematically shown in FIG. 32B. The light emitting part forming region 11 has a strip shape in which the width of the center part is smaller than that of both the end parts. In FIG. 32B, the light emitting part forming region 11 is hatched for clearly showing it.

[Step-20]

Subsequently, based on normal MOCVD, specifically, MOCVD with use of an organic metal and a hydrogen compound as the source gas, a buffer layer 12, an n-type first compound semiconductor layer 21, an active layer 23, a p-type second compound semiconductor layer 22 are epitaxially grown over the projection surface and the recess surface. At this time, the oblique surfaces (side surfaces) of the compound semiconductor layers above the projection surface correspond to the {111}B plane. As described above, the {111}B plane is a non-growth surface Therefore, the multilayer structure formed by the buffer layer 12, the first compound semiconductor layer 21, the active layer 23, and the second compound semiconductor layer 22 (so-called double heterostructure) is so formed (stacked) that the double heterostructure in the region above the projection surface is separated from that in the region above the recess surface (i.e., a separated double heterostructure is obtained). By properly selecting the width and thickness of the light emitting part forming region 11 (projection surface) and properly selecting the thicknesses of the buffer layer 12, the first compound semiconductor layer 21, the active layer 23, and the second compound semiconductor layer 22, a multilayer structure of a light emitting part 20 having a triangular sectional shape can be obtained above the center part of the light emitting part forming region 11 (projection surface). On the other hand, at both the end parts of the light emitting part forming region 11, a multilayer structure of the light emitting part 20 having a trapezoidal sectional shape can be obtained at this moment.

[Step-30]

Thereafter, continuously with the formation of the second compound semiconductor layer 22, a layer 30 for adjustment of the current block layer position (hereinafter, referred to simply as the adjustment layer 30), formed of a p-type compound semiconductor layer, is formed across the entire surface based on MOCVD. In this way, the sectional structure shown in FIG. 33 can be obtained at the center part of the light emitting part forming region 11. On the other hand, at both the end parts of the light emitting part forming region 11, the sectional structure shown in FIG. 34 can be obtained at this moment. Furthermore, for example, a current block layer 40 formed of a multilayer structure composed of a p-type compound semiconductor layer and an n-type compound semiconductor layer is formed based on MOCVD. The current block layer 40 is not grown on the {111}B plane. The current block layer 40 is so formed that the end surfaces of the current block layer 40 cover at least the side surfaces of the active layer 23. Such configuration and structure can be achieved by properly selecting the thickness of the adjustment layer 30.

As shown in FIG. 35, at the center part of the light emitting part forming region 11, the current block layer 40 is formed only on the side surfaces of the light emitting part 20. At this moment, as shown in FIG. 36, at both the end parts of the light emitting part forming region 11, in addition to the formation of the current block layer 40 on the side surfaces of the light emitting part 20, the same multilayer structure as that of the current block layer 40 is formed above the top surface ({100} plane) of the multilayer structure of the light emitting part 20 in such a way that the {111}B facet planes (side surfaces) are gradually formed and thus the width of the top surface is gradually decreased. The same multilayer structure as that of the current block layer 40, formed above the top surface of the multilayer structure of the light emitting part 20, will be referred to as a deposited layer 40", for convenience. Between the deposited layer 40" and the top surface of the multilayer structure of the light emitting part 20, a compound semiconductor layer 30' having the same configuration as that of the adjustment layer 30 is formed.

Subsequently, a burying layer 31 and a contact layer (cap layer) 32 are sequentially formed across the entire surface based on MOCVD. At this moment, at both the end parts of the light emitting part forming region 11, the burying layer is formed on the top surface ({100} plane) of the deposited layer 40" in such a way that the {111}B facet planes (side surfaces) are gradually formed and thus the width of the top surface is gradually decreased. Furthermore, if the width of the top surface is sufficiently large, the same multilayer structure as that of the contact layer (cap layer) 32 is formed. The burying layer on the deposited layer 40" will be represented as a burying layer 31". Thereafter, a second electrode 52 is formed based on vacuum evaporation on the contact layer 32 formed as the outermost layer. Furthermore, the substrate 10 is lapped to a proper thickness from the backside thereof, and then a first electrode 51 is formed based on vacuum evaporation (see FIGS. 42 and 43).

SUMMARY OF THE INVENTION

In the above-described [Step-30], at both the end parts of the light emitting part forming region 11, the deposited layer 40" having the same multilayer structure as that of the current block layer 40 is formed above the top surface of the multilayer structure of the light emitting part 20. This deposited layer 40" is formed of the multilayer structure composed of the p-type compound semiconductor layer and the n-type compound semiconductor layer, and therefore does not allow the passage of current therethrough. Thus, the current supplied from the second electrode 52 reaches the contact layer (cap layer) 32 and the burying layer 31, and then flows from the periphery of the deposited layer 40" into the second compound semiconductor layer 22 via the {111}B side surfaces (contact surfaces) in contact with the burying layer 31. That is, the current injection path to the active layer is limited to the {111}B side surfaces (contact surfaces). This results in a problem that the electric resistance is increased and thus the heat generation and the current consumption are increased, and hence a problem that the light emission efficiency of the semiconductor light emitting device is decreased.

The current block layer 40 obtained through crystal growth from the recess surface is composed of a {311}B crystal plane region that extends from the side surface of the light emitting part 20, a {100} crystal plane region that extends along the major surface of the substrate 10, and a {h11}B crystal plane region that is located between the {311}B crystal plane region and the {100} crystal plane region (h is an integer equal to or larger than four, and it will be often referred to as a high-order crystal plane region, for convenience). In particular, in the {h11}B crystal plane region or in the vicinity of this region, the current block layer 40 is annihilated or thinned due to impurity mutual diffusion between the n-type compound semiconductor layer and the p-type compound semiconductor layer of the current block layer 40. This causes a problem that the effect of the current block layer 40 is unstable and leakage current is increased.

In order to solve such a problem, in a technique disclosed in Japanese Patent No. 2990837, a p-type substrate is used as the substrate 10 and the current block layer 40 is formed of a p-type compound semiconductor layer. There is a tendency that the {311}B crystal plane region is readily turned to an n-type region and the high-order crystal plane region is readily turned to a p-type region. Therefore, the thickness of the {311}B crystal plane region is eventually decreased from the original p-type epitaxial growth thickness, so that this region becomes a thin film part. On the other hand, the thickness of the high-order crystal plane region is eventually increased due to the turning to a p-type region, so that this region becomes a thick film part. As a result, the thickness of the high-order crystal plane region of the current block layer 40 becomes large, and thus leakage current of this part can be surely avoided.

As above, the technique disclosed in Japanese Patent No. 2990837 is very effective to solve the above-described problem. However, using an n-type substrate is strongly demanded. Furthermore, also in the case of using a p-type substrate, it is desirable to further reduce leakage current of the current block layer 40.

There is a first need for the present invention to provide a semiconductor light emitting device having structure and configuration that include no deposited layer having a current block effect above the top surface of the multilayer structure of a light emitting part, and thus allow ensured avoidance of a problem that the electric resistance is increased and therefore the heat generation and the current consumption are increased, and hence a problem that the light emission efficiency of the semiconductor light emitting device is decreased. Furthermore, there is a second need for the present invention to provide a semiconductor light emitting device having structure and configuration that meet the first need and allow a current block layer formed of plural crystal planes to have high stability across the entire layer without being affected by impurity mutual diffusion between plural compound semiconductor layers of the current block layer, and thus allow further reduction in leakage current of the current block layer.

According to an embodiment of the present invention, there is provided a semiconductor light emitting device to meet the above-described first need. This semiconductor light emitting device includes:

(A) a light emitting part configured to be formed of a multilayer structure arising from sequential stacking of a first compound semiconductor layer of a first conductivity type, an active layer, and a second compound semiconductor layer of a second conductivity type;

(B) a current block layer configured to be provided in contact with a side surface of the light emitting part; and (C) a burying layer configured to be formed over the current block layer and the light emitting part, wherein the planar shape of the active layer is a strip shape in which the width of a center part is smaller than the width of both end parts, the current block layer is composed of a third compound semiconductor layer of the first conductivity type and a fourth compound semiconductor layer of the second conductivity type in contact with the third compound semiconductor layer, the burying layer has the second conductivity type and is formed of a multilayer structure arising from sequential stacking of a first burying layer and a second burying layer, and in the burying layer located above the current block layer, the impurity for causing the second burying layer to have the second conductivity type is such that the substitution site of the impurity in the second burying layer does not compete with the substitution site of the impurity in the third compound semiconductor layer for causing the third compound semiconductor layer to have the first conductivity type. The semiconductor light emitting device according to the embodiment of the present invention has a so-called flare-stripe structure.

In the semiconductor light emitting device according to the embodiment of the present invention, it is preferable that, in the burying layer located above the current block layer, the impurity for causing the first burying layer to have the second conductivity type be such that the substitution site of the impurity in the first burying layer competes with the substitution site of the impurity in the third compound semiconductor layer for causing the third compound semiconductor layer to have the first conductivity type. Furthermore, it is preferable that, in the burying layer located above the current block layer, the impurity for causing the first burying layer to have the second conductivity type be such that the substitution site of the impurity in the first burying layer competes with the substitution site of the impurity in the fourth compound semiconductor layer for causing the fourth compound semiconductor layer to have the second conductivity type. Hereinafter, the semiconductor light emitting device according to the embodiment of the present invention including these preferred configurations will be often referred to as "the semiconductor light emitting device according to the embodiment of the present invention including the above-described preferred configuration."

The semiconductor light emitting device according to the embodiment of the present invention including the above-described preferred configuration may have the following configuration. Specifically, the impurity for causing the first compound semiconductor layer to have the first conductivity type is such that the substitution site of the impurity in the first compound semiconductor layer does not compete with the substitution site of the impurity in the second compound semiconductor layer for causing the second compound semiconductor layer to have the second conductivity type, and the impurity for causing the third compound semiconductor layer to have the first conductivity type is such that the substitution site of the impurity in the third compound semiconductor layer competes with the substitution site of the impurity in the fourth compound semiconductor layer for causing the fourth compound semiconductor layer to have the second conductivity type. This configuration meets the above-described second need. For convenience, this configuration will be referred to as "the semiconductor light emitting device according to the first mode of the present invention." In this configuration, the multilayer structure composed of the fourth compound semiconductor layer and the third compound semiconductor layer stacked in that order from the lower side may be employed. Alternatively, the multilayer structure composed of the third compound semiconductor layer and the fourth compound semiconductor layer stacked in that order from the lower side may be employed. However, it is more preferable to employ the former multilayer structure.

The semiconductor light emitting device according to the first mode of the present invention may have the following configuration. Specifically, the first compound semiconductor layer, the second compound semiconductor layer, the third compound semiconductor layer, the fourth compound semiconductor layer, the first burying layer, and the second burying layer are composed of a III-V compound semiconductor, the substitution site of the impurity in the first compound semiconductor layer is the site occupied by a group V atom, the substitution site of the impurity in the second compound semiconductor layer is the site occupied by a group III atom, the substitution site of the impurity in the third compound semiconductor layer and the substitution site of the impurity in the fourth compound semiconductor layer are the site occupied by a group III atom, the substitution site of the impurity in the first burying layer is the site occupied by a group III atom, and the substitution site of the impurity in the second burying layer is the site occupied by a group V atom. For convenience, this configuration will be referred to as "the semiconductor light emitting device according to the (1-A)-th mode of the present invention."

In addition, the semiconductor light emitting device according to the first mode of the present invention may have the following configuration. Specifically, the first compound semiconductor layer, the second compound semiconductor layer, the third compound semiconductor layer, the fourth compound semiconductor layer, the first burying layer, and the second burying layer are composed of a III-V compound semiconductor, the first compound semiconductor layer is composed of a 1A-th compound semiconductor layer and a 1B-th compound semiconductor layer that is provided on the 1A-th compound semiconductor layer and is in contact with the active layer, the second compound semiconductor layer is composed of a 2B-th compound semiconductor layer in contact with the active layer and a 2A-th compound semiconductor layer provided on the 2B-th compound semiconductor layer, the substitution site of the impurity in the 1A-th compound semiconductor layer is the site occupied by a group III atom, the substitution site of the impurity in the 1B-th compound semiconductor layer is the site occupied by a group V atom, the substitution site of the impurity in the 2B-th compound semiconductor layer is the site occupied by a group III atom, the substitution site of the impurity in the 2A-th compound semiconductor layer is the site occupied by a group V atom, the substitution site of the impurity in the third compound semiconductor layer and the substitution site of the impurity in the fourth compound semiconductor layer are the site occupied by a group III atom, the substitution site of the impurity in the first burying layer is the site occupied by a group III atom, and the substitution site of the impurity in the second burying layer is the site occupied by a group V atom. For convenience, this configuration will be referred to as "the semiconductor light emitting device according to the (1-B)-th mode of the present invention."

In addition, the semiconductor light emitting device according to the first mode of the present invention may have the following configuration. Specifically, the first compound semiconductor layer, the second compound semiconductor layer, the third compound semiconductor layer, the fourth compound semiconductor layer, the first burying layer, and the second burying layer are composed of a III-V compound semiconductor, the substitution site of the impurity in the first compound semiconductor layer is the site occupied by a group V atom, the substitution site of the impurity in the second compound semiconductor layer is the site occupied by a group III atom, the substitution site of the impurity in the third compound semiconductor layer and the substitution site of the impurity in the fourth compound semiconductor layer are the site occupied by a group V atom, the substitution site of the impurity in the first burying layer is the site occupied by a group V atom, and the substitution site of the impurity in the second burying layer is the site occupied by a group III atom. For convenience, this configuration will be referred to as "the semiconductor light emitting device according to the (1-a)-th mode of the present invention."

In addition, the semiconductor light emitting device according to the first mode of the present invention may have the following configuration. Specifically, the first compound semiconductor layer, the second compound semiconductor layer, the third compound semiconductor layer, the fourth compound semiconductor layer, the first burying layer, and the second burying layer are composed of a III-V compound semiconductor, the first compound semiconductor layer is composed of a 1A-th compound semiconductor layer and a 1B-th compound semiconductor layer that is provided on the 1A-th compound semiconductor layer and is in contact with the active layer, the second compound semiconductor layer is composed of a 2B-th compound semiconductor layer in contact with the active layer and a 2A-th compound semiconductor layer provided on the 2B-th compound semiconductor layer, the substitution site of the impurity in the 1A-th compound semiconductor layer is the site occupied by a group III atom, the substitution site of the impurity in the 1B-th compound semiconductor layer is the site occupied by a group V atom, the substitution site of the impurity in the 2B-th compound semiconductor layer is the site occupied by a group III atom, the substitution site of the impurity in the 2A-th compound semiconductor layer is a site occupied by a group V atom, the substitution site of the impurity in the third compound semiconductor layer and the substitution site of the impurity in the fourth compound semiconductor layer are the site occupied by a group V atom, the substitution site of the impurity in the first burying layer is the site occupied by a group V atom, and the substitution site of the impurity in the second burying layer is the site occupied by a group III atom. For convenience, this configuration will be referred to as "the semiconductor light emitting device according to the (1-b)-th mode of the present invention."

In addition, the semiconductor light emitting device according to the first mode of the present invention may have the following configuration. Specifically, the first compound semiconductor layer, the second compound semiconductor layer, the third compound semiconductor layer, the fourth compound semiconductor layer, the first burying layer, and the second burying layer are composed of a III-V compound semiconductor, the substitution site of the impurity in the first compound semiconductor layer is the site occupied by a group III atom, the substitution site of the impurity in the second compound semiconductor layer is the site occupied by a group V atom, the substitution site of the impurity in the third compound semiconductor layer and the substitution site of the impurity in the fourth compound semiconductor layer are the site occupied by a group V atom, the substitution site of the impurity in the first burying layer is the site occupied by a group V atom, and the substitution site of the impurity in the second burying layer is the site occupied by a group III atom. For convenience, this configuration will be referred to as "the semiconductor light emitting device according to the (1-C)-th mode of the present invention."

In addition, the semiconductor light emitting device according to the first mode of the present invention may have the following configuration. Specifically, the first compound semiconductor layer, the second compound semiconductor layer, the third compound semiconductor layer, the fourth compound semiconductor layer, the first burying layer, and the second burying layer are composed of a III-V compound semiconductor, the first compound semiconductor layer is composed of a 1A-th compound semiconductor layer and a 1B-th compound semiconductor layer that is provided on the 1A-th compound semiconductor layer and is in contact with the active layer, the second compound semiconductor layer is composed of a 2B-th compound semiconductor layer in contact with the active layer and a 2A-th compound semiconductor layer provided on the 2B-th compound semiconductor layer, the substitution site of the impurity in the 1A-th compound semiconductor layer is the site occupied by a group V atom, the substitution site of the impurity in the 1B-th compound semiconductor layer is the site occupied by a group III atom, the substitution site of the impurity in the 2B-th compound semiconductor layer is the site occupied by a group V atom, the substitution site of the impurity in the 2A-th compound semiconductor layer is the site occupied by a group III atom, the substitution site of the impurity in the third compound semiconductor layer and the substitution site of the impurity in the fourth compound semiconductor layer are the site occupied by a group V atom, the substitution site of the impurity in the first burying layer is the site occupied by a group V atom, and the substitution site of the impurity in the second burying layer is the site occupied by a group III atom. For convenience, this configuration will be referred to as "the semiconductor light emitting device according to the (1-D)-th mode of the present invention."

In addition, the semiconductor light emitting device according to the first mode of the present invention may have the following configuration. Specifically, the first compound semiconductor layer, the second compound semiconductor layer, the third compound semiconductor layer, the fourth compound semiconductor layer, the first burying layer, and the second burying layer are composed of a III-V compound semiconductor, the substitution site of the impurity in the first compound semiconductor layer is the site occupied by a group III atom, the substitution site of the impurity in the second compound semiconductor layer is the site occupied by a group V atom, the substitution site of the impurity in the third compound semiconductor layer and the substitution site of the impurity in the fourth compound semiconductor layer are the site occupied by a group III atom, the substitution site of the impurity in the first burying layer is the site occupied by a group III atom, and the substitution site of the impurity in the second burying layer is the site occupied by a group V atom. For convenience, this configuration will be referred to as "the semiconductor light emitting device according to the (1-c)-th mode of the present invention."

In addition, the semiconductor light emitting device according to the first mode of the present invention may have the following configuration. Specifically, the first compound semiconductor layer, the second compound semiconductor layer, the third compound semiconductor layer, the fourth compound semiconductor layer, the first burying layer, and the second burying layer are composed of a III-V compound semiconductor, the first compound semiconductor layer is composed of a 1A-th compound semiconductor layer and a 1B-th compound semiconductor layer that is provided on the 1A-th compound semiconductor layer and is in contact with the active layer, the second compound semiconductor layer is composed of a 2B-th compound semiconductor layer in contact with the active layer and a 2A-th compound semiconductor layer provided on the 2B-th compound semiconductor layer, the substitution site of the impurity in the 1A-th compound semiconductor layer is the site occupied by a group V atom, the substitution site of the impurity in the 1B-th compound semiconductor layer is the site occupied by a group III atom, the substitution site of the impurity in the 2B-th compound semiconductor layer is the site occupied by a group V atom, the substitution site of the impurity in the 2A-th compound semiconductor layer is the site occupied by a group III atom, the substitution site of the impurity in the third compound semiconductor layer and the substitution site of the impurity in the fourth compound semiconductor layer are the site occupied by a group III atom, the substitution site of the impurity in the first burying layer is the site occupied by a group III atom, and the substitution site of the impurity in the second burying layer is the site occupied by a group V atom. For convenience, this configuration will be referred to as "the semiconductor light emitting device according to the (1-d)-th mode of the present invention."

The above-described semiconductor light emitting devices relating to the preferred configurations of the first mode of the present invention, i.e., the semiconductor light emitting devices according to the (1-A)-th mode, (1-a)-th mode, (1-B)-th mode, (1-b)-th mode, (1-C)-th mode, (1-c)-th mode, (1-D)-th mode, and (1-d)-th mode of the present invention, may have the following configuration. Specifically, the current block layer further includes a fifth compound semiconductor layer of the second conductivity type, the third compound semiconductor layer is sandwiched by the fourth compound semiconductor layer and the fifth compound semiconductor layer, and the impurity for causing the third compound semiconductor layer to have the first conductivity type is such that the substitution site of the impurity in the third compound semiconductor layer competes with the substitution site of the impurity in the fifth compound semiconductor layer for causing the fifth compound semiconductor layer to have the second conductivity type. In this configuration, the multilayer structure composed of the fourth compound semiconductor layer, the third compound semiconductor layer, and the fifth compound semiconductor layer stacked in that order from the lower side may be employed. Alternatively, the multilayer structure composed of the fifth compound semiconductor layer, the third compound semiconductor layer, and the fourth compound semiconductor layer stacked in that order from the lower side may be employed. In addition, the following configuration is also available. Specifically, the current block layer further includes a sixth compound semiconductor layer of the first conductivity type, the fourth compound semiconductor layer is sandwiched by the third compound semiconductor layer and the sixth compound semiconductor layer, and the impurity for causing the fourth compound semiconductor layer to have the second conductivity type is such that the substitution site of the impurity in the fourth compound semiconductor layer competes with the substitution site of the impurity in the sixth compound semiconductor layer for causing the sixth compound semiconductor layer to have the first conductivity type. In this configuration, the multilayer structure composed of the third compound semiconductor layer, the fourth compound semiconductor layer, and the sixth compound semiconductor layer stacked in that order from the lower side may be employed. Alternatively, the multilayer structure composed of the sixth compound semiconductor layer, the fourth compound semiconductor layer, and the third compound semiconductor layer stacked in that order from the lower side may be employed.

In the following description, at least one kind of impurity selected from the group composed of three kinds of impurities of selenium (Se), tellurium (Te), and sulfur (S) is referred to as a group VI impurity, for convenience. Furthermore, at least one kind of impurity selected from the group composed of two kinds of impurities of silicon (Si) and tin (Sn) is referred to as a group IV impurity, for convenience. Moreover, at least one kind of impurity selected from the group composed of four kinds of impurities of zinc (Zn), magnesium (Mg), beryllium (Be), and manganese (Mn) is referred to as a group II impurity, for convenience.

The semiconductor light emitting device according to the embodiment of the present invention including the above-described preferred configuration may have the following configuration. Specifically, the first compound semiconductor layer, the second compound semiconductor layer, the third compound semiconductor layer, the fourth compound semiconductor layer, the first burying layer, and the second burying layer are composed of a III-V compound semiconductor, the impurity for causing the first compound semiconductor layer to be the n-type as the first conductivity type is a group VI impurity, the impurity for causing the third compound semiconductor layer to be the n-type as the first conductivity type is a group IV impurity, the impurity for causing the first burying layer to be the p-type as the second conductivity type is a group II impurity, and the impurity for causing the second burying layer to be the p-type as the second conductivity type is carbon (C). This configuration meets the above-described second need. For convenience, this configuration will be referred to as "the semiconductor light emitting device according to the (2-A)-th mode of the present invention." In the semiconductor light emitting device according to the (2-A)-th mode of the present invention, the number of combinations of (the impurity in the first compound semiconductor layer, the impurity in the third compound semiconductor layer, the impurity in the first burying layer, and the impurity in the second burying layer) is $3 \times 2 \times 4 \times 1 = 24$.

The first compound semiconductor layer containing a group VI impurity is the part that is in contact with at least the active layer (including well layers and confinement layers), specifically. In this configuration, the multilayer structure composed of the fourth compound semiconductor layer and the third compound semiconductor layer stacked in that order from the lower side may be employed. Alternatively, the multilayer structure composed of the third compound semiconductor layer and the fourth compound semiconductor layer stacked in that order from the lower side may be employed. However, it is more preferable to employ the former multilayer structure In addition, the semiconductor light emitting device according to the embodiment of the present invention including the above-described preferred configuration may have the following configuration. Specifically, the first compound semiconductor layer, the second compound semiconductor layer, the third compound semiconductor layer, the fourth compound semiconductor layer, the first burying layer, and the second burying layer are composed of a III-V compound semiconductor, the first compound semiconductor layer is composed of a 1A-th compound semiconductor layer and a 1B-th compound semiconductor layer that is provided on the 1A-th compound semiconductor layer and is in contact with the active layer, the second compound semiconductor layer is composed of a 2B-th compound semiconductor layer in contact with the active layer and a 2A-th compound semiconductor layer provided on the 2B-th compound semiconductor layer, the impurity for causing the 1A-th compound semiconductor layer to be the n-type as the first conductivity type is a group IV impurity, the impurity for causing the 1B-th compound semiconductor layer to be the n-type as the first conductivity type is a group VI impurity, the impurity for causing the 2B-th compound semiconductor layer to be the p-type as the second conductivity type is a group II impurity, the impurity for causing the 2A-th compound semiconductor layer to be the p-type as the second conductivity type is carbon (C), the impurity for causing the third compound semiconductor layer to be the n-type as the first conductivity type is a group IV impurity, the impurity for causing the fourth compound semiconductor layer to be the p-type as the second conductivity type is a group II impurity, the impurity for causing the first burying layer to be the p-type as the second conductivity type is a group II impurity, and the impurity for causing the second burying layer to be the p-type as the second conductivity type is carbon (C). This configuration meets the above-described second need. For convenience, this configuration will be referred to as "the semiconductor light emitting device according to the (2-B)-th mode of the present invention." In the semiconductor light emitting device according to the (2-B)-th mode of the present invention, the number of combinations of (the impurity in the 1A-th compound semiconductor layer, the impurity in the 1B-th compound semiconductor layer, the impurity in the 2B-th compound semiconductor layer, the impurity in the 2A-th compound semiconductor layer, the impurity in the fourth compound semiconductor layer, the impurity in the third compound semiconductor layer, the impurity in the first burying layer, and the impurity in the second burying layer) is $2 \times 3 \times 4 \times 1 \times 4 \times 2 \times 4 \times 1 = 768$.

In addition, the semiconductor light emitting device according to the embodiment of the present invention including the above-described preferred configuration may have the following configuration. Specifically, the first compound semiconductor layer, the second compound semiconductor layer, the third compound semiconductor layer, the fourth compound semiconductor layer, the first burying layer, and the second burying layer are composed of a III-V compound semiconductor, the impurity for causing the first compound semiconductor layer to be the p-type as the first conductivity type is a group II impurity, the impurity for causing the third compound semiconductor layer to be the p-type as the first conductivity type is carbon (C), the impurity for causing the first burying layer to be the n-type as the second conductivity type is a group VI impurity, and the impurity for causing the second burying layer to be the n-type as the second conductivity type is a group IV impurity. This configuration meets the above-described second need. For convenience, this configuration will be referred to as "the semiconductor light emitting device according to the (2-C)-th mode of the present invention." In the semiconductor light emitting device according to the (2-C)-th mode of the present invention, the number of combinations of (the impurity in the first compound semiconductor layer, the impurity in the third compound semiconductor layer, the impurity in the first burying layer, and the impurity in the second burying layer) is $4\times1\times3\times2=24$.

The first compound semiconductor layer containing a group II impurity is the part that is in contact with at least the active layer (including well layers and confinement layers), specifically. In this configuration, the multilayer structure composed of the fourth compound semiconductor layer and the third compound semiconductor layer stacked in that order from the lower side may be employed. Alternatively, the multilayer structure composed of the third compound semiconductor layer and the fourth compound semiconductor layer stacked in that order from the lower side may be employed. However, it is more preferable to employ the former multilayer structure.

In addition, the semiconductor light emitting device according to the embodiment of the present invention including the above-described preferred configuration may have the following configuration. Specifically, the first compound semiconductor layer, the second compound semiconductor layer, the third compound semiconductor layer, the fourth compound semiconductor layer, the first burying layer, and the second burying layer are composed of a III-V compound semiconductor, the first compound semiconductor layer is composed of a 1A-th compound semiconductor layer and a 1B-th compound semiconductor layer that is provided on the 1A-th compound semiconductor layer and is in contact with the active layer, the second compound semiconductor layer is composed of a 2B-th compound semiconductor layer in contact with the active layer and a 2A-th compound semiconductor layer provided on the 2B-th compound semiconductor layer, the impurity for causing the 1A-th compound semiconductor layer to be the p-type as the first conductivity type is carbon (C), the impurity for causing the 1B-th compound semiconductor layer to be the p-type as the first conductivity type is a group II impurity, the impurity for causing the 2B-th compound semiconductor layer to be the n-type as the second conductivity type is a group VI impurity, the impurity for causing the 2A-th compound semiconductor layer to be the n-type as the second conductivity type is a group IV impurity, the impurity for causing the third compound semiconductor layer to be the p-type as the first conductivity type is carbon (C), the impurity for causing the fourth compound semiconductor layer to be the n-type as the second conductivity type is a group VI impurity, the impurity for causing the first burying layer to be the n-type as the second conductivity type is a group VI impurity, and the impurity for causing the second burying layer to be the n-type as the second conductivity type is a group IV impurity. This configuration meets the above-described second need. For convenience, this configuration will be referred to as "the semiconductor light emitting device according to the (2-D)-th mode of the present invention." In the semiconductor light emitting device according to the (2-D)-th mode of the present invention, the number of combinations of (the impurity in the 1A-th compound semiconductor layer, the impurity in the 1B-th compound semiconductor layer, the impurity in the 2B-th compound semiconductor layer, the impurity in the 2A-th compound semiconductor layer, the impurity in the third compound semiconductor layer, the impurity in the fourth compound semiconductor layer, the impurity in the first burying layer, and the impurity in the second burying layer) is $1\times4\times3\times2\times1\times3\times3\times2=432$.

In addition, the semiconductor light emitting device according to the embodiment of the present invention including the above-described preferred configuration may have the following configuration. Specifically, the first compound semiconductor layer, the second compound semiconductor layer, the third compound semiconductor layer, the fourth compound semiconductor layer, the first burying layer, and the second burying layer are composed of a III-V compound semiconductor, the impurity for causing the second compound semiconductor layer to be the p-type as the second conductivity type is a group II impurity, the impurity for causing the fourth compound semiconductor layer to be the p-type as the second conductivity type is carbon (C), the impurity for causing the first burying layer to be the p-type as the second conductivity type is carbon (C), and the impurity for causing the second burying layer to be the p-type as the second conductivity type is a group II impurity. This configuration meets the above-described second need. For convenience, this configuration will be referred to as "the semiconductor light emitting device according to the (3-a)-th mode of the present invention." In the semiconductor light emitting device according to the (3-a)-th mode of the present invention, the number of combinations of (the impurity in the second compound semiconductor layer, the impurity in the fourth compound semiconductor layer, the impurity in the first burying layer, and the impurity in the second burying layer) is $4\times1\times1\times4=16$.

The second compound semiconductor layer containing a group II impurity is the part that is in contact with at least the active layer (including well layers and confinement layers), specifically. In this configuration, the multilayer structure composed of the fourth compound semiconductor layer and the third compound semiconductor layer stacked in that order from the lower side may be employed. Alternatively, the multilayer structure composed of the third compound semiconductor layer and the fourth compound semiconductor layer stacked in that order from the lower side may be employed. However, it is more preferable to employ the former multilayer structure.

In addition, the semiconductor light emitting device according to the embodiment of the present invention including the above-described preferred configuration may have the following configuration. Specifically, the first compound semiconductor layer, the second compound semiconductor layer, the third compound semiconductor layer, the fourth compound semiconductor layer, the first burying layer, and the second burying layer are composed of a III-V compound semiconductor, the first compound semiconductor layer is composed of a 1A-th compound semiconductor layer and a 1B-th compound semiconductor layer that is provided on the 1A-th compound semiconductor layer and is in contact with the active layer, the second compound semiconductor layer is composed of a 2B-th compound semiconductor layer in contact with the active layer and a 2A-th compound semiconductor layer provided on the 2B-th compound semiconductor layer, the impurity for causing the 1A-th compound semiconductor layer to be the n-type as the first conductivity type is a group IV impurity, the impurity for causing the 1B-th compound semiconductor layer to be the n-type as the first conductivity type is a group VI impurity, the impurity for causing the 2B-th compound semiconductor layer to be the p-type as the second conductivity type is a group II impurity, the impurity for causing the 2A-th compound semiconductor layer to be the p-type as the second conductivity type is carbon (C), the impurity for causing the third compound semiconductor layer to be the n-type as the first conductivity type is a group VI impurity, the impurity for causing the fourth compound semiconductor layer to be the p-type as the second conductivity type is carbon (C), the impurity for causing the first burying layer to be the p-type as the second conductivity type is carbon (C), and the impurity for causing the second burying layer to be the p-type as the second conductivity type is a group II impurity. This configuration meets the above-described second need. For convenience, this configuration will be referred to as "the semiconductor light emitting device according to the (3-b)-th mode of the present invention." In the semiconductor light emitting device according to the (3-b)-th mode of the present invention, the number of combinations of (the impurity in the 1A-th compound semiconductor layer, the impurity in the 1B-th compound semiconductor layer, the impurity in the 2B-th compound semiconductor layer, the impurity in the 2A-th compound semiconductor layer, the impurity in the fourth compound semiconductor layer, the impurity in the third compound semiconductor layer, the impurity in the first burying layer, and the impurity in the second burying layer) is $2 \times 3 \times 4 \times 1 \times 1 \times 3 \times 1 \times 4 = 288$.

In addition, the semiconductor light emitting device according to the embodiment of the present invention including the above-described preferred configuration may have the following configuration. Specifically, the first compound semiconductor layer, the second compound semiconductor layer, the third compound semiconductor layer, the fourth compound semiconductor layer, the first burying layer, and the second burying layer are composed of a III-V compound semiconductor, the impurity for causing the second compound semiconductor layer to be the n-type as the second conductivity type is a group VI impurity, the impurity for causing the fourth compound semiconductor layer to be the n-type as the second conductivity type is a group IV impurity, the impurity for causing the first burying layer to be the n-type as the second conductivity type is a group IV impurity, and the impurity for causing the second burying layer to be the n-type as the second conductivity type is a group VI impurity. This configuration meets the above-described second need. For convenience, this configuration will be referred to as "the semiconductor light emitting device according to the (3-c)-th mode of the present invention." In the semiconductor light emitting device according to the (3-c)-th mode of the present invention, the number of combinations of (the impurity in the second compound semiconductor layer, the impurity in the third compound semiconductor layer, the impurity in the first burying layer, and the impurity in the second burying layer) is $3 \times 2 \times 2 \times 3 = 36$.

The second compound semiconductor layer containing a group VI impurity is the part that is in contact with at least the active layer (including well layers and confinement layers), specifically. In this configuration, the multilayer structure composed of the fourth compound semiconductor layer and the third compound semiconductor layer stacked in that order from the lower side may be employed. Alternatively, the multilayer structure composed of the third compound semiconductor layer and the fourth compound semiconductor layer stacked in that order from the lower side may be employed. However, it is more preferable to employ the former multilayer structure.

In addition, the semiconductor light emitting device according to the embodiment of the present invention including the above-described preferred configuration may have the following configuration. Specifically, the first compound semiconductor layer, the second compound semiconductor layer, the third compound semiconductor layer, the fourth compound semiconductor layer, the first burying layer, and the second burying layer are composed of a III-V compound semiconductor, the first compound semiconductor layer is composed of a 1A-th compound semiconductor layer and a 1B-th compound semiconductor layer that is provided on the 1A-th compound semiconductor layer and is in contact with the active layer, the second compound semiconductor layer is composed of a 2B-th compound semiconductor layer in contact with the active layer and a 2A-th compound semiconductor layer provided on the 2B-th compound semiconductor layer, the impurity for causing the 1A-th compound semiconductor layer to be the p-type as the first conductivity type is carbon (C), the impurity for causing the 1B-th compound semiconductor layer to be the p-type as the first conductivity type is a group II impurity, the impurity for causing the 2B-th compound semiconductor layer to be the n-type as the second conductivity type is a group VI impurity, the impurity for causing the 2A-th compound semiconductor layer to be the n-type as the second conductivity type is a group IV impurity, the impurity for causing the third compound semiconductor layer to be the p-type as the first conductivity type is a group II impurity, the impurity for causing the fourth compound semiconductor layer to be the n-type as the second conductivity type is a group IV impurity, the impurity for causing the first burying layer to be the n-type as the second conductivity type is a group IV impurity, and the impurity for causing the second burying layer to be the n-type as the second conductivity type is a group VI impurity. This configuration meets the above-described second need. For convenience, this configuration will be referred to as "the semiconductor light emitting device according to the (3-d)-th mode of the present invention." In the semiconductor light emitting device according to the (3-d)-th mode of the present invention, the number of combinations of (the impurity in the 1A-th compound semiconductor layer, the impurity in the 1B-th compound semiconductor layer, the impurity in the 2B-th compound semiconductor layer, the impurity in the 2A-th compound semiconductor layer, the impurity in the third compound semiconductor layer, the impurity in the fourth compound semiconductor layer, the impurity in the first burying layer, and the impurity in the second burying layer) is $1 \times 4 \times 3 \times 2 \times 2 \times 4 \times 2 \times 3 = 1152$.

In addition, the semiconductor light emitting device according to the embodiment of the present invention including the above-described preferred configuration may have a configuration in which the impurity for causing the first compound semiconductor layer (or the 1B-th compound semiconductor layer) to have the first conductivity type is different from the impurity for causing the third compound semiconductor layer to have the first conductivity type. This configuration meets the above-described second need. For convenience, this configuration will be referred to as "the semiconductor light emitting device according to the (4-A)-th mode of the present invention."

The first compound semiconductor layer (or the 1B-th compound semiconductor layer) containing the impurity different from the impurity for causing the third compound semiconductor layer to have the first conductivity type is the part that is in contact with at least the active layer, specifically. The active layer with which the first compound semiconductor layer is in contact encompasses well layers and confinement layers. This applies also to the following description. The provision of the confinement layer allows light confinement and/or carrier confinement. In this configuration, the multilayer structure composed of the fourth compound semiconductor layer and the third compound semiconductor layer stacked in that order from the lower side may be employed. Alternatively, the multilayer structure composed of the third compound semiconductor layer and the fourth compound semiconductor layer stacked in that order from the lower side may be employed. It is desirable that the plane orientation dependence of the impurity for causing the third compound semiconductor layer to have the first conductivity type is smaller than that of the impurity for causing the first compound semiconductor layer to have the first conductivity type.

In addition, the semiconductor light emitting device according to the embodiment of the present invention including the above-described preferred configuration may have a configuration in which the impurity for causing the second compound semiconductor layer (or the 2B-th compound semiconductor layer) to have the second conductivity type is different from the impurity for causing the fourth compound semiconductor layer to have the second conductivity type. This configuration meets the above-described second need. For convenience, this configuration will be referred to as "the semiconductor light emitting device according to the (4-a)-th mode of the present invention."

The second compound semiconductor layer (or the 2B-th compound semiconductor layer) containing the impurity different from the impurity for causing the fourth compound semiconductor layer to have the second conductivity type is the part that is in contact with at least the active layer (including well layers and confinement layers), specifically. In this configuration, the multilayer structure composed of the fourth compound semiconductor layer and the third compound semiconductor layer stacked in that order from the lower side may be employed. Alternatively, the multilayer structure composed of the third compound semiconductor layer and the fourth compound semiconductor layer stacked in that order from the lower side may be employed. It is desirable that the plane orientation dependence of the impurity for causing the fourth compound semiconductor layer to have the second conductivity type is smaller than that of the impurity for causing the second compound semiconductor layer to have the second conductivity type.

In addition, the semiconductor light emitting device according to the embodiment of the present invention including the above-described preferred configuration may have the following configuration. Specifically, the current block layer is formed of a multilayer structure arising from sequential stacking of at least the fourth compound semiconductor layer of the second conductivity type and the third compound semiconductor layer of the first conductivity type, the impurity for causing the fourth compound semiconductor layer to have the second conductivity type is such that the substitution site of the impurity in the fourth compound semiconductor layer competes with the substitution site of the impurity in the third compound semiconductor layer for causing the third compound semiconductor layer to have the first conductivity type, and competes with the substitution site of the impurity in the first compound semiconductor layer for causing the first compound semiconductor layer to have the first conductivity type, the impurity for causing the second compound semiconductor layer to have the second conductivity type is such that the substitution site of the impurity in the second compound semiconductor layer competes with the substitution site of the impurity in the third compound semiconductor layer for causing the third compound semiconductor layer to have the first conductivity type, and if a bypass channel that passes through the first compound semiconductor layer, the current block layer, and the second compound semiconductor layer is assumed, at least three pn junction interfaces formed of the interfaces between the compound semiconductor layers exist in the bypass channel. This configuration meets the above-described second need. For convenience, this configuration will be referred to as "the semiconductor light emitting device according to the fifth mode of the present invention."

It is possible for the semiconductor light emitting device according to the fifth mode of the present invention to have a form in which the fourth compound semiconductor layer is in contact with the side surface of the first compound semiconductor layer and the third compound semiconductor layer is in contact with the side surface of the second compound semiconductor layer. In this case, the bypass channel is composed of the first compound semiconductor layer, the fourth compound semiconductor layer, the third compound semiconductor layer, and the second compound semiconductor layer. The pn junction interfaces are formed of the following three interfaces: the interface between the side surface of the first compound semiconductor layer and the fourth compound semiconductor layer; the interface between the fourth compound semiconductor layer and the third compound semiconductor layer; and the interface between the third compound semiconductor layer and the side surface of the second compound semiconductor layer.

The semiconductor light emitting device according to the fifth mode of the present invention may have the following configuration. Specifically, the first compound semiconductor layer is composed of a 1A-th compound semiconductor layer and a 1B-th compound semiconductor layer that is provided on the 1A-th compound semiconductor layer and is in contact with the active layer, and the impurity for causing the 1B-th compound semiconductor layer to have the first conductivity type is such that the substitution site of the impurity in the 1B-th compound semiconductor layer does not compete with the substitution site of the impurity in the 1A-th compound semiconductor layer for causing the 1A-th compound semiconductor layer to have the first conductivity type, and does not compete with the substitution site of the impurity in the second compound semiconductor layer for causing the second compound semiconductor layer to have the second conductivity type. In this case, the impurity for causing the 1A-th compound semiconductor layer to have the first conductivity type is such that the substitution site of the impurity in the 1A-th compound semiconductor layer competes with the substitution site of the impurity in the fourth compound semiconductor layer for causing the fourth compound semiconductor layer to have the second conductivity type.

In the case of the configuration in which the 1B-th compound semiconductor layer is used, the relationship between the 1B-th compound semiconductor layer and the fourth compound semiconductor layer in contact with the side surface of the 1B-th compound semiconductor layer is such that their impurity substitution sites do not compete with each other in some cases. In such a case, initially impurity diffusion between the 1B-th compound semiconductor layer and the fourth compound semiconductor layer will occur across this side surface part, and then the impurity diffusion will reach the third compound semiconductor layer included in the current block layer, so that a current leakage path is possibly formed.

Therefore, for this case, the following configuration may be employed. Specifically, a sixth compound semiconductor layer of the first conductivity type is provided under the fourth compound semiconductor layer, the impurity for causing the sixth compound semiconductor layer to have the first conductivity type is such that the substitution site of the impurity in the sixth compound semiconductor layer competes with the substitution site of the impurity in the first compound semiconductor layer (or the 1A-th compound semiconductor layer) for causing the first compound semiconductor layer (or the 1A-th compound semiconductor layer) to have the first conductivity type, and the sixth compound semiconductor layer is in contact with the side surface of the first compound semiconductor layer (at least a part of the side surface of the 1A-th compound semiconductor layer and all of the side surface of the 1B-th compound semiconductor layer), and the third compound semiconductor layer is in contact with the side surface of the second compound semiconductor layer. Employing such a configuration eliminates the contact between the 1B-th compound semiconductor layer and the fourth compound semiconductor layer, whose impurity substitution sites do not compete with each other, and thus can prevent the impurity diffusion. In this case, the bypass channel is composed of the first compound semiconductor layer (the 1A-th compound semiconductor layer and the 1B-th compound semiconductor layer), the sixth compound semiconductor layer, the fourth compound semiconductor layer, the third compound semiconductor layer, and the second compound semiconductor layer. The pn junction interfaces are formed of the following three interfaces: the interface between the sixth compound semiconductor layer and the fourth compound semiconductor layer; the interface between the fourth compound semiconductor layer and the third compound semiconductor layer; and the interface between the third compound semiconductor layer and the side surface of the second compound semiconductor layer.

In addition, in such a case, it is desirable to provide an impurity diffusion barrier layer in the current block layer in order to prevent the occurrence of current leakage attributed to impurity diffusion from the 1B-th compound semiconductor layer into the current block layer. Specifically, a seventh compound semiconductor layer of the second conductivity type whose impurity substitution site is different from that of the fourth compound semiconductor layer of the second conductivity type is provided as the "impurity diffusion barrier layer." More specifically, in the fourth compound semiconductor layer that is included in the current block layer and has the second conductivity type, at least one impurity diffusion barrier layer having the second conductivity type (e.g. the seventh compound semiconductor layer) is provided. Furthermore, impurities are so selected that the substitution site of the impurity in the fourth compound semiconductor layer is different from that of the impurity in the impurity diffusion barrier layer (e.g. the seventh compound semiconductor layer if the number of impurity diffusion barrier layers is one). Employing such a configuration allows further-ensured prevention of the phenomenon that a current leakage path from the bypass channel is formed due to impurity diffusion into the current block layer.

Furthermore, the semiconductor light emitting device according to the fifth mode of the present invention may have the following configuration. Specifically, the second compound semiconductor layer is composed of a 2B-th compound semiconductor layer in contact with the active layer and a 2A-th compound semiconductor layer provided on the 2B-th compound semiconductor layer, and the impurity for causing the 2B-th compound semiconductor layer to have the second conductivity type is such that the substitution site of the impurity in the 2B-th compound semiconductor layer does not compete with the substitution site of the impurity in the 2A-th compound semiconductor layer for causing the 2A-th compound semiconductor layer to have the second conductivity type, and does not compete with the substitution site of the impurity in the first compound semiconductor layer for causing the first compound semiconductor layer to have the first conductivity type. In this case, the impurity for causing the 2A-th compound semiconductor layer to have the second conductivity type is such that the substitution site of the impurity in the 2A-th compound semiconductor layer competes with the substitution site of the impurity in the third compound semiconductor layer for causing the third compound semiconductor layer to have the first conductivity type.

In the case of the configuration in which the 2B-th compound semiconductor layer is used, the relationship between the 2B-th compound semiconductor layer and the third compound semiconductor layer in contact with the side surface of the 2B-th compound semiconductor layer is such that their impurity substitution sites do not compete with each other in some cases. In such a case, initially impurity diffusion between the 2B-th compound semiconductor layer and the third compound semiconductor layer will occur across this side surface part, and then the impurity diffusion will reach the fourth compound semiconductor layer included in the current block layer, so that a current leakage path is possibly formed.

Therefore, for this case, the following configuration may be employed. Specifically, a fifth compound semiconductor layer of the second conductivity type is provided on the third compound semiconductor layer, the impurity for causing the fifth compound semiconductor layer to have the second conductivity type is such that the substitution site of the impurity in the fifth compound semiconductor layer competes with the substitution site of the impurity in the second compound semiconductor layer (or the 2A-th compound semiconductor layer) for causing the second compound semiconductor layer (or the 2A-th compound semiconductor layer) to have the second conductivity type, and the fourth compound semiconductor layer is in contact with the side surface of the first compound semiconductor layer and the fifth compound semiconductor layer is in contact with the side surface of the second compound semiconductor layer (at least a part of the side surface of the 2A-th compound semiconductor layer and all of the side surface of the 2B-th compound semiconductor layer). Employing such a configuration eliminates the contact between the 2B-th compound semiconductor layer and the third compound semiconductor layer, whose impurity substitution sites do not compete with each other, and thus can prevent the impurity diffusion. In this case, the bypass channel is composed of the first compound semiconductor layer, the fourth compound semiconductor layer, the third compound semiconductor layer, the fifth compound semiconductor layer, and the second compound semiconductor layer (the 2B-th compound semiconductor layer and the 2A-th compound semiconductor layer). The pn junction interfaces are formed of the following three interfaces: the interface between the side surface of the first compound semiconductor layer and the fourth compound semiconductor layer; the interface between the fourth compound semiconductor layer and the third compound semiconductor layer; and the interface between the third compound semiconductor layer and the fifth compound semiconductor layer.

In addition, in such a case, it is desirable to provide an impurity diffusion barrier layer in the current block layer in order to prevent the occurrence of current leakage attributed to impurity diffusion from the 2B-th compound semiconductor layer into the current block layer. Specifically, an eighth compound semiconductor layer of the first conductivity type whose impurity substitution site is different from that of the third compound semiconductor layer of the first conductivity type is provided as the "impurity diffusion barrier layer." More specifically, in the third compound semiconductor layer that is included in the current block layer and has the first conductivity type, at least one impurity diffusion barrier layer having the first conductivity type (e.g. the eighth compound semiconductor layer) is provided. Furthermore, impurities are so selected that the substitution site of the impurity in the third compound semiconductor layer is different from that of the impurity in the impurity diffusion barrier layer (e.g. the eighth compound semiconductor layer if the number of impurity diffusion barrier layers is one). Employing such a configuration allows further-ensured prevention of the phenomenon that a current leakage path from the bypass channel is formed due to impurity diffusion into the current block layer.

In the semiconductor light emitting device according to the fifth mode of the present invention, the first compound semiconductor layer, the second compound semiconductor layer, the fourth compound semiconductor layer, and the third compound semiconductor layer are composed of a III-V compound semiconductor. Alternatively, the 1A-th compound semiconductor layer, the 1B-th compound semiconductor layer, the second compound semiconductor layer, the fourth compound semiconductor layer, and the third compound semiconductor layer are composed of a III-V compound semiconductor. Alternatively, the first compound semiconductor layer, the 2B-th compound semiconductor layer, the 2A-th compound semiconductor layer, the fourth compound semiconductor layer, and the third compound semiconductor layer are composed of a III-V compound semiconductor.

Furthermore, the following configuration can be employed. Specifically, the substitution site of the impurity in the first compound semiconductor layer, the substitution site of the impurity in the second compound semiconductor layer, the substitution site of the impurity in the fourth compound semiconductor layer, and the substitution site of the impurity in the third compound semiconductor layer are the site occupied by a group III atom. The substitution site of the impurity in the first burying layer is the site occupied by a group III atom. The substitution site of the impurity in the second burying layer is the site occupied by a group V atom. For convenience, this configuration will be referred to as "the semiconductor light emitting device according to the (5-A)-th mode of the present invention." It is possible to employ a form in which the fourth compound semiconductor layer is in contact with the side surface of the first compound semiconductor layer and the third compound semiconductor layer is in contact with the side surface of the second compound semiconductor layer.

The semiconductor light emitting device according to the (5-A)-th mode of the present invention may have the following configuration. Specifically, the impurity for causing the first compound semiconductor layer and the third compound semiconductor layer to be the n-type as the first conductivity type is a group IV impurity, the impurity for causing the second compound semiconductor layer and the fourth compound semiconductor layer to be the p-type as the second conductivity type is a group II impurity, the impurity for causing the first burying layer to be the p-type as the second conductivity type is a group II impurity, and the impurity for causing the second burying layer to be the p-type as the second conductivity type is carbon (C). For convenience, this configuration will be referred to as "the semiconductor light emitting device according to the (5-A-1)-th mode of the present invention." In the semiconductor light emitting device according to the (5-A-1)-th mode of the present invention, the number of combinations of (the impurity in the first compound semiconductor layer, the impurity in the second compound semiconductor layer, the impurity in the fourth compound semiconductor layer, the impurity in the third compound semiconductor layer, the impurity in the first burying layer, and the impurity in the second burying layer) is $2 \times 4 \times 4 \times 2 \times 4 \times 1 = 256$.

In addition, the semiconductor light emitting device according to the (5-A)-th mode of the present invention may have the following configuration. Specifically, the impurity for causing the first compound semiconductor layer and the third compound semiconductor layer to be the p-type as the first conductivity type is a group II impurity, the impurity for causing the second compound semiconductor layer and the fourth compound semiconductor layer to be the n-type as the second conductivity type is a group IV impurity, the impurity for causing the first burying layer to be the n-type as the second conductivity type is a group IV impurity, and the impurity for causing the second burying layer to be the n-type as the second conductivity type is a group VI impurity. For convenience, this configuration will be referred to as "the semiconductor light emitting device according to the (5-A-2)-th mode of the present invention." In the semiconductor light emitting device according to the (5-A-2)-th mode of the present invention, the number of combinations of (the impurity in the first compound semiconductor layer, the impurity in the second compound semiconductor layer, the impurity in the fourth compound semiconductor layer, the impurity in the third compound semiconductor layer, the impurity in the first burying layer, and the impurity in the second burying layer) is $4 \times 2 \times 2 \times 4 \times 2 \times 3 = 384$.

Furthermore, the following configuration can be employed. Specifically, the substitution site of the impurity in the first compound semiconductor layer, the substitution site of the impurity in the second compound semiconductor layer, the substitution site of the impurity in the fourth compound semiconductor layer, and the substitution site of the impurity in the third compound semiconductor layer are the site occupied by a group V atom. The substitution site of the impurity in the first burying layer is the site occupied by a group V atom. The substitution site of the impurity in the second burying layer is the site occupied by a group III atom. For convenience, this configuration will be referred to as "the semiconductor light emitting device according to the (5-a)-th mode of the present invention." It is possible to employ a form in which the fourth compound semiconductor layer is in contact with the side surface of the first compound semiconductor layer and the third compound semiconductor layer is in contact with the side surface of the second compound semiconductor layer.

The semiconductor light emitting device according to the (5-a)-th mode of the present invention may have the following configuration. Specifically, the impurity for causing the first compound semiconductor layer and the third compound semiconductor layer to be the n-type as the first conductivity type is a group VI impurity, the impurity for causing the second compound semiconductor layer and the fourth compound semiconductor layer to be the p-type as the second conductivity type is carbon (C), and the impurity for causing the first burying layer to be the p-type as the second conductivity type is carbon (C), and the impurity for causing the second burying layer to be the p-type as the second conductivity type is a group II impurity. For convenience, this configuration will be referred to as "the semiconductor light emitting device according to the (5-a-1)-th mode of the present invention." In the semiconductor light emitting device according to the (5-a-1)-th mode of the present invention, the number of combinations of (the impurity in the first compound semiconductor layer, the impurity in the second compound semiconductor layer, the impurity in the fourth compound semiconductor layer, the impurity in the third compound semiconductor layer, the impurity in the first burying layer, and the impurity in the second burying layer) is $3 \times 1 \times 1 \times 3 \times 1 \times 4 = 36$.

In addition, the semiconductor light emitting device according to the (5-a)-th mode of the present invention may have the following configuration. Specifically, the impurity for causing the first compound semiconductor layer and the third compound semiconductor layer to be the p-type as the first conductivity type is carbon (C), the impurity for causing the second compound semiconductor layer and the fourth compound semiconductor layer to be the n-type as the second conductivity type is a group VI impurity, and the impurity for causing the first burying layer to be the n-type as the second conductivity type is a group VI impurity, and the impurity for causing the second burying layer to be the n-type as the second conductivity type is a group IV impurity. For convenience, this configuration will be referred to as "the semiconductor light emitting device according to the (5-a-2)-th mode of the present invention." In the semiconductor light emitting device according to the (5-a-2)-th mode of the present invention, the number of combinations of (the impurity in the first compound semiconductor layer, the impurity in the second compound semiconductor layer, the impurity in the fourth compound semiconductor layer, the impurity in the third compound semiconductor layer, the impurity in the first burying layer, and the impurity in the second burying layer) is $1 \times 3 \times 3 \times 1 \times 3 \times 2 = 54$.

Furthermore, the following configuration may be employed. Specifically, the substitution site of the impurity in the 1A-th compound semiconductor layer, the substitution site of the impurity in the second compound semiconductor layer, the substitution site of the impurity in the fourth compound semiconductor layer, and the substitution site of the impurity in the third compound semiconductor layer are the site occupied by a group III atom. The substitution site of the impurity in the 1B-th compound semiconductor layer is the site occupied by a group V atom. The substitution site of the impurity in the first burying layer is the site occupied by a group III atom. The substitution site of the impurity in the second burying layer is the site occupied by a group V atom. For convenience, this configuration will be referred to as "the semiconductor light emitting device according to the (5-B)-th mode of the present invention."

The semiconductor light emitting device according to the (5-B)-th mode of the present invention may have the following configuration. Specifically, the impurity for causing the 1A-th compound semiconductor layer and the third compound semiconductor layer to be the n-type as the first conductivity type is a group IV impurity, the impurity for causing the 1B-th compound semiconductor layer to be the n-type as the first conductivity type is a group VI impurity, the impurity for causing the second compound semiconductor layer and the fourth compound semiconductor layer to be the p-type as the second conductivity type is a group II impurity, and the impurity for causing the first burying layer to be the p-type as the second conductivity type is a group II impurity, and the impurity for causing the second burying layer to be the p-type as the second conductivity type is carbon (C). For convenience, this configuration will be referred to as "the semiconductor light emitting device according to the (5-B-1)-th mode of the present invention." In the semiconductor light emitting device according to the (5-B-1)-th mode of the present invention, the number of combinations of (the impurity in the 1A-th compound semiconductor layer, the impurity in the 1B-th compound semiconductor layer, the impurity in the second compound semiconductor layer, the impurity in the fourth compound semiconductor layer, the impurity in the third compound semiconductor layer, the impurity in the first burying layer, and the impurity in the second burying layer) is $2 \times 3 \times 4 \times 4 \times 2 \times 4 \times 1 = 768$.

In this case, the following configuration may be employed. Specifically, the sixth compound semiconductor layer of the first conductivity type is provided under the fourth compound semiconductor layer, the impurity for causing the sixth compound semiconductor layer and the 1A-th compound semiconductor layer to have the first conductivity type is a group IV impurity, and the sixth compound semiconductor layer is in contact with the side surface of the first compound semiconductor layer (at least a part of the side surface of the 1A-th compound semiconductor layer and all of the side surface of the 1B-th compound semiconductor layer), and the third compound semiconductor layer is in contact with the side surface of the second compound semiconductor layer.

In addition, the semiconductor light emitting device according to the (5-B)-th mode of the present invention may have the following configuration. Specifically, the impurity for causing the 1A-th compound semiconductor layer and the third compound semiconductor layer to be the p-type as the first conductivity type is a group II impurity, the impurity for causing the 1B-th compound semiconductor layer to be the p-type as the first conductivity type is carbon (C), the impurity for causing the second compound semiconductor layer and the fourth compound semiconductor layer to be the n-type as the second conductivity type is a group IV impurity, and the impurity for causing the first burying layer to be the n-type as the second conductivity type is a group IV impurity, and the impurity for causing the second burying layer to be the n-type as the second conductivity type is a group VI impurity. For convenience, this configuration will be referred to as "the semiconductor light emitting device according to the (5-B-2)-th mode of the present invention." In the semiconductor light emitting device according to the (5-B-2)-th mode of the present invention, the number of combinations of (the impurity in the 1A-th compound semiconductor layer, the impurity in the 1B-th compound semiconductor layer, the impurity in the second compound semiconductor layer, the impurity in the fourth compound semiconductor layer, the impurity in the third compound semiconductor layer, the impurity in the first burying layer, and the impurity in the second burying layer) is 4×1×2×2×4×2×3=384.

In this case, the following configuration may be employed. Specifically, the sixth compound semiconductor layer of the first conductivity type is provided under the fourth compound semiconductor layer, the impurity for causing the sixth compound semiconductor layer and the 1A-th compound semiconductor layer to have the first conductivity type is a group II impurity, and the sixth compound semiconductor layer is in contact with the side surface of the first compound semiconductor layer (at least a part of the side surface of the 1A-th compound semiconductor layer and all of the side surface of the 1B-th compound semiconductor layer), and the third compound semiconductor layer is in contact with the side surface of the second compound semiconductor layer.

Furthermore, the following configuration may be employed. Specifically, the substitution site of the impurity in the 1A-th compound semiconductor layer, the substitution site of the impurity in the second compound semiconductor layer, the substitution site of the impurity in the fourth compound semiconductor layer, and the substitution site of the impurity in the third compound semiconductor layer are the site occupied by a group V atom. The substitution site of the impurity in the 1B-th compound semiconductor layer is the site occupied by a group III atom. The substitution site of the impurity in the first burying layer is the site occupied by a group V atom. The substitution site of the impurity in the second burying layer is the site occupied by a group III atom. For convenience, this configuration will be referred to as "the semiconductor light emitting device according to the (5-b)-th mode of the present invention."

The semiconductor light emitting device according to the (5-b)-th mode of the present invention may have the following configuration. Specifically, the impurity for causing the 1A-th compound semiconductor layer and the third compound semiconductor layer to be the n-type as the first conductivity type is a group VI impurity, the impurity for causing the 1B-th compound semiconductor layer to be the n-type as the first conductivity type is a group IV impurity, the impurity for causing the second compound semiconductor layer and the fourth compound semiconductor layer to be the p-type as the second conductivity type is carbon (C), and the impurity for causing the first burying layer to be the p-type as the second conductivity type is carbon (C), and the impurity for causing the second burying layer to be the p-type as the second conductivity type is a group II impurity. For convenience, this configuration will be referred to as "the semiconductor light emitting device according to the (5-b-1)-th mode of the present invention." In the semiconductor light emitting device according to the (5-b-1)-th mode of the present invention, the number of combinations of (the impurity in the 1A-th compound semiconductor layer, the impurity in the 1B-th compound semiconductor layer, the impurity in the second compound semiconductor layer, the impurity in the fourth compound semiconductor layer, the impurity in the third compound semiconductor layer, the impurity in the first burying layer, and the impurity in the second burying layer) is 3×2×1×1×3×1×4=72.

In this case, the following configuration may be employed. Specifically, the sixth compound semiconductor layer of the first conductivity type is provided under the fourth compound semiconductor layer, the impurity for causing the sixth compound semiconductor layer and the 1A-th compound semiconductor layer to have the first conductivity type is a group VI impurity, and the sixth compound semiconductor layer is in contact with the side surface of the first compound semiconductor layer (at least a part of the side surface of the 1A-th compound semiconductor layer and all of the side surface of the 1B-th compound semiconductor layer), and the third compound semiconductor layer is in contact with the side surface of the second compound semiconductor layer.

In addition, the semiconductor light emitting device according to the (5-b)-th mode of the present invention may have the following configuration. Specifically, the impurity for causing the 1A-th compound semiconductor layer and the third compound semiconductor layer to be the p-type as the first conductivity type is carbon (C), the impurity for causing the 1B-th compound semiconductor layer to be the p-type as the first conductivity type is a group II impurity, the impurity for causing the second compound semiconductor layer and the fourth compound semiconductor layer to be the n-type as the second conductivity type is a group VI impurity, and the impurity for causing the first burying layer to be the n-type as the second conductivity type is a group VI impurity, and the impurity for causing the second burying layer to be the n-type as the second conductivity type is a group IV impurity. For convenience, this configuration will be referred to as "the semiconductor light emitting device according to the (5-b-2)-th mode of the present invention." In the semiconductor light emitting device according to the (5-b-2)-th mode of the present invention, the number of combinations of (the impurity in the 1A-th compound semiconductor layer, the impurity in the 1B-th compound semiconductor layer, the impurity in the second compound semiconductor layer, the impurity in the fourth compound semiconductor layer, the impurity in the third compound semiconductor layer, the impurity in the first burying layer, and the impurity in the second burying layer) is 1×4×3×3×1×3×2=216.

In this case, the following configuration may be employed. Specifically, the sixth compound semiconductor layer of the first conductivity type is provided under the fourth compound semiconductor layer, the impurity for causing the sixth compound semiconductor layer and the 1A-th compound semiconductor layer to have the first conductivity type is carbon (C), and the sixth compound semiconductor layer is in contact with the side surface of the first compound semiconductor layer (at least a part of the side surface of the 1A-th compound semiconductor layer and all of the side surface of the 1B-th compound semiconductor layer), and the third compound semiconductor layer is in contact with the side surface of the second compound semiconductor layer.

Furthermore, the following configuration may be employed. Specifically, the substitution site of the impurity in the first compound semiconductor layer, the substitution site of the impurity in the 2A-th compound semiconductor layer, the substitution site of the impurity in the fourth compound semiconductor layer, and the substitution site of the impurity in the third compound semiconductor layer are the site occupied by a group III atom. The substitution site of the impurity in the 2B-th compound semiconductor layer is the site occupied by a group V atom. The substitution site of the impurity in the first burying layer is the site occupied by a group III atom. The substitution site of the impurity in the second burying layer is the site occupied by a group V atom. For convenience, this configuration will be referred to as "the semiconductor light emitting device according to the (5-C)-th mode of the present invention."

The semiconductor light emitting device according to the (5-C)-th mode of the present invention may have the following configuration. Specifically, the impurity for causing the first compound semiconductor layer and the third compound semiconductor layer to be the n-type as the first conductivity type is a group IV impurity, the impurity for causing the 2A-th compound semiconductor layer and the fourth compound semiconductor layer to be the p-type as the second conductivity type is a group II impurity, the impurity for causing the 2B-th compound semiconductor layer to be the p-type as the second conductivity type is carbon (C), and the impurity for causing the first burying layer to be the p-type as the second conductivity type is a group II impurity, and the impurity for causing the second burying layer to be the p-type as the second conductivity type is carbon (C). For convenience, this configuration will be referred to as "the semiconductor light emitting device according to the (5-C-1)-th mode of the present invention." In the semiconductor light emitting device according to the (5-C-1)-th mode of the present invention, the number of combinations of (the impurity in the first compound semiconductor layer, the impurity in the 2B-th compound semiconductor layer, the impurity in the 2A-th compound semiconductor layer, the impurity in the fourth compound semiconductor layer, the impurity in the third compound semiconductor layer, the impurity in the first burying layer, and the impurity in the second burying layer) is $2 \times 1 \times 4 \times 4 \times 2 \times 4 \times 1 = 256$.

In this case, the following configuration may be employed. Specifically, the fifth compound semiconductor layer of the second conductivity type is provided on the third compound semiconductor layer, the impurity for causing the fifth compound semiconductor layer and the 2A-th compound semiconductor layer to have the second conductivity type is a group II impurity, and the fifth compound semiconductor layer is in contact with the side surface of the second compound semiconductor layer (at least a part of the side surface of the 2A-th compound semiconductor layer and all of the side surface of the 2B-th compound semiconductor layer), and the fourth compound semiconductor layer is in contact with the side surface of the first compound semiconductor layer.

In addition, the semiconductor light emitting device according to the (5-C)-th mode of the present invention may have the following configuration. Specifically, the impurity for causing the first compound semiconductor layer and the third compound semiconductor layer to be the p-type as the first conductivity type is a group II impurity, the impurity for causing the 2A-th compound semiconductor layer and the fourth compound semiconductor layer to be the n-type as the second conductivity type is a group IV impurity, the impurity for causing the 2B-th compound semiconductor layer to be the n-type as the second conductivity type is a group VI impurity, the impurity for causing the first burying layer to be the n-type as the second conductivity type is a group IV impurity, and the impurity for causing the second burying layer to be the n-type as the second conductivity type is a group VI impurity. For convenience, this configuration will be referred to as "the semiconductor light emitting device according to the (5-C-2)-th mode of the present invention." In the semiconductor light emitting device according to the (5-C-2)-th mode of the present invention, the number of combinations of (the impurity in the first compound semiconductor layer, the impurity in the 2B-th compound semiconductor layer, the impurity in the 2A-th compound semiconductor layer, the impurity in the fourth compound semiconductor layer, the impurity in the third compound semiconductor layer, the impurity in the first burying layer, and the impurity in the second burying layer) is $4 \times 3 \times 2 \times 2 \times 4 \times 2 \times 3 = 1152$.

In this case, the following configuration may be employed. Specifically, the fifth compound semiconductor layer of the second conductivity type is provided on the third compound semiconductor layer, the impurity for causing the fifth compound semiconductor layer and the 2A-th compound semiconductor layer to have the second conductivity type is a group IV impurity, and the fifth compound semiconductor layer is in contact with the side surface of the second compound semiconductor layer (at least a part of the side surface of the 2A-th compound semiconductor layer and all of the side surface of the 2B-th compound semiconductor layer), and the fourth compound semiconductor layer is in contact with the side surface of the first compound semiconductor layer.

Furthermore, the following configuration may be employed. Specifically, the substitution site of the impurity in the first compound semiconductor layer, the substitution site of the impurity in the 2A-th compound semiconductor layer, the substitution site of the impurity in the fourth compound semiconductor layer, and the substitution site of the impurity in the third compound semiconductor layer are the site occupied by a group V atom. The substitution site of the impurity in the 2B-th compound semiconductor layer is the site occupied by a group III atom. The substitution site of the impurity in the first burying layer is the site occupied by a group V atom. The substitution site of the impurity in the second burying layer is the site occupied by a group III atom. For convenience, this configuration will be referred to as "the semiconductor light emitting device according to the (5-c)-th mode of the present invention."

The semiconductor light emitting device according to the (5-c)-th mode of the present invention may have the following configuration. Specifically, the impurity for causing the first compound semiconductor layer and the third compound semiconductor layer to be the n-type as the first conductivity type is a group VI impurity, the impurity for causing the 2A-th compound semiconductor layer and the fourth compound semiconductor layer to be the p-type as the second conductivity type is carbon (C), the impurity for causing the 2B-th compound semiconductor layer to be the p-type as the second conductivity type is a group II impurity, the impurity for causing the first burying layer to be the p-type as the second conductivity type is carbon (C), and the impurity for causing the second burying layer to be the p-type as the second conductivity type is a group II impurity. For convenience, this configuration will be referred to as "the semiconductor light emitting device according to the (5-c-1)-th mode of the present invention." In the semiconductor light emitting device according to the (5-c-1)-th mode of the present invention, the number of combinations of (the impurity in the first compound semiconductor layer, the impurity in the 2B-th compound semiconductor layer, the impurity in the 2A-th compound semiconductor layer, the impurity in the fourth compound semiconductor layer, the impurity in the third compound semiconductor layer, the impurity in the first burying layer, and the impurity in the second burying layer) is $3\times4\times1\times1\times3\times1\times4=144$.

In this case, the following configuration may be employed. Specifically, the fifth compound semiconductor layer of the second conductivity type is provided on the third compound semiconductor layer, the impurity for causing the fifth compound semiconductor layer and the 2A-th compound semiconductor layer to have the second conductivity type is carbon (C), and the fifth compound semiconductor layer is in contact with the side surface of the second compound semiconductor layer (at least a part of the side surface of the 2A-th compound semiconductor layer and all of the side surface of the 2B-th compound semiconductor layer), and the fourth compound semiconductor layer is in contact with the side surface of the first compound semiconductor layer.

In addition, the semiconductor light emitting device according to the (5-c)-th mode of the present invention may have the following configuration. Specifically, the impurity for causing the first compound semiconductor layer and the third compound semiconductor layer to be the p-type as the first conductivity type is carbon (C), the impurity for causing the 2A-th compound semiconductor layer and the fourth compound semiconductor layer to be the n-type as the second conductivity type is a group VI impurity, the impurity for causing the 2B-th compound semiconductor layer to be the n-type as the second conductivity type is a group IV impurity, and the impurity for causing the first burying layer to be the n-type as the second conductivity type is a group VI impurity, and the impurity for causing the second burying layer to be the n-type as the second conductivity type is a group IV impurity. For convenience, this configuration will be referred to as "the semiconductor light emitting device according to the (5-c-2)-th mode of the present invention." In the semiconductor light emitting device according to the (5-c-2)-th mode of the present invention, the number of combinations of (the impurity in the first compound semiconductor layer, the impurity in the 2B-th compound semiconductor layer, the impurity in the 2A-th compound semiconductor layer, the impurity in the fourth compound semiconductor layer, the impurity in the third compound semiconductor layer, the impurity in the first burying layer, and the impurity in the second burying layer) is $1\times2\times3\times3\times1\times3\times2=108$.

In this case, the following configuration may be employed. Specifically, the fifth compound semiconductor layer of the second conductivity type is provided on the third compound semiconductor layer, the impurity for causing the fifth compound semiconductor layer and the 2A-th compound semiconductor layer to have the second conductivity type is a group VI impurity, and the fifth compound semiconductor layer is in contact with the side surface of the second compound semiconductor layer (at least a part of the side surface of the 2A-th compound semiconductor layer and all of the side surface of the 2B-th compound semiconductor layer), and the fourth compound semiconductor layer is in contact with the side surface of the first compound semiconductor layer.

In addition, in the semiconductor light emitting device according to the fifth mode of the present invention, a plurality of compound semiconductor layers may be provided between the fourth compound semiconductor layer and the third compound semiconductor layer of the current block layer. Specifically, it is also possible to employ a configuration in which at least a compound semiconductor layer of the first conductivity type and a compound semiconductor layer of the second conductivity type are further sequentially stacked between the fourth compound semiconductor layer and the third compound semiconductor layer. More specifically, if the first conductivity type is the n-type and the second conductivity type is the p-type, the current block layer may be formed based on a four-layer structure composed of the p-type fourth compound semiconductor layer, an n-type compound semiconductor layer, a p-type compound semiconductor layer, and the n-type third compound semiconductor layer. Alternatively, the current block layer may be formed based on a six-layer structure composed of the p-type fourth compound semiconductor layer, an n-type compound semiconductor layer, a p-type compound semiconductor layer, an n-type compound semiconductor layer, a p-type compound semiconductor layer, and the n-type third compound semiconductor layer. More alternatively, the current block layer may be formed based on an eight-layer structure composed of the p-type fourth compound semiconductor layer, an n-type compound semiconductor layer, a p-type compound semiconductor layer, an n-type compound semiconductor layer, a p-type compound semiconductor layer, an n-type compound semiconductor layer, a p-type compound semiconductor layer, and the n-type third compound semiconductor layer. Such a multilayer structure will be often represented as "the p-type fourth compound semiconductor layer, (n-type compound semiconductor layer, p-type compound semiconductor layer)$_m$, and the n-type third compound semiconductor layer (m=1, 2, 3, . . . )." In addition, if the first conductivity type is the p-type and the second conductivity type is the n-type, the current block layer may be formed based on a multilayer structure composed of the n-type fourth compound semiconductor layer, (p-type compound semiconductor layer, n-type compound semiconductor layer)$_m$, and the p-type third compound semiconductor layer (m=1, 2, 3, . . . ). By thus forming the current block layer based on a multilayer structure, the phenomenon that a current leakage path from the bypass channel is formed can be prevented more surely even if a relative positional error between the light emitting part and the current block layer occurred. It is desirable that the thickness of the current block layer be not increased even when the current block layer is formed based on a multilayer structure. Furthermore, it is more desirable that at least one pn interface (or np interface) between the compound semiconductor layers included in the current block layer be in contact with the side surface of the active layer. This feature decreases the area of the contact part with the side surface of the light emitting part per one compound semiconductor layer included in the current block layer, which results in an increase in the electric resistance. Consequently, leakage current is further suppressed and thus the light output can be improved.

In the semiconductor light emitting device according to the embodiment of the present invention including the semiconductor light emitting devices according to the first to fifth modes of the present invention (including the above-described various preferred configurations and forms) (hereinafter, these semiconductor light emitting devices will be often referred to simply as "the semiconductor light emitting device of the present invention" generically), it is desirable for the first burying layer to have such a thickness or a smaller thickness that the first burying layer grown on the current block layer reaches the edge line composed of the top surface and the side surfaces of the light emitting part at the center part or both the end parts of the light emitting part at which the sectional shape of the light emitting part obtained when the light emitting part is cut along a virtual plane perpendicular to the axis line is composed of the top surface and both the side surfaces. That is, it is desirable for the first burying layer to have such a thickness or a smaller thickness as to cover the side surfaces of the light emitting part. On the other hand, it is preferable for the second burying layer to have such a thickness as to cover at least the side surfaces of the deposited layer formed on the top surface at both the end parts of the light emitting part at the same timing as that of the current block layer. Furthermore, it is more preferable that these layers be so deposited to a large thickness that the top surface (apex) is sufficiently covered by the multilayer structure composed of the first burying layer and the second burying layer with a thickness corresponding to such a distance that light generated by the active layer is not absorbed. In addition, it is preferable to select materials having lower refractive indexes as the materials of the first burying layer and the second burying layer.

Moreover, as a more desirable form regarding the contact surface with the side surface of the light emitting part per one compound semiconductor layer included in the current block layer, it is desirable that the width of the contact surface (the length of the contact surface along the vertical direction of the side surface of the light emitting part) per one compound semiconductor layer included in the current block layer be equal to or smaller than the total thickness of the active layer (the length of the active layer along the vertical direction of the side surface of the light emitting part) sandwiched between the first compound semiconductor layer (or the 1B-th compound semiconductor layer) and the second compound semiconductor layer (or the 2B-th compound semiconductor layer). In addition, if the active layer has a quantum well structure, it is desirable that the width of the contact surface per one compound semiconductor layer included in the current block layer be equal to or smaller than the width of one well layer of the quantum well structure (the length of the well layer along the vertical direction of the side surface of the light emitting part). Such a form involves the necessity that the thicknesses of the respective compound semiconductor layers included in the current block layer are set to very small values. Therefore, the related art has a problem that a part of the current block layer formed of the {311}B plane or a higher-order crystal plane is annihilated or, conversely, the thickness of this part is abnormally increased because of conductivity type neutralization due to impurity mutual diffusion across the interface of n-type compound semiconductor layer/p-type compound semiconductor layer (or p-type compound semiconductor layer/n-type compound semiconductor layer) as described above. Consequently, according to the semiconductor light emitting device of the present invention, in achievement of desired conductivity types of the respective compound semiconductor layers included in the current block layer, the impurity combination in consideration of the competition relationship of the impurity substitution site is comprehensively determined from the viewpoint of current leakage suppression. This makes it possible to realize a structure that allows suppression of conductivity type neutralization due to impurity mutual diffusion, enhancement in the current block quality of the current block layer itself, and ensured suppression of leakage current from the side surface of the light emitting part, even when the thicknesses of the respective compound semiconductor layers included in the current block layer are set to very small values.

In the semiconductor light emitting device of the present invention, it is preferable that the side surfaces of the multilayer structure facing each other be the {111}B plane. In this case, the light emitting part is formed above the light emitting part forming region on the substrate. The light emitting part forming region is formed on the {100} plane of the substrate as its major surface and is formed of a projection part that extends substantially along the {110}A crystal plane direction and has the {100} plane as its top surface. Furthermore, the third compound semiconductor layer may be composed of a {311}B crystal plane region that extends from the side surface of the light emitting part; a {100} crystal plane region that extends along the major surface of the substrate; and a {h11}B crystal plane region (h is an integer equal to or larger than four) located between the {311}B crystal plane region and the {100} crystal plane region. In addition, the fourth compound semiconductor layer may be composed of a {311}B crystal plane region that extends from the side surface of the light emitting part; a {100} crystal plane region that extends along the major surface of the substrate; and a {h11}B crystal plane region (h is an integer equal to or larger than four) located between the {311}B crystal plane region and the {100} crystal plane region.

Examples of the substrate used for the semiconductor light emitting device of the present invention include a GaN substrate, GaP substrate, GaAs substrate, AlN substrate, AlP substrate, InN substrate, InP substrate, AlGaInN substrate, AlGaN substrate, AlInN substrate, GaInN substrate, AlGaInP substrate, AlGaP substrate, AlInP substrate, GaInP substrate, and ZnS substrate. In particular, it is preferable to use a substrate having a zinc blende crystal structure or a substrate on which a crystal film of the zinc blende crystal structure is formed. As atoms included in the substrate having the zinc blende crystal structure, at least As, Sb, and Bi can be cited. It is more preferable to use a substrate to which the atoms are added and hence in which the atoms are contained as a mixed crystal. Moreover, a base obtained by forming an underlying layer or a buffer layer on the surface (major surface) of any of the above-described substrates can be cited as the substrate. It is preferable to add at least one of As, Sb, and Bi as a group V material or use it as a mixed crystal also in crystal growth with use of any of these substrates. This feature makes it easy to set a crystal growth condition under which the migration of group III atoms hardly occurs. Thus, it becomes possible to form a group V trimmer on the outermost surface of the {111}B plane and thereby turn the {111}B plane to a non-growth surface.

Examples of various kinds of compound semiconductor layers including the active layer in the semiconductor light emitting device of the present invention include a GaInNAs compound semiconductor (containing a GaInAs mixed crystal or a GaNAs mixed crystal), AlGaInP compound semiconductor, AlGaInAs compound semiconductor, GaInAs compound semiconductor, GaInAsP compound semiconductor, GaInP compound semiconductor, GaP compound semiconductor, and InP compound semiconductor. Examples of a method for forming (depositing) various kinds of compound semiconductor layers including the active layer include metal organic chemical vapor deposition (MOCVD, MOVPE), metal organic molecular beam epitaxy (MOMBE), and hydride vapor phase epitaxy (HVPE), in which a halogen contributes to transportation and reaction. As the semiconductor light emitting device, a semiconductor laser or a light emitting diode (LED) can be cited.

According to the semiconductor light emitting device of embodiments of the present invention, in the burying layer located above the current block layer, the impurity for causing the second burying layer to have the second conductivity type is such that the substitution site of the impurity in the second burying layer does not compete with the substitution site of the impurity in the third compound semiconductor layer for causing the third compound semiconductor layer to have the first conductivity type. Therefore, the impurity for causing the second burying layer to have the second conductivity type diffuses into the compound semiconductor layer of the first conductivity type in the deposited layer formed of the multilayer structure that is formed above the top surface at both the end parts of the light emitting part and has the same composition as that of the current block layer. This diffusion turns the compound semiconductor layer of the first conductivity type to a compound semiconductor layer of the second conductivity type. As a result, all of the compound semiconductor layers located above the light emitting part have the second conductivity type. Consequently, the deposited layer having the same multilayer structure as that of the current block layer does not exist above the top surface of the multilayer structure of the light emitting part, and thus it is possible to surely avoid the occurrence of a problem that the light emission efficiency of the semiconductor light emitting device is decreased and a problem that the heat generation and the current consumption are increased due to an increase in the electric resistance.

In the semiconductor light emitting device according to the first mode of the present invention, the impurity for causing the third compound semiconductor layer to have the first conductivity type included in the current block layer is such that the substitution site of the impurity in the third compound semiconductor layer competes with the substitution site of the impurity in the fourth compound semiconductor layer for causing the fourth compound semiconductor layer to have the second conductivity type. Thus, impurity mutual diffusion hardly occurs between the n-type compound semiconductor layer and the p-type compound semiconductor layer of the current block layer. This allows avoidance of the occurrence of a problem that the effect of the current block layer is unstable and thus leakage current is increased due to annihilation or thinning of the current block layer. Furthermore, the impurity for causing the first compound semiconductor layer to have the first conductivity type is such that the substitution site of the impurity in the first compound semiconductor layer does not compete with the substitution site of the impurity in the second compound semiconductor layer for causing the second compound semiconductor layer to have the second conductivity type. Thus, the pn junction control, designed through intentional impurity mutual diffusion between the first compound semiconductor layer and the second compound semiconductor layer, can be finely designed easily through adjustment of the concentrations and doping positions of the impurities in the respective layers. This allows enhancement in the light emission characteristic.

In the semiconductor light emitting device according to the (2-A)-th mode of the present invention or the (2-B)-th mode of the present invention, the impurity for causing the first compound semiconductor layer or the 1B-th compound semiconductor layer to be the n-type as the first conductivity type is a group VI impurity, and the impurity for causing the third compound semiconductor layer to be the n-type as the first conductivity type is a group IV impurity. Furthermore, in the semiconductor light emitting device according to the (2-C)-th mode of the present invention or the (2-D)-th mode of the present invention, the impurity for causing the first compound semiconductor layer or the 1B-th compound semiconductor layer to be the p-type as the second conductivity type is a group II impurity, and the impurity for causing the third compound semiconductor layer to be the p-type as the second conductivity type is carbon (C). Furthermore, in the semiconductor light emitting device according to the (3-a)-th mode of the present invention or the (3-b)-th mode of the present invention, the impurity for causing the second compound semiconductor layer or the 2B-th compound semiconductor layer to be the p-type as the second conductivity type is a group II impurity, and the impurity for causing the fourth compound semiconductor layer to be the p-type as the second conductivity type is carbon (C) In addition, in the semiconductor light emitting device according to the (3-c)-th mode of the present invention or the (3-d)-th mode of the present invention, the impurity for causing the second compound semiconductor layer or the 2B-th compound semiconductor layer to be the n-type as the second conductivity type is a group VI impurity, and the impurity for causing the fourth compound semiconductor layer to be the n-type as the second conductivity type is a group IV impurity. Moreover, in the semiconductor light emitting device according to the (4-A)-th mode of the present invention, the impurity for causing the first compound semiconductor layer to have the first conductivity type is different from the impurity for causing the third compound semiconductor layer to have the first conductivity type. In the semiconductor light emitting device according to the (4-a)-th mode of the present invention, the impurity for causing the second compound semiconductor layer to have the second conductivity type is different from the impurity for causing the fourth compound semiconductor layer to have the second conductivity type. Employing these configurations and structures makes it possible to achieve configuration and structure in which impurity mutual diffusion hardly occurs between the n-type compound semiconductor layer and the p-type compound semiconductor layer of the current block layer. As a result, it is possible to avoid the occurrence of a problem that the effect of the current block layer is unstable and thus leakage current is increased due to annihilation or thinning of the current block layer.

Furthermore, in the semiconductor light emitting device according to the fifth mode of the present invention, when a bypass channel that passes through the first compound semiconductor layer, the current block layer, and the second compound semiconductor layer is assumed, at least three pn junction interfaces formed of the interfaces between the compound semiconductor layers exist in the bypass channel. In addition, the impurity for causing a respective one of the compound semiconductor layers to have a predetermined conductivity type is such that the substitution site of the impurity in the respective one of the compound semiconductor layers competes with the substitution site of the impurity in the adjacent compound semiconductor layer for causing the adjacent compound semiconductor layer to have a predetermined conductivity type. Thus, impurity mutual diffusion hardly occurs between the n-type compound semiconductor layer and the p-type compound semiconductor layer of the current block layer. In addition, impurity mutual diffusion hardly occurs between the n-type compound semiconductor layer and the p-type compound semiconductor layer of the current block layer and the p-type compound semiconductor layer and the n-type compound semiconductor layer of the light emitting part. As a result, it is possible to avoid the occurrence of a problem that the effect of the current block layer is unstable and thus leakage current is increased due to annihilation or thinning of the current block layer.

DETAILED DESCRIPTION OF THE PREFERRED EMBODIMENTS

Embodiments of the present invention will be described below with reference to the accompanying drawings.

First Embodiment

A first embodiment of the present invention relates to the first mode (specifically, the (1-A)-th mode), the (2-A)-th mode, and the (4-A)-th mode of the present invention.

In the first embodiment, and second to ninth embodiments of the present invention, to be described later, selenium (Se) is used as at least one kind of impurity selected from the group composed of selenium (Se), tellurium (Te), and sulfur (S) (group VI impurity). Furthermore, silicon (Si) is used as at least one kind of impurity selected from the group composed of silicon (Si) and tin (Sn) (group IV impurity) In addition, zinc (Zn) is used as at least one kind of impurity selected from the group composed of zinc (Zn), magnesium (Mg), beryllium (Be), and manganese (Mn) (group II impurity). However, the present invention is not limited to these impurities.

The semiconductor light emitting devices in the first embodiment and the second to ninth embodiments to be described later are formed of a semiconductor laser, and specifically an SDH semiconductor laser.

Figure 1A:
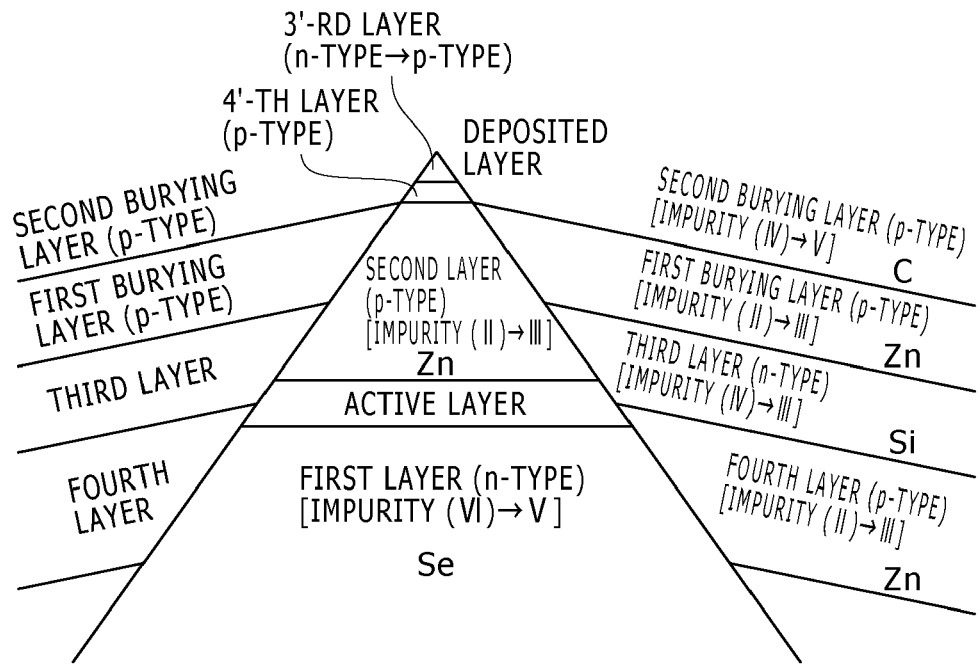
FIGS. 1A and 1B are conceptual diagrams of a semiconductor light emitting device according to a first embodiment of the present invention.
Figure 1B:
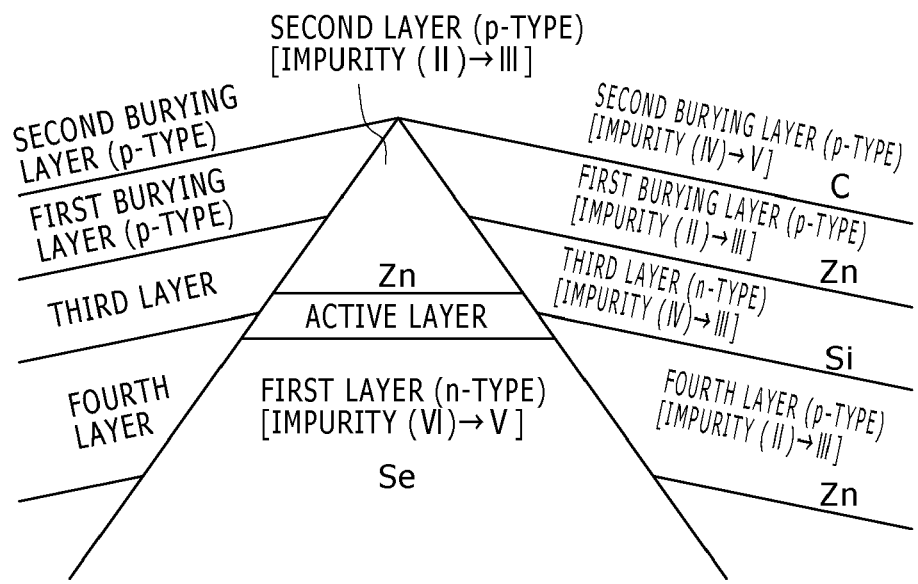
Figure 29:
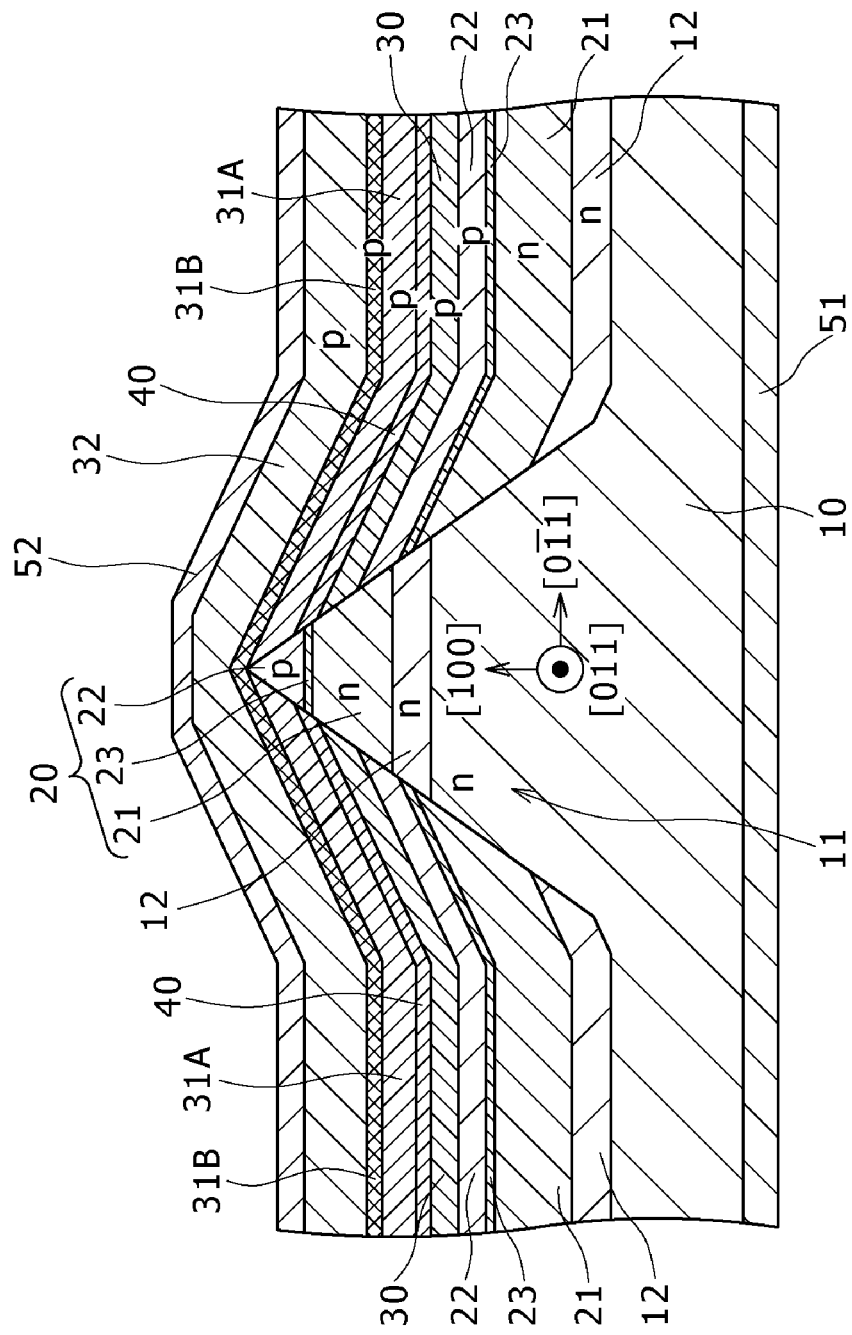
FIG. 29 is a schematic partial sectional view of the center part of the semiconductor light emitting device according to the first embodiment.
Figure 30:
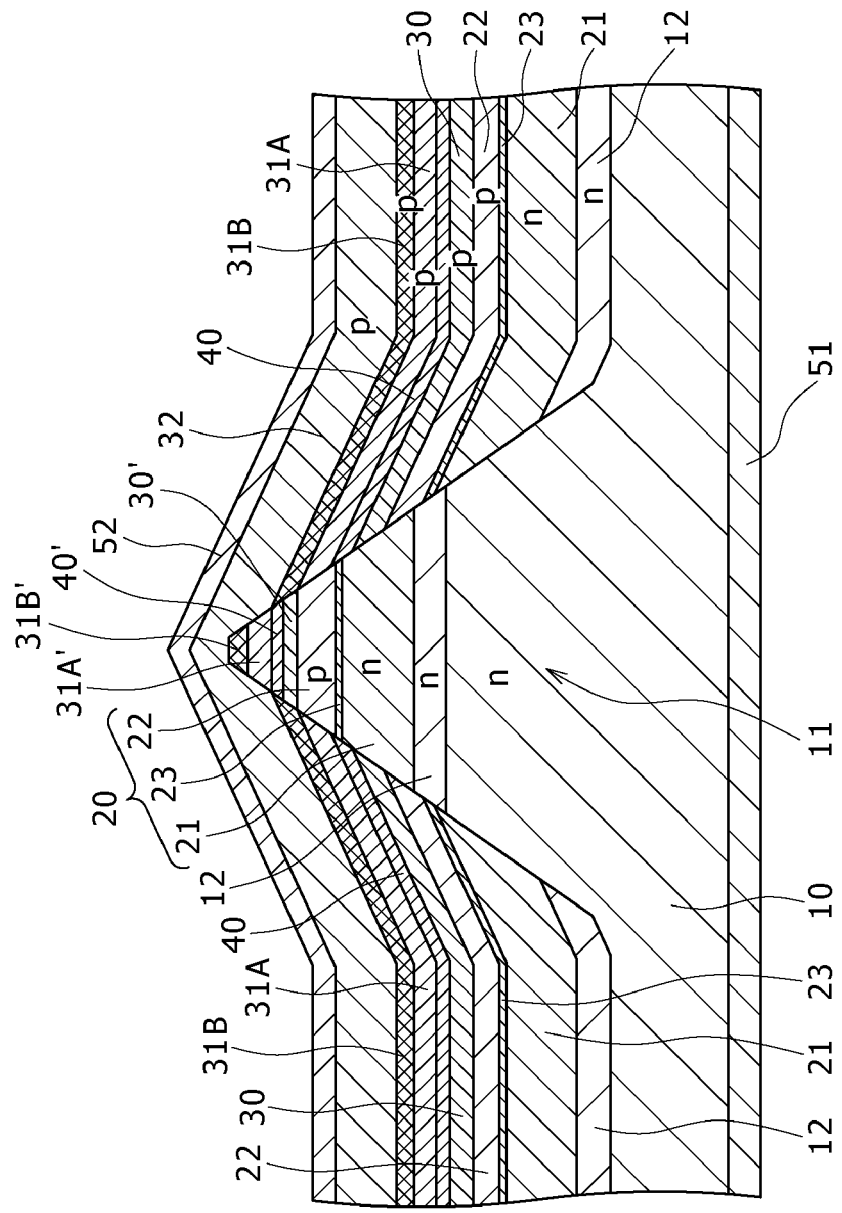
FIG. 30 is a schematic partial sectional view of both the end parts of the semiconductor light emitting device according to the first embodiment.
Figure 31A:
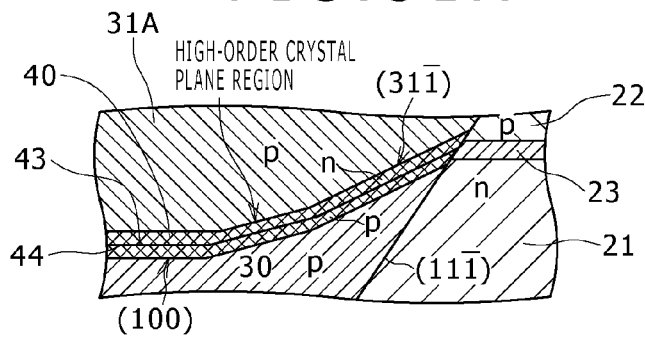
FIGS. 31A to 31C are enlarged schematic partial sectional views of the semiconductor light emitting device according to the first embodiment.
Figure 31B:
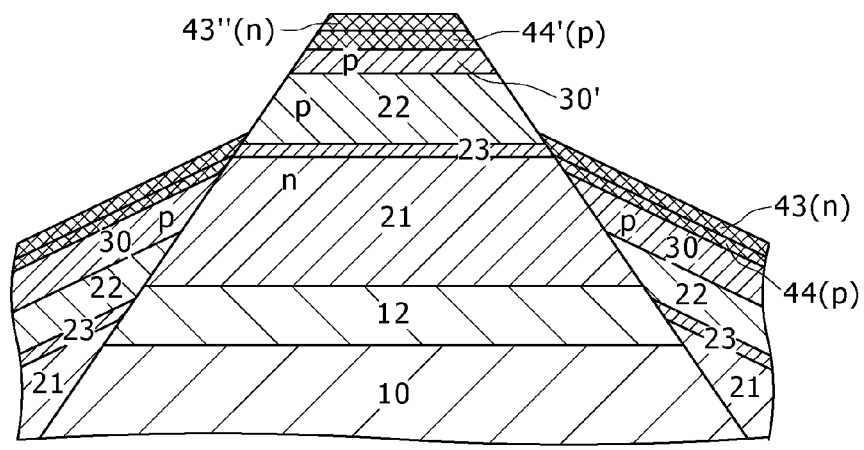
Figure 31C:
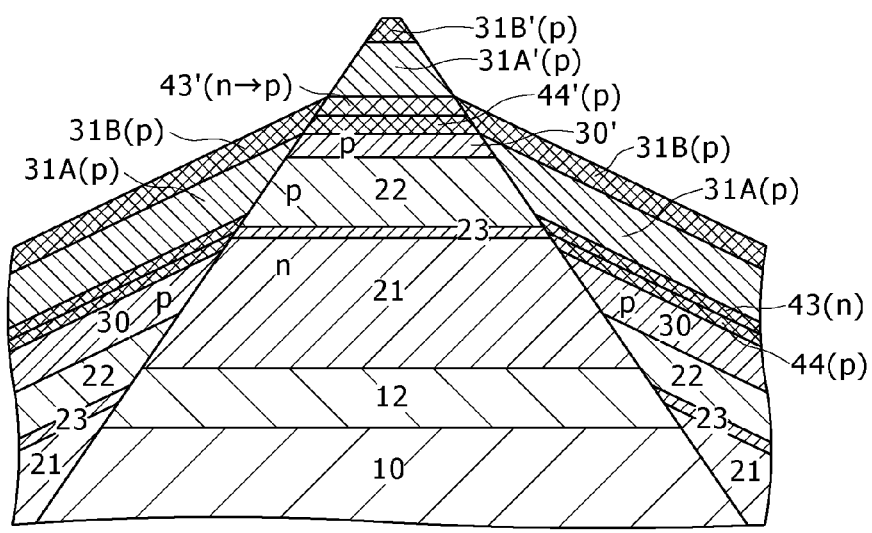
Figure 42:
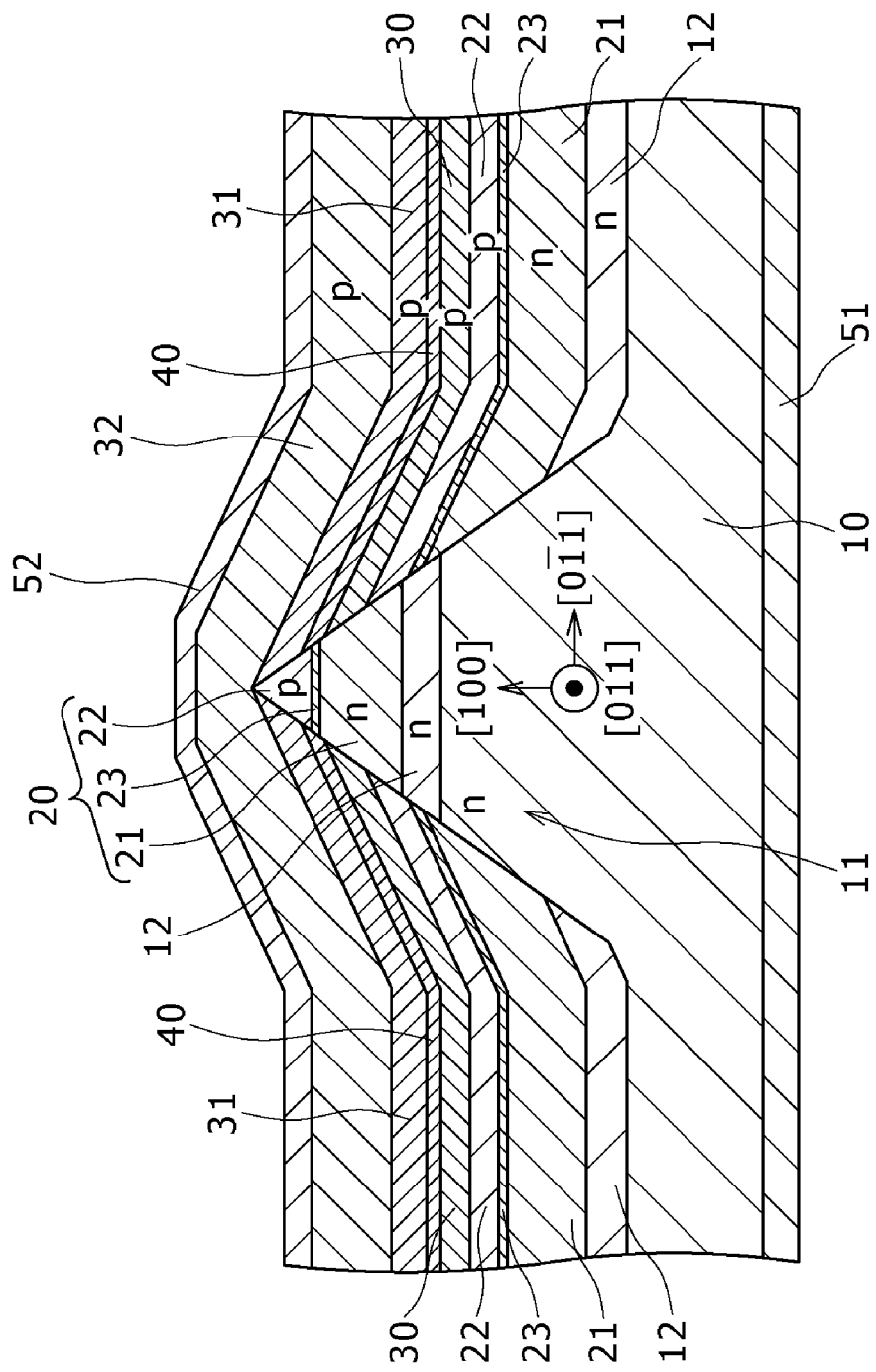
FIG. 42 is a schematic partial sectional view of a substrate and so on (at the center part of a semiconductor light emitting device), for explaining a method for manufacturing a related-art semiconductor light emitting device.
Figure 43:
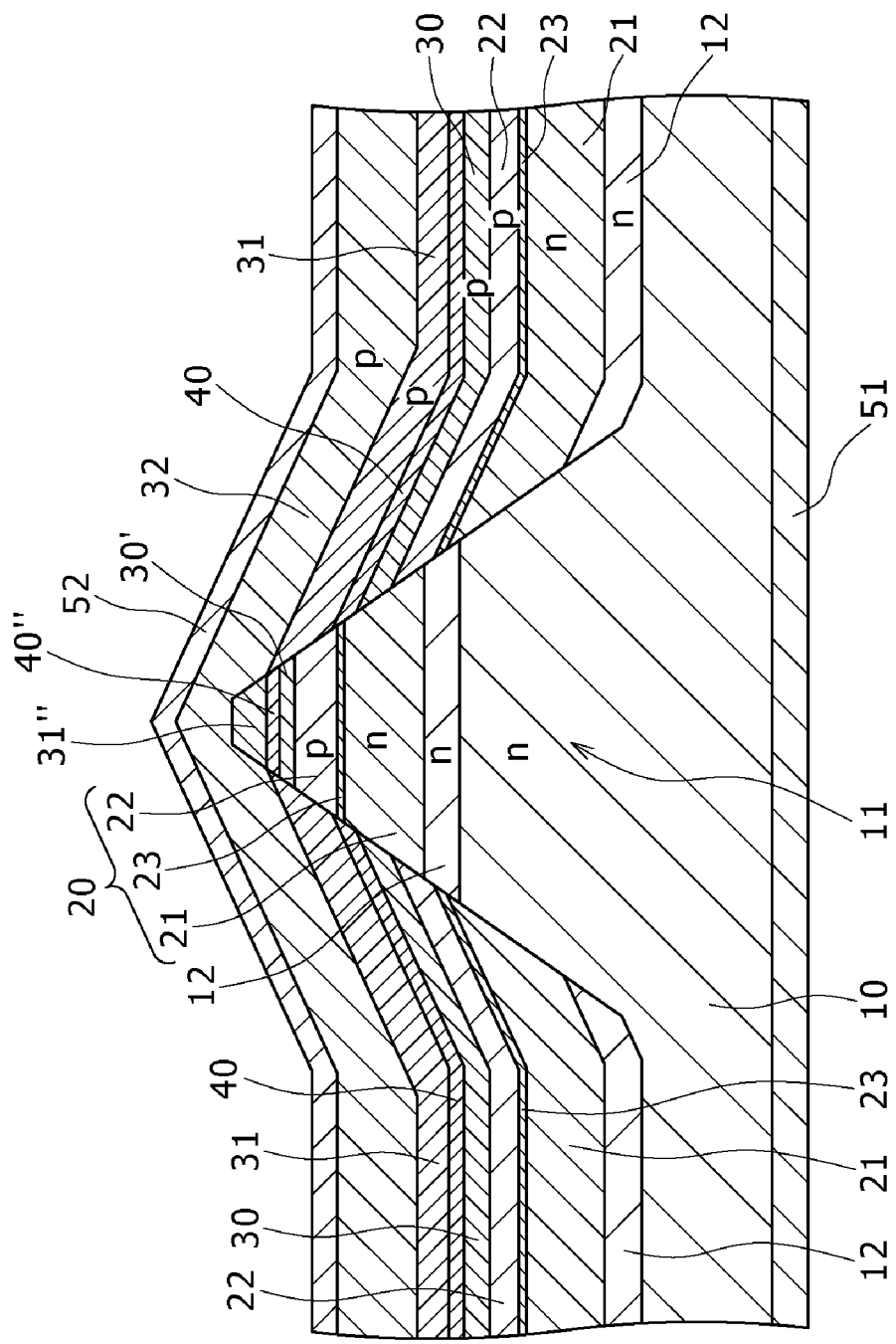
FIG. 43 is a schematic partial sectional view of the substrate and so on (at both the end parts of the semiconductor light emitting device), for explaining the method for manufacturing the related-art semiconductor light emitting device.

Conceptual diagrams of the semiconductor light emitting device of the first embodiment are shown in FIGS. 1A and 1B. Schematic partial sectional views of the semiconductor light emitting device are shown in FIGS. 29 and 30. Enlarged schematic partial sectional views of the semiconductor light emitting device are shown in FIGS. 31A to 31C. FIG. 1A is a conceptual diagram of the end parts of the semiconductor light emitting device. FIG. 1B is a conceptual diagram of the center part of the semiconductor light emitting device. FIG. 29 is a schematic partial sectional view of the center part of the semiconductor light emitting device. FIG. 30 is a schematic partial sectional view of the end parts of the semiconductor light emitting device. FIG. 31A is an enlarged schematic partial sectional view of a current block layer and the periphery thereof. FIGS. 31B and 31C are enlarged schematic partial sectional views of a light emitting part and the periphery thereof at the end parts of the semiconductor light emitting device. The sectional structure of the semiconductor light emitting device at the center part thereof shown in FIG. 29 is the same as that of the related-art semiconductor light emitting device described with reference to FIG. 42. On the other hand, the sectional structure of the semiconductor light emitting device at the end parts thereof shown in FIG. 30 is different from that of the related-art semiconductor light emitting device described with reference to FIG. 43, in the configuration of a deposited layer to be described later. In the drawings, the thicknesses of some compound semiconductor layers in the sectional structure of the semiconductor light emitting device at the center part thereof shown in FIG. 29 look different from those of the same compound semiconductor layers in the sectional structure of the semiconductor light emitting device at both the end parts thereof shown in FIG. 30. However, the same layer actually has the same thickness. In FIGS. 1A to 28B, "compound semiconductor layer" is represented simply as "layer." That is, for example, "first layer" means a first compound semiconductor layer. FIGS. 1A, 2A, 3A, 4A, 5A, 6A, 7A, 8A, 9A, 10A, 11A, 12A, 13A, 14A, 15A, 16A, 17A, 18A, 19A, 20A, 21A, 22A, 23A, 24A, 25A, 26A, 27A and 28A are conceptual diagrams of both the end parts of semiconductor light emitting devices. FIGS. 1B, 2B, 3B, 4B, 5B, 6B, 7B, 8B, 9B, 10B, 11B, 12B, 13B, 14B, 15B, 16B, 17B, 18B, 19B, 20B, 21B, 22B, 23B, 24B, 25B, 26B, 27B and 28B are conceptual diagrams of the center part of the semiconductor light emitting devices.

The semiconductor light emitting device of the first embodiment includes (A) a light emitting part 20 formed of a multilayer structure arising from sequential stacking of a first compound semiconductor layer 21 of a first conductivity type (n-type, in the first embodiment), an active layer 23, and second compound semiconductor layers 22A and 22B of a second conductivity type (p-type, in the first embodiment), (B) a current block layer 40 provided in contact with the side surface of the light emitting part 20, and (C) a burying layer 31 formed over the current block layer 40 and the light emitting part 20.

Figure 32A:
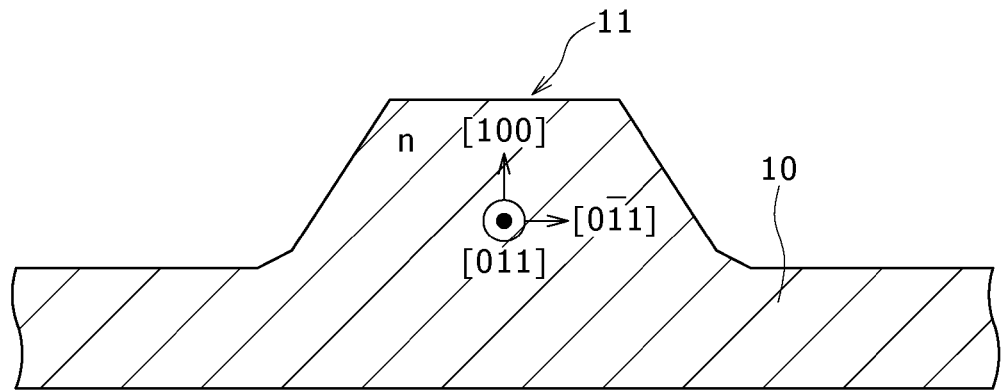
FIG. 32A is a schematic partial sectional view of a substrate and so on, for explaining a method for manufacturing the semiconductor light emitting device according to the first embodiment.
Figure 32B:
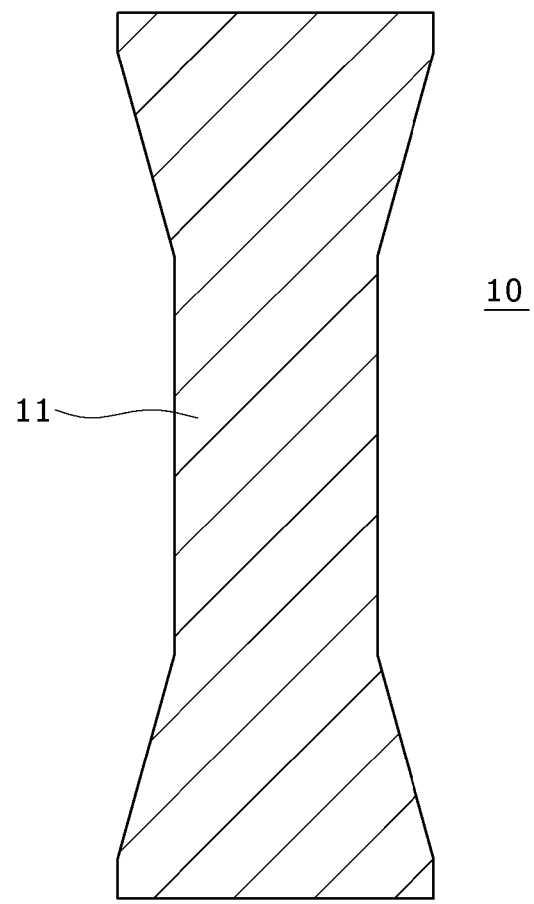
FIG. 32B is a schematic plan view of the light emitting part forming region.

The active layer is stacked above the light emitting part forming region 11 having the planar shape schematically shown in FIG. 32B. Thus, the active layer has a strip planar shape in which the width of the center part is smaller than that of both the end parts. That is, the semiconductor light emitting devices of the first embodiment and the second to ninth embodiments to be described later have a so-called flare-stripe structure.

The current block layer 40 is composed of a third compound semiconductor layer 43 of the first conductivity type (n-type) and a fourth compound semiconductor layer 44 of the second conductivity type (p-type) in contact with the third compound semiconductor layer 43. For simplification, in the drawings, two or more layers that have the same conductivity type or the same impurity site but have different refractive indexes (e.g. in the case of the second layer, the second compound semiconductor layer 22A and the second compound semiconductor layer 22B) are collectively represented as one layer (the second compound semiconductor layer 22).

For example, as shown in FIG. 31, the burying layer 31 of the second conductivity type is formed of a multilayer structure arising from sequential stacking of a first burying layer 31A and a second burying layer 31B. In the burying layer 31 located above the current block layer 40, the impurity for causing the second burying layer 31B to have the second conductivity type is such that the substitution site of the impurity in the second burying layer 31B does not compete with the substitution site of the impurity in the third compound semiconductor layer 43 for causing the third compound semiconductor layer 43 to have the first conductivity type. Furthermore, in the burying layer 31 located above the current block layer 40, the impurity for causing the first burying layer 31A to have the second conductivity type is such that the substitution site of the impurity in the first burying layer 31A competes with the substitution site of the impurity in the third compound semiconductor layer 43 for causing the third compound semiconductor layer 43 to have the first conductivity type. In addition, in the burying layer 31 located above the current block layer 40, the impurity for causing the first burying layer 31A to have the second conductivity type is such that the substitution site of the impurity in the first burying layer 31A competes with the substitution site of the impurity in the fourth compound semiconductor layer 44 for causing the fourth compound semiconductor layer 44 to have the second conductivity type. These features apply also to the second to ninth embodiments to be described later.

In the example shown in FIGS. 29 and 30, the third compound semiconductor layer 43 is formed on the fourth compound semiconductor layer 44. The pn junction interface between the fourth compound semiconductor layer 44 (p-type) and the third compound semiconductor layer 43 (n-type) thereon extends along the {311}B crystal plane, and the end part thereof is in contact with the light emitting part 20 (in particular, the side surface of the active layer 23). This forms two new junction interfaces. Specifically, a current path formed of the pnpn junction structure including the following junction interfaces is formed: the pn junction interface between the second compound semiconductor layers 22A and 22B and the third compound semiconductor layer 43; the np junction interface between the third compound semiconductor layer 43 and the fourth compound semiconductor layer 44; and the pn junction interface between the fourth compound semiconductor layer 44 and the first compound semiconductor layer 21. This is a desirable design as the current block structure.

Inversely with this multilayer structure, the positional relationship between the third compound semiconductor layer 43 (n-type) and the fourth compound semiconductor layer 44 (p-type) may be reversed. In this case, the pn junction interface between the fourth compound semiconductor layer 44 (p-type) and the third compound semiconductor layer 43 (n-type) thereunder extends along the {311}B crystal plane, and the end part thereof is in contact with the light emitting part 20 (in particular, the side surface of the active layer 23). This forms two new junction interfaces. As a result, the following junction interfaces exist: the pp junction interface between the second compound semiconductor layers 22A and 22B and the fourth compound semiconductor layer 44; the pn junction interface between the fourth compound semiconductor layer 44 and the third compound semiconductor layer 43; and the nn junction interface between the third compound semiconductor layer 43 and the first compound semiconductor layer 21. Thus, a ppnn junction structure arises due to the second compound semiconductor layers 22A and 22B/the fourth compound semiconductor layer 44/the third compound semiconductor layer 43/the first compound semiconductor layer 21. However, by decreasing the junction area between the current block layer 40 and the light emitting part 20 (in particular, the nn junction area), a desired design as the current block structure can be obtained through an increase in the resistance of the contact area.

Moreover, in the first embodiment, the impurity for causing the first compound semiconductor layer 21 to have the first conductivity type (n-type) is such that the substitution site of the impurity in the first compound semiconductor layer 21 does not compete with the substitution site of the impurity in the second compound semiconductor layers 22A and 22B for causing the second compound semiconductor layers 22A and 22B to have the second conductivity type (p-type). Furthermore, the impurity for causing the third compound semiconductor layer 43 to have the first conductivity type (n-type) is such that the substitution site of the impurity in the third compound semiconductor layer 43 competes with the substitution site of the impurity in the fourth compound semiconductor layer 44 for causing the fourth compound semiconductor layer 44 in contact with the third compound semiconductor layer 43 to have the second conductivity type (p-type).

Specifically, when the semiconductor light emitting device of the first embodiment is represented based on the (1-A)-th mode of the present invention, in the semiconductor light emitting device of the first embodiment, the first compound semiconductor layer 21, the second compound semiconductor layers 22A and 22B, the third compound semiconductor layer 43, the fourth compound semiconductor layer 44, the first burying layer 31A, and the second burying layer 31B are composed of a III-V compound semiconductor, the substitution site of the impurity in the first compound semiconductor layer 21 is the site occupied by a group V atom, the substitution site of the impurity in the second compound semiconductor layers 22A and 22B is the site occupied by a group III atom, the substitution site of the impurity in the third compound semiconductor layer 43 and the substitution site of the impurity in the fourth compound semiconductor layer 44 are the site occupied by a group III atom, the substitution site of the impurity in the first burying layer 31A is the site occupied by a group III atom, and the substitution site of the impurity in the second burying layer 31B is the site occupied by a group V atom.

Furthermore, when the semiconductor light emitting device of the first embodiment is represented based on the (2-A)-th mode of the present invention, in the semiconductor light emitting device of the first embodiment, the first compound semiconductor layer 21, the second compound semiconductor layers 22A and 22B, the third compound semiconductor layer 43, the fourth compound semiconductor layer 44, the first burying layer 31A, and the second burying layer 31B are composed of a III-V compound semiconductor, the impurity for causing the first compound semiconductor layer 21 to be the n-type as the first conductivity type is a group VI impurity, the impurity for causing the third compound semiconductor layer 43 to be the n-type as the first conductivity type is a group IV impurity, the impurity for causing the first burying layer 31A to be the p-type as the second conductivity type is a group II impurity, and the impurity for causing the second burying layer 31B to be the p-type as the second conductivity type is carbon (C).

In addition, when the semiconductor light emitting device of the first embodiment is represented based on the (4-A)-th mode of the present invention, in the semiconductor light emitting device of the first embodiment, the impurity for causing the first compound semiconductor layer 21 to have the first conductivity type (n-type) is different from the impurity for causing the third compound semiconductor layer 43 to have the first conductivity type (n-type).

Specifically, in the semiconductor light emitting device of the first embodiment, the respective layers have the configuration shown in Table 1A or Table 1B shown below. The compound semiconductors of the first compound semiconductor layer 21, the second compound semiconductor layers 22A and 22B, and the current block layer 40 have wider band gaps, i.e., lower refractive indexes, compared with the compound semiconductors of the active layer 23. In the example shown in Table 1A, the third compound semiconductor layer 43 is stacked on the fourth compound semiconductor layer 44. In the example shown in Table 1B, the fourth compound semiconductor layer 44 is stacked on the third compound semiconductor layer 43. In the multilayer structures shown in Table 1A and Table 1B, and Table 2A, Table 2B, Table 3A, Table 3B, Table 4A, Table 4B, Table 5A, Table 5B, Table 6A, Table 6B, Table 7A, Table 7B, Table 8A, Table 8B, and Tables 9A to 9L, which will be described later, an upper layer corresponds to a layer shown on an upper row in the table.

The active layer having the structure shown in the following table will be represented as [Active layer-A] in Table 1A, Table 1B, Table 2A, Table 2B, Table 5A, Table 5B, Table 6A, Table 6B, Table 9A, Table 9C, Table 9E, Table 9G, Table 9I, and Table 9K. In this multilayer structure, an upper layer corresponds to a layer shown on an upper row in the table.

[Active Layer-A]

Confinement layer . . . p-$Al_{0.3}Ga_{0.7}As$:Zn

Confinement layer . . . i-$Al_{0.3}Ga_{0.7}As$

Multiple quantum well structure . . .

i-$Al_{0.1}Ga_{0.9}As$ (well layer)

i-$Al_{0.3}Ga_{0.7}As$ (barrier layer), and i-$Al_{0.1}Ga_{0.9}As$ (well layer)

Confinement layer . . . i-$Al_{0.3}Ga_{0.7}As$

Confinement layer . . . n-$Al_{0.3}Ga_{0.7}As$:Se

The active layer having the structure shown in the following table will be represented as [Active layer-B] in Table 3A, Table 3B, Table 4A, Table 4B, Table 7A, Table 7B, Table 8A, Table 8B, Table 9B, Table 9D, Table 9F, Table 9H, Table 9J, and Table 9L. In this multilayer structure, an upper layer corresponds to a layer shown on an upper row in the table.

[Active Layer-B]

Confinement layer . . . n-$Al_{0.3}Ga_{0.7}As$:Se

Confinement layer . . . i-$Al_{0.3}Ga_{0.7}As$

Multiple quantum well structure . . .

i-$Al_{0.1}Ga_{0.9}As$ (well layer)

i-$Al_{0.3}Ga_{0.7}As$ (barrier layer), and i-$Al_{0.1}Ga_{0.9}As$ (well layer)

Confinement layer . . . i-$Al_{0.3}Ga_{0.7}As$

Confinement layer . . . p-$Al_{0.3}Ga_{0.7}As$:Zn

TABLE 1A (Configuration of light emitting part)

| | |
|---|---|
| Second compound semiconductor layer 22B | p-$Al_{0.47}Ga_{0.53}As$: Zn |
| Second compound semiconductor layer 22A | p-$Al_{0.4}Ga_{0.6}As$: Zn |
| Active layer 23 | [Active layer-A] |
| First compound semiconductor layer 21 | n-$Al_{0.4}Ga_{0.6}As$: Se |
| (Current block layer) | |
| Second burying layer 31B | p-$Al_{0.47}Ga_{0.53}As$: C |
| First burying layer 31A | p-$Al_{0.47}Ga_{0.53}As$: Zn |
| Third compound semiconductor layer 43 | n-$Al_{0.47}Ga_{0.53}As$: Si |
| Fourth compound semiconductor layer 44 | p-$Al_{0.47}Ga_{0.53}As$: Zn |
| Adjustment layer 30 | p-$Al_{0.47}Ga_{0.53}As$: Zn |
| (Whole) | |
| Contact layer 32 | p-GaAs: Zn (or C) |

(Note 1)
The adjustment layer 30 is formed subsequently to the second compound semiconductor layer 22B.
(Note 2)
The fourth compound semiconductor layer 44 is formed subsequently to the adjustment layer 30 in a continuous manner, and a boundary does not exist between the fourth compound semiconductor layer 44 and the adjustment layer 30 substantially.
(Note 3)
It is also possible to consider that a fifth compound semiconductor layer composed of p-$Al_{0.47}Ga_{0.53}As$: Zn is formed between the third compound semiconductor layer 43 and the first burying layer 31A (the partial portion of the first burying layer 31A in the vicinity of the interface with the third compound semiconductor layer 43 corresponds to this fifth compound semiconductor layer).

TABLE 1B (Configuration of light emitting part)

| | |
|---|---|
| Second compound semiconductor layer 22B | p-$Al_{0.47}Ga_{0.53}As$: Zn |
| Second compound semiconductor layer 22A | p-$Al_{0.4}Ga_{0.6}As$: Zn |
| Active layer 23 | [Active layer - A] |
| First compound semiconductor layer 21 | n-$Al_{0.4}Ga_{0.6}As$: Se |
| (Current block layer) | |
| Second burying layer 31B | p-$Al_{0.47}Ga_{0.53}As$: C |
| First burying layer 31A | p-$Al_{0.47}Ga_{0.53}As$: Zn |
| Fourth compound semiconductor layer 44 | p-$Al_{0.47}Ga_{0.53}As$: Zn |
| Third compound semiconductor layer 43 | n-$Al_{0.47}Ga_{0.53}As$: Si |
| Adjustment layer 30 | p-$Al_{0.47}Ga_{0.53}As$: Zn |
| (Whole) | |
| Contact layer 32 | p-GaAs: Zn (or C) |

(Note 1)
The adjustment layer 30 is formed subsequently to the second compound semiconductor layer 22B.
(Note 2)
The first burying layer 31A is formed subsequently to the fourth compound semiconductor layer 44 in a continuous manner, and a boundary does not exist between the first burying layer 31A and the fourth compound semiconductor layer 44 substantially.

In the manufacturing process of the semiconductor light emitting device of the first embodiment, at the timing when the formation of the light emitting part 20 is completed, the sectional shape of the light emitting part 20 obtained when the center part of the light emitting part 20 is cut along a virtual plane perpendicular to the axis line of the light emitting part 20 is a triangle. At this time, the sectional shape of the light emitting part 20 obtained when the end part of the light emitting part 20 is cut along a virtual plane perpendicular to the axis line of the light emitting part 20 is a trapezoid. Therefore, in the formation of the current block layer 40 (the fourth compound semiconductor layer 44 and the third compound semiconductor layer 43), the current block layer 40 is formed only on the side surfaces of the light emitting part 20 at the center part of the light emitting part 20. At this time, at the end parts of the light emitting part 20, in addition to the formation of the current block layer 40 on the side surfaces of the light emitting part 20, a layer (deposited layer 40") having the same multilayer structure as that of the current block layer 40 is formed above the top surface of the light emitting part 20 (see FIG. 31B). The fourth compound semiconductor layer included in the deposited layer 40" at the timing when the deposited layer 40" is formed will be referred to as a deposited layer 44' of the fourth compound semiconductor layer, and the third compound semiconductor layer included in the deposited layer 40" at the same timing will be referred to as a deposited layer 43" of the third compound semiconductor layer. Between the deposited layer 40" and the top surface of the multilayer structure of the light emitting part 20, a compound semiconductor layer 30' having the same configuration as that of the adjustment layer 30 is formed.

Subsequently to the formation of the current block layer 40, the first burying layer 31A is so formed as to cover the side surfaces of the light emitting part 20 and the side surfaces of at least one layer of the deposited layer 40" stacked above the light emitting part 20, at both the end parts in particular. Subsequently, at the timing of the completion of the covering of at least the side surfaces of the light emitting part 20 and the side surfaces of the compound semiconductor layer 30' by the first burying layer 31A, the formation of the second burying layer 31B is started, so that the entire surface is covered by the second burying layer 31B. At this time, the impurity for causing the second burying layer 31B to have the second conductivity type is such that the substitution site of the impurity in the second burying layer 31B (the site occupied by a group V atom, in the first embodiment) does not compete with the substitution site of the impurity in the third compound semiconductor layer (the site occupied by a group III atom, in the first embodiment) for causing the third compound semiconductor layer 43 to have the first conductivity type (see Table 1A or Table 1B). Therefore, e.g. the impurity for causing the second burying layer 31B that is deposited to a large thickness so that the apex may be finally covered to have the second conductivity type diffuses into the deposited layer 43" of the third compound semiconductor layer, formed above the top surface at both the end parts of the light emitting part 20. This diffusion turns the deposited layer 43" of the third compound semiconductor layer to a deposited layer 43' of the third compound semiconductor layer, having the second conductivity type (see FIG. 31C). The deposited layer that has become such a state will be referred to as a deposited layer vestige 40'. Furthermore, the first burying layer and the second burying layer formed above the deposited layer vestige 40' will be referred to as a first burying layer 31A' and a second burying layer 31B,' respectively. In FIGS. 1A, 2A, 3A, 4A, 5A, 6A, 7A, 8A, 9A, 10A, 11A, 12A, 13A, 14A, 15A, 16A, 17A, 18A, 19A, 20A, 21A, 22A, 23A, 24A, 25A, 26A, 27A and 28A, the deposited layer 43' of the third compound semiconductor layer is indicated as "3'-rd layer," and the deposited layer 44' of the fourth compound semiconductor layer is indicated as "4'-th layer." In particular, if a compound semiconductor layer of the first conductivity type is included in the deposited layer 40", it is desirable that the burying layer 31 of the second conductivity type whose impurity substitution site does not compete with the impurity substitution site in this compound semiconductor layer of the first conductivity type included in the deposited layer 40" be in contact with at least a part of the side surface of the deposited layer 40". This structure allows the impurity of the second conductivity type in the burying layer 31 (e.g. the burying layer 31B) to diffuse from the at least a part of the side surface of the deposited layer 40". As a result, it is possible to initially carry out conductivity type compensation for the compound semiconductor layer of the first conductivity type that is included in the deposited layer 40" and causes the current blocking, and thus turn this compound semiconductor layer of the first conductivity type to a layer of the second conductivity type.

In the semiconductor light emitting devices of the first embodiment and the second to ninth embodiments to be described later, the light emitting part 20 is formed above the light emitting part forming region 11 on the substrate 10. The light emitting part forming region 11 of the substrate 10 is formed on the {100} plane of the substrate 10 as its major surface, and is formed of a projection part that extends along the {110}A plane direction ([011]A plane direction, in the illustrated example) and has the {100} plane ((100) plane, in the illustrated example) as its top surface. The substrate 10 is formed of a GaAs substrate, and the conductivity type of the substrate 10 is the same as that of the first compound semiconductor layer. The light emitting part forming region 11 has a so-called mesa structure (projection part). In the semiconductor light emitting devices of the first embodiment and the second to ninth embodiments to be described later, the side surfaces of the multilayer structure (light emitting part 20) facing each other are the {111}B planes (specifically, the (11-1)B plane and the (1-11)B plane).

The third compound semiconductor layer 43 as a part of the current block layer is composed of
the {311}B crystal plane region (specifically, the (31-1)B plane and the (3-11)B plane) that extends from the side surface of the light emitting part 20,
the {100} crystal plane region that extends along the major surface of the substrate 10, and
the {h11}B crystal plane region (specifically, the (h1-1)B plane and the (h-11)B plane, h is an integer equal to or larger than four) that is located between the {311}B crystal plane region and the {100} crystal plane region. The {h11}B crystal plane region (h is an integer equal to or larger than four) will be referred to as a high-order crystal plane region, for convenience.

Furthermore, the fourth compound semiconductor layer 44 formed under the third compound semiconductor layer 43 is also composed of
similarly to the third compound semiconductor layer 43, the {311}B crystal plane region that extends from the side surface of the light emitting part 20,
the {100} crystal plane region that extends along the major surface of the substrate 10, and
the high-order crystal plane region that is located between the {311}B crystal plane region and the {100} crystal plane region.

Also in the semiconductor light emitting devices of the second to ninth embodiments to be described later, the third compound semiconductor layer 43 and the fourth compound semiconductor layer 44 have the same structures as the above-described structures basically, except for the vertical positional relationship between the layers.

In the semiconductor light emitting device of the first embodiment, over the light emitting part forming region 11 that is provided on the substrate 10 and is formed of a mesa structure (over the {100} plane of the projection part, hereinafter represented as "over the projection surface"), the buffer layer 12 that is composed of GaAs of the first conductivity type, the first compound semiconductor layer 21, the active layer 23, and the second compound semiconductor layer 22A are sequentially formed. Furthermore, the second compound semiconductor layer 22B is formed on the second compound semiconductor layer 22A, so that the apex is formed. The sectional shape of the light emitting part 20 including the second compound semiconductor layer 22B, obtained when the light emitting part forming region 11 is cut along the {011}A plane, is a triangle. The side surfaces of the light emitting part 20 are the {111}B plane, as described above. By controlling the compositions of the second compound semiconductor layer 22A and the second compound semiconductor layer 22B, the light emitting part 20 having a triangular sectional shape can be accurately formed. In general, the {111}B plane is known as a non-growth surface covered by an As trimmer in MOCVD (referred to also as MOVPE), except for special crystal growth conditions. Therefore, in the case of an SDH semiconductor laser, after the light emitting part 20 whose oblique surface (side surface) is the {111}B plane is formed, "self growth stop" of the crystal growth of the light emitting part is kept even if the MOCVD is continued thereafter. The angle of the {111}B plane is 54.7 degrees. Depending on the growth condition and so on, it is also possible that the part having a triangular sectional shape be composed only of the light emitting part 20.

On the other hand, over the part of the {100} plane ((100) plane, in the illustrated example) as the substrate major surface except for the projection part (referred to as the recess surface, for convenience), the following components are sequentially formed: the same structure as that of the light emitting part 20; the adjustment layer 30 (it is a continuation part of the second compound semiconductor layer 22 (or the second compound semiconductor layer 22B) substantially); the current block layer 40; and the burying layer (clad layer for burying) 31 (specifically, the first burying layer 31A and the second burying layer 31B).

Furthermore, the whole device is covered by the contact layer (cap layer) 32 that is composed of GaAs of the second conductivity type. In addition, the first electrode 51 is formed on the backside of the substrate 10, and the second electrode 52 is formed on the contact layer (cap layer) 32.

The semiconductor light emitting devices of the second to ninth embodiments to be described later also have the same structure as the above-described structure basically.

The semiconductor light emitting device of the first embodiment can be manufactured based on a method described below for example.

[Step-100]

Initially, on the {100} crystal plane, e.g. the (100) crystal plane, of the substrate 10 composed of n-GaAs as its major surface, an etching mask that has a predetermined width and a substantially-stripe shape and extends along the [011]A direction is formed based on a photolithography technique. By using this etching mask, the major surface is subjected to wet etching with use of e.g. an etchant obtained by mixing $H_2SO_4$, $H_2O_2$, and $H_2O$ at a ratio of 3:1:1. Thereby, the light emitting part forming region 11 extending along the [011]A direction is formed. The width direction of the light emitting part forming region 11 is parallel to the [0-11]B direction. Thereafter, the etching mask is removed. In this way, the structure shown in FIG. 32A can be obtained. The light emitting part forming region 11 has the oblique surfaces (side surfaces) corresponding to the {111}B plane. The planar shape of the light emitting part forming region 11 is schematically shown in FIG. 32B. The light emitting part forming region 11 has a strip shape in which the width of the center part is smaller than that of both the end parts. In FIG. 32B, the light emitting part forming region 11 is hatched for clearly showing it.

[Step-110]

Subsequently, based on normal MOCVD, specifically, MOCVD with use of an organic metal and a hydrogen compound as the source gas, the buffer layer 12, the first compound semiconductor layer 21, the active layer 23, and the second compound semiconductor layers 22A and 22B are epitaxially grown over the projection surface and the recess surface. At this time, the oblique surfaces (side surfaces) of the compound semiconductor layers above the projection surface correspond to the {111}B plane. As described above, the {111}B plane is a non-growth surface. Therefore, the buffer layer 12, the first compound semiconductor layer 21, the active layer 23, and the second compound semiconductor layers 22A and 22B are so formed (stacked) that the layers in the region above the projection surface are separated from those in the region above the recess surface.

By properly selecting the width and thickness of the light emitting part forming region 11 (projection surface) and properly selecting the thicknesses of the buffer layer 12, the first compound semiconductor layer 21, the active layer 23, and the second compound semiconductor layers 22A and 22B, a multilayer structure of the light emitting part 20 having a triangular sectional shape can be obtained above the center part of the light emitting part forming region 11 (projection surface). At this time, at both the end parts of the light emitting part forming region 11, a multilayer structure of the light emitting part 20 having a trapezoidal sectional shape can be obtained simultaneously. Thereafter, in the process of the continuation of the growth of the layers subsequent to the second compound semiconductor layer 22, at the center part, the side surfaces of the triangle in the growth stop state are gradually covered, so that the apex of the triangle is also completely covered by the second burying layer finally. On the other hand, at both the end parts, the growth of the compound semiconductor layer continues on the top surface ({100} plane) of the trapezoid in the process of the continuation of the growth of the layers subsequent to the second compound semiconductor layer 22. Thus, for example, a triangle (apex) having a larger sectional area compared with the triangle of the center part is eventually formed. Furthermore, the side surfaces of this triangle are gradually covered, so that the apex is also completely covered by the second burying layer finally.

[Step-120]

Figure 33:
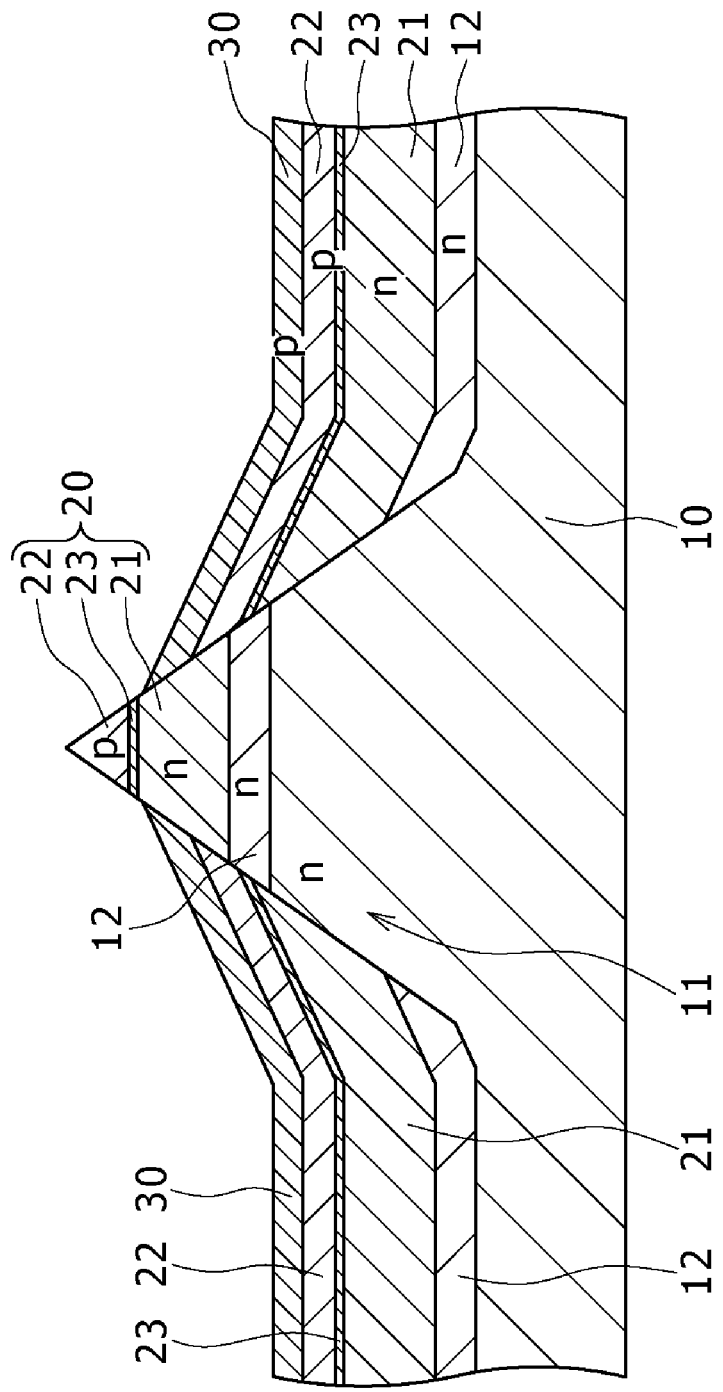
FIG. 33 is a schematic partial sectional view of the substrate and so on (at the center part of the semiconductor light emitting device), subsequent to FIG. 32A, for explaining the method for manufacturing the semiconductor light emitting device according to the first embodiment.
Figure 34:
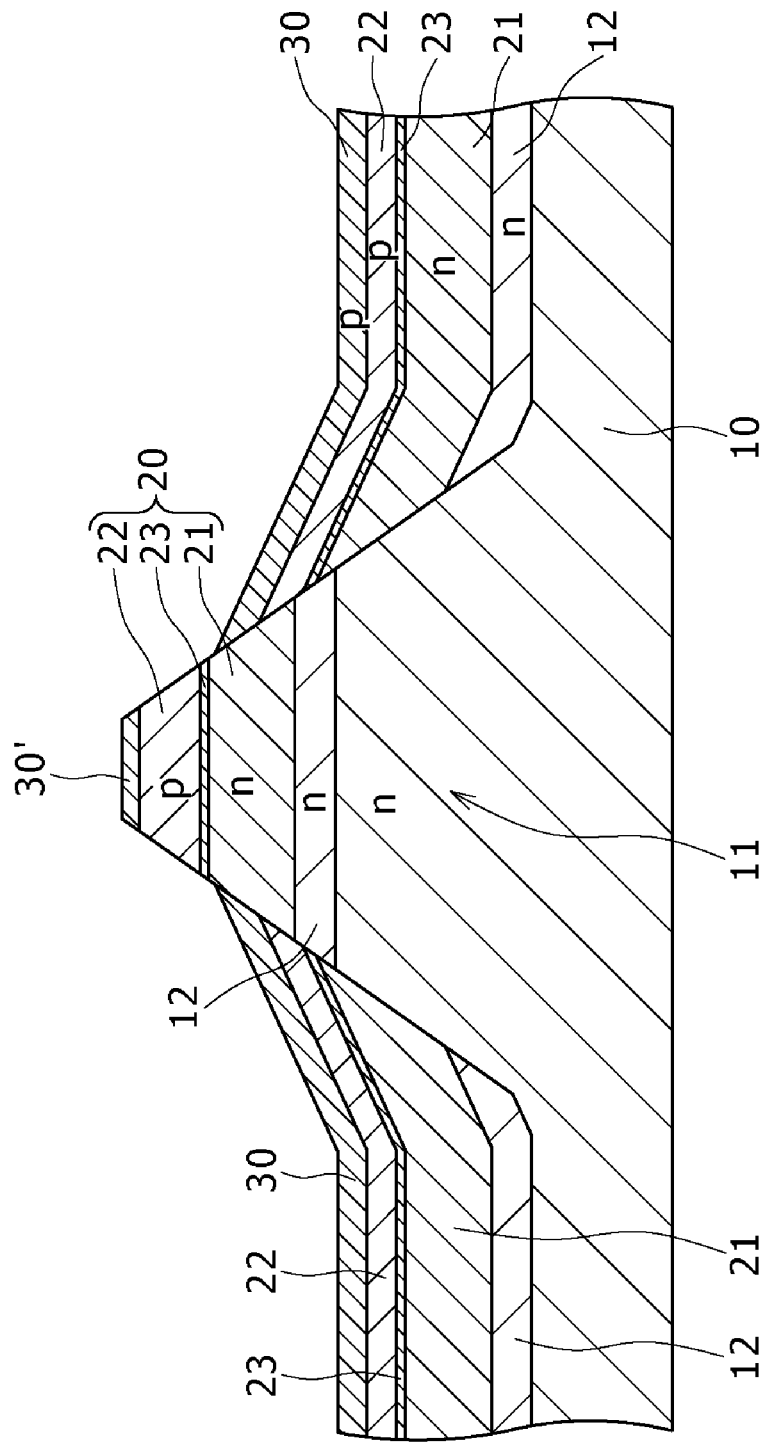
FIG. 34 is a schematic partial sectional view of the substrate and so on (at both the end parts of the semiconductor light emitting device), subsequent to FIG. 32A, for explaining the method for manufacturing the semiconductor light emitting device according to the first embodiment.
Figure 35:
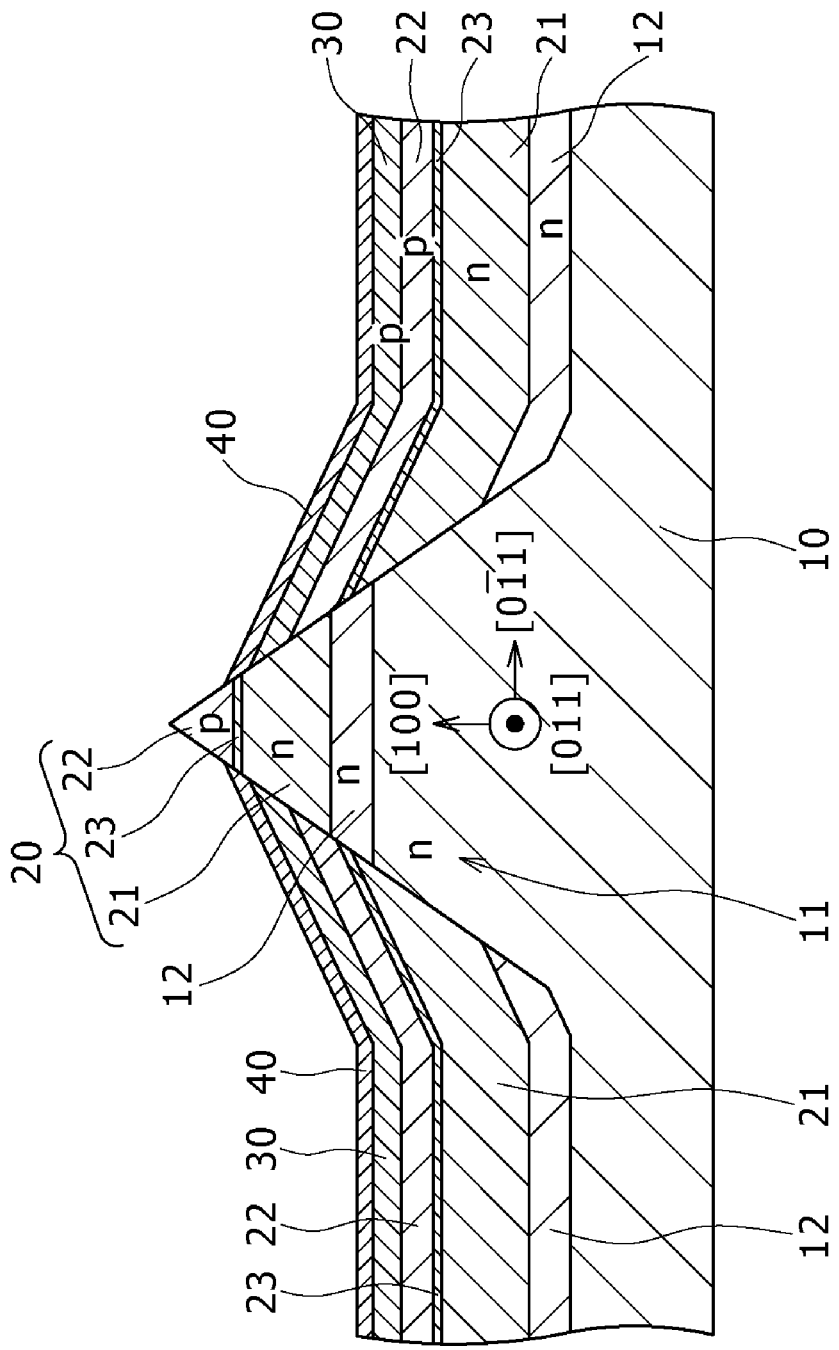
FIG. 35 is a schematic partial sectional view of the substrate and so on (at the center part of the semiconductor light emitting device), subsequent to FIG. 33, for explaining the method for manufacturing the semiconductor light emitting device according to the first embodiment.
Figure 36:
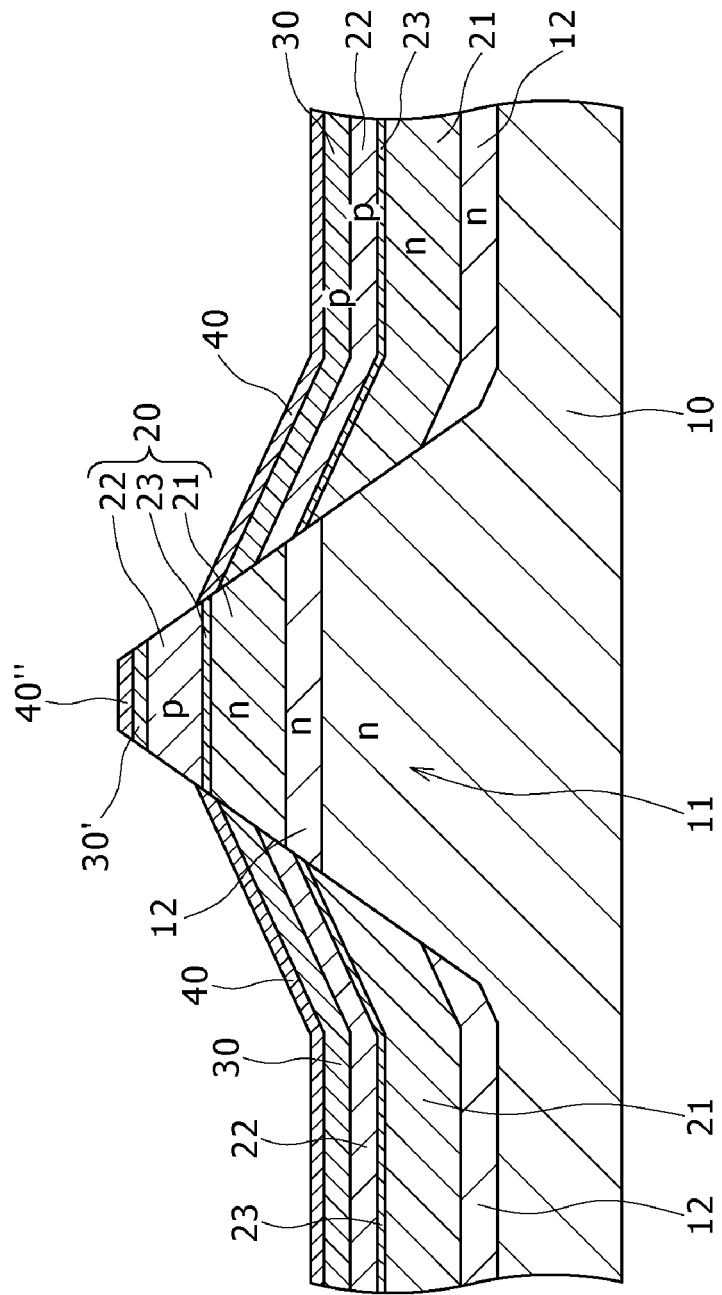
FIG. 36 is a schematic partial sectional view of the substrate and so on (at both the end parts of the semiconductor light emitting device), subsequent to FIG. 34, for explaining the method for manufacturing the semiconductor light emitting device according to the first embodiment.

Specifically, continuously with the formation of the second compound semiconductor layer 22B, the adjustment layer 30 is formed across the entire surface based on MOCVD. In this way, the sectional structure shown in FIG. 33 can be obtained at the center part of the light emitting part forming region 11. At both the end parts of the light emitting part forming region 11, the sectional structure shown in FIG. 34 can be obtained. Subsequently, for example, the current block layer 40 formed of the multilayer structure composed of the fourth compound semiconductor layer 44 and the third compound semiconductor layer 43 is formed based on MOCVD. In this way, the sectional structure shown in FIG. 35 can be obtained at the center part of the light emitting part forming region 11. At both the end parts of the light emitting part forming region 11, the sectional structure shown in FIG. 36 can be obtained. The current block layer 40 is not grown on the {111}B plane. The current block layer 40 is so formed that the end surfaces of the current block layer 40 cover at least the side surfaces of the active layer 23. Such configuration and structure can be achieved by properly selecting the thickness of the adjustment layer 30. The configurations and structures of the third compound semiconductor layer 43 and the fourth compound semiconductor layer 44 are as described above.

[Step-130]

Figure 37:
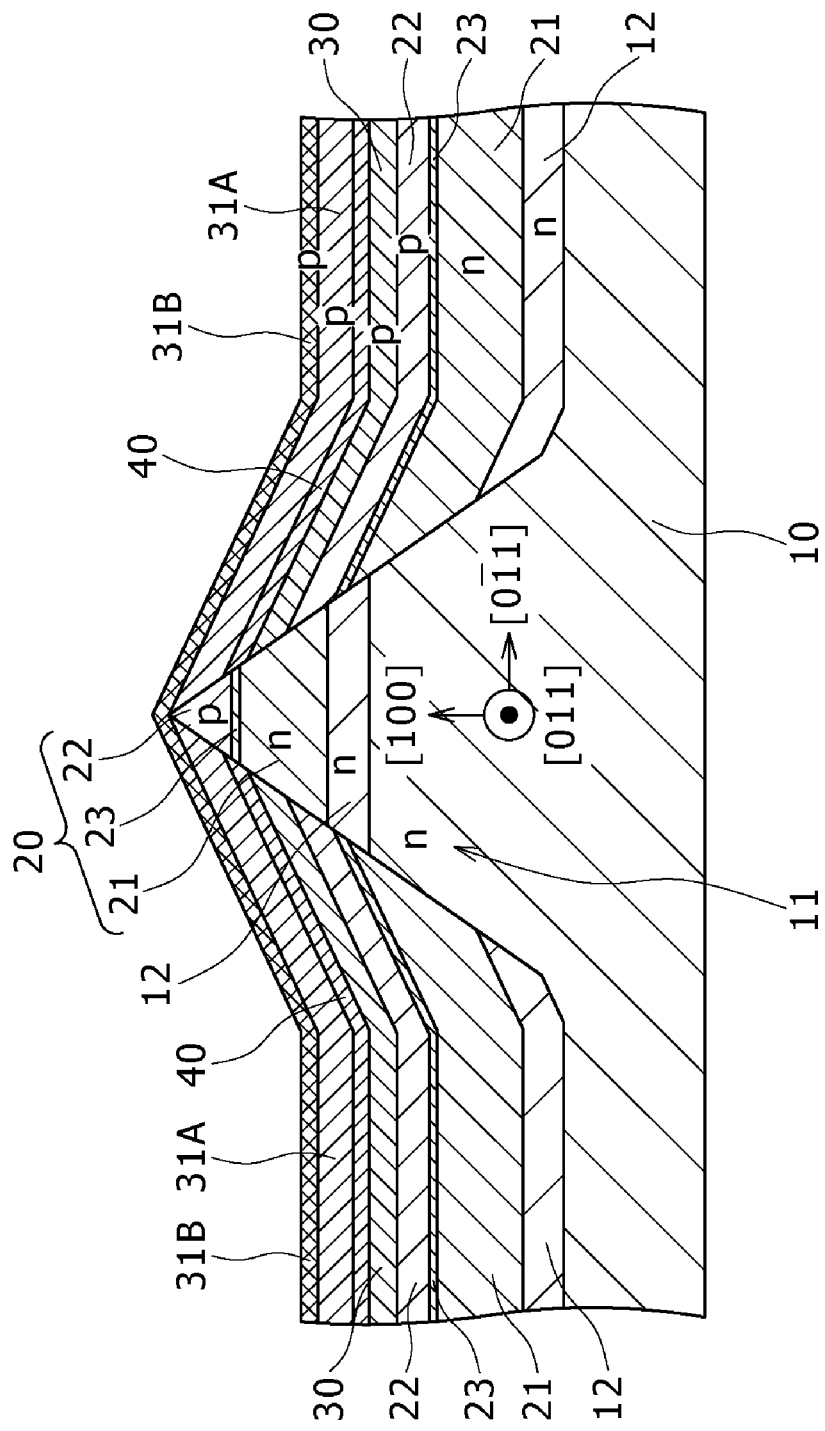
FIG. 37 is a schematic partial sectional view of the substrate and so on (at the center part of the semiconductor light emitting device), subsequent to FIG. 35, for explaining the method for manufacturing the semiconductor light emitting device according to the first embodiment.
Figure 38:
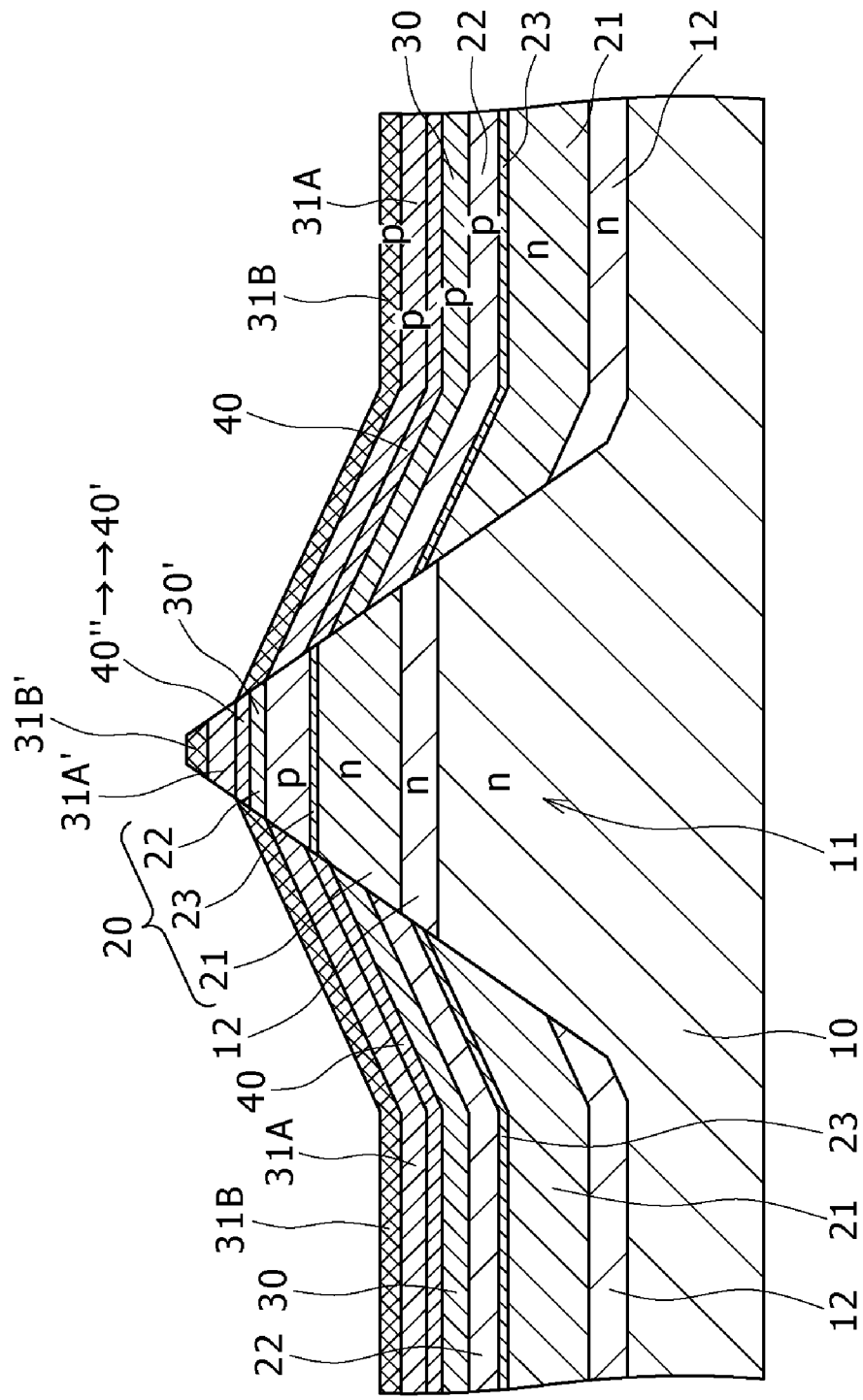
FIG. 38 is a schematic partial sectional view of the substrate and so on (at both the end parts of the semiconductor light emitting device), subsequent to FIG. 36, for explaining the method for manufacturing the semiconductor light emitting device according to the first embodiment.

Subsequently, the first burying layer 31A, the second burying layer 31B, and the contact layer (cap layer) 32 are sequentially formed across the entire surface based on MOCVD. Specifically, if the MOCVD is continued, the first burying layer 31A composed of the compound semiconductor arising from the crystal growth from the recess surface will, in time, completely cover the side surfaces of the light emitting part 20 in the self growth stop state, and, at both the end parts, at least the side surfaces of one layer of the deposited layer 40" stacked above the light emitting part 20. In this state, the growth of the first burying layer 31A is stopped. Subsequently, the second burying layer 31B is grown, so that the entire surface is completely buried by the second burying layer 31B. In this way, the sectional structure shown in FIG. 37 can be obtained at the center part of the light emitting part forming region 11. At both the end parts of the light emitting part forming region 11, the sectional structure shown in FIG. 38 can be obtained. Thereafter, the second electrode 52 is formed on the contact layer 32 based on the vacuum evaporation. Furthermore, the substrate 10 is lapped to a proper thickness from the backside thereof, and then the first electrode 51 is formed based on vacuum evaporation. In this way, the sectional structure shown in FIG. 29 can be obtained at the center part of the light emitting part forming region 11. At both the end parts of the light emitting part forming region 11, the sectional structure shown in FIG. 30 can be obtained.

[Step-140]

Thereafter, the respective semiconductor light emitting devices are separated from each other, so that the semiconductor light emitting devices can be obtained. The semiconductor light emitting devices of the second to ninth embodiments to be described later can also be manufactured based on a method similar to the above-described method basically.

In the burying layer 31 located above the current block layer 40, the impurity for causing the first burying layer 31A to have the second conductivity type is such that the substitution site of the impurity in the first burying layer 31A competes with the substitution site of the impurity in the fourth compound semiconductor layer 44 for causing the fourth compound semiconductor layer 44 to have the second conductivity type. This feature allows ensured prevention of the diffusion of the impurity in the first burying layer 31A into the fourth compound semiconductor layer 44. On the other hand, the impurity for causing the second burying layer 31B to have the second conductivity type is such that the substitution site of the impurity in the second burying layer 31B does not compete with the substitution site of the impurity in the third compound semiconductor layer 43 for causing the third compound semiconductor layer 43 to have the first conductivity type. Therefore, the impurity for causing the second burying layer 31B to have the second conductivity type diffuses into the deposited layer 43" of the third compound semiconductor layer, having the first conductivity type, in the deposited layer 40" formed above the top surface at both the end parts of the light emitting part 20 at the same timing as that of the current block layer. This impurity diffusion turns the deposited layer 43" of the third compound semiconductor layer to the deposited layer 43' of the third compound semiconductor layer, having the second conductivity type. As a result, all of the compound semiconductor layers located above the light emitting part 20 at both the end parts of the light emitting part 20 have the second conductivity type. Therefore, the deposited layer having the same multilayer structure as that of the current block layer 40 does not exist above the top surface of the multilayer structure of the light emitting part 20, and the current injection path to the active layer 23 is not limited to the {111}B side surface (contact surface). This allows ensured avoidance of the occurrence of a problem that the electric resistance is increased and thus the heat generation and the current consumption are increased, and hence a problem that the light emission efficiency of the semiconductor light emitting device is decreased. This basic principle applies also to the second to ninth embodiments to be described later.

In [Step-120], the current block layer 40 composed of the fourth compound semiconductor layer 44 and the third compound semiconductor layer 43 is formed based on MOCVD. The fourth compound semiconductor layer 44 is composed of p-$Al_{0.47}Ga_{0.53}As$:Zn, and the third compound semiconductor layer 43 is composed of n-$Al_{0.47}Ga_{0.53}As$:Si. Specifically, the substitution site of the impurity (Si) for causing the third compound semiconductor layer 43 to have the first conductivity type (n-type) in the third compound semiconductor layer 43 is the site occupied by a group III atom. Furthermore, the substitution site of the impurity (Zn) for causing the fourth compound semiconductor layer 44 to have the second conductivity type (p-type) in the fourth compound semiconductor layer 44 is also the site occupied by a group III atom. That is, the impurity for causing the third compound semiconductor layer 43 to have the first conductivity type is such that the substitution site of the impurity in the third compound semiconductor layer 43 competes with the substitution site of the impurity in the fourth compound semiconductor layer 44 for causing the fourth compound semiconductor layer 44 to have the second conductivity type.

Therefore, when the fourth compound semiconductor layer 44 and the burying layer 31 are deposited after the deposition of the third compound semiconductor layer 43, impurity mutual diffusion between the third compound semiconductor layer 43 and the fourth compound semiconductor layer 44 of the current block layer 40 hardly occurs. In addition, impurity mutual diffusion between the current block layer 40 and the upper and lower layers in contact with the current block layer 40 also hardly occurs. This allows avoidance of the occurrence of a problem that the effect of the current block layer 40 is unstable and thus leakage current is increased due to annihilation or thinning of the current block layer 40.

Moreover, the impurity for causing the first compound semiconductor layer 21 to have the first conductivity type (n-type) is such that the substitution site of the impurity in the first compound semiconductor layer 21 (the site occupied by a group V atom) does not compete with the substitution site of the impurity in the second compound semiconductor layers 22A and 22B (the site occupied by a group III atom) for causing the second compound semiconductor layers 22A and 22B to have the second conductivity type (p-type). Thus, the pn junction control, designed through intentional impurity mutual diffusion between the first compound semiconductor layer 21 and the second compound semiconductor layers 22A and 22B, can be finely designed easily through adjustment of the concentrations and doping positions of the impurities in the respective layers. This allows enhancement in the light emission characteristic.

In the semiconductor light emitting device of the first embodiment, the side parts (side surfaces) of the active layer 23 formed above the light emitting part forming region 11 (projection surface) are covered by the current block layer 40, whose refractive index is lower than that of the active layer 23. Furthermore, the active layer 23 is vertically sandwiched by the first compound semiconductor layer 21 and the second compound semiconductor layers 22A and 22B, whose refractive indexes are lower than that of the active layer 23. Consequently, the upper and lower regions and the side regions of the active layer 23 provide a complete light confinement structure. Moreover, above the recess surface, in the vicinity of the side surface of the active layer 23, a so-called thyristor structure is formed due to the p-n-p-n structure (the p-type burying layer 31-the n-type third compound semiconductor layer 43-the p-type fourth compound semiconductor layer 44, the p-type adjustment layer 30 (the p-type second compound semiconductor layer 22B), and the p-type second compound semiconductor layer 22A-the n-type first compound semiconductor layer 21). Therefore, current flowing above the recess surface is prevented, which focuses the current on the active layer 23 and thus allows lower threshold current. It is also possible to regard the p-type adjustment layer 30 as the p-type fourth compound semiconductor layer 44 or the p-type second compound semiconductor layer 22B. This applies also to the second, fifth, and sixth embodiments to be described later.

Although FIGS. 29 and 30 show the structure in which the end surfaces of the current block layer 40 are in contact with the side surfaces of the active layer 23, the end surfaces of the current block layer 40 may be in contact with the side surfaces of the second compound semiconductor layers 22A and 22B, or may be in contact with the side surfaces of the first compound semiconductor layer 21. Also with this structure, leakage current can be suppressed in practical use. However, regarding the positions of the end surfaces of the current block layer 40 in contact with the light emitting part 20, it is desirable that at least a part of the current block layer 40 be in contact with the side surface of the active layer 23. This applies also to the second to ninth embodiments to be described later.

Second Embodiment

The second embodiment is a modification of the first embodiment, and relates to the (1-B)-th mode of the present invention and the (2-B)-th mode of the present invention.

Figure 2A:
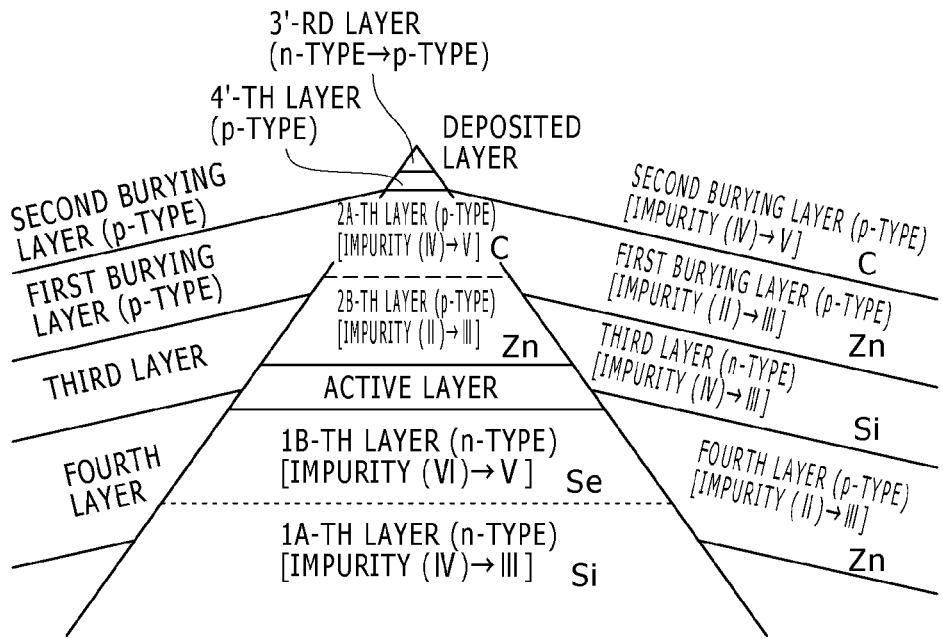
FIGS. 2A and 2B are conceptual diagrams of a semiconductor light emitting device according to a second embodiment of the present invention.
Figure 2B:
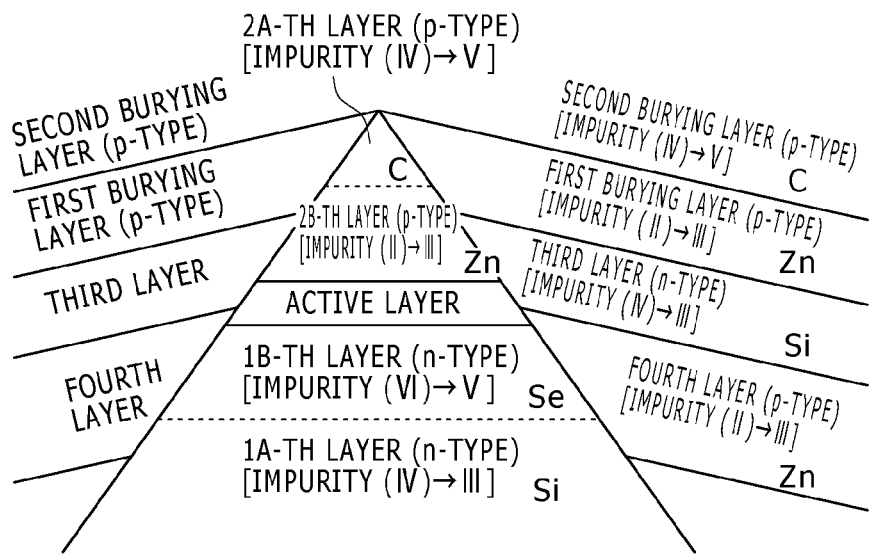

Specifically, as shown in FIG. 2A as a conceptual diagram of the end parts of the light emitting part and FIG. 2B as a conceptual diagram of the center part of the light emitting part, when the semiconductor light emitting device of the second embodiment is represented based on the (1-B)-th mode of the present invention, in the semiconductor light emitting device of the second embodiment, a first compound semiconductor layer, a second compound semiconductor layer, a third compound semiconductor layer, a fourth compound semiconductor layer, a first burying layer, and a second burying layer are composed of a III-V compound semiconductor, the first compound semiconductor layer is composed of a 1A-th compound semiconductor layer and a 1B-th compound semiconductor layer that is provided on the 1A-th compound semiconductor layer and is in contact with an active layer, the second compound semiconductor layer is composed of a 2B-th compound semiconductor layer in contact with the active layer and a 2A-th compound semiconductor layer provided on the 2B-th compound semiconductor layer, the substitution site of the impurity in the 1A-th compound semiconductor layer is the site occupied by a group III atom, the substitution site of the impurity in the 1B-th compound semiconductor layer is the site occupied by a group V atom, the substitution site of the impurity in the 2B-th compound semiconductor layer is the site occupied by a group III atom, the substitution site of the impurity in the 2A-th compound semiconductor layer is the site occupied by a group V atom, the substitution site of the impurity in the third compound semiconductor layer and the substitution site of the impurity in the fourth compound semiconductor layer are the site occupied by a group III atom, the substitution site of the impurity in the first burying layer is the site occupied by a group III atom, and the substitution site of the impurity in the second burying layer is the site occupied by a group V atom.

Furthermore, when the semiconductor light emitting device of the second embodiment is represented based on the (2-B)-th mode of the present invention, in the semiconductor light emitting device of the second embodiment, the first compound semiconductor layer, the second compound semiconductor layer, the third compound semiconductor layer, the fourth compound semiconductor layer, the first burying layer, and the second burying layer are composed of a III-V compound semiconductor, the first compound semiconductor layer is composed of the 1A-th compound semiconductor layer and the 1B-th compound semiconductor layer that is provided on the 1A-th compound semiconductor layer and is in contact with the active layer, the second compound semiconductor layer is composed of the 2B-th compound semiconductor layer in contact with the active layer and the 2A-th compound semiconductor layer provided on the 2B-th compound semiconductor layer, the impurity for causing the 1A-th compound semiconductor layer to be the n-type as the first conductivity type is a group IV impurity, the impurity for causing the 1B-th compound semiconductor layer to be the n-type as the first conductivity type is a group VI impurity, the impurity for causing the 2B-th compound semiconductor layer to be the p-type as the second conductivity type is a group II impurity, the impurity for causing the 2A-th compound semiconductor layer to be the p-type as the second conductivity type is carbon (C), the impurity for causing the third compound semiconductor layer to be the n-type as the first conductivity type is a group IV impurity, the impurity for causing the fourth compound semiconductor layer to be the p-type as the second conductivity type is a group II impurity, the impurity for causing the first burying layer to be the p-type as the second conductivity type is a group II impurity, and the impurity for causing the second burying layer to be the p-type as the second conductivity type is carbon (C).

More specifically, in the semiconductor light emitting device of the second embodiment, the respective layers have the configuration shown in Table 2A or Table 2B shown below. In the example shown in Table 2A, the third compound semiconductor layer is stacked on the fourth compound semiconductor layer. In the example shown in Table 2B, the fourth compound semiconductor layer is stacked on the third compound semiconductor layer.

TABLE 2A (Configuration of light emitting part)

| | |
|---|---|
| 2A-th compound semiconductor layer | p-$Al_{0.4}Ga_{0.6}As$: C |
| 2B-th compound semiconductor layer | p-$Al_{0.4}Ga_{0.6}As$: Zn |
| Active layer | [Active layer - A] |
| 1B-th compound semiconductor layer | n-$Al_{0.4}Ga_{0.6}As$: Se |
| 1A-th compound semiconductor layer | n-$Al_{0.4}Ga_{0.6}As$: Si |
| (Current block layer) | |
| Second burying layer | p-$Al_{0.47}Ga_{0.53}As$: C |
| First burying layer | p-$Al_{0.47}Ga_{0.53}As$: Zn |
| Third compound semiconductor layer | n-$Al_{0.47}Ga_{0.53}As$: Si |
| Fourth compound semiconductor layer | p-$Al_{0.47}Ga_{0.53}As$: Zn |
| Adjustment layer | p-$Al_{0.47}Ga_{0.53}As$: Zn |
| (Whole) | |
| Contact layer | p-GaAs: Zn (or C) |

(Note 1)
The adjustment layer is formed subsequently to the 2A-th compound semiconductor layer.

(Note 2)
The fourth compound semiconductor layer is formed subsequently to the adjustment layer in a continuous manner, and a boundary does not exist between the fourth compound semiconductor layer and the adjustment layer substantially.

(Note 3)
It is also possible to consider that a fifth compound semiconductor layer composed of p-$Al_{0.47}Ga_{0.53}As$: Zn is formed between the third compound semiconductor layer and the first burying layer (the partial portion of the first burying layer in the vicinity of the interface with the third compound semiconductor layer corresponds to this fifth compound semiconductor layer).

TABLE 2B (Configuration of light emitting part)

| | |
|---|---|
| 2A-th compound semiconductor layer | p-$Al_{0.4}Ga_{0.6}As$: C |
| 2B-th compound semiconductor layer | p-$Al_{0.4}Ga_{0.6}As$: Zn |
| Active layer | [Active layer - A] |
| 1B-th compound semiconductor layer | n-$Al_{0.4}Ga_{0.6}As$: Se |
| 1A-th compound semiconductor layer | n-$Al_{0.4}Ga_{0.6}As$: Si |
| (Current block layer) | |
| Second burying layer | p-$Al_{0.47}Ga_{0.53}As$: C |
| First burying layer | p-$Al_{0.47}Ga_{0.53}As$: Zn |
| Fourth compound semiconductor layer | p-$Al_{0.47}Ga_{0.53}As$: Zn |

TABLE 2B-continued

| Third compound semiconductor layer | n-Al$_{0.47}$Ga$_{0.53}$As: Si |
|---|---|
| Adjustment layer (Whole) | p-Al$_{0.47}$Ga$_{0.53}$As: Zn |
| Contact layer | p-GaAs: Zn (or C) |

(Note 1)
The adjustment layer is formed subsequently to the 2A-th compound semiconductor layer.
(Note 2)
The first burying layer is formed subsequently to the fourth compound semiconductor layer in a continuous manner, and a boundary does not exist between the first burying layer and the fourth compound semiconductor layer substantially.

In the second embodiment, the substitution site of the impurity in the 1A-th compound semiconductor layer is the site occupied by a group III atom, and the substitution site of the impurity in the fourth compound semiconductor layer is also the site occupied by a group III atom. Furthermore, the substitution site of the impurity in the third compound semiconductor layer in contact with the fourth compound semiconductor layer is also the site occupied by a group III atom. Specifically, the impurity for causing the 1A-th compound semiconductor layer to have the first conductivity type (n-type) is such that the substitution site of the impurity in the 1A-th compound semiconductor layer (the site occupied by a group III atom) competes with the substitution site of the impurity in the fourth compound semiconductor layer (the site occupied by a group III atom) for causing the fourth compound semiconductor layer to have the second conductivity type (p-type), and competes also with the substitution site of the impurity for causing the third compound semiconductor layer in contact with the fourth compound semiconductor layer to have the first conductivity type (n-type) (the site occupied by a group III atom). Therefore, when the fourth compound semiconductor layer is deposited, impurity mutual diffusion hardly occurs between the fourth compound semiconductor layer of the current block layer and the 1A-th compound semiconductor layer, and between the fourth compound semiconductor layer and the third compound semiconductor layer. Thus, the current block layer having high reliability can be formed. The suppression of the impurity mutual diffusion in the current block layer composed of the fourth compound semiconductor layer and the third compound semiconductor layer is effective for the {311}B plane and the high-order plane. On the other hand, the suppression of the impurity mutual diffusion across the interface between the fourth compound semiconductor layer and the 1A-th compound semiconductor layer is effective for the {111}B plane interface.

Third Embodiment

The third embodiment is also a modification of the first embodiment, and relates to the (1-C)-th mode of the present invention, the (2-C)-th mode of the present invention, and the (4-A)-th mode of the present invention. In the third embodiment and the fourth embodiment to be described later, the conductivity types are reversed from those in the first embodiment. That is, in the third embodiment and the fourth embodiment to be described later, the first conductivity type is the p-type and the second conductivity type is the n-type.

Figure 3A:
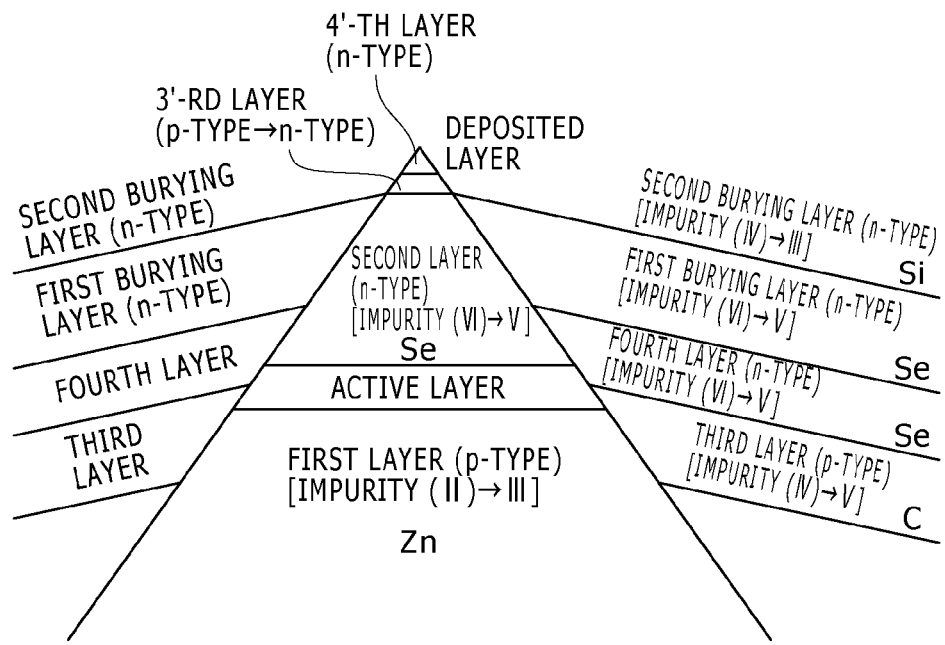
FIGS. 3A and 3B are conceptual diagrams of a semiconductor light emitting device according to a third embodiment of the present invention.
Figure 3B:
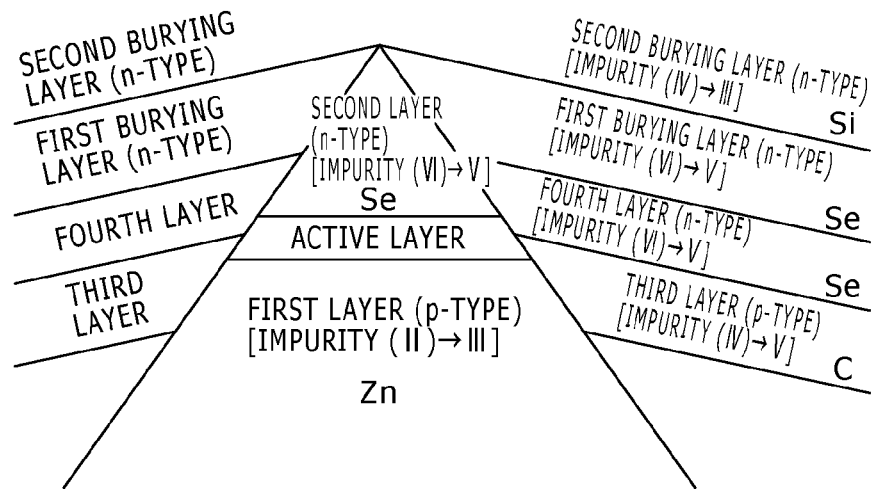
Figure 39:
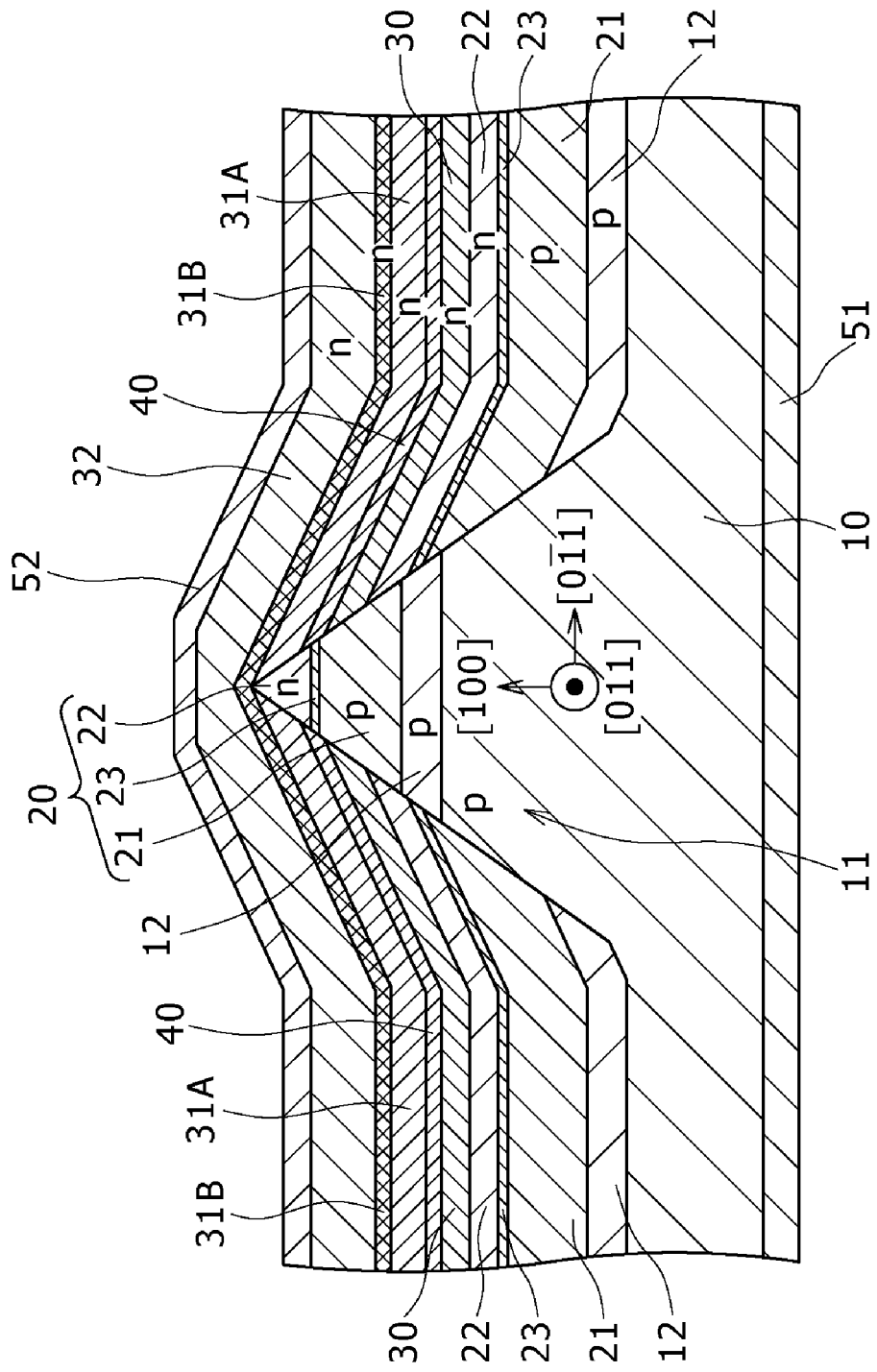
FIG. 39 is a schematic partial sectional view of the center part of the semiconductor light emitting device according to the third embodiment.
Figure 40:
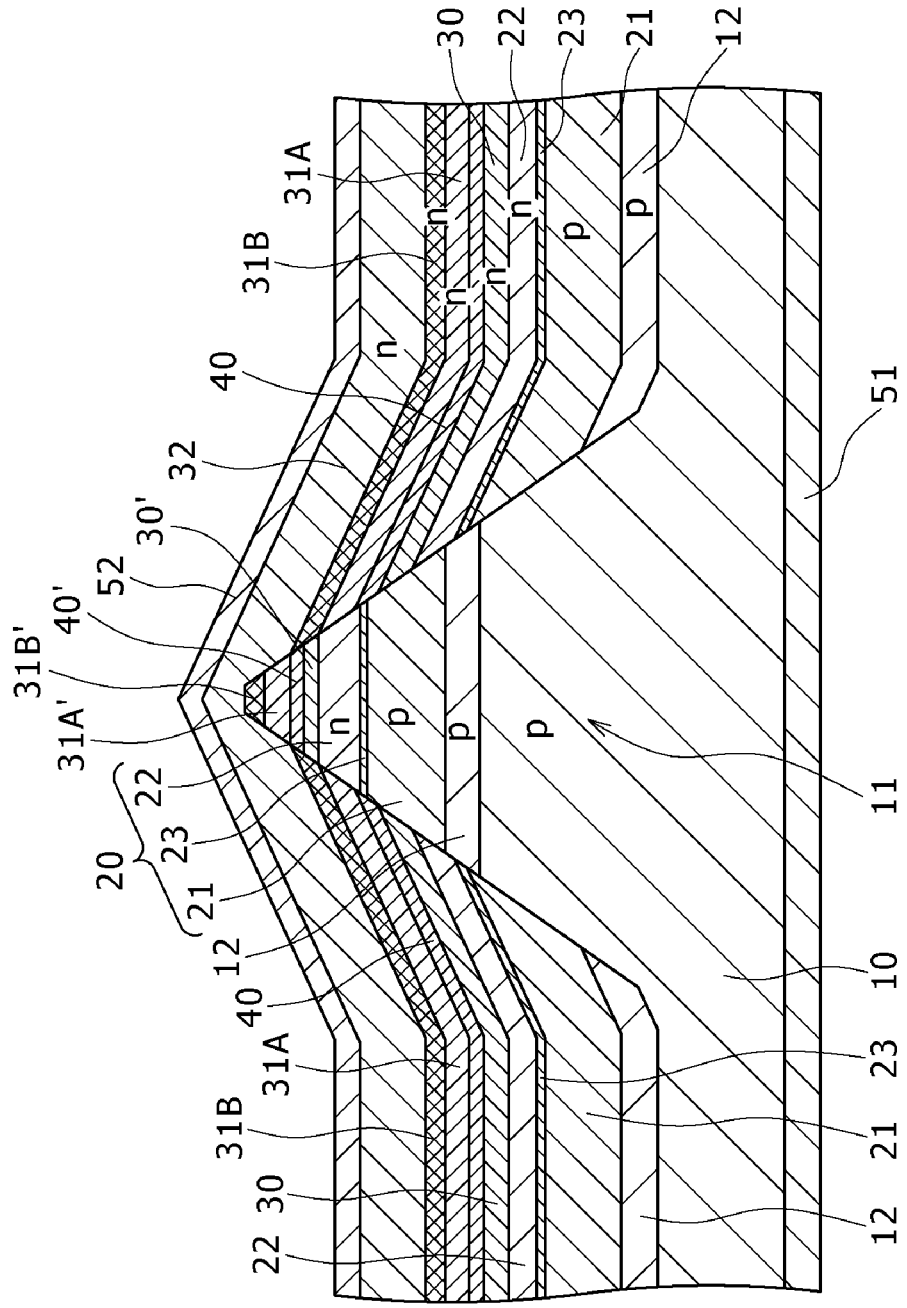
FIG. 40 is a schematic partial sectional view of both the end parts of the semiconductor light emitting device according to the third embodiment.
Figure 41A:
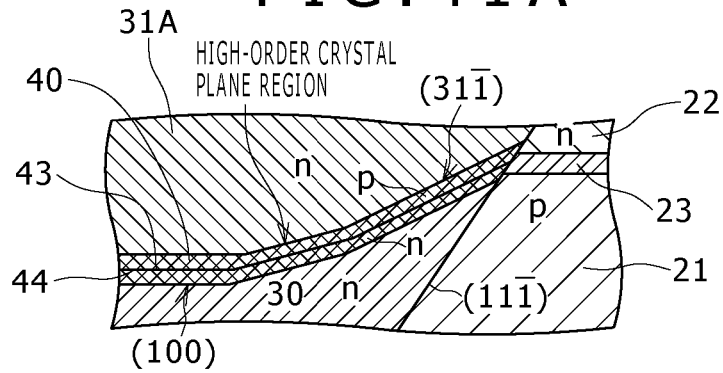
FIGS. 41A to 41C are enlarged schematic partial sectional views of the semiconductor light emitting device according to the third embodiment.
Figure 41B:
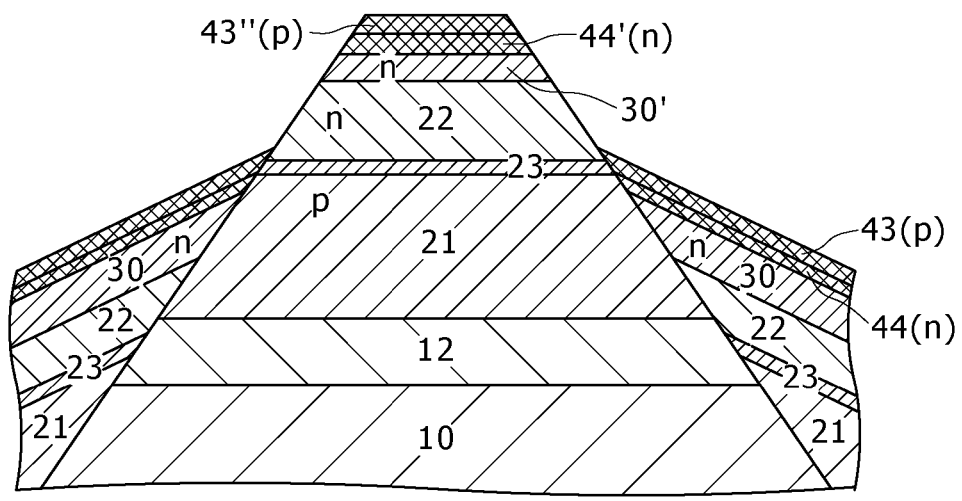
Figure 41C:
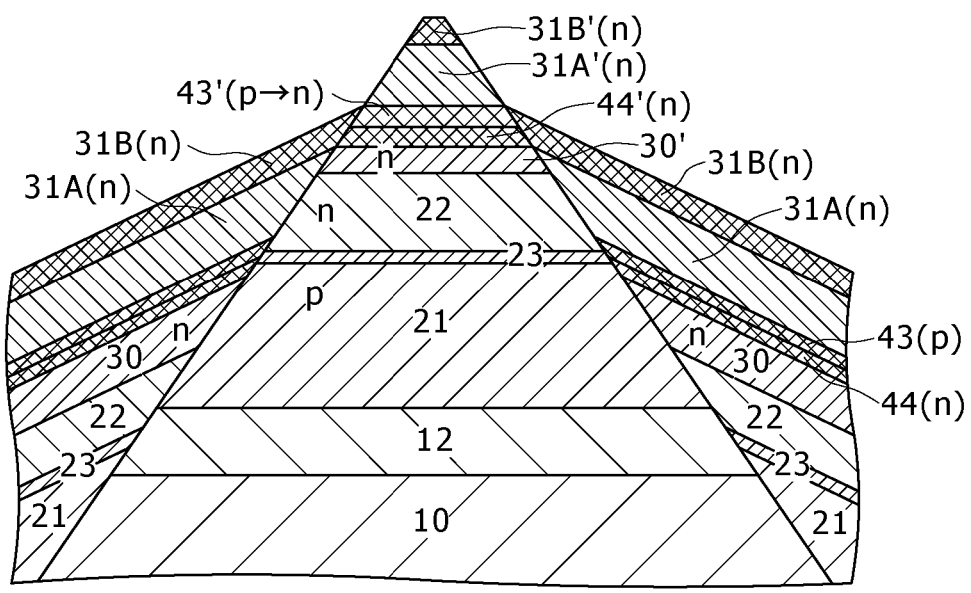

Specifically, a conceptual diagram of the light emitting part at the end parts is shown in FIG. 3A. A conceptual diagram of the light emitting part at the center part is shown in FIG. 3B. Schematic partial sectional views are shown in FIGS. 39 and 40. Enlarged schematic partial sectional views are shown in FIGS. 41A to 41C. FIG. 39 is a schematic partial sectional view of the center part of the semiconductor light emitting device. FIG. 40 is a schematic partial sectional view of the end parts of the semiconductor light emitting device. FIG. 41A is an enlarged schematic partial sectional view of a current block layer and the periphery thereof. FIGS. 41B and 41C are enlarged schematic partial sectional views of the light emitting part and the periphery thereof at the end parts of the semiconductor light emitting device.

When the semiconductor light emitting device of the third embodiment is represented based on the (1-C)-th mode of the present invention, in the semiconductor light emitting device of the third embodiment, a first compound semiconductor layer 21, second compound semiconductor layers 22A and 22B, a current block layer 40 (a third compound semiconductor layer 43 and a fourth compound semiconductor layer 44), a first burying layer, and a second burying layer are composed of a III-V compound semiconductor, the substitution site of the impurity in the first compound semiconductor layer 21 is the site occupied by a group III atom, the substitution site of the impurity in the second compound semiconductor layers 22A and 22B is the site occupied by a group V atom, the substitution site of the impurity in the third compound semiconductor layer 43 and the substitution site of the impurity in the fourth compound semiconductor layer 44 are the site occupied by a group V atom, the substitution site of the impurity in the first burying layer is the site occupied by a group V atom, and the substitution site of the impurity in the second burying layer is the site occupied by a group III atom.

Furthermore, when the semiconductor light emitting device of the third embodiment is represented based on the (2-C)-th mode of the present invention, in the semiconductor light emitting device of the third embodiment, the first compound semiconductor layer 21, the second compound semiconductor layers 22A and 22B, the current block layer 40 (the third compound semiconductor layer 43 and the fourth compound semiconductor layer 44), the first burying layer, and the second burying layer are composed of a III-V compound semiconductor, the impurity for causing the first compound semiconductor layer 21 to be the p-type as the first conductivity type is a group II impurity, the impurity for causing the third compound semiconductor layer 43 to be the p-type as the first conductivity type is carbon (C), the impurity for causing the first burying layer to be the n-type as the second conductivity type is a group VI impurity, and the impurity for causing the second burying layer to be the n-type as the second conductivity type is a group IV impurity.

Furthermore, when the semiconductor light emitting device of the third embodiment is represented based on the (4-A)-th mode of the present invention, in the semiconductor light emitting device of the third embodiment, the impurity for causing the first compound semiconductor layer 21 to have the first conductivity type (p-type) is different from the impurity for causing the third compound semiconductor layer 43 to have the first conductivity type (p-type).

More specifically, in the semiconductor light emitting device of the third embodiment, the respective layers have the configuration shown in Table 3A or Table 3B shown below. In the example shown in Table 3A, the third compound semiconductor layer 43 is stacked on the fourth compound semiconductor layer 44. In the example shown in Table 3B, the fourth compound semiconductor layer 44 is stacked on the third compound semiconductor layer 43.

TABLE 3A (Configuration of light emitting part)

| | |
|---|---|
| Second compound semiconductor layer 22B | n-$Al_{0.47}Ga_{0.53}As$: Se |
| Second compound semiconductor layer 22A | n-$Al_{0.4}Ga_{0.6}As$: Se |
| Active layer 23 | [Active layer - B] |
| First compound semiconductor layer 21 | p-$Al_{0.4}Ga_{0.6}As$: Zn |
| (Current block layer) | |
| Second burying layer 31B | n-$Al_{0.47}Ga_{0.53}As$: Si |
| First burying layer 31A | n-$Al_{0.47}Ga_{0.53}As$: Se |
| Third compound semiconductor layer 43 | p-$Al_{0.47}Ga_{0.53}As$: C |
| Fourth compound semiconductor layer 44 | n-$Al_{0.47}Ga_{0.53}As$: Se |
| Adjustment layer 30 | n-$Al_{0.47}Ga_{0.53}As$: Se |
| (Whole) | |
| Contact layer 32 | n-GaAs: Se (or Si) |

(Note 1)
The adjustment layer 30 is formed subsequently to the second compound semiconductor layer 22B.
(Note 2)
The fourth compound semiconductor layer 44 is formed subsequently to the adjustment layer 30 in a continuous manner, and a boundary does not exist between the fourth compound semiconductor layer 44 and the adjustment layer 30 substantially.
(Note 3)
It is also possible to consider that a fifth compound semiconductor layer composed of n-$Al_{0.47}Ga_{0.53}As$: Se is formed between the third compound semiconductor layer 43 and the first burying layer 31A (the partial portion of the first burying layer 31A in the vicinity of the interface with the third compound semiconductor layer 43 corresponds to this fifth compound semiconductor layer).

TABLE 3B (Configuration of light emitting part)

| | |
|---|---|
| Second compound semiconductor layer 22B | n-$Al_{0.47}Ga_{0.53}As$: Se |
| Second compound semiconductor layer 22A | n-$Al_{0.4}Ga_{0.6}As$: Se |
| Active layer 23 | [Active layer - B] |
| First compound semiconductor layer 21 | p-$Al_{0.4}Ga_{0.6}As$: Zn |
| (Current block layer) | |
| Second burying layer 31B | n-$Al_{0.47}Ga_{0.53}As$: Si |
| First burying layer 31A | n-$Al_{0.47}Ga_{0.53}As$: Se |
| Fourth compound semiconductor layer 44 | n-$Al_{0.47}Ga_{0.53}As$: Se |
| Third compound semiconductor layer 43 | p-$Al_{0.47}Ga_{0.53}As$: C |
| Adjustment layer 30 | n-$Al_{0.47}Ga_{0.53}As$: Se |
| (Whole) | |
| Contact layer 32 | n-GaAs: Se (or Si) |

(Note 1)
The adjustment layer 30 is formed subsequently to the second compound semiconductor layer 22B.
(Note 2)
The first burying layer 31A is formed subsequently to the fourth compound semiconductor layer 44 in a continuous manner, and a boundary does not exist between the first burying layer 31A and the fourth compound semiconductor layer 44 substantially.

Also in the third embodiment, at the timing when the formation of a light emitting part 20 is completed in a step similar to [Step-130] of the first embodiment, the sectional shape of the light emitting part 20 obtained when the center part of the light emitting part 20 is cut along a virtual plane perpendicular to the axis line of the light emitting part 20 is a triangle. At this time, the sectional shape of the light emitting part 20 obtained when the end part of the light emitting part 20 is cut along a virtual plane perpendicular to the axis line of the light emitting part 20 is a trapezoid. Therefore, in the formation of the current block layer 40 (the fourth compound semiconductor layer 44 and the third compound semiconductor layer 43), the current block layer 40 is formed only on the side surfaces of the light emitting part 20 at the center part of the light emitting part 20. At this time, at the end parts of the light emitting part 20, in addition to the formation of the current block layer 40 on the side surfaces of the light emitting part 20, a deposited layer 40″ having the same multilayer structure as that of the current block layer 40 is formed above the top surface of the light emitting part 20. Subsequently to the formation of the current block layer 40, the first burying layer 31A is so formed as to cover the side surfaces of the light emitting part 20 and the side surfaces of at least one layer of the deposited layer 40″ stacked above the light emitting part 20, at both the end parts in particular. Subsequently, at the timing of the completion of the covering of at least the side surfaces of the light emitting part 20 and the side surfaces of a compound semiconductor layer 30′ by the first burying layer 31A, the formation of the second burying layer 31B is started, so that the entire surface is covered by the second burying layer 31B. If a compound semiconductor layer of the first conductivity type is included in the deposited layer 40″ particularly as above, it is desirable that the burying layer 31 of the second conductivity type (e.g. the burying layer 31B) whose impurity substitution site does not compete with the impurity substitution site in this compound semiconductor layer of the first conductivity type included in the deposited layer 40″ be in contact with at least a part of the side surface of the deposited layer 40″. This structure allows the impurity of the second conductivity type in the burying layer 31 (e.g. the burying layer 31B) to diffuse from the at least a part of the side surface of the deposited layer 40″. This makes it possible to initially carry out conductivity type compensation for the compound semiconductor layer of the first conductivity type that is included in the deposited layer 40″ and causes the current blocking, and thus turn this compound semiconductor layer of the first conductivity type to a layer of the second conductivity type. At this time, the impurity for causing the second burying layer 31B to have the second conductivity type is such that the substitution site of the impurity in the second burying layer 31B (the site occupied by a group III atom, in the third embodiment) does not compete with the substitution site of the impurity in the third compound semiconductor layer (the site occupied by a group V atom, in the third embodiment) for causing the third compound semiconductor layer 43 to have the first conductivity type (see Table 3A or Table 3B). Therefore, e.g. the impurity for causing the second burying layer 31B that is deposited to a large thickness so that the apex may be finally covered to have the second conductivity type diffuses into a deposited layer 43″ of the third compound semiconductor layer, having the first conductivity type and formed above the top surface at both the end parts of the light emitting part 20. This diffusion turns the deposited layer 43″ of the third compound semiconductor layer to a deposited layer 43′ of the third compound semiconductor layer, having the second conductivity type. As a result, all of the compound semiconductor layers located above the light emitting part 20 at both the end parts of the light emitting part 20 have the second conductivity type. Therefore, the deposited layer having the same multilayer structure as that of the current block layer 40 does not exist above the top surface of the multilayer structure of the light emitting part 20, and the current injection path to the active layer is not limited to the {111}B side surface (contact surface). This allows ensured avoidance of the occurrence of a problem that the electric resistance is increased and thus the heat generation and the current consumption are increased, and hence a problem that the light emission efficiency of the semiconductor light emitting device is decreased.

Also in the third embodiment, in a step similar to [Step-120] of the first embodiment, e.g. the adjustment layer 30 and the current block layer 40 composed of the fourth compound semiconductor layer 44 and the third compound semiconductor layer 43 are sequentially formed based on MOCVD. The third compound semiconductor layer 43 is composed of p-Al$_{0.47}$Ga$_{0.53}$As:C, and the fourth compound semiconductor layer 44 is composed of n-Al$_{0.47}$Ga$_{0.53}$As:Se. Specifically, the substitution site of the impurity (C) for causing the third compound semiconductor layer 43 to have the first conductivity type (p-type) in the third compound semiconductor layer 43 is the site occupied by a group V atom. Furthermore, the substitution site of the impurity (Se) for causing the fourth compound semiconductor layer 44 to have the second conductivity type (n-type) in the fourth compound semiconductor layer 44 is also the site occupied by a group V atom. That is, the impurity for causing the third compound semiconductor layer 43 to have the first conductivity type is such that the substitution site of the impurity in the third compound semiconductor layer 43 competes with the substitution site of the impurity in the fourth compound semiconductor layer 44 for causing the fourth compound semiconductor layer 44 to have the second conductivity type.

Therefore, when the fourth compound semiconductor layer 44 is deposited after the deposition of the third compound semiconductor layer 43, or when the third compound semiconductor layer 43 is deposited after the deposition of the fourth compound semiconductor layer 44, impurity mutual diffusion between the third compound semiconductor layer 43 and the fourth compound semiconductor layer 44 of the current block layer 40 hardly occurs. This allows avoidance of the occurrence of a problem that the effect of the current block layer 40 is unstable and thus leakage current is increased due to annihilation or thinning of the current block layer 40.

Moreover, the impurity for causing the first compound semiconductor layer 21 to have the first conductivity type (p-type) is such that the substitution site of the impurity in the first compound semiconductor layer 21 (the site occupied by a group III atom) does not compete with the substitution site of the impurity in the second compound semiconductor layers 22A and 22B (the site occupied by a group V atom) for causing the second compound semiconductor layers 22A and 22B to have the second conductivity type (n-type). Thus, the pn junction control, designed through intentional impurity mutual diffusion between the first compound semiconductor layer 21 and the second compound semiconductor layers 22A and 22B, can be finely designed easily through adjustment of the concentrations and doping positions of the impurities in the respective layers. This allows enhancement in the light emission characteristic.

Also in the semiconductor light emitting device of the third embodiment, the side parts (side surfaces) of the active layer 23 formed above the light emitting part forming region 11 (projection surface) are covered by the current block layer 40, whose refractive index is lower than that of the active layer 23. Furthermore, the active layer 23 is vertically sandwiched by the first compound semiconductor layer 21 and the second compound semiconductor layers 22A and 22B, whose refractive indexes are lower than that of the active layer 23. Consequently, the upper and lower regions and the side regions of the active layer 23 provide a complete light confinement structure. Moreover, above the recess surface, in the vicinity of the side surface of the active layer 23, a so-called thyristor structure is formed due to the n-p-n-p structure (the n-type burying layer 31-the p-type third compound semiconductor layer 43-the n-type fourth compound semiconductor layer 44-the n-type adjustment layer 30 (the n-type second compound semiconductor layer 22B) and the n-type second compound semiconductor layer 22A-the p-type first compound semiconductor layer 21). Therefore, current flowing above the recess surface is prevented, which focuses the current on the active layer 23 and thus allows lower threshold current. It is also possible to regard the n-type adjustment layer 30 as the n-type fourth compound semiconductor layer 44 or the n-type second compound semiconductor layer 22B. This applies also to the fourth, seventh, and eighth embodiments to be described later.

In the MOCVD at the time of the deposition of the third compound semiconductor layer 43, a methyl group or an ethyl group obtained through decomposition of the source gas for a group III atom may be intentionally used as the source gas for the addition of carbon (C). Alternatively, in the MOCVD at the time of the deposition of the third compound semiconductor layer 43, a CBr$_4$ or a CCl$_4$ gas may be added.

Fourth Embodiment

The fourth embodiment is a modification of the first embodiment and the third embodiment, and relates to the (1-D)-th mode of the present invention and the (2-D)-th mode of the present invention.

Figure 4A:
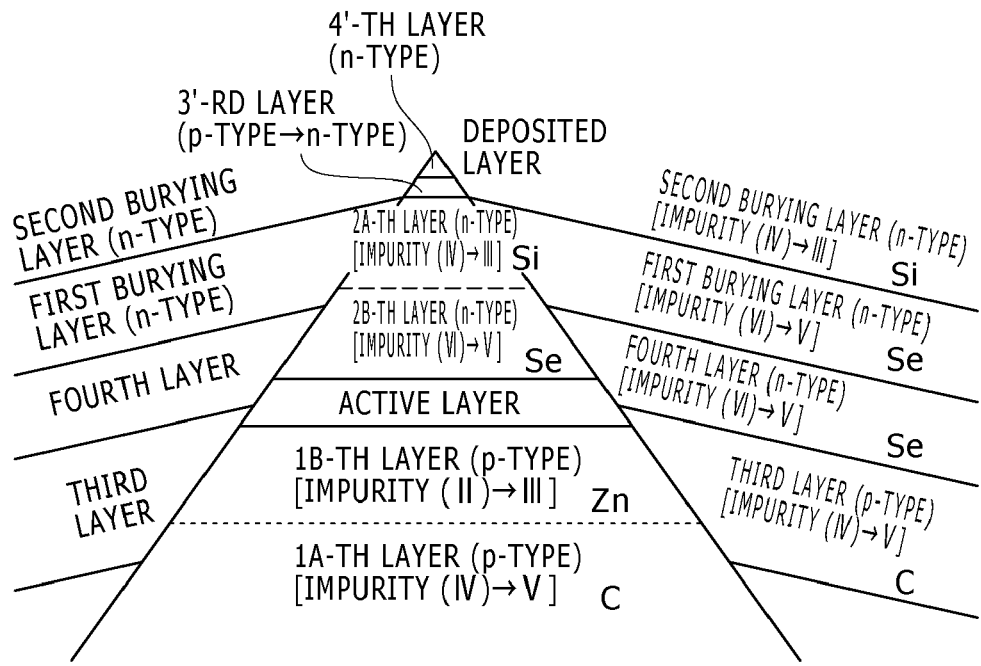
FIGS. 4A and 4B are conceptual diagrams of a semiconductor light emitting device according to a fourth embodiment of the present invention.
Figure 4B:
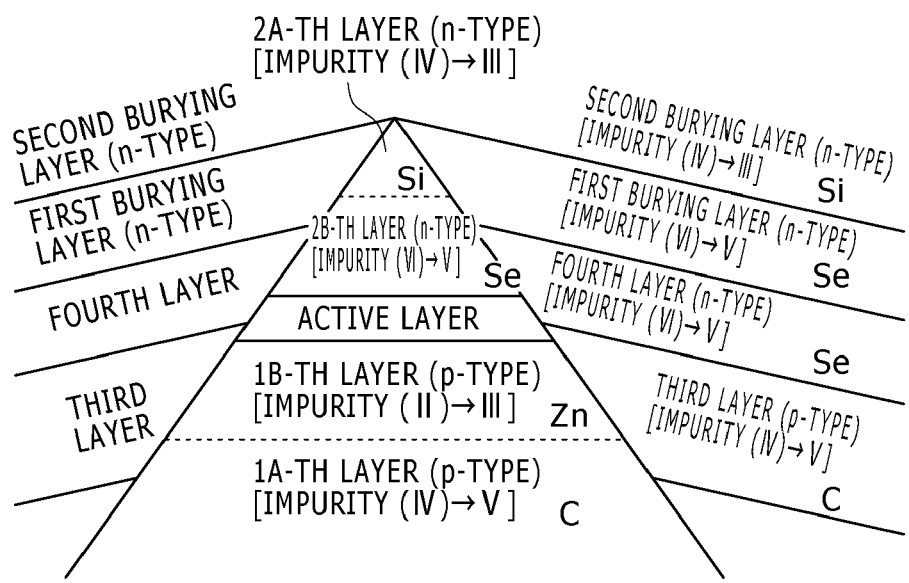

Specifically, as shown in FIG. 4A as a conceptual diagram of the end parts of the light emitting part and FIG. 4B as a conceptual diagram of the center part of the light emitting part, when the semiconductor light emitting device of the fourth embodiment is represented based on the (1-D)-th mode of the present invention, in the semiconductor light emitting device of the fourth embodiment, a first compound semiconductor layer, a second compound semiconductor layer, a third compound semiconductor layer, a fourth compound semiconductor layer, a first burying layer, and a second burying layer are composed of a III-V compound semiconductor, the first compound semiconductor layer is composed of a 1A-th compound semiconductor layer and a 1B-th compound semiconductor layer that is provided on the 1A-th compound semiconductor layer and is in contact with an active layer, the second compound semiconductor layer is composed of a 2B-th compound semiconductor layer in contact with the active layer and a 2A-th compound semiconductor layer provided on the 2B-th compound semiconductor layer, the substitution site of the impurity in the 1A-th compound semiconductor layer is the site occupied by a group V atom, the substitution site of the impurity in the 1B-th compound semiconductor layer is the site occupied by a group III atom, the substitution site of the impurity in the 2B-th compound semiconductor layer is the site occupied by a group V atom, the substitution site of the impurity in the 2A-th compound semiconductor layer is the site occupied by a group III atom, the substitution site of the impurity in the third compound semiconductor layer and the substitution site of the impurity in the fourth compound semiconductor layer are the site occupied by a group V atom, the substitution site of the impurity in the first burying layer is the site occupied by a group V atom, and the substitution site of the impurity in the second burying layer is the site occupied by a group III atom.

Furthermore, when the semiconductor light emitting device of the fourth embodiment is represented based on the (2-D)-th mode of the present invention, in the semiconductor light emitting device of the fourth embodiment, the first compound semiconductor layer, the second compound semiconductor layer, the third compound semiconductor layer, the fourth compound semiconductor layer, the first burying layer, and the second burying layer are composed of a III-V compound semiconductor, the first compound semiconductor layer is composed of the 1A-th compound semiconductor layer and the 1B-th compound semiconductor layer that is provided on the 1A-th compound semiconductor layer and is in contact with the active layer, the second compound semiconductor layer is composed of the 2B-th compound semiconductor layer in contact with the active layer and the 2A-th compound semiconductor layer provided on the 2B-th compound semiconductor layer, the impurity for causing the 1A-th compound semiconductor layer to be the p-type as the first conductivity type is carbon (C), the impurity for causing the 1B-th compound semiconductor layer to be the p-type as the first conductivity type is a group II impurity, the impurity for causing the 2B-th compound semiconductor layer to be the n-type as the second conductivity type is a group VI impurity, the impurity for causing the 2A-th compound semiconductor layer to be the n-type as the second conductivity type is a group IV impurity, the impurity for causing the third compound semiconductor layer to be the p-type as the first conductivity type is carbon (C), the impurity for causing the fourth compound semiconductor layer to be the n-type as the second conductivity type is a group VI impurity, the impurity for causing the first burying layer to be the n-type as the second conductivity type is a group VI impurity, and the impurity for causing the second burying layer to be the n-type as the second conductivity type is a group IV impurity.

More specifically, in the semiconductor light emitting device of the fourth embodiment, the respective layers have the configuration shown in Table 4A or Table 4B shown below. In the example shown in Table 4A, the third compound semiconductor layer is stacked on the fourth compound semiconductor layer. In the example shown in Table 4B, the fourth compound semiconductor layer is stacked on the third compound semiconductor layer.

TABLE 4A (Configuration of light emitting part)

| | |
|---|---|
| 2A-th compound semiconductor layer | n-$Al_{0.4}Ga_{0.6}As$: Si |
| 2B-th compound semiconductor layer | n-$Al_{0.4}Ga_{0.6}As$: Se |
| Active layer | [Active layer - B] |
| 1B-th compound semiconductor layer | p-$Al_{0.4}Ga_{0.6}As$: Zn |
| 1A-th compound semiconductor layer | p-$Al_{0.4}Ga_{0.6}As$: C |
| (Current block layer) | |
| Second burying layer | n-$Al_{0.47}Ga_{0.53}As$: Si |
| First burying layer | n-$Al_{0.47}Ga_{0.53}As$: Se |
| Third compound semiconductor layer | p-$Al_{0.47}Ga_{0.53}As$: C |
| Fourth compound semiconductor layer | n-$Al_{0.47}Ga_{0.53}As$: Se |
| Adjustment layer | n-$Al_{0.47}Ga_{0.53}As$: Se |
| (Whole) | |
| Contact layer | n-GaAs: Se (or Si) |

(Note 1)
The adjustment layer is formed subsequently to the 2A-th compound semiconductor layer.
(Note 2)
The fourth compound semiconductor layer is formed subsequently to the adjustment layer in a continuous manner, and a boundary does not exist between the fourth compound semiconductor layer and the adjustment layer substantially.
(Note 3)
It is also possible to consider that a fifth compound semiconductor layer composed of n-$Al_{0.47}Ga_{0.53}As$: Se is formed between the third compound semiconductor layer and the first burying layer (the partial portion of the first burying layer in the vicinity of the interface with the third compound semiconductor layer corresponds to this fifth compound semiconductor layer).

TABLE 4B (Configuration of light emitting part)

| | |
|---|---|
| 2A-th compound semiconductor layer | n-$Al_{0.4}Ga_{0.6}As$: Si |
| 2B-th compound semiconductor layer | n-$Al_{0.4}Ga_{0.6}As$: Se |
| Active layer | [Active layer - B] |
| 1B-th compound semiconductor layer | p-$Al_{0.4}Ga_{0.6}As$: Zn |
| 1A-th compound semiconductor layer | p-$Al_{0.4}Ga_{0.6}As$: C |
| (Current block layer) | |
| Second burying layer | n-$Al_{0.47}Ga_{0.53}As$: Si |
| First burying layer | n-$Al_{0.47}Ga_{0.53}As$: Se |
| Fourth compound semiconductor layer | n-$Al_{0.47}Ga_{0.53}As$: Se |
| Third compound semiconductor layer | p-$Al_{0.47}Ga_{0.53}As$: C |
| Adjustment layer | n-$Al_{0.47}Ga_{0.53}As$: Se |
| (Whole) | |
| Contact layer | n-GaAs: Se (or Si) |

(Note 1)
The adjustment layer is formed subsequently to the 2A-th compound semiconductor layer.
(Note 2)
The first burying layer is formed subsequently to the fourth compound semiconductor layer in a continuous manner, and a boundary does not exist between the first burying layer and the fourth compound semiconductor layer substantially.

In the fourth embodiment, if a multilayer structure that includes the fourth compound semiconductor layer as the lower layer and the third compound semiconductor layer as the upper layer as shown in Table 4B is formed unlike the example shown in FIGS. 4A and 4B, the substitution site of the impurity in the 1A-th compound semiconductor layer is the site occupied by a group V atom, and the substitution site of the impurity in the fourth compound semiconductor layer is also the site occupied by a group V atom. Furthermore, the substitution site of the impurity in the third compound semiconductor layer in contact with the fourth compound semiconductor layer is also the site occupied by a group V site. That is, the impurity for causing the 1A-th compound semiconductor layer to have the first conductivity type (p-type) is such that the substitution site of the impurity in the 1A-th compound semiconductor layer (the site occupied by a group V atom) competes with the substitution site of the impurity in the fourth compound semiconductor layer (the site occupied by a group V atom) for causing the fourth compound semiconductor layer to have the second conductivity type (n-type), and competes also with the substitution site of the impurity for causing the third compound semiconductor layer in contact with the fourth compound semiconductor layer to have the first conductivity type (p-type) (the site occupied by a group V atom). Therefore, when the fourth compound semiconductor layer is deposited, impurity mutual diffusion hardly occurs between the fourth compound semiconductor layer of the current block layer and the 1A-th compound semiconductor layer, and between the fourth compound semiconductor layer and the third compound semiconductor layer. Thus, the current block layer having high reliability can be formed. This allows more effective avoidance of the occurrence of a problem that the effect of the current block layer 40 is unstable and thus leakage current is increased due to annihilation or thinning of the current block layer 40.

Fifth Embodiment

The fifth embodiment relates to the first mode (specifically, the (1-a)-th mode) of the present invention, the (3-a)-th mode of the present invention, and the (4-a)-th mode of the present invention.

Figure 5A:
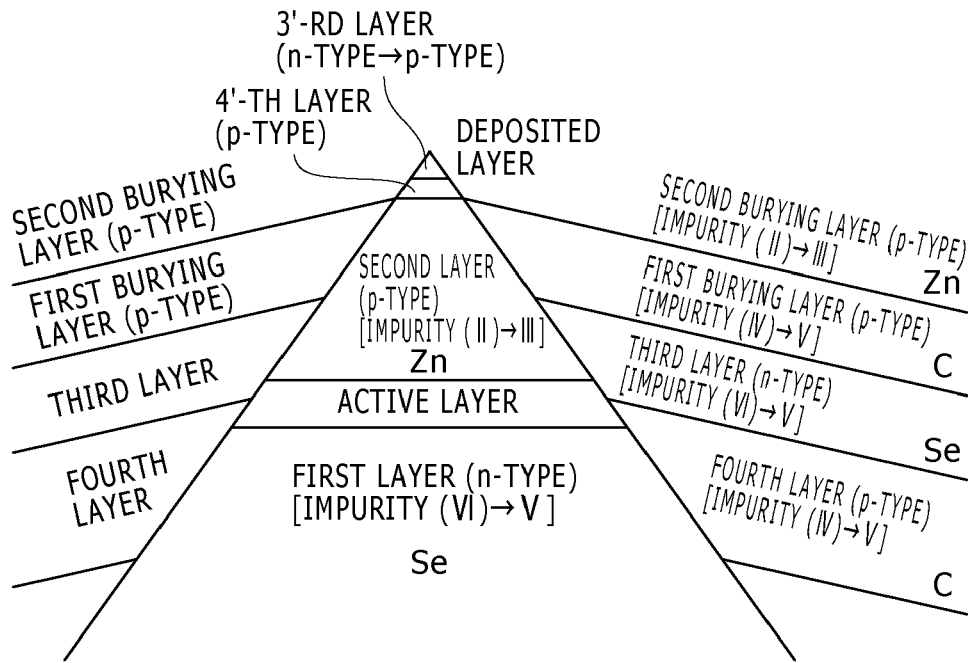
FIGS. 5A and 5B are conceptual diagrams of a semiconductor light emitting device according to a fifth embodiment of the present invention.
Figure 5B:
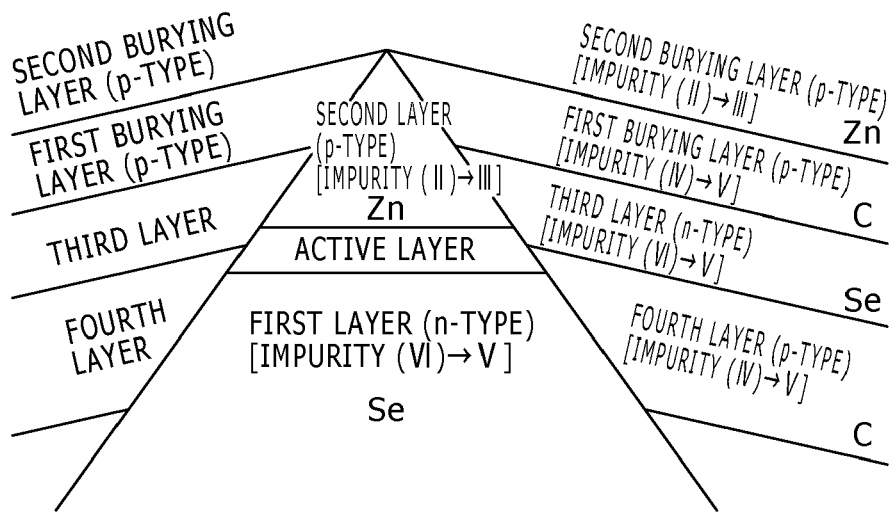

Specifically, as shown in FIG. 5A as a conceptual diagram of the end parts of the light emitting part and FIG. 5B as a conceptual diagram of the center part of the light emitting part, when the semiconductor light emitting device of the fifth embodiment is represented based on the (1-a)-th mode of the present invention, in the semiconductor light emitting device of the fifth embodiment, a first compound semiconductor layer 21, second compound semiconductor layers 22A and 22B, a current block layer 40 (a fourth compound semiconductor layer 44 and a third compound semiconductor layer 43), a first burying layer, and a second burying layer are composed of a III-V compound semiconductor, the substitution site of the impurity in the first compound semiconductor layer 21 is the site occupied by a group V atom, the substitution site of the impurity in the second compound semiconductor layers 22A and 22B is the site occupied by a group III atom, the substitution site of the impurity in the third compound semiconductor layer 43 and the substitution site of the impurity in the fourth compound semiconductor layer 44 are the site occupied by a group V atom, the substitution site of the impurity in the first burying layer is the site occupied by a group V atom, and the substitution site of the impurity in the second burying layer is the site occupied by a group III atom. Schematic partial sectional views of the semiconductor light emitting device of the fifth embodiment are the same as those shown in FIGS. 29 and 30.

When the semiconductor light emitting device of the fifth embodiment is represented based on the (3-a)-th mode of the present invention, in the semiconductor light emitting device of the fifth embodiment, the first compound semiconductor layer 21, the second compound semiconductor layers 22A and 22B, the current block layer 40 (the fourth compound semiconductor layer 44 and the third compound semiconductor layer 43), the first burying layer, and the second burying layer are composed of a III-V compound semiconductor, the impurity for causing the second compound semiconductor layers 22A and 22B to be the p-type as the second conductivity type is a group II impurity, the impurity for causing the fourth compound semiconductor layer 44 to be the p-type as the second conductivity type is carbon (C), the impurity for causing the first burying layer to be the p-type as the second conductivity type is carbon (C), and the impurity for causing the second burying layer to be the p-type as the second conductivity type is a group II impurity.

Furthermore, when the semiconductor light emitting device of the fifth embodiment is represented based on the (4-a)-th mode of the present invention, in the semiconductor light emitting device of the fifth embodiment, the impurity for causing the second compound semiconductor layers 22A and 22B to have the second conductivity type (p-type) is different from the impurity for causing the fourth compound semiconductor layer 44 to have the second conductivity type (p-type).

More specifically, in the semiconductor light emitting device of the fifth embodiment, the respective layers have the configuration shown in Table 5A or Table 5B shown below. In the example shown in Table 5A, the third compound semiconductor layer 43 is stacked on the fourth compound semiconductor layer 44. In the example shown in Table 5B, the fourth compound semiconductor layer 44 is stacked on the third compound semiconductor layer 43.

TABLE 5A (Configuration of light emitting part)

| | |
|---|---|
| Second compound semiconductor layer 22B | p-$Al_{0.47}Ga_{0.53}As$: Zn |
| Second compound semiconductor layer 22A | p-$Al_{0.4}Ga_{0.6}As$: Zn |
| Active layer 23 | [Active layer - A] |
| First compound semiconductor layer 21 | n-$Al_{0.4}Ga_{0.6}As$: Se |
| (Current block layer) | |
| Second burying layer 31B | p-$Al_{0.47}Ga_{0.53}As$: Zn |
| First burying layer 31A | p-$Al_{0.47}Ga_{0.53}As$: C |
| Third compound semiconductor layer 43 | n-$Al_{0.47}Ga_{0.53}As$: Se |
| Fourth compound semiconductor layer 44 | p-$Al_{0.47}Ga_{0.53}As$: C |
| Adjustment layer 30 | p-$Al_{0.47}Ga_{0.53}As$: Zn |
| (Whole) | |
| Contact layer 32 | p-GaAs: Zn (or C) |

(Note 1)
The adjustment layer 30 is formed subsequently to the second compound semiconductor layer 22B.
(Note 2)
The fourth compound semiconductor layer 44 is formed subsequently to the adjustment layer 30 in a continuous manner, and a boundary does not exist between the fourth compound semiconductor layer 44 and the adjustment layer 30 substantially.
(Note 3)
It is also possible to consider that a fifth compound semiconductor layer composed of p-$Al_{0.47}Ga_{0.53}As$: C is formed between the third compound semiconductor layer 43 and the first burying layer 31A (the partial portion of the first burying layer 31A in the vicinity of the interface with the third compound semiconductor layer 43 corresponds to this fifth compound semiconductor layer).

TABLE 5B (Configuration of light emitting part)

| | |
|---|---|
| Second compound semiconductor layer 22B | p-$Al_{0.47}Ga_{0.53}As$: Zn |
| Second compound semiconductor layer 22A | p-$Al_{0.4}Ga_{0.6}As$: Zn |
| Active layer 23 | [Active layer - A] |
| First compound semiconductor layer 21 | n-$Al_{0.4}Ga_{0.6}As$: Se |
| (Current block layer) | |
| Second burying layer 31B | p-$Al_{0.47}Ga_{0.53}As$: Zn |
| First burying layer 31A | p-$Al_{0.47}Ga_{0.53}As$: C |
| Fourth compound semiconductor layer 44 | p-$Al_{0.47}Ga_{0.53}As$: C |
| Third compound semiconductor layer 43 | n-$Al_{0.47}Ga_{0.53}As$: Se |
| Adjustment layer 30 | p-$Al_{0.47}Ga_{0.53}As$: Zn |
| (Whole) | |
| Contact layer 32 | p-GaAs: Zn (or C) |

(Note 1)
The adjustment layer 30 is formed subsequently to the second compound semiconductor layer 22B.
(Note 2)
The first burying layer 31A is formed subsequently to the fourth compound semiconductor layer 44 in a continuous manner, and a boundary does not exist between the first burying layer 31A and the fourth compound semiconductor layer 44 substantially.

Also in the fifth embodiment, at the timing when the formation of a light emitting part 20 is completed in a step similar to [Step-130] of the first embodiment, the sectional shape of the light emitting part 20 obtained when the center part of the light emitting part 20 is cut along a virtual plane perpendicular to the axis line of the light emitting part 20 is a triangle. At this time, the sectional shape of the light emitting part 20 obtained when the end part of the light emitting part 20 is cut along a virtual plane perpendicular to the axis line of the light emitting part 20 is a trapezoid. Therefore, in the formation of the current block layer 40 (the fourth compound semiconductor layer 44 and the third compound semiconductor layer 43), the current block layer 40 is formed only on the side surfaces of the light emitting part 20 at the center part of the light emitting part 20. At this time, at the end parts of the light emitting part 20, in addition to the formation of the current block layer 40 on the side surfaces of the light emitting part 20, a deposited layer 40" having the same multilayer structure as that of the current block layer 40 is formed above the top surface of the light emitting part 20. Subsequently to the formation of the current block layer 40, the first burying layer 31A is so formed as to cover the side surfaces of the light emitting part 20 and the side surfaces of at least one layer of the deposited layer 40" stacked above the light emitting part 20, at both the end parts in particular. Subsequently, at the timing of the completion of the covering of at least the side surfaces of the light emitting part 20 and the side surfaces of a compound semiconductor layer 30' by the first burying layer 31A, the formation of the second burying layer 31B is started, so that the entire surface is covered by the second burying layer 31B. If a compound semiconductor layer of the first conductivity type is included in the deposited layer 40" particularly as above, it is desirable that the burying layer 31 of the second conductivity type (e.g. the burying layer 31B) whose impurity substitution site does not compete with the impurity substitution site in this compound semiconductor layer of the first conductivity type included in the deposited layer 40" be in contact with at least a part of the side surface of the deposited layer 40". This structure allows the impurity of the second conductivity type in the burying layer 31 (e.g. the burying layer 31B) to diffuse from the at least a part of the side surface of the deposited layer 40". This makes it possible to initially carry out conductivity type compensation for the compound semiconductor layer of the first conductivity type that is included in the deposited layer 40" and causes the current blocking, and thus turn this compound semiconductor layer of the first conductivity type to a layer of the second conductivity type. At this time, the impurity for causing the second burying layer 31B to have the second conductivity type is such that the substitution site of the impurity in the second burying layer 31B (the site occupied by a group III atom, in the fifth embodiment) does not compete with the substitution site of the impurity in the third compound semiconductor layer (the site occupied by a group V atom, in the fifth embodiment) for causing the third compound semiconductor layer 43 to have the first conductivity type (see Table 5A or Table 5B). Therefore, e.g. the impurity for causing the second burying layer 31B that is deposited to a large thickness so that the apex may be finally covered to have the second conductivity type diffuses into a deposited layer 43" of the third compound semiconductor layer, having the first conductivity type and formed above the top surface at both the end parts of the light emitting part 20. This diffusion turns the deposited layer 43" of the third compound semiconductor layer to a deposited layer 43' of the third compound semiconductor layer, having the second conductivity type. As a result, all of the compound semiconductor layers located above the light emitting part 20 at both the end parts of the light emitting part 20 have the second conductivity type. Therefore, the deposited layer having the same multilayer structure as that of the current block layer 40 does not exist above the top surface of the multilayer structure of the light emitting part 20, and the current injection path to the active layer is not limited to the {111}B side surface (contact surface). This allows ensured avoidance of the occurrence of a problem that the electric resistance is increased and thus the heat generation and the current consumption are increased, and hence a problem that the light emission efficiency of the semiconductor light emitting device is decreased.

Also in the fifth embodiment, in a step similar to [Step-120] of the first embodiment, e.g. the adjustment layer 30 and the current block layer 40 composed of the fourth compound semiconductor layer 44 and the third compound semiconductor layer 43 are sequentially formed based on MOCVD. The fourth compound semiconductor layer 44 is composed of p-$Al_{0.47}Ga_{0.53}As$:C, and the third compound semiconductor layer 43 is composed of n-$Al_{0.47}Ga_{0.53}As$: Se. Specifically, the substitution site of the impurity (Se) for causing the third compound semiconductor layer 43 to have the first conductivity type (n-type) in the third compound semiconductor layer 43 is the site occupied by a group V atom. Furthermore, the substitution site of the impurity (C) for causing the fourth compound semiconductor layer 44 to have the second conductivity type (p-type) in the fourth compound semiconductor layer 44 is also the site occupied by a group V atom. That is, the impurity for causing the third compound semiconductor layer 43 to have the first conductivity type is such that the substitution site of the impurity in the third compound semiconductor layer 43 competes with the substitution site of the impurity in the fourth compound semiconductor layer for causing the fourth compound semiconductor layer 44 to have the second conductivity type.

Therefore, when the third compound semiconductor layer 43 is deposited after the deposition of the fourth compound semiconductor layer 44, or when the fourth compound semiconductor layer 44 is deposited after the deposition of the third compound semiconductor layer 43, impurity mutual diffusion between the third compound semiconductor layer 43 and the fourth compound semiconductor layer 44 of the current block layer 40 hardly occurs. This allows avoidance of the occurrence of a problem that the effect of the current block layer 40 is unstable and thus leakage current is increased due to annihilation or thinning of the current block layer 40.

Moreover, the impurity for causing the first compound semiconductor layer 21 to have the first conductivity type (n-type) is such that the substitution site of the impurity in the first compound semiconductor layer 21 (the site occupied by a group V atom) does not compete with the substitution site of the impurity in the second compound semiconductor layers 22A and 22B (the site occupied by a group III atom) for causing the second compound semiconductor layers 22A and 22B to have the second conductivity type (p-type). Thus, the pn junction control, designed through intentional impurity mutual diffusion between the first compound semiconductor layer 21 and the second compound semiconductor layers 22A and 22B, can be finely designed easily through adjustment of the concentrations and doping positions of the impurities in the respective layers. This allows enhancement in the light emission characteristic.

Also in the semiconductor light emitting device of the fifth embodiment, the side parts (side surfaces) of the active layer 23 formed above the light emitting part forming region 11 (projection surface) are covered by the current block layer 40, whose refractive index is lower than that of the active layer 23. Furthermore, the active layer 23 is vertically sandwiched by the first compound semiconductor layer 21 and the second compound semiconductor layers 22A and 22B, whose refractive indexes are lower than that of the active layer 23. Consequently, the upper and lower regions and the side regions of the active layer 23 provide a complete light confinement structure. Moreover, above the recess surface, in the vicinity of the side surface of the active layer 23, a so-called thyristor structure is formed due to the p-n-p-n structure (the p-type burying layer 31-the n-type third compound semiconductor layer 43-the p-type fourth compound semiconductor layer 44, the p-type adjustment layer 30 (the p-type second compound semiconductor layer 22B), and the p-type second compound semiconductor layer 22A-the n-type first compound semiconductor layer 21). Therefore, current flowing above the recess surface is prevented, which focuses the current on the active layer 23 and thus allows lower threshold current.

Sixth Embodiment

The sixth embodiment is a modification of the fifth embodiment, and relates to the (1-b)-th mode of the present invention and the (3-b)-th mode of the present invention.

Figure 6A:
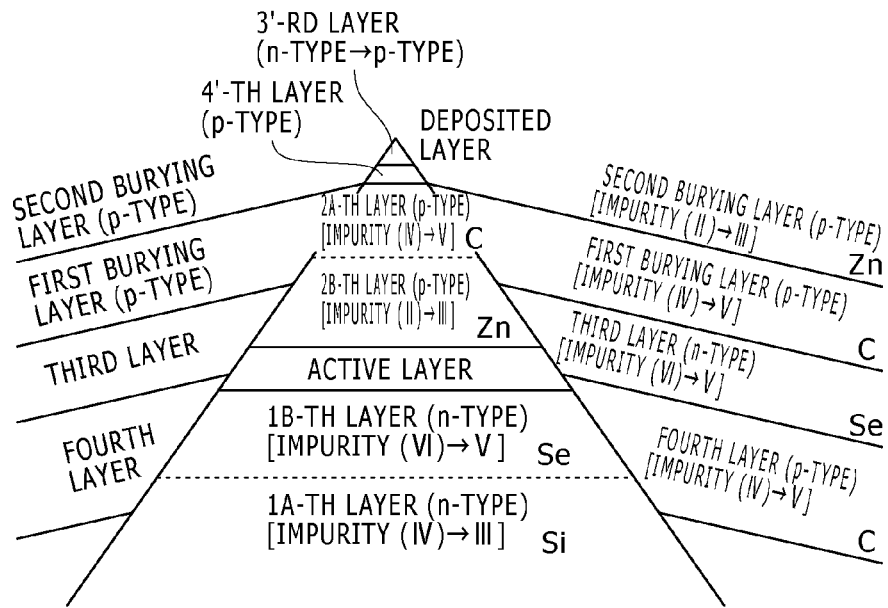
FIGS. 6A and 6B are conceptual diagrams of a semiconductor light emitting device according to a sixth embodiment of the present invention.
Figure 6B:
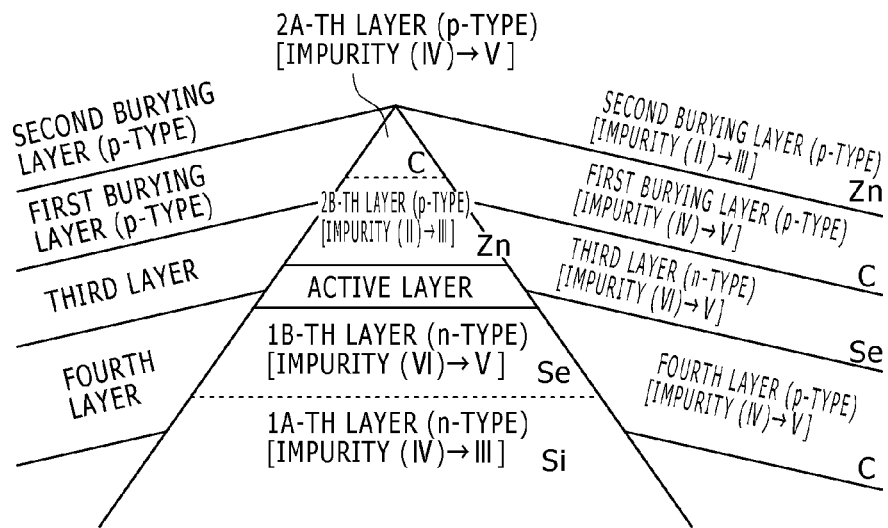

Specifically, as shown in FIG. 6A as a conceptual diagram of the end parts of the light emitting part and FIG. 6B as a conceptual diagram of the center part of the light emitting part, when the semiconductor light emitting device of the sixth embodiment is represented based on the (1-b)-th mode of the present invention, in the semiconductor light emitting device of the sixth embodiment, a first compound semiconductor layer, a second compound semiconductor layer, a third compound semiconductor layer, a fourth compound semiconductor layer, a first burying layer, and a second burying layer are composed of a III-V compound semiconductor, the first compound semiconductor layer is composed of a 1A-th compound semiconductor layer and a 1B-th compound semiconductor layer that is provided on the 1A-th compound semiconductor layer and is in contact with an active layer, the second compound semiconductor layer is composed of a 2B-th compound semiconductor layer in contact with the active layer and a 2A-th compound semiconductor layer provided on the 2B-th compound semiconductor layer, the substitution site of the impurity in the 1A-th compound semiconductor layer is the site occupied by a group III atom, the substitution site of the impurity in the 1B-th compound semiconductor layer is the site occupied by a group V atom, the substitution site of the impurity in the 2B-th compound semiconductor layer is the site occupied by a group III atom, the substitution site of the impurity in the 2A-th compound semiconductor layer is the site occupied by a group V atom, the substitution site of the impurity in the third compound semiconductor layer and the substitution site of the impurity in the fourth compound semiconductor layer are the site occupied by a group V atom, the substitution site of the impurity in the first burying layer is the site occupied by a group V atom, and the substitution site of the impurity in the second burying layer is the site occupied by a group III atom.

Furthermore, when the semiconductor light emitting device of the sixth embodiment is represented based on the (3-b)-th mode of the present invention, in the semiconductor light emitting device of the sixth embodiment, the first compound semiconductor layer, the second compound semiconductor layer, the third compound semiconductor layer, the fourth compound semiconductor layer, the first burying layer, and the second burying layer are composed of a III-V compound semiconductor, the first compound semiconductor layer is composed of the 1A-th compound semiconductor layer and the 1B-th compound semiconductor layer that is provided on the 1A-th compound semiconductor layer and is in contact with the active layer, the second compound semiconductor layer is composed of the 2B-th compound semiconductor layer in contact with the active layer and the 2A-th compound semiconductor layer provided on the 2B-th compound semiconductor layer, the impurity for causing the 1A-th compound semiconductor layer to be the n-type as the first conductivity type is a group IV impurity, the impurity for causing the 1B-th compound semiconductor layer to be the n-type as the first conductivity type is a group VI impurity, the impurity for causing the 2B-th compound semiconductor layer to be the p-type as the second conductivity type is a group II impurity, the impurity for causing the 2A-th compound semiconductor layer to be the p-type as the second conductivity type is carbon (C), the impurity for causing the third compound semiconductor layer to be the n-type as the first conductivity type is a group VI impurity, the impurity for causing the fourth compound semiconductor layer to be the p-type as the second conductivity type is carbon (C), the impurity for causing the first burying layer to be the p-type as the second conductivity type is carbon (C), and the impurity for causing the second burying layer to be the p-type as the second conductivity type is a group II impurity.

More specifically, in the semiconductor light emitting device of the sixth embodiment, the respective layers have the configuration shown in Table 6A or Table 6B shown below. In the example shown in Table 6A, the third compound semiconductor layer is stacked on the fourth compound semiconductor layer. In the example shown in Table 6B, the fourth compound semiconductor layer is stacked on the third compound semiconductor layer.

TABLE 6A (Configuration of light emitting part)

| | |
|---|---|
| 2A-th compound semiconductor layer | p-$Al_{0.4}Ga_{0.6}As$: C |
| 2B-th compound semiconductor layer | p-$Al_{0.4}Ga_{0.6}As$: Zn |
| Active layer | [Active layer - A] |
| 1B-th compound semiconductor layer | n-$Al_{0.4}Ga_{0.6}As$: Se |
| 1A-th compound semiconductor layer | n-$Al_{0.4}Ga_{0.6}As$: Si |
| (Current block layer) | |
| Second burying layer | p-$Al_{0.47}Ga_{0.53}As$: Zn |
| First burying layer | p-$Al_{0.47}Ga_{0.53}As$: C |
| Third compound semiconductor layer | n-$Al_{0.47}Ga_{0.53}As$: Se |
| Fourth compound semiconductor layer | p-$Al_{0.47}Ga_{0.53}As$: C |
| Adjustment layer | p-$Al_{0.47}Ga_{0.53}As$: C |
| (Whole) | |
| Contact layer | p-GaAs: C (or Zn) |

(Note 1)
The adjustment layer is formed subsequently to the 2A-th compound semiconductor layer.
(Note 2)
The fourth compound semiconductor layer is formed subsequently to the adjustment layer in a continuous manner, and a boundary does not exist between the fourth compound semiconductor layer and the adjustment layer substantially.
(Note 3)
It is also possible to consider that a fifth compound semiconductor layer composed of p-$Al_{0.47}Ga_{0.53}As$: C is formed between the third compound semiconductor layer and the first burying layer (the partial portion of the first burying layer 31A in the vicinity of the interface with the third compound semiconductor layer corresponds to this fifth compound semiconductor layer).

TABLE 6B (Configuration of light emitting part)

| | |
|---|---|
| 2A-th compound semiconductor layer | p-$Al_{0.4}Ga_{0.6}As$: C |
| 2B-th compound semiconductor layer | p-$Al_{0.4}Ga_{0.6}As$: Zn |
| Active layer | [Active layer - A] |
| 1B-th compound semiconductor layer | n-$Al_{0.4}Ga_{0.6}As$: Se |
| 1A-th compound semiconductor layer | n-$Al_{0.4}Ga_{0.6}As$: Si |
| (Current block layer) | |
| Second burying layer | p-$Al_{0.47}Ga_{0.53}As$: Zn |
| First burying layer | p-$Al_{0.47}Ga_{0.53}As$: C |

TABLE 6B-continued

| | |
|---|---|
| Fourth compound semiconductor layer | p-$Al_{0.47}Ga_{0.53}As$: C |
| Third compound semiconductor layer | n-$Al_{0.47}Ga_{0.53}As$: Se |
| Adjustment layer (Whole) | p-$Al_{0.47}Ga_{0.53}As$: C |
| Contact layer | p-GaAs: C (or Zn) |

(Note 1)
The adjustment layer is formed subsequently to the 2A-th compound semiconductor layer.
(Note 2)
The first burying layer is formed subsequently to the fourth compound semiconductor layer in a continuous manner, and a boundary does not exist between the first burying layer and the fourth compound semiconductor layer substantially.

Seventh Embodiment

The seventh embodiment is also a modification of the fifth embodiment, and relates to the (1-c)-th mode of the present invention, the (3-c)-th mode of the present invention, and the (4-a)-th mode of the present invention. In the seventh embodiment and the eighth embodiment to be described later, the conductivity types are reversed from those in the fifth embodiment. That is, in the seventh embodiment and the eighth embodiment to be described later, the first conductivity type is the p-type and the second conductivity type is the n-type.

Figure 7A:
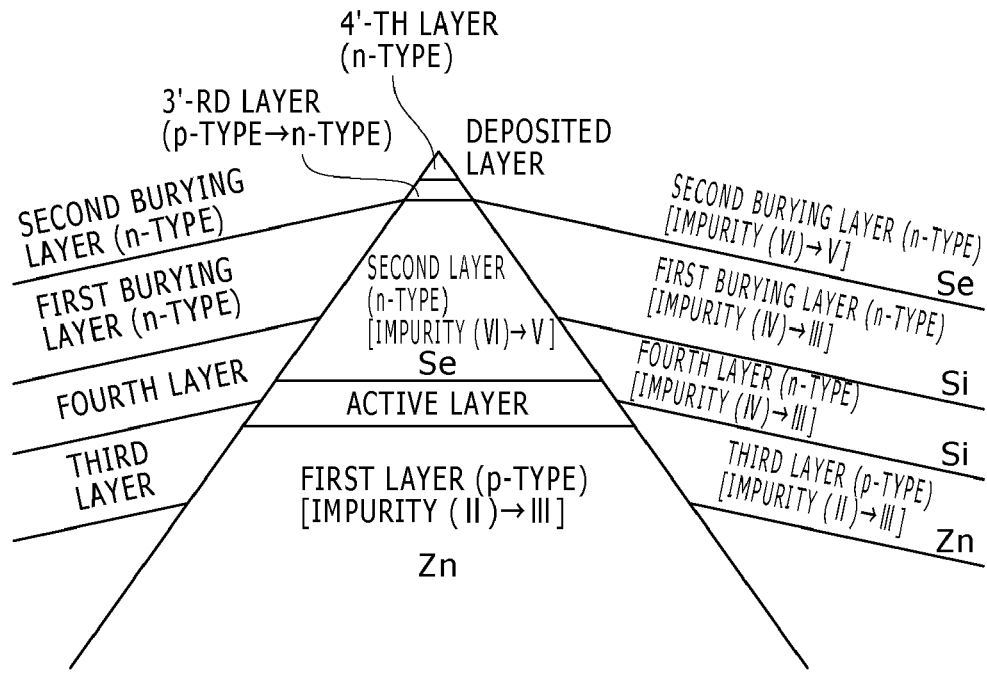
FIGS. 7A and 7B are conceptual diagrams of a semiconductor light emitting device according to a seventh embodiment of the present invention.
Figure 7B:
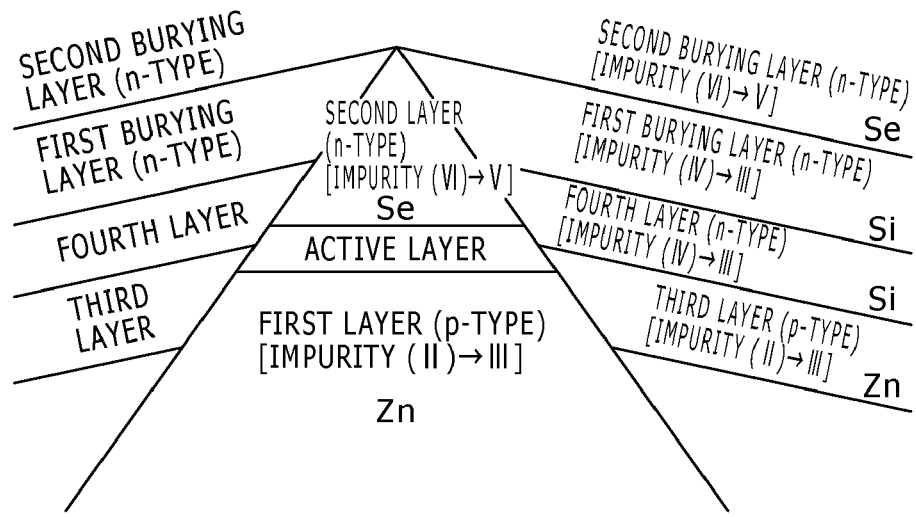

Specifically, as shown in FIG. 7A as a conceptual diagram of the end parts of the light emitting part and FIG. 7B as a conceptual diagram of the center part of the light emitting part, when the semiconductor light emitting device of the seventh embodiment is represented based on the (1-c)-th mode of the present invention, in the semiconductor light emitting device of the seventh embodiment, a first compound semiconductor layer 21, second compound semiconductor layers 22A and 22B, a current block layer 40 (a third compound semiconductor layer 43 and a fourth compound semiconductor layer 44), a first burying layer, and a second burying layer are composed of a III-V compound semiconductor, the substitution site of the impurity in the first compound semiconductor layer 21 is the site occupied by a group III atom, the substitution site of the impurity in the second compound semiconductor layers 22A and 22B is the site occupied by a group V atom, the substitution site of the impurity in the third compound semiconductor layer 43 and the substitution site of the impurity in the fourth compound semiconductor layer 44 are the site occupied by a group III atom, the substitution site of the impurity in the first burying layer is the site occupied by a group III atom, and the substitution site of the impurity in the second burying layer is the site occupied by a group V atom. Schematic partial sectional views of the semiconductor light emitting device of the seventh embodiment are the same as those shown in FIGS. 39 and 40.

Furthermore, when the semiconductor light emitting device of the seventh embodiment is represented based on the (3-c)-th mode of the present invention, in the semiconductor light emitting device of the seventh embodiment, the first compound semiconductor layer 21, the second compound semiconductor layers 22A and 22B, the current block layer 40 (the third compound semiconductor layer 43 and the fourth compound semiconductor layer 44), the first burying layer, and the second burying layer are composed of a III-V compound semiconductor, the impurity for causing the second compound semiconductor layers 22A and 22B to be the n-type as the second conductivity type is a group VI impurity, the impurity for causing the fourth compound semiconductor layer 44 to be the n-type as the second conductivity type is a group IV impurity, the impurity for causing the first burying layer to be the n-type as the second conductivity type is a group IV impurity, and the impurity for causing the second burying layer to be the n-type as the second conductivity type is a group VI impurity.

Furthermore, when the semiconductor light emitting device of the seventh embodiment is represented based on the (4-a)-th mode of the present invention, in the semiconductor light emitting device of the seventh embodiment, the impurity for causing the second compound semiconductor layers 22A and 22B to have the second conductivity type (n-type) is different from the impurity for causing the fourth compound semiconductor layer 44 to have the second conductivity type (n-type).

More specifically, in the semiconductor light emitting device of the seventh embodiment, the respective layers have the configuration shown in Table 7A or Table 7B shown below. In the example shown in Table 7A, the third compound semiconductor layer 43 is stacked on the fourth compound semiconductor layer 44. In the example shown in Table 7B, the fourth compound semiconductor layer 44 is stacked on the third compound semiconductor layer 43.

TABLE 7A (Configuration of light emitting part)

| | |
|---|---|
| Second compound semiconductor layer 22B | n-$Al_{0.47}Ga_{0.53}As$: Se |
| Second compound semiconductor layer 22A | n-$Al_{0.4}Ga_{0.6}As$: Se |
| Active layer 23 | [Active layer - B] |
| First compound semiconductor layer 21 (Current block layer) | p-$Al_{0.4}Ga_{0.6}As$: Zn |
| Second burying layer 31B | n-$Al_{0.47}Ga_{0.53}As$: Se |
| First burying layer 31A | n-$Al_{0.47}Ga_{0.53}As$: Si |
| Third compound semiconductor layer 43 | p-$Al_{0.47}Ga_{0.53}As$: Zn |
| Fourth compound semiconductor layer 44 | n-$Al_{0.47}Ga_{0.53}As$: Si |
| Adjustment layer 30 (Whole) | n-$Al_{0.47}Ga_{0.53}As$: Si |
| Contact layer 32 | n-GaAs: Si (or Se) |

(Note 1)
The adjustment layer 30 is formed subsequently to the second compound semiconductor layer 22B.
(Note 2)
The fourth compound semiconductor layer 44 is formed subsequently to the adjustment layer 30 in a continuous manner, and a boundary does not exist between the fourth compound semiconductor layer 44 and the adjustment layer 30 substantially.
(Note 3)
It is also possible to consider that a fifth compound semiconductor layer composed of n-$Al_{0.47}Ga_{0.53}As$: Si is formed between the third compound semiconductor layer 43 and the first burying layer 31A (the partial portion of the first burying layer 31A in the vicinity of the interface with the third compound semiconductor layer 43 corresponds to this fifth compound semiconductor layer).

TABLE 7B (Configuration of light emitting part)

| | |
|---|---|
| Second compound semiconductor layer 22B | n-$Al_{0.47}Ga_{0.53}As$: Se |
| Second compound semiconductor layer 22A | n-$Al_{0.4}Ga_{0.6}As$: Se |
| Active layer 23 | [Active layer-B] |
| First compound semiconductor layer 21 (Current block layer) | p-$Al_{0.4}Ga_{0.6}As$: Zn |
| Second burying layer 31B | n-$Al_{0.47}Ga_{0.53}As$: Se |
| First burying layer 31A | n-$Al_{0.47}Ga_{0.53}As$: Si |

TABLE 7B-continued

| | |
|---|---|
| Fourth compound semiconductor layer 44 | n-Al$_{0.47}$Ga$_{0.53}$As: Si |
| Third compound semiconductor layer 43 | p-Al$_{0.47}$Ga$_{0.53}$As: Zn |
| Adjustment layer 30 | n-Al$_{0.47}$Ga$_{0.53}$As: Si |
| (Whole) | |
| Contact layer 32 | n-GaAs: Si (or Se) |

(Note 1)
The adjustment layer 30 is formed subsequently to the second compound semiconductor layer 22B.
(Note 2)
The first burying layer 31A is formed subsequently to the fourth compound semiconductor layer 44 in a continuous manner, and a boundary does not exist between the first burying layer 31A and the fourth compound semiconductor layer 44 substantially.

Also in the seventh embodiment, at the timing when the formation of a light emitting part 20 is completed in a step similar to [Step-130] of the first embodiment, the sectional shape of the light emitting part 20 obtained when the center part of the light emitting part 20 is cut along a virtual plane perpendicular to the axis line of the light emitting part 20 is a triangle. At this time, the sectional shape of the light emitting part 20 obtained when the end part of the light emitting part 20 is cut along a virtual plane perpendicular to the axis line of the light emitting part 20 is a trapezoid. Therefore, in the formation of the current block layer 40 (the fourth compound semiconductor layer 44 and the third compound semiconductor layer 43), the current block layer 40 is formed only on the side surfaces of the light emitting part 20 at the center part of the light emitting part 20. At this time, at the end parts of the light emitting part 20, in addition to the formation of the current block layer 40 on the side surfaces of the light emitting part 20, a deposited layer 40" having the same multilayer structure as that of the current block layer 40 is formed above the top surface of the light emitting part 20. Subsequently to the formation of the current block layer 40, the first burying layer 31A is so formed as to cover the side surfaces of the light emitting part 20 and the side surfaces of at least one layer of the deposited layer 40" stacked above the light emitting part 20, at both the end parts in particular. Subsequently, at the timing of the completion of the covering of at least the side surfaces of the light emitting part 20 and the side surfaces of a compound semiconductor layer 30' by the first burying layer 31A, the formation of the second burying layer 31B is started, so that the entire surface is covered by the second burying layer 31B. If a compound semiconductor layer of the first conductivity type is included in the deposited layer 40" particularly as above, it is desirable that the burying layer 31 of the second conductivity type (e.g. the burying layer 31B) whose impurity substitution site does not compete with the impurity substitution site in this compound semiconductor layer of the first conductivity type included in the deposited layer 40" be in contact with at least a part of the side surface of the deposited layer 40". This structure allows the impurity of the second conductivity type in the burying layer 31 (e.g. the burying layer 31B) to diffuse from the at least a part of the side surface of the deposited layer 40". This makes it possible to initially carry out conductivity type compensation for the compound semiconductor layer of the first conductivity type that is included in the deposited layer 40" and causes the current blocking, and thus turn this compound semiconductor layer of the first conductivity type to a layer of the second conductivity type. At this time, the impurity for causing the second burying layer 31B to have the second conductivity type is such that the substitution site of the impurity in the second burying layer 31B (the site occupied by a group V atom, in the seventh embodiment) does not compete with the substitution site of the impurity in the third compound semiconductor layer (the site occupied by a group III atom, in the seventh embodiment) for causing the third compound semiconductor layer 43 to have the first conductivity type (see Table 7A or Table 7B). Therefore, e.g. the impurity for causing the second burying layer 31B that is deposited to a large thickness so that the apex may be finally covered to have the second conductivity type diffuses into a deposited layer 43" of the third compound semiconductor layer, having the first conductivity type and formed above the top surface at both the end parts of the light emitting part 20. This diffusion turns the deposited layer 43" of the third compound semiconductor layer to a deposited layer 43' of the third compound semiconductor layer, having the second conductivity type. As a result, all of the compound semiconductor layers located above the light emitting part 20 at both the end parts of the light emitting part 20 have the second conductivity type. Therefore, the deposited layer having the same multilayer structure as that of the current block layer 40 does not exist above the top surface of the multilayer structure of the light emitting part 20, and the current injection path to the active layer is not limited to the {111}B side surface (contact surface). This allows ensured avoidance of the occurrence of a problem that the electric resistance is increased and thus the heat generation and the current consumption are increased, and hence a problem that the light emission efficiency of the semiconductor light emitting device is decreased.

Also in the seventh embodiment, in a step similar to [Step-120] of the first embodiment, e.g. the adjustment layer 30 and the current block layer 40 composed of the fourth compound semiconductor layer 44 and the third compound semiconductor layer 43 are sequentially formed based on MOCVD. The third compound semiconductor layer 43 is composed of p-Al$_{0.47}$Ga$_{0.53}$As:Zn, and the fourth compound semiconductor layer 44 is composed of n-Al$_{0.47}$Ga$_{0.53}$As:Si. Specifically, the substitution site of the impurity (Zn) for causing the third compound semiconductor layer 43 to have the first conductivity type (p-type) in the third compound semiconductor layer 43 is the site occupied by a group III atom. Furthermore, the substitution site of the impurity (Si) for causing the fourth compound semiconductor layer 44 to have the second conductivity type (n-type) in the fourth compound semiconductor layer 44 is also the site occupied by a group III atom. That is, the impurity for causing the third compound semiconductor layer 43 to have the first conductivity type is such that the substitution site of the impurity in the third compound semiconductor layer 43 competes with the substitution site of the impurity in the fourth compound semiconductor layer for causing the fourth compound semiconductor layer 44 to have the second conductivity type.

Therefore, when the fourth compound semiconductor layer 44 is deposited after the deposition of the third compound semiconductor layer 43, or when the third compound semiconductor layer 43 is deposited after the deposition of the fourth compound semiconductor layer 44, impurity mutual diffusion between the third compound semiconductor layer 43 and the fourth compound semiconductor layer 44 of the current block layer 40 hardly occurs. This allows avoidance of the occurrence of a problem that the effect of the current block layer 40 is unstable and thus leakage current is increased due to annihilation or thinning of the current block layer 40.

Moreover, the impurity for causing the first compound semiconductor layer 21 to have the first conductivity type (p-type) is such that the substitution site of the impurity in the first compound semiconductor layer 21 (the site occupied by a group III atom) does not compete with the substitution site of the impurity in the second compound semiconductor layers 22A and 22B (the site occupied by a group V atom) for causing the second compound semiconductor layers 22A and 22B to have the second conductivity type (n-type). Thus, the pn junction control, designed through intentional impurity mutual diffusion between the first compound semiconductor layer 21 and the second compound semiconductor layers 22A and 22B, can be finely designed easily through adjustment of the concentrations and doping positions of the impurities in the respective layers. This allows enhancement in the light emission characteristic.

Also in the semiconductor light emitting device of the seventh embodiment, the side parts (side surfaces) of the active layer 23 formed above the light emitting part forming region 11 (projection surface) are covered by the current block layer 40, whose refractive index is lower than that of the active layer 23. Furthermore, the active layer 23 is vertically sandwiched by the first compound semiconductor layer 21 and the second compound semiconductor layers 22A and 22B, whose refractive indexes are lower than that of the active layer 23. Consequently, the upper and lower regions and the side regions of the active layer 23 provide a complete light confinement structure. Moreover, above the recess surface, in the vicinity of the side surface of the active layer 23, a so-called thyristor structure is formed due to the n-p-n-p structure (the n-type burying layer 31-the p-type third compound semiconductor layer 43-the n-type fourth compound semiconductor layer 44-the n-type adjustment layer 30 (the n-type second compound semiconductor layer 22B) and the n-type second compound semiconductor layer 22A-the p-type first compound semiconductor layer 21). Therefore, current flowing above the recess surface is prevented, which focuses the current on the active layer 23 and thus allows lower threshold current.

In addition, the plane orientation dependence of silicon (Si), which is the impurity for causing the fourth compound semiconductor layer 44 to have the second conductivity type (n-type), is smaller than that of selenium (Se), which is the impurity for causing the second compound semiconductor layers 22A and 22B to have the second conductivity type (n-type). Therefore, in the formation (deposition) of the third compound semiconductor layer 43, which is composed of the {311}B crystal plane region that extends from the side surface of the light emitting part 20, the {100} crystal plane region that extends along the major surface of the substrate 10, and the high-order crystal plane region located between the {311}B crystal plane region and the {100} crystal plane region, variation in the doping concentration of Si as the impurity for these regions is small. As a result, the third compound semiconductor layer 43 having stable (uniform) impurity concentration can be formed (stacked), which makes it easy to adjust the concentration balance with respective to the layer that is in contact with the third compound semiconductor layer 43 and has the different conductivity type. Thus, the current block layer 40 having high current block capability can be obtained. Moreover, because the third compound semiconductor layer 43 having stable impurity concentration can be formed (stacked), when the fourth compound semiconductor layer 44 is formed on the third compound semiconductor layer 43, or when the third compound semiconductor layer 43 is formed on the fourth compound semiconductor layer 44, it is possible to more surely avoid the occurrence of a problem that the effect of the current block layer 40 is unstable and thus leakage current is increased due to annihilation or thinning of the current block layer 40.

Eighth Embodiment

The eighth embodiment is a modification of the fifth embodiment and the seventh embodiment, and relates to the (1-d)-th mode of the present invention and the (3-d)-th mode of the present invention.

Figure 8A:
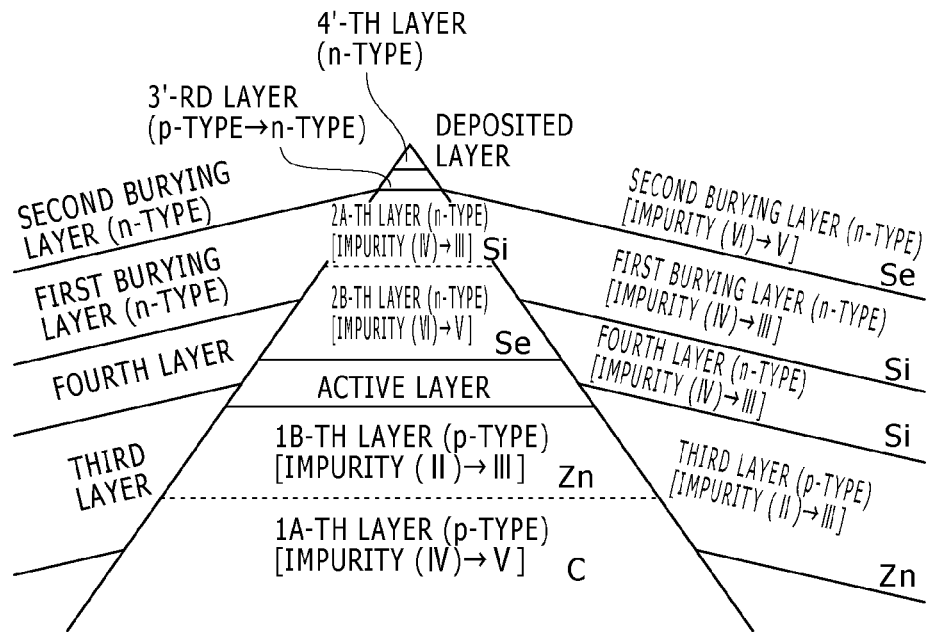
FIGS. 8A and 8B are conceptual diagrams of a semiconductor light emitting device according to an eighth embodiment of the present invention.
Figure 8B:
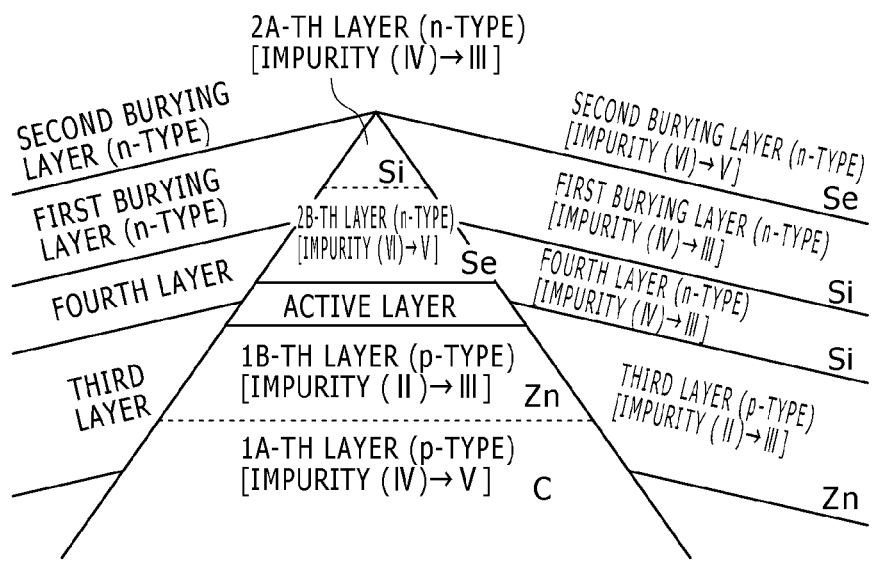

Specifically, as shown in FIG. 8A as a conceptual diagram of the end parts of the light emitting part and FIG. 8B as a conceptual diagram of the center part of the light emitting part, when the semiconductor light emitting device of the eighth embodiment is represented based on the (1-d)-th mode of the present invention, in the semiconductor light emitting device of the eighth embodiment, a first compound semiconductor layer, a second compound semiconductor layer, a third compound semiconductor layer, a fourth compound semiconductor layer, a first burying layer, and a second burying layer are composed of a III-V compound semiconductor, the first compound semiconductor layer is composed of a 1A-th compound semiconductor layer and a 1B-th compound semiconductor layer that is provided on the 1A-th compound semiconductor layer and is in contact with an active layer, the second compound semiconductor layer is composed of a 2B-th compound semiconductor layer in contact with the active layer and a 2A-th compound semiconductor layer provided on the 2B-th compound semiconductor layer, the substitution site of the impurity in the 1A-th compound semiconductor layer is the site occupied by a group V atom, the substitution site of the impurity in the 1B-th compound semiconductor layer is the site occupied by a group III atom, the substitution site of the impurity in the 2B-th compound semiconductor layer is the site occupied by a group V atom, the substitution site of the impurity in the 2A-th compound semiconductor layer is the site occupied by a group III atom, the substitution site of the impurity in the third compound semiconductor layer and the substitution site of the impurity in the fourth compound semiconductor layer are the site occupied by a group III atom, the substitution site of the impurity in the first burying layer is the site occupied by a group III atom, and the substitution site of the impurity in the second burying layer is the site occupied by a group V atom.

Furthermore, when the semiconductor light emitting device of the eighth embodiment is represented based on the (3-d)-th mode of the present invention, in the semiconductor light emitting device of the eighth embodiment, the first compound semiconductor layer, the second compound semiconductor layer, the third compound semiconductor layer, the fourth compound semiconductor layer, the first burying layer, and the second burying layer are composed of a III-V compound semiconductor, the first compound semiconductor layer is composed of the 1A-th compound semiconductor layer and the 1B-th compound semiconductor layer that is provided on the 1A-th compound semiconductor layer and is in contact with the active layer, the second compound semiconductor layer is composed of the 2B-th compound semiconductor layer in contact with the active layer and the 2A-th compound semiconductor layer provided on the 2B-th compound semiconductor layer, the impurity for causing the 1A-th compound semiconductor layer to be the p-type as the first conductivity type is carbon (C), the impurity for causing the 1B-th compound semiconductor layer to be the p-type as the first conductivity type is a group II impurity, the impurity for causing the 2B-th compound semiconductor layer to be the n-type as the second conductivity type is a group VI impurity, the impurity for causing the 2A-th compound semiconductor layer to be the n-type as the second conductivity type is a group IV impurity, the impurity for causing the third compound semiconductor layer to be the p-type as the first conductivity type is a group II impurity, the impurity for causing the fourth compound semiconductor layer to be the n-type as the second conductivity type is a group IV impurity, the impurity for causing the first burying layer to be the n-type as the second conductivity type is a group IV impurity, and the impurity for causing the second burying layer to be the n-type as the second conductivity type is a group VI impurity.

More specifically, in the semiconductor light emitting device of the eighth embodiment, the respective layers have the configuration shown in Table 8A or Table 8B shown below. In the example shown in Table 8A, the third compound semiconductor layer is stacked on the fourth compound semiconductor layer. In the example shown in Table 8B, the fourth compound semiconductor layer is stacked on the third compound semiconductor layer.

TABLE 8A (Configuration of light emitting part)

| | |
|---|---|
| 2A-th compound semiconductor layer | n-$Al_{0.4}Ga_{0.6}As$: Si |
| 2B-th compound semiconductor layer | n-$Al_{0.4}Ga_{0.6}As$: Se |
| Active layer | [Active layer-B] |
| 1B-th compound semiconductor layer | p-$Al_{0.4}Ga_{0.6}As$: Zn |
| 1A-th compound semiconductor layer | p-$Al_{0.4}Ga_{0.6}As$: C |
| (Current block layer) | |
| Second burying layer | n-$Al_{0.47}Ga_{0.53}As$: Se |
| First burying layer | n-$Al_{0.47}Ga_{0.53}As$: Si |
| Third compound semiconductor layer | p-$Al_{0.47}Ga_{0.53}As$: Zn |
| Fourth compound semiconductor layer | n-$Al_{0.47}Ga_{0.53}As$: Si |
| Adjustment layer | n-$Al_{0.47}Ga_{0.53}As$: Si |
| (Whole) | |
| Contact layer | n-GaAs: Si (or Se) |

(Note 1)
The adjustment layer is formed subsequently to the 2A-th compound semiconductor layer.
(Note 2)
The fourth compound semiconductor layer is formed subsequently to the adjustment layer in a continuous manner, and a boundary does not exist between the fourth compound semiconductor layer and the adjustment layer substantially.
(Note 3)
It is also possible to consider that a fifth compound semiconductor layer composed of n-$Al_{0.47}Ga_{0.53}As$: Si is formed between the third compound semiconductor layer and the first burying layer (the partial portion of the first burying layer in the vicinity of the interface with the third compound semiconductor layer corresponds to this fifth compound semiconductor layer).

TABLE 8B (Configuration of light emitting part)

| | |
|---|---|
| 2A-th compound semiconductor layer | n-$Al_{0.4}Ga_{0.6}As$: Si |
| 2B-th compound semiconductor layer | n-$Al_{0.4}Ga_{0.6}As$: Se |
| Active layer | [Active layer-B] |
| 1B-th compound semiconductor layer | p-$Al_{0.4}Ga_{0.6}As$: Zn |
| 1A-th compound semiconductor layer | p-$Al_{0.4}Ga_{0.6}As$: C |
| (Current block layer) | |
| Second burying layer | n-$Al_{0.47}Ga_{0.53}As$: Se |
| First burying layer | n-$Al_{0.47}Ga_{0.53}As$: Si |
| Fourth compound semiconductor layer | n-$Al_{0.47}Ga_{0.53}As$: Si |
| Third compound semiconductor layer | p-$Al_{0.47}Ga_{0.53}As$: Zn |
| Adjustment layer | n-$Al_{0.47}Ga_{0.53}As$: Si |
| (Whole) | |
| Contact layer | n-GaAs: Si (or Se) |

(Note 1)
The adjustment layer is formed subsequently to the 2A-th compound semiconductor layer.
(Note 2)
The first burying layer is formed subsequently to the fourth compound semiconductor layer in a continuous manner, and a boundary does not exist between the first burying layer and the fourth compound semiconductor layer substantially.

Ninth Embodiment

Figure 9A:
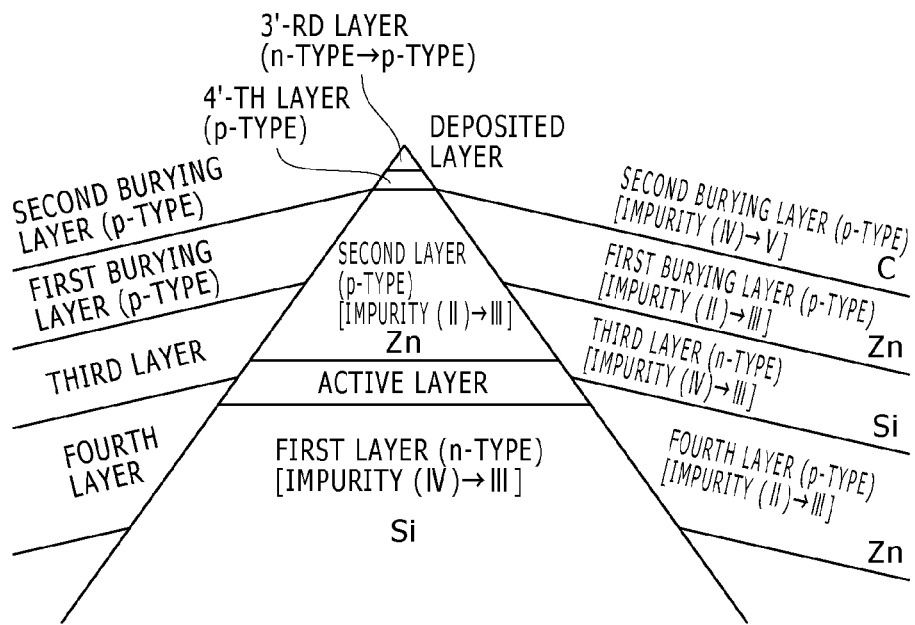
FIGS. 9A and 9B are conceptual diagrams of a semiconductor light emitting device according to a ninth embodiment of the present invention.
Figure 9B:
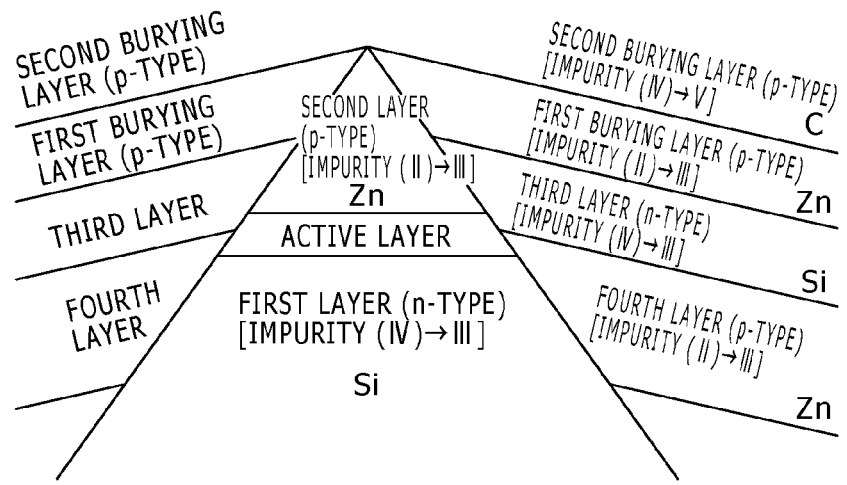

The ninth embodiment relates to the semiconductor light emitting device according to the fifth mode (specifically, the (5-A-1)-th mode) of the present invention. As shown in FIG. 9A as a conceptual diagram of the end parts of the light emitting part, FIG. 9B as a conceptual diagram of the center part of the light emitting part, FIGS. 29 and 30 as schematic partial sectional views, and FIGS. 31A to 31C as enlarged schematic partial sectional views, the semiconductor light emitting device of the ninth embodiment includes (A) a light emitting part 20 formed of a multilayer structure arising from sequential stacking of a first compound semiconductor layer 21 of a first conductivity type (n-type, in the ninth embodiment), an active layer 23, and a second compound semiconductor layer 22 of a second conductivity type (p-type, in the ninth embodiment), and (B) a current block layer 40 provided in contact with the side surface of the light emitting part 20.

The current block layer 40 is formed of a multilayer structure arising from sequential stacking of at least a fourth compound semiconductor layer 44 of the second conductivity type and a third compound semiconductor layer 43 of the first conductivity type. The impurity for causing the fourth compound semiconductor layer 44 to have the second conductivity type is such that the substitution site of the impurity in the fourth compound semiconductor layer 44 competes with the substitution site of the impurity in the third compound semiconductor layer 43 for causing the third compound semiconductor layer 43 to have the first conductivity type, and competes with the substitution site of the impurity in the first compound semiconductor layer 21 for causing the first compound semiconductor layer 21 to have the first conductivity type. Furthermore, the impurity for causing the second compound semiconductor layer 22 to have the second conductivity type is such that the substitution site of the impurity in the second compound semiconductor layer 22 competes with the substitution site of the impurity in the third compound semiconductor layer 43 for causing the third compound semiconductor layer 43 to have the first conductivity type. In addition, when a bypass channel that passes through the first compound semiconductor layer 21, the current block layer 40, and the second compound semiconductor layer 22 is assumed, at least three pn junction interfaces formed of the interfaces between the respective compound semiconductor layers exist in the bypass channel.

The fourth compound semiconductor layer 44 is in contact with the side surface of the first compound semiconductor layer 21, and the third compound semiconductor layer 43 is in contact with the side surface of the second compound semiconductor layer 22. Specifically, the bypass channel is composed of the first compound semiconductor layer 21, the fourth compound semiconductor layer 44, the third compound semiconductor layer 43, and the second compound semiconductor layer 22. The pn junction interfaces are formed of the following three interfaces: the interface between the side surface of the first compound semiconductor layer 21 and the fourth compound semiconductor layer 44; the interface between the fourth compound semiconductor layer 44 and the third compound semiconductor layer 43; and the interface between the third compound semiconductor layer 43 and the side surface of the second compound semiconductor layer 22.

Also in the semiconductor light emitting device of the ninth embodiment, the first compound semiconductor layer 21, the second compound semiconductor layer 22, the fourth compound semiconductor layer 44, and the third compound semiconductor layer 43 are composed of a III-V compound semiconductor. Furthermore, as described later, a 1A-th compound semiconductor layer 21A, a 1B-th compound semiconductor layer 21B, the second compound semiconductor layer 22, the fourth compound semiconductor layer 44, and the third compound semiconductor layer 43 are composed of a III-V compound semiconductor. In addition, the first compound semiconductor layer 21, a 2A-th compound semiconductor layer 22A, a 2B-th compound semiconductor layer 22B, the fourth compound semiconductor layer 44, the third compound semiconductor layer 43, a first burying layer 31A, and a second burying layer 31B are composed of a III-V compound semiconductor.

In the ninth embodiment, the substitution site of the impurity in the first compound semiconductor layer 21, the substitution site of the impurity in the second compound semiconductor layer 22, the substitution site of the impurity in the fourth compound semiconductor layer 44, and the substitution site of the impurity in the third compound semiconductor layer 43 are the site occupied by a group III atom. The substitution site of the impurity in the first burying layer is the site occupied by a group III atom, and the substitution site of the impurity in the second burying layer is the site occupied by a group V atom. The impurity for causing the first compound semiconductor layer 21 and the third compound semiconductor layer 43 to be the n-type as the first conductivity type is a group IV impurity (specifically, silicon, Si). The impurity for causing the second compound semiconductor layer 22 and the fourth compound semiconductor layer 44 to be the p-type as the second conductivity type is a group II impurity (specifically, zinc, Zn). The impurity for causing the first burying layer 31A to be the p-type as the second conductivity type is a group II impurity (specifically, zinc, Zn). The impurity for causing the second burying layer 31B to be the p-type as the second conductivity type is carbon (C).

More specifically, in the semiconductor light emitting device of the ninth embodiment, the respective layers have the configuration shown in Table 9A shown below.

TABLE 9A (Configuration of light emitting part)

| | |
|---|---|
| Second compound semiconductor layer 22B | p-$Al_{0.47}Ga_{0.53}As$: Zn |
| Second compound semiconductor layer 22A | p-$Al_{0.4}Ga_{0.6}As$: Zn |
| Active layer 23 | [Active layer-A] |
| First compound semiconductor layer 21 | n-$Al_{0.4}Ga_{0.6}As$: Si |
| (Current block layer) | |
| Second burying layer 31B | p-$Al_{0.47}Ga_{0.53}As$: C |
| First burying layer 31A | p-$Al_{0.47}Ga_{0.53}As$: Zn |
| Third compound semiconductor layer 43 | n-$Al_{0.47}Ga_{0.53}As$: Si |
| Fourth compound semiconductor layer 44 p-$Al_{0.47}Ga_{0.53}As$: Zn | |
| Adjustment layer 30 | p-$Al_{0.47}Ga_{0.53}As$: Zn |
| (Whole) | |
| Contact layer 32 | p-GaAs: Zn (or C) |

(Note 1)
The adjustment layer 30 is formed subsequently to the second compound semiconductor layer 22B.
(Note 2)
The fourth compound semiconductor layer 44 is formed subsequently to the adjustment layer 30 in a continuous manner, and a boundary does not exist between the adjustment layer 30 and the fourth compound semiconductor layer 44 substantially.

In the example shown in FIG. 31A, the third compound semiconductor layer 43 is formed on the fourth compound semiconductor layer 44. The pn junction interface between the third compound semiconductor layer 43 (n-type) and the fourth compound semiconductor layer 44 (p-type) thereunder extends along the {311}B crystal plane, and the end part thereof is in contact with the light emitting part 20 (in particular, the side surface of the active layer 23). This forms two new junction interfaces. Specifically, a current path formed of the pnpn junction structure including the following junction interfaces is formed: the pn junction interface between the second compound semiconductor layers 22A and 22B and the third compound semiconductor layer 43; the np junction interface between the third compound semiconductor layer 43 and the fourth compound semiconductor layer 44; and the pn junction interface between the fourth compound semiconductor layer 44 and the first compound semiconductor layer 21. This is a desirable design as the current block structure.

Moreover, in the ninth embodiment, the substitution site of the impurity in the first compound semiconductor layer 21, the substitution site of the impurity in the fourth compound semiconductor layer 44, the substitution site of the impurity in the third compound semiconductor layer 43, and the substitution site of the impurity in the second compound semiconductor layer 22 are the site occupied by a group III atom. That is, the impurity for causing the first compound semiconductor layer 21 to have the first conductivity type (n-type) is such that the substitution site of the impurity in the first compound semiconductor layer 21 (the site occupied by a group III atom) competes with the substitution site of the impurity in the fourth compound semiconductor layer 44 (the site occupied by a group III atom) for causing the fourth compound semiconductor layer 44 to have the second conductivity type (p-type). Furthermore, the impurity for causing the third compound semiconductor layer 43 to have the first conductivity type (n-type) is such that the substitution site of the impurity in the third compound semiconductor layer 43 (the site occupied by a group III atom) competes with the substitution site of the impurity in the fourth compound semiconductor layer 44 (the site occupied by a group III atom) for causing the fourth compound semiconductor layer 44 to have the second conductivity type (p-type). In addition, the impurity for causing the second compound semiconductor layer 22 to have the second conductivity type (p-type) is such that the substitution site of the impurity in the second compound semiconductor layer 22 (the site occupied by a group III atom) competes with the substitution site of the impurity in the third compound semiconductor layer 43 (the site occupied by a group III atom) for causing the third compound semiconductor layer 43 to have the first conductivity type (n-type). Therefore, when the fourth compound semiconductor layer 44 is deposited, impurity mutual diffusion hardly occurs between the fourth compound semiconductor layer 44 of the current block layer 40 and the first compound semiconductor layer 21. Furthermore, when the third compound semiconductor layer 43 is deposited, impurity mutual diffusion hardly occurs between the third compound semiconductor layer 43 and the fourth compound semiconductor layer 44 of the current block layer 40, and between the third compound semiconductor layer 43 and the second compound semiconductor layer 22. Thus, the current block layer 40 having high reliability can be formed. Specifically, it is possible to surely avoid the occurrence of a problem that the effect of the current block layer 40 is unstable and thus leakage current is increased due to annihilation or thinning of the current block layer 40.

Also in the ninth embodiment, at the timing when the formation of the light emitting part 20 is completed in a step similar to [Step-130] of the first embodiment, the sectional shape of the light emitting part 20 obtained when the center part of the light emitting part 20 is cut along a virtual plane perpendicular to the axis line of the light emitting part 20 is a triangle. At this time, the sectional shape of the light emitting part 20 obtained when the end part of the light emitting part 20 is cut along a virtual plane perpendicular to the axis line of the light emitting part 20 is a trapezoid. Therefore, in the formation of the current block layer 40 (the fourth compound semiconductor layer 44 and the third compound semiconductor layer 43), the current block layer 40 is formed only on the side surfaces of the light emitting part 20 at the center part of the light emitting part 20. At this time, at the end parts of the light emitting part 20, in addition to the formation of the current block layer 40 on the side surfaces of the light emitting part 20, a deposited layer 40″ having the same multilayer structure as that of the current block layer 40 is formed above the top surface of the light emitting part 20. Subsequently to the formation of the current block layer 40, the first burying layer 31A is so formed as to cover the side surfaces of the light emitting part 20 and the side surfaces of at least one layer of the deposited layer 40″ stacked above the light emitting part 20, at both the end parts in particular. Subsequently, at the timing of the completion of the covering of at least the side surfaces of the light emitting part 20 and the side surfaces of a compound semiconductor layer 30′ by the first burying layer 31A, the formation of the second burying layer 31B is started, so that the entire surface is covered by the second burying layer 31B. If a compound semiconductor layer of the first conductivity type is included in the deposited layer 40″ particularly as above, it is desirable that the burying layer 31 of the second conductivity type (e.g. the burying layer 31B) whose impurity substitution site does not compete with the impurity substitution site in this compound semiconductor layer of the first conductivity type included in the deposited layer 40″ be in contact with at least a part of the side surface of the deposited layer 40″. This structure allows the impurity of the second conductivity type in the burying layer 31 (e.g. the burying layer 31B) to diffuse from the at least a part of the side surface of the deposited layer 40″. This makes it possible to initially carry out conductivity type compensation for the compound semiconductor layer of the first conductivity type that is included in the deposited layer 40″ and causes the current blocking, and thus turn this compound semiconductor layer of the first conductivity type to a layer of the second conductivity type. At this time, the impurity for causing the second burying layer 31B to have the second conductivity type is such that the substitution site of the impurity in the second burying layer 31B (the site occupied by a group V atom, in the ninth embodiment) does not compete with the substitution site of the impurity in the third compound semiconductor layer (the site occupied by a group III atom, in the ninth embodiment) for causing the third compound semiconductor layer 43 to have the first conductivity type (see Table 9A or Table 9B). Therefore, e.g. the impurity for causing the second burying layer 31B that is deposited to a large thickness so that the apex may be finally covered to have the second conductivity type diffuses into a deposited layer 43″ of the third compound semiconductor layer, having the first conductivity type and formed above the top surface at both the end parts of the light emitting part 20. This diffusion turns the deposited layer 43″ of the third compound semiconductor layer to a deposited layer 43′ of the third compound semiconductor layer, having the second conductivity type. As a result, all of the compound semiconductor layers located above the light emitting part 20 at both the end parts of the light emitting part 20 have the second conductivity type. Therefore, the deposited layer having the same multilayer structure as that of the current block layer 40 does not exist above the top surface of the multilayer structure of the light emitting part 20, and the current injection path to the active layer is not limited to the {111}B side surface (contact surface). This allows ensured avoidance of the occurrence of a problem that the electric resistance is increased and thus the heat generation and the current consumption are increased, and hence a problem that the light emission efficiency of the semiconductor light emitting device is decreased.

Except for the above-described points, the semiconductor light emitting device of the ninth embodiment has the same configuration and structure as those of the semiconductor light emitting device of the first embodiment basically, and therefore the detailed description thereof is omitted.

Modification examples of the semiconductor light emitting device of the ninth embodiment will be described below.

Figure 10A:
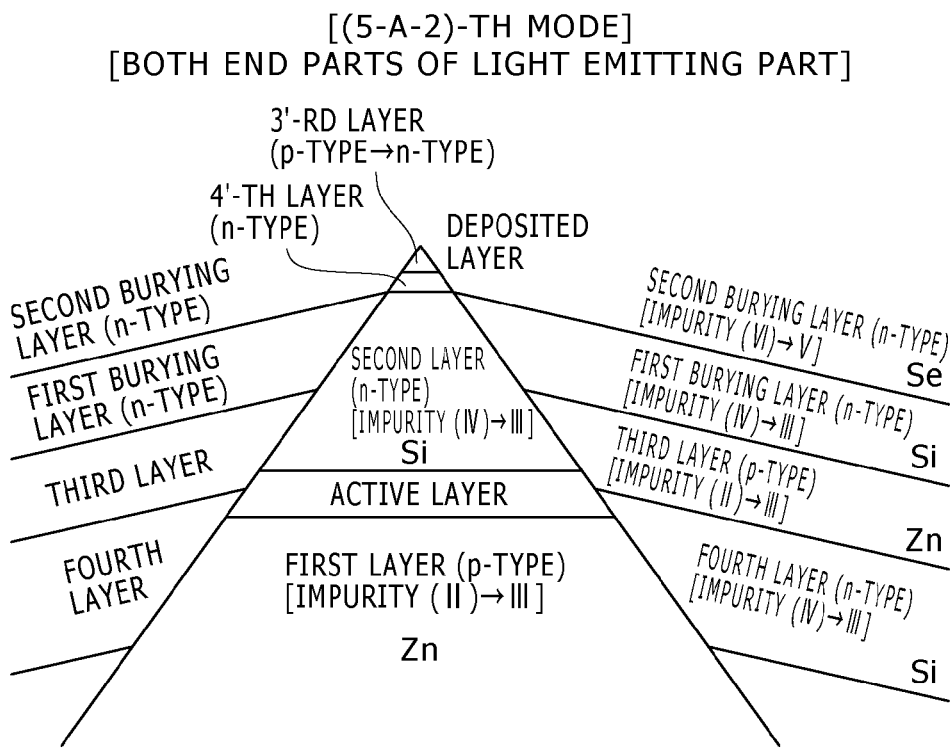
FIGS. 10A and 10B are conceptual diagrams of a modification example of the semiconductor light emitting device according to the ninth embodiment.
Figure 10B:
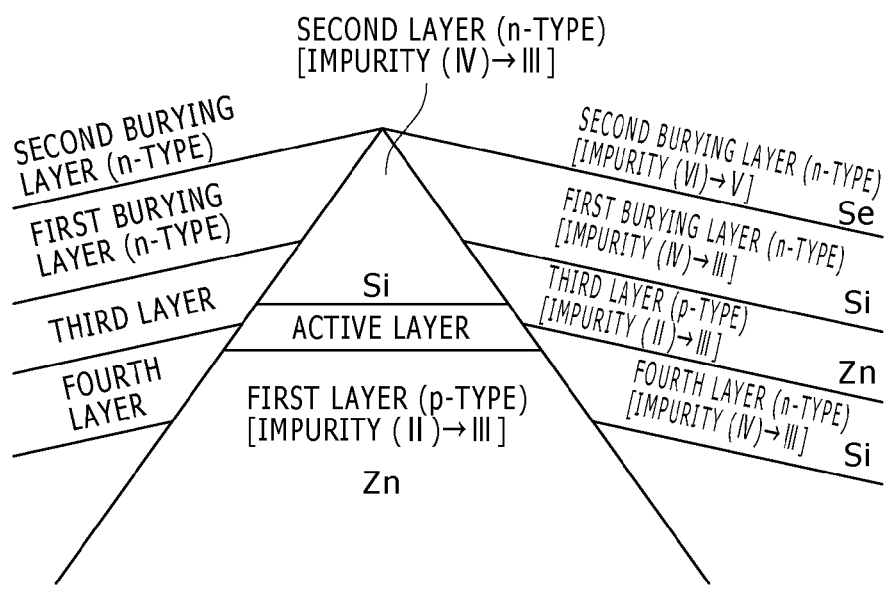

A modification example of the semiconductor light emitting device of the ninth embodiment is shown in FIG. 10A as a conceptual diagram of the end parts of the light emitting part and FIG. 10B as a conceptual diagram of the center part of the light emitting part. This modification example corresponds to the semiconductor light emitting device according to the (5-A-2)-th mode of the present invention. Specifically, in this semiconductor light emitting device, the impurity for causing the first compound semiconductor layer and the third compound semiconductor layer to be the p-type as the first conductivity type is a group II impurity (specifically, Zn), the impurity for causing the second compound semiconductor layer and the fourth compound semiconductor layer to be the n-type as the second conductivity type is a group IV impurity (specifically, Si), and the impurity for causing the first burying layer to be the n-type as the second conductivity type is a group IV impurity, and the impurity for causing the second burying layer to be the n-type as the second conductivity type is a group VI impurity.

More specifically, in this modification example of the semiconductor light emitting device of the ninth embodiment, the respective layers have the configuration shown in Table 9B shown below. Table 9B is given the same notes as (Note 1) and (Note 2) of Table 9A (this applies also to Tables 9C to 9J to be described later).

TABLE 9B

| (Configuration of light emitting part) | |
|---|---|
| Second compound semiconductor layer | n-$Al_{0.47}Ga_{0.53}As$: Si |
| Second compound semiconductor layer | n-$Al_{0.4}Ga_{0.6}As$: Si |
| Active layer | [Active layer-B] |
| First compound semiconductor layer | p-$Al_{0.4}Ga_{0.6}As$: Zn |
| (Current block layer) | |
| Second burying layer | n-$Al_{0.47}Ga_{0.53}As$: Se |
| First burying layer | n-$Al_{0.47}Ga_{0.53}As$: Si |
| Third compound semiconductor layer | p-$Al_{0.47}Ga_{0.53}As$: Zn |
| Fourth compound semiconductor layer | n-$Al_{0.47}Ga_{0.53}As$: Si |
| Adjustment layer | n-$Al_{0.47}Ga_{0.53}As$: Se |
| (Whole) | |
| Contact layer | p-GaAs: Zn (or C) |

Figure 11A:
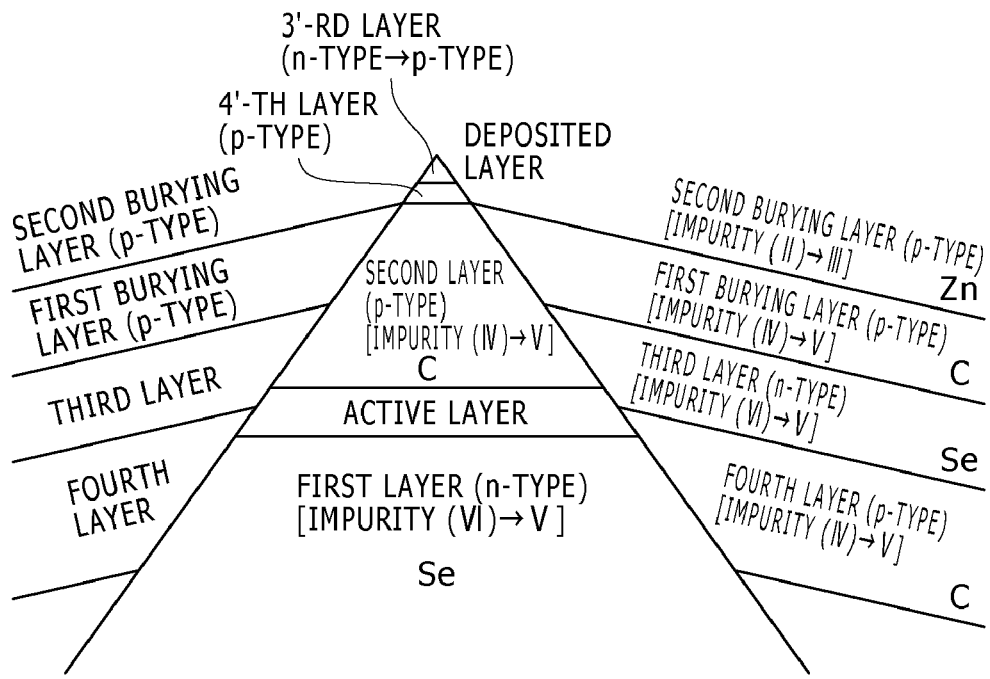
FIGS. 11A and 11B are conceptual diagrams of another modification example of the semiconductor light emitting device according to the ninth embodiment.
Figure 11B:
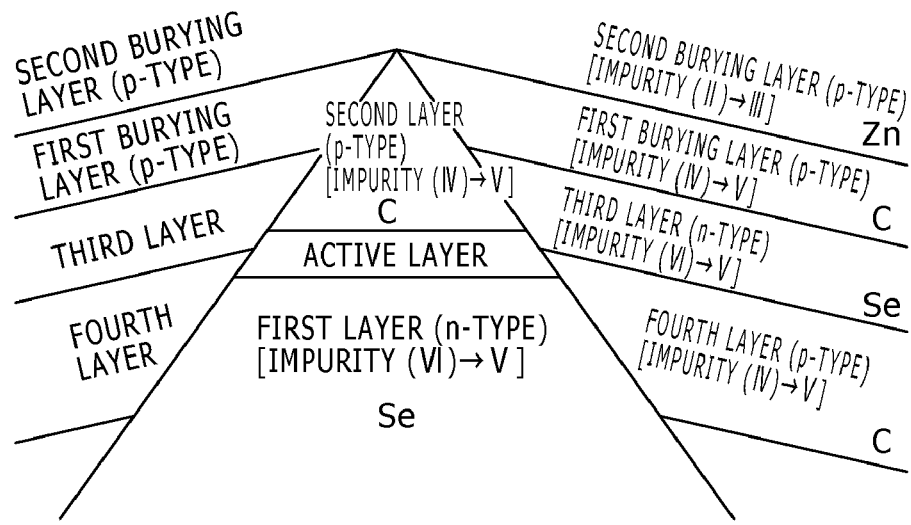
Figure 12A:
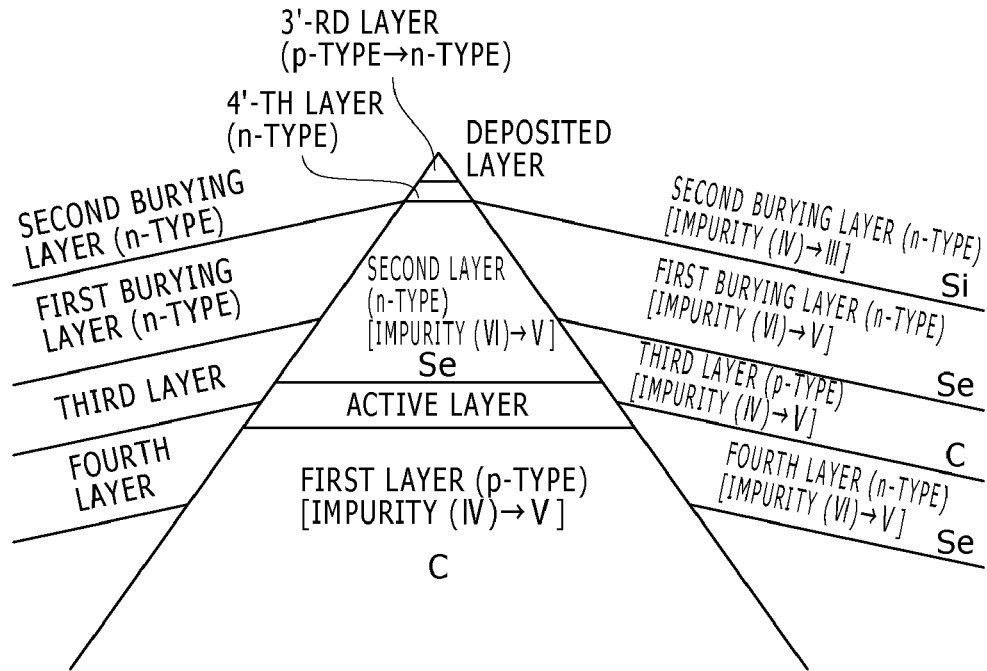
FIGS. 12A and 12B are conceptual diagrams of yet another modification example of the semiconductor light emitting device according to the ninth embodiment.

A modification example of the semiconductor light emitting device of the ninth embodiment is shown in FIG. 11A as a conceptual diagram of the end parts of the light emitting part and FIG. 11B as a conceptual diagram of the center part of the light emitting part. Furthermore, another modification example of the semiconductor light emitting device of the ninth embodiment is shown in FIG. 12A as a conceptual diagram of the end parts of the light emitting part and FIG. 12B as a conceptual diagram of the center part of the light emitting part. These modification examples correspond to the semiconductor light emitting device according to the (5-a)-th mode of the present invention. In this semiconductor light emitting device, the substitution site of the impurity in the first compound semiconductor layer, the substitution site of the impurity in the second compound semiconductor layer, the substitution site of the impurity in the fourth compound semiconductor layer, and the substitution site of the impurity in the third compound semiconductor layer are the site occupied by a group V atom. The substitution site of the impurity in the first burying layer is the site occupied by a group V atom, and the substitution site of the impurity in the second burying layer is the site occupied by a group III atom.

The modification example of the semiconductor light emitting device of the ninth embodiment whose conceptual diagrams are shown in FIGS. 11A and 11B correspond to the semiconductor light emitting device according to the (5-a-1)-th mode of the present invention. In this semiconductor light emitting device, the impurity for causing the first compound semiconductor layer and the third compound semiconductor layer to be the n-type as the first conductivity type is a group VI impurity (specifically, Se), the impurity for causing the second compound semiconductor layer and the fourth compound semiconductor layer to be the p-type as the second conductivity type is carbon (C), and the impurity for causing the first burying layer to be the p-type as the second conductivity type is carbon (C), and the impurity for causing the second burying layer to be the p-type as the second conductivity type is a group II impurity.

More specifically, in this modification example of the semiconductor light emitting device of the ninth embodiment, the respective layers have the configuration shown in Table 9C shown below.

TABLE 9C

| (Configuration of light emitting part) | |
|---|---|
| Second compound semiconductor layer | p-$Al_{0.47}Ga_{0.53}As$: C |
| Second compound semiconductor layer | p-$Al_{0.4}Ga_{0.6}As$: C |
| Active layer | [Active layer-A] |
| First compound semiconductor layer (Current block layer) | n-$Al_{0.4}Ga_{0.6}As$: Se |
| Second burying layer | p-$Al_{0.47}Ga_{0.53}As$: Zn |
| First burying layer | p-$Al_{0.47}Ga_{0.53}As$: C |
| Third compound semiconductor layer | n-$Al_{0.47}Ga_{0.53}As$: Se |
| Fourth compound semiconductor layer | p-$Al_{0.47}Ga_{0.53}As$: C |
| Adjustment layer (Whole) | p-$Al_{0.47}Ga_{0.53}As$: Zn |
| Contact layer 32 | p-GaAs: Zn (or C) |

Figure 12B:
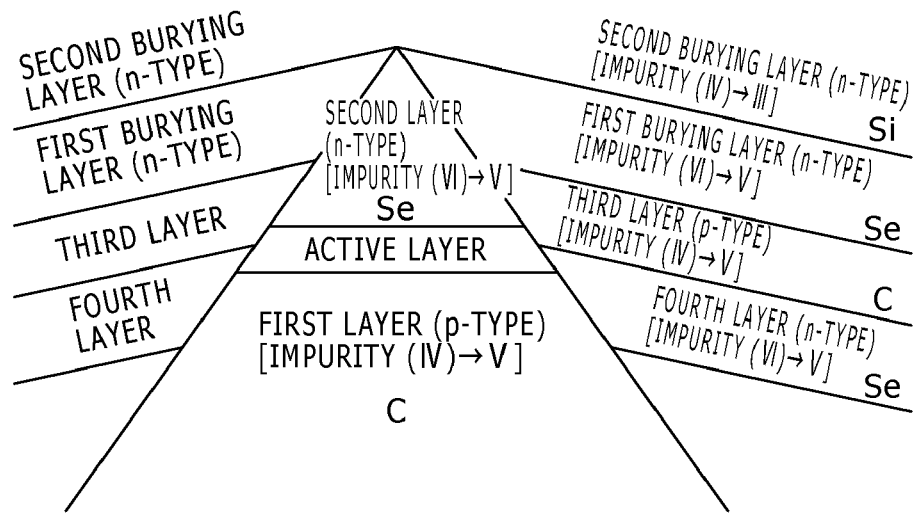

The modification example of the semiconductor light emitting device of the ninth embodiment whose conceptual diagrams are shown in FIGS. 12A and 12B correspond to the semiconductor light emitting device according to the (5-a-2)-th mode of the present invention. In this semiconductor light emitting device, the impurity for causing the first compound semiconductor layer and the third compound semiconductor layer to be the p-type as the first conductivity type is carbon (C), the impurity for causing the second compound semiconductor layer and the fourth compound semiconductor layer to be the n-type as the second conductivity type is a group VI impurity (specifically, Se), and the impurity for causing the first burying layer to be the n-type as the second conductivity type is a group VI impurity, and the impurity for causing the second burying layer to be the n-type as the second conductivity type is a group IV impurity.

More specifically, in this modification example of the semiconductor light emitting device of the ninth embodiment, the respective layers have the configuration shown in Table 9D shown below.

TABLE 9D

| (Configuration of light emitting part) | |
|---|---|
| Second compound semiconductor layer | n-$Al_{0.47}Ga_{0.53}As$: Se |
| Second compound semiconductor layer | n-$Al_{0.4}Ga_{0.6}As$: Se |
| Active layer | [Active layer-B] |
| First compound semiconductor layer (Current block layer) | p-$Al_{0.4}Ga_{0.6}As$: C |
| Second burying layer | n-$Al_{0.47}Ga_{0.53}As$: Si |
| First burying layer | n-$Al_{0.47}Ga_{0.53}As$: Se |
| Third compound semiconductor layer | p-$Al_{0.47}Ga_{0.53}As$: C |
| Fourth compound semiconductor layer | n-$Al_{0.47}Ga_{0.53}As$: Se |
| Adjustment layer (Whole) | n-$Al_{0.47}Ga_{0.53}As$: Se |
| Contact layer | p-GaAs: Zn (or C) |

Figure 13A:
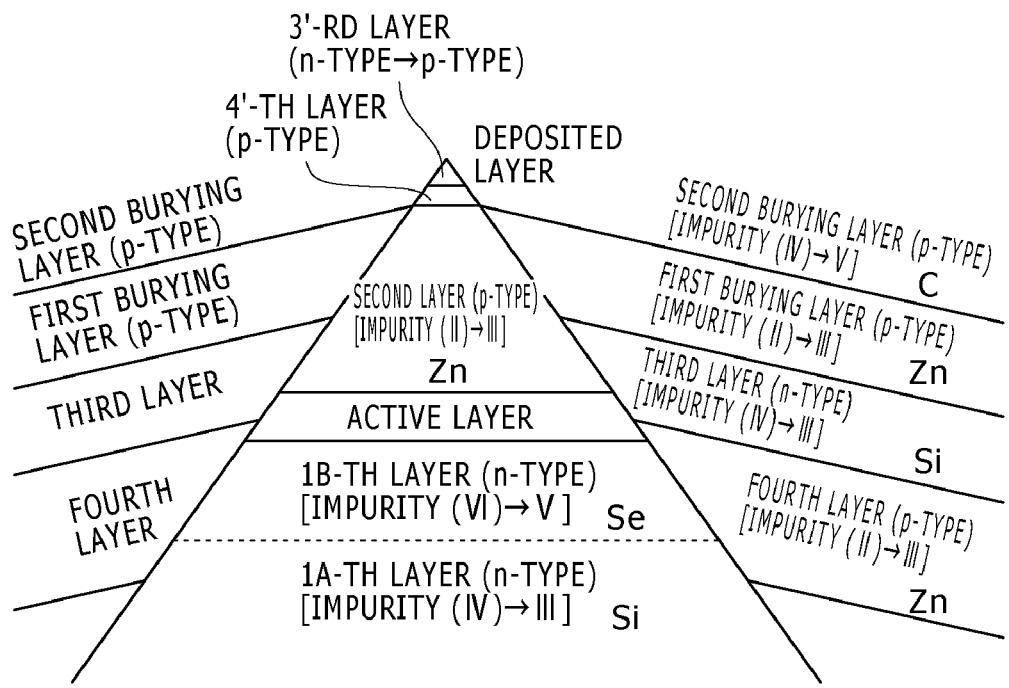
FIGS. 13A and 13B are conceptual diagrams of yet another modification example of the semiconductor light emitting device according to the ninth embodiment.
Figure 13B:
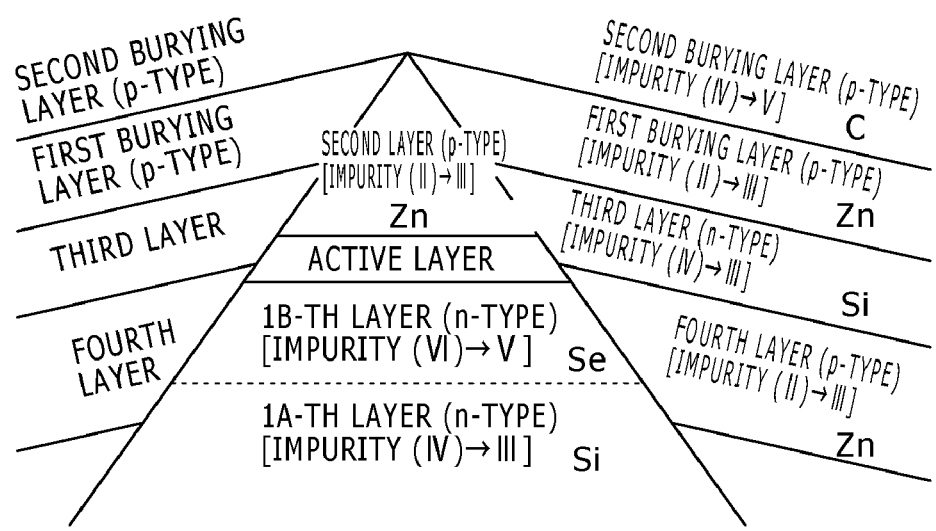
Figure 14A:
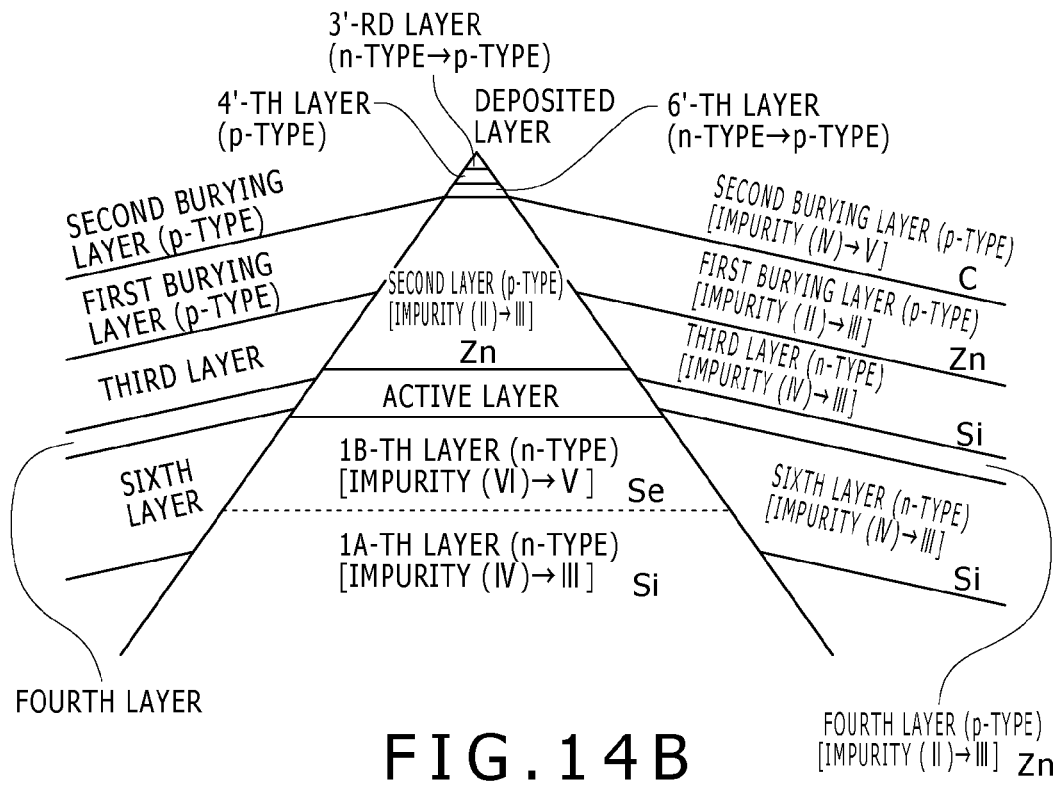
FIGS. 14A and 14B are conceptual diagrams of yet another modification example of the semiconductor light emitting device according to the ninth embodiment.
Figure 14B:
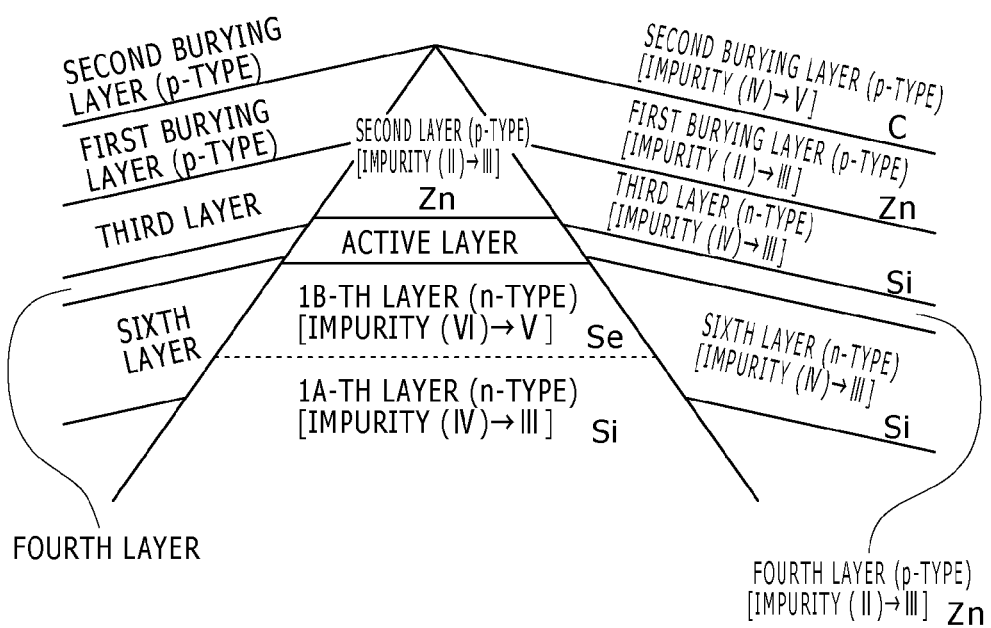
Figure 15A:
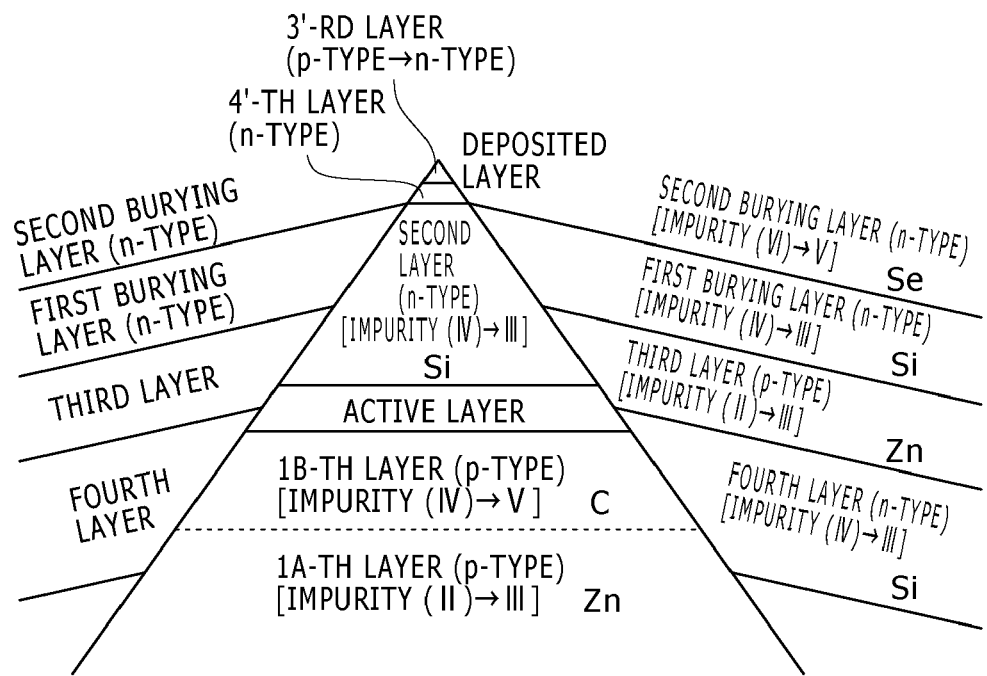
FIGS. 15A and 15B are conceptual diagrams of yet another modification example of the semiconductor light emitting device according to the ninth embodiment.

A modification example of the semiconductor light emitting device of the ninth embodiment is shown in FIG. 13A as a conceptual diagram of the end parts of the light emitting part and FIG. 13B as a conceptual diagram of the center part of the light emitting part. Furthermore, another modification example of the semiconductor light emitting device of the ninth embodiment is shown in FIG. 15A as a conceptual diagram of the end parts of the light emitting part and FIG. 15B as a conceptual diagram of the center part of the light emitting part. These modification examples correspond to the semiconductor light emitting device according to the (5-B)-th mode of the present invention. In this semiconductor light emitting device, the first compound semiconductor layer is composed of a 1A-th compound semiconductor layer and a 1B-th compound semiconductor layer that is provided on the 1A-th compound semiconductor layer and is in contact with an active layer, and the impurity for causing the 1B-th compound semiconductor layer to have the first conductivity type is such that the substitution site of the impurity in the 1B-th compound semiconductor layer does not compete with the substitution site of the impurity in the 1A-th compound semiconductor layer for causing the 1A-th compound semiconductor layer to have the first conductivity type, and does not compete with the substitution site of the impurity in the second compound semiconductor layer for causing the second compound semiconductor layer to have the second conductivity type. The impurity for causing the 1A-th compound semiconductor layer to have the first conductivity type is such that the substitution site of the impurity in the 1A-th compound semiconductor layer competes with the substitution site of the impurity in the fourth compound semiconductor layer for causing the fourth compound semiconductor layer to have the second conductivity type. Specifically, the substitution site of the impurity in the 1A-th compound semiconductor layer, the substitution site of the impurity in the second compound semiconductor layer, the substitution site of the impurity in the fourth compound semiconductor layer, and the substitution site of the impurity in the third compound semiconductor layer are the site occupied by a group III atom. The substitution site of the impurity in the 1B-th compound semiconductor layer is the site occupied by a group V atom. The substitution site of the impurity in the first burying layer is the site occupied by a group III atom. The substitution site of the impurity in the second burying layer is the site occupied by a group V atom.

The modification example of the semiconductor light emitting device of the ninth embodiment whose conceptual diagrams are shown in FIGS. 13A and 13B correspond to the semiconductor light emitting device according to the (5-B-1)-th mode of the present invention. In this semiconductor light emitting device, the impurity for causing the 1A-th compound semiconductor layer and the third compound semiconductor layer to be the n-type as the first conductivity type is a group IV impurity (specifically, Si), the impurity for causing the 1B-th compound semiconductor layer to be the n-type as the first conductivity type is a group VI impurity (specifically, Se), the impurity for causing the second compound semiconductor layer and the fourth compound semiconductor layer to be the p-type as the second conductivity type is a group II impurity (specifically, Zn), and the impurity for causing the first burying layer to be the p-type as the second conductivity type is a group II impurity, and the impurity for causing the second burying layer to be the p-type as the second conductivity type is carbon (C).

More specifically, in this modification example of the semiconductor light emitting device of the ninth embodiment, the respective layers have the configuration shown in Table 9E shown below.

TABLE 9E (Configuration of light emitting part)

| | |
|---|---|
| Second compound semiconductor layer | p-$Al_{0.47}Ga_{0.53}As$: Zn |
| Second compound semiconductor layer | p-$Al_{0.4}Ga_{0.6}As$: Zn |
| Active layer | [Active layer-A] |
| 1B-th compound semiconductor layer | n-$Al_{0.4}Ga_{0.6}As$: Se |
| 1A-th compound semiconductor layer | n-$Al_{0.4}Ga_{0.6}As$: Si |
| (Current block layer) | |
| Second burying layer | p-$Al_{0.47}Ga_{0.53}As$: C |
| First burying layer | p-$Al_{0.47}Ga_{0.53}As$: Zn |
| Third compound semiconductor layer | n-$Al_{0.47}Ga_{0.53}As$: Si |
| Fourth compound semiconductor layer | p-$Al_{0.47}Ga_{0.53}As$: Zn |
| Adjustment layer | p-$Al_{0.47}Ga_{0.53}As$: Zn |
| (Whole) | |
| Contact layer | p-GaAs: Zn (or C) |

Figure 15B:
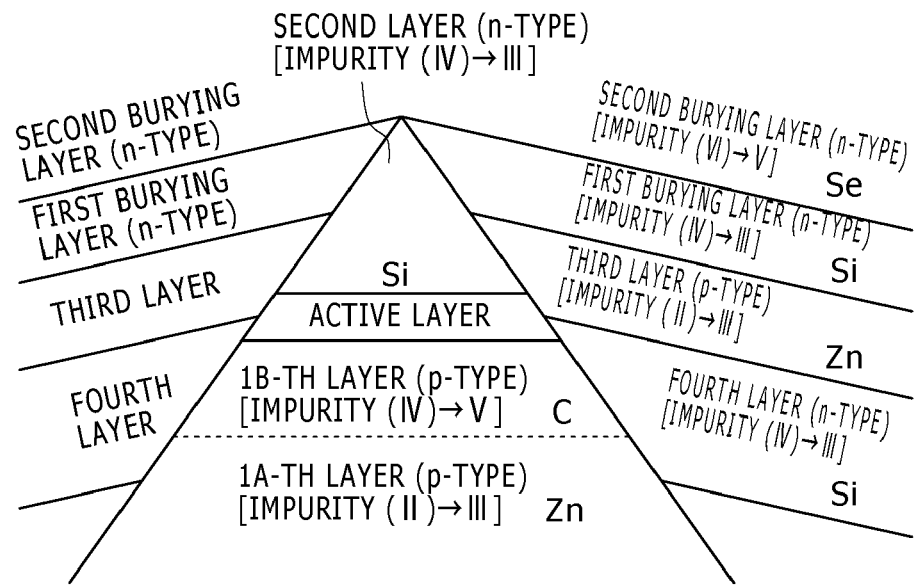

The modification example of the semiconductor light emitting device of the ninth embodiment whose conceptual diagrams are shown in FIGS. 15A and 15B correspond to the semiconductor light emitting device according to the (5-B-2)-th mode of the present invention. In this semiconductor light emitting device, the impurity for causing the 1A-th compound semiconductor layer and the third compound semiconductor layer to be the p-type as the first conductivity type is a group II impurity (specifically, Zn), the impurity for causing the 1B-th compound semiconductor layer to be the p-type as the first conductivity type is carbon (C), the impurity for causing the second compound semiconductor layer and the fourth compound semiconductor layer to be the n-type as the second conductivity type is a group IV impurity (specifically, Si), and the impurity for causing the first burying layer to be the n-type as the second conductivity type is a group IV impurity, and the impurity for causing the second burying layer to be the n-type as the second conductivity type is a group VI impurity.

More specifically, in this modification example of the semiconductor light emitting device of the ninth embodiment, the respective layers have the configuration shown in Table 9F shown below.

TABLE 9F (Configuration of light emitting part)

| | |
|---|---|
| Second compound semiconductor layer | n-$Al_{0.47}Ga_{0.53}As$: Si |
| Second compound semiconductor layer | n-$Al_{0.4}Ga_{0.6}As$: Si |
| Active layer | [Active layer-B] |
| 1B-th compound semiconductor layer | p-$Al_{0.4}Ga_{0.6}As$: C |
| 1A-th compound semiconductor layer | p-$Al_{0.4}Ga_{0.6}As$: Zn |
| (Current block layer) | |
| Second burying layer | n-$Al_{0.47}Ga_{0.53}As$: Se |
| First burying layer | n-$Al_{0.47}Ga_{0.53}As$: Si |
| Third compound semiconductor layer | p-$Al_{0.47}Ga_{0.53}As$: Zn |
| Fourth compound semiconductor layer | n-$Al_{0.47}Ga_{0.53}As$: Si |
| Adjustment layer | n-$Al_{0.47}Ga_{0.53}As$: Se |
| (Whole) | |
| Contact layer | p-GaAs: Zn (or C) |

Conceptual diagrams of further-modified examples of the modification examples of the semiconductor light emitting device of the ninth embodiment whose conceptual diagrams are shown in FIGS. 13A and 13B and FIGS. 15A and 15B are shown in FIGS. 14A and 14B and FIGS. 16A and 16B. In these further-modified examples, a sixth compound semiconductor layer of the first conductivity type is provided under the fourth compound semiconductor layer, the impurity for causing the sixth compound semiconductor layer and the 1A-th compound semiconductor layer to have the first conductivity type is such that the substitution site of the impurity in the sixth compound semiconductor layer competes with the substitution site of the impurity in the 1A-th compound semiconductor layer for causing the 1A-th compound semiconductor layer to have the first conductivity type (specifically, a group IV impurity, Si, in FIGS. 14A and 14B, and a group II impurity, Zn, in FIGS. 16A and 16B), and the sixth compound semiconductor layer is in contact with the side surface of the first compound semiconductor layer (at least a part of the side surface of the 1A-th compound semiconductor layer and all of the side surface of the 1B-th compound semiconductor layer), and the third compound semiconductor layer is in contact with the side surface of the second compound semiconductor layer. The bypass channel is composed of the first compound semiconductor layer (the 1A-th compound semiconductor layer and the 1B-th compound semiconductor layer), the sixth compound semiconductor layer, the fourth compound semiconductor layer, the third compound semiconductor layer, and the second compound semiconductor layer. The pn junction interfaces are formed of the following three interfaces: the interface between the sixth compound semiconductor layer and the fourth compound semiconductor layer; the interface between the fourth compound semiconductor layer and the third compound semiconductor layer; and the interface between the third compound semiconductor layer and the side surface of the second compound semiconductor layer.

Figure 17A:
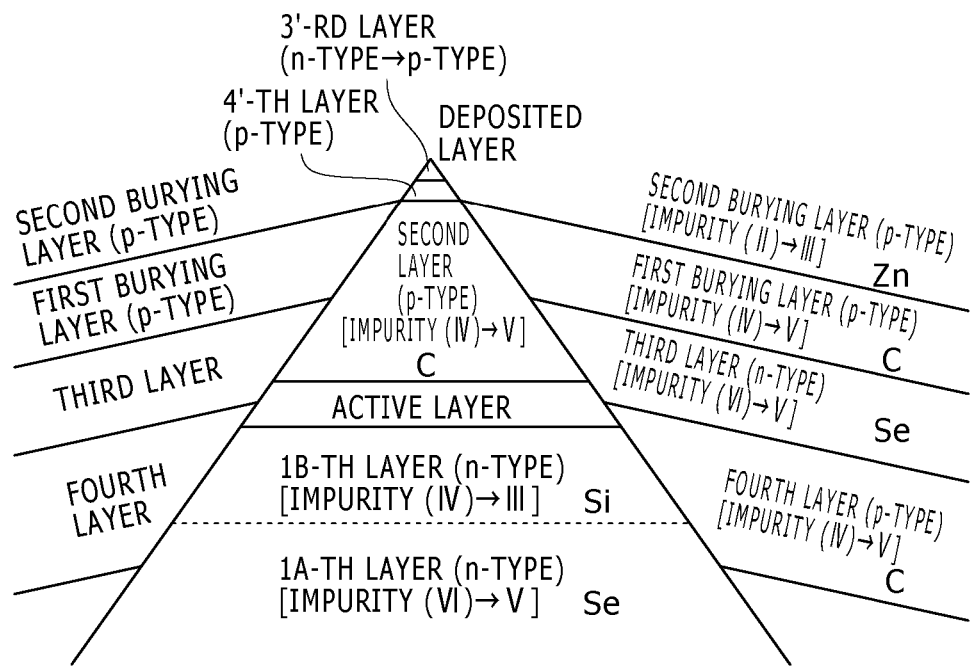
FIGS. 17A and 17B are conceptual diagrams of yet another modification example of the semiconductor light emitting device according to the ninth embodiment.
Figure 17B:
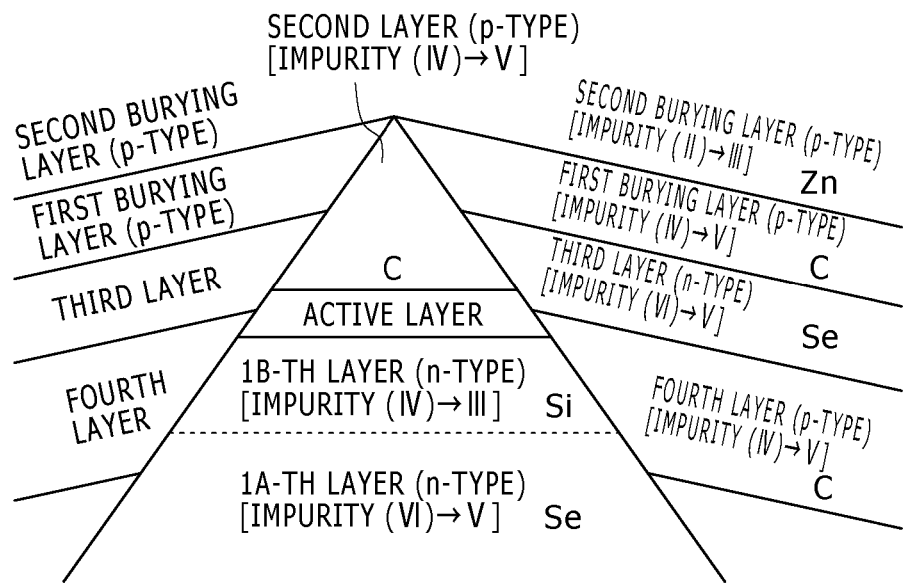
Figure 19A:
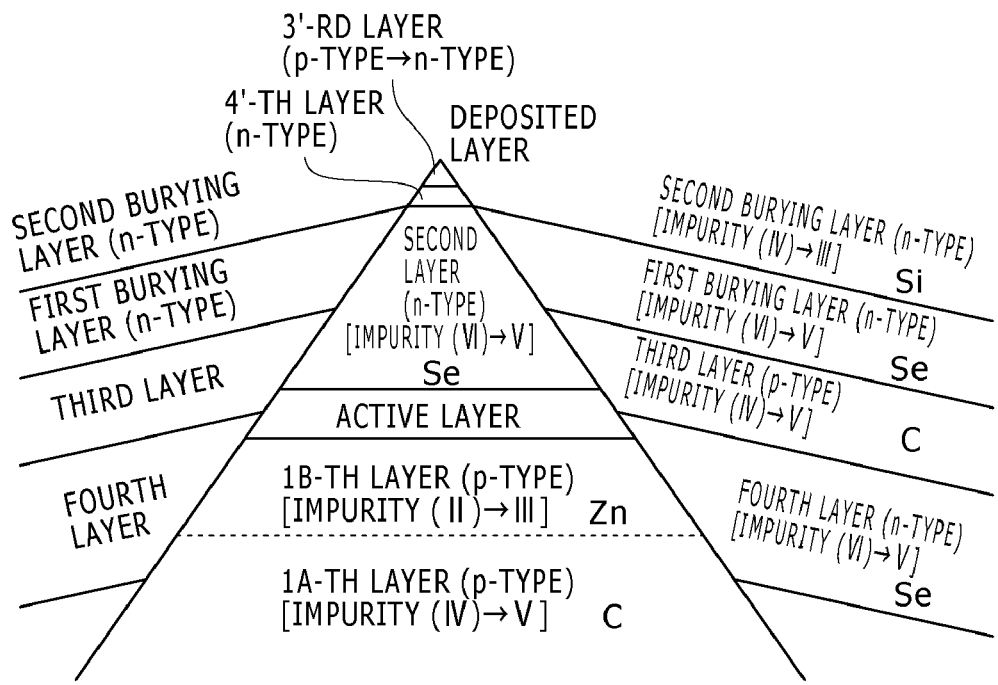
FIGS. 19A and 19B are conceptual diagrams of yet another modification example of the semiconductor light emitting device according to the ninth embodiment.

A modification example of the semiconductor light emitting device of the ninth embodiment is shown in FIG. 17A as a conceptual diagram of the end parts of the light emitting part and FIG. 17B as a conceptual diagram of the center part of the light emitting part. Furthermore, another modification example of the semiconductor light emitting device of the ninth embodiment is shown in FIG. 19A as a conceptual diagram of the end parts of the light emitting part and FIG. 19B as a conceptual diagram of the center part of the light emitting part. These modification examples correspond to the semiconductor light emitting device according to the (5-b)-th mode of the present invention. In this semiconductor light emitting device, the substitution site of the impurity in the 1A-th compound semiconductor layer, the substitution site of the impurity in the second compound semiconductor layer, the substitution site of the impurity in the fourth compound semiconductor layer, and the substitution site of the impurity in the third compound semiconductor layer are the site occupied by a group V atom. The substitution site of the impurity in the 1B-th compound semiconductor layer is the site occupied by a group III atom. The substitution site of the impurity in the first burying layer is the site occupied by a group V atom, and the substitution site of the impurity in the second burying layer is the site occupied by a group III atom.

The modification example of the semiconductor light emitting device of the ninth embodiment whose conceptual diagrams are shown in FIGS. 17A and 17B correspond to the semiconductor light emitting device according to the (5-b-1)-th mode of the present invention. In this semiconductor light emitting device, the impurity for causing the 1A-th compound semiconductor layer and the third compound semiconductor layer to be the n-type as the first conductivity type is a group VI impurity (specifically, Se), the impurity for causing the 1B-th compound semiconductor layer to be the n-type as the first conductivity type is a group IV impurity (specifically, Si), the impurity for causing the second compound semiconductor layer and the fourth compound semiconductor layer to be the p-type as the second conductivity type is carbon (C), and the impurity for causing the first burying layer to be the p-type as the second conductivity type is carbon (C), and the impurity for causing the second burying layer to be the p-type as the second conductivity type is a group II impurity.

More specifically, in this modification example of the semiconductor light emitting device of the ninth embodiment, the respective layers have the configuration shown in Table 9G shown below.

TABLE 9G (Configuration of light emitting part)

| Second compound semiconductor layer | p-$Al_{0.47}Ga_{0.53}As$: C |
| Second compound semiconductor layer | p-$Al_{0.4}Ga_{0.6}As$: C |
| Active layer | [Active layer-A] |
| 1B-th compound semiconductor layer | n-$Al_{0.4}Ga_{0.6}As$: Si |
| 1A-th compound semiconductor layer | n-$Al_{0.4}Ga_{0.6}As$: Se |
| (Current block layer) | |
| Second burying layer | p-$Al_{0.47}Ga_{0.53}As$: Zn |
| First burying layer | p-$Al_{0.47}Ga_{0.53}As$: C |
| Third compound semiconductor layer | n-$Al_{0.47}Ga_{0.53}As$: Se |
| Fourth compound semiconductor layer | p-$Al_{0.47}Ga_{0.53}As$: C |
| Adjustment layer | p-$Al_{0.47}Ga_{0.53}As$: Zn |
| (Whole) | |
| Contact layer | p-GaAs: Zn (or C) |

Figure 19B:
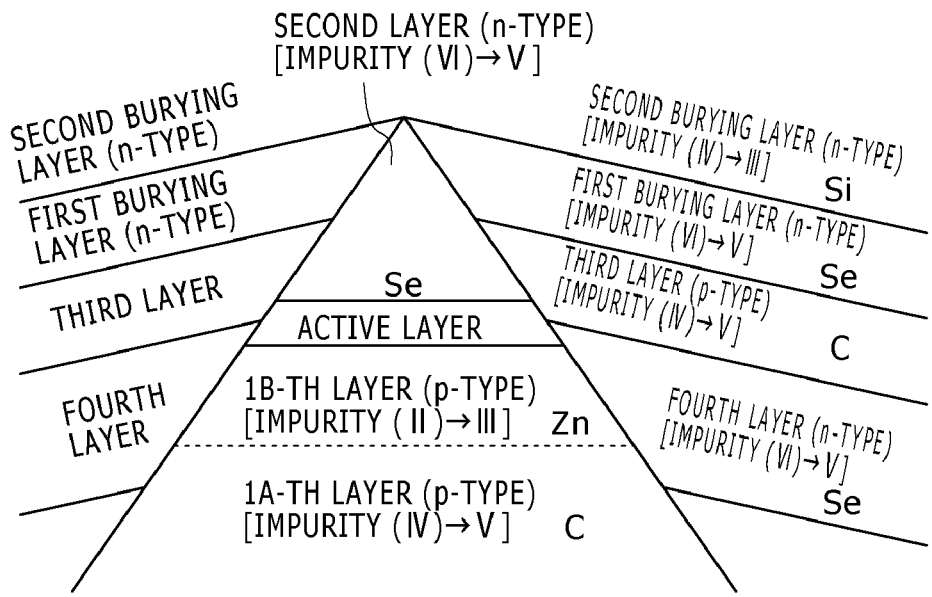

The modification example of the semiconductor light emitting device of the ninth embodiment whose conceptual diagrams are shown in FIGS. 19A and 19B correspond to the semiconductor light emitting device according to the (5-b-2)-th mode of the present invention. In this semiconductor light emitting device, the impurity for causing the 1A-th compound semiconductor layer and the third compound semiconductor layer to be the p-type as the first conductivity type is carbon (C), the impurity for causing the 1B-th compound semiconductor layer to be the p-type as the first conductivity type is a group II impurity (specifically, Zn), the impurity for causing the second compound semiconductor layer and the fourth compound semiconductor layer to be the n-type as the second conductivity type is a group VI impurity (specifically, Se), and the impurity for causing the first burying layer to be the n-type as the second conductivity type is a group VI impurity, and the impurity for causing the second burying layer to be the n-type as the second conductivity type is a group IV impurity.

More specifically, in this modification example of the semiconductor light emitting device of the ninth embodiment, the respective layers have the configuration shown in Table 9H shown below.

TABLE 9H (Configuration of light emitting part)

| Second compound semiconductor layer | n-$Al_{0.47}Ga_{0.53}As$: Se |
| Second compound semiconductor layer | n-$Al_{0.4}Ga_{0.6}As$: Se |
| Active layer | [Active layer-B] |
| 1B-th compound semiconductor layer | p-$Al_{0.4}Ga_{0.6}As$: Zn |
| 1A-th compound semiconductor layer | p-$Al_{0.4}Ga_{0.6}As$: C |
| (Current block layer) | |
| Second burying layer | n-$Al_{0.47}Ga_{0.53}As$: Si |
| First burying layer | n-$Al_{0.47}Ga_{0.53}As$: Se |
| Third compound semiconductor layer | p-$Al_{0.47}Ga_{0.53}As$: C |
| Fourth compound semiconductor layer | n-$Al_{0.47}Ga_{0.53}As$: Se |
| Adjustment layer | n-$Al_{0.47}Ga_{0.53}As$: Se |
| (Whole) | |
| Contact layer | p-GaAs: Zn (or C) |

Conceptual diagrams of further-modified examples of the modification examples of the semiconductor light emitting device of the ninth embodiment whose conceptual diagrams are shown in FIGS. 17A and 17B and FIGS. 19A and 19B are shown in FIGS. 18A and 18B and FIGS. 20A and 20B. Also in these further-modified examples, the sixth compound semiconductor layer of the first conductivity type is provided under the fourth compound semiconductor layer, the impurity for causing the sixth compound semiconductor layer to have the first conductivity type is such that the substitution site of the impurity in the sixth compound semiconductor layer competes with the substitution site of the impurity in the 1A-th compound semiconductor layer for causing the 1A-th compound semiconductor layer to have the first conductivity type (specifically, a group VI impurity, Se, in FIGS. 18A and 18B, and carbon (C) in FIGS. 20A and 20B), and the sixth compound semiconductor layer is in contact with the side surface of the first compound semiconductor layer (at least a part of the side surface of the 1A-th compound semiconductor layer and all of the side surface of the 1B-th compound semiconductor layer), and the third compound semiconductor layer is in contact with the side surface of the second compound semiconductor layer. The bypass channel is composed of the first compound semiconductor layer (the 1A-th compound semiconductor layer and the 1B-th compound semiconductor layer), the sixth compound semiconductor layer, the fourth compound semiconductor layer, the third compound semiconductor layer, and the second compound semiconductor layer. The pn junction interfaces are formed of the following three interfaces: the interface between the sixth compound semiconductor layer and the fourth compound semiconductor layer; the interface between the fourth compound semiconductor layer and the third compound semiconductor layer; and the interface between the third compound semiconductor layer and the side surface of the second compound semiconductor layer.

Figure 21A:
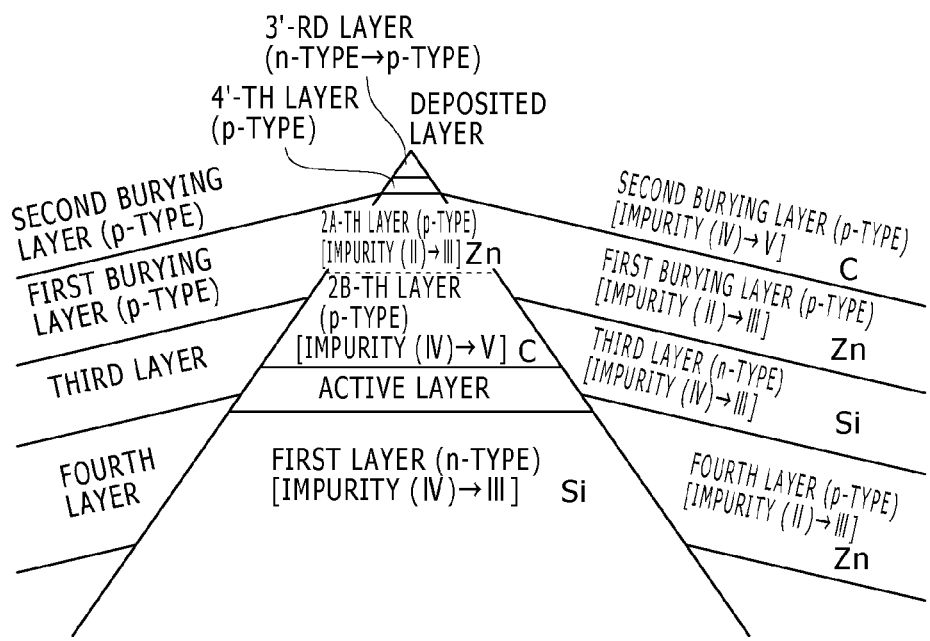
FIGS. 21A and 21B are conceptual diagrams of yet another modification example of the semiconductor light emitting device according to the ninth embodiment.
Figure 21B:
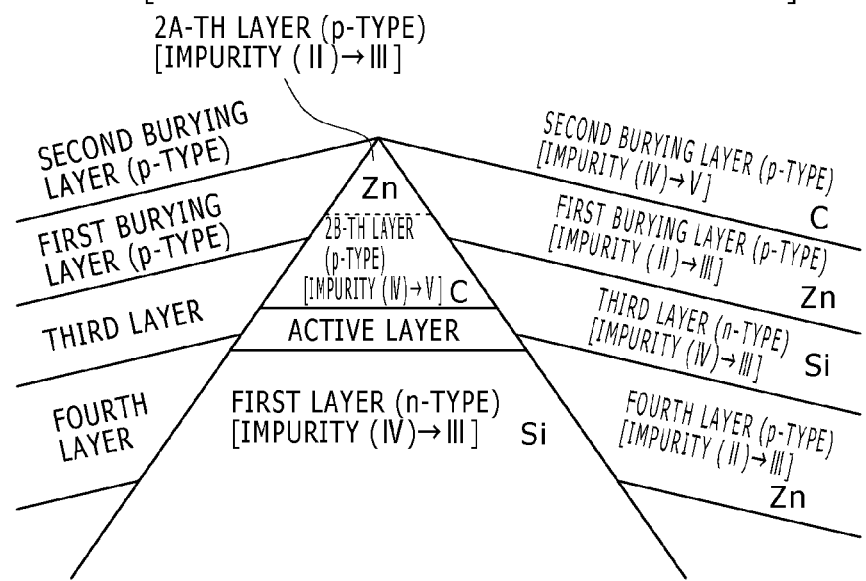
Figure 22A:
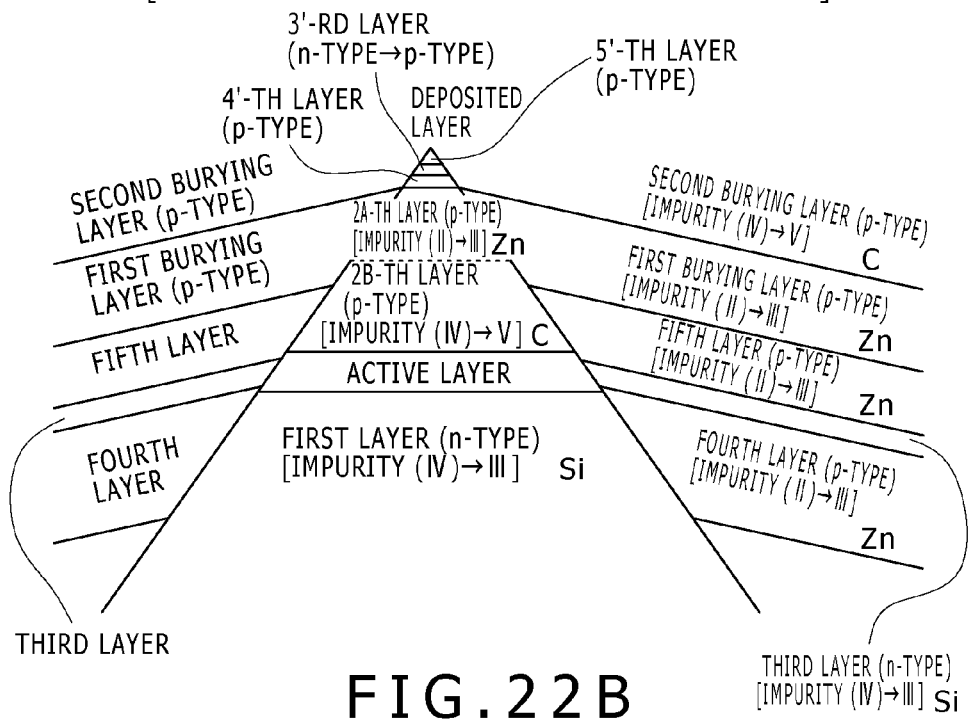
FIGS. 22A and 22B are conceptual diagrams of yet another modification example of the semiconductor light emitting device according to the ninth embodiment.
Figure 22B:
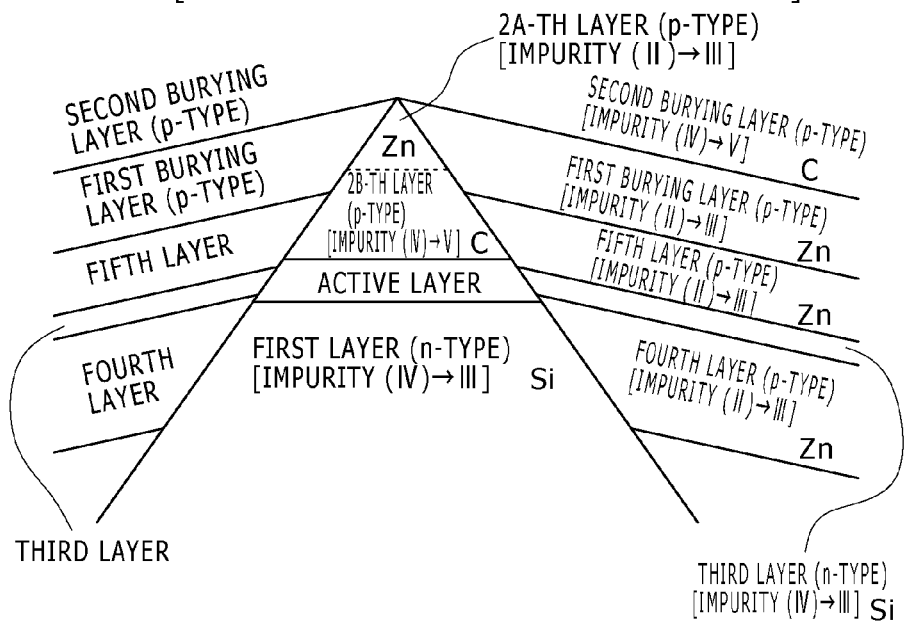
Figure 23A:
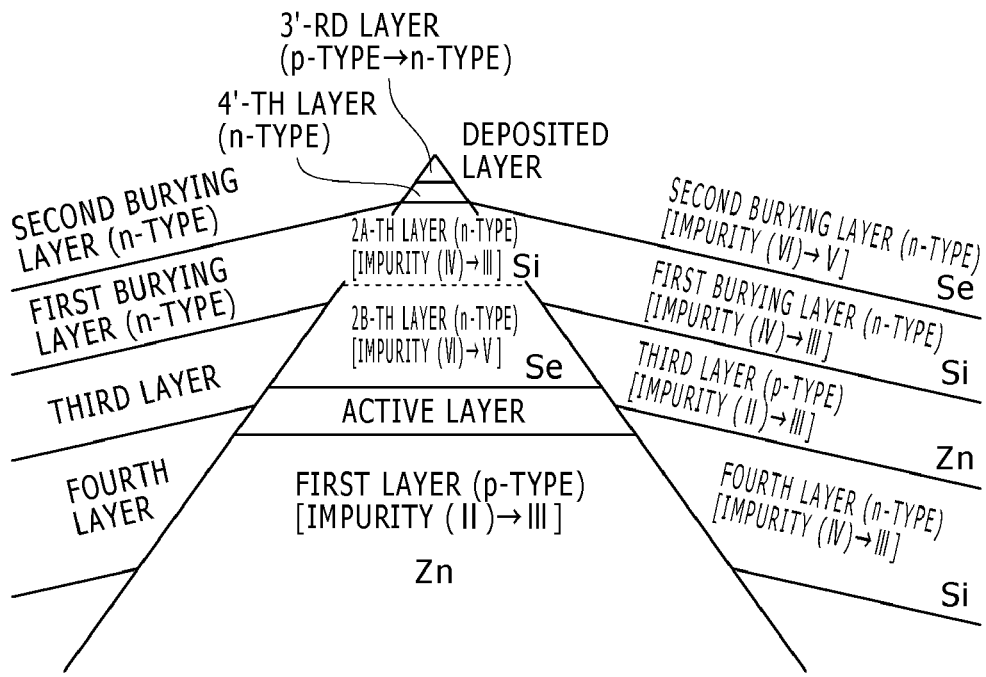
FIGS. 23A and 23B are conceptual diagrams of yet another modification example of the semiconductor light emitting device according to the ninth embodiment.

A modification example of the semiconductor light emitting device of the ninth embodiment is shown in FIG. 21A as a conceptual diagram of the end parts of the light emitting part and FIG. 21B as a conceptual diagram of the center part of the light emitting part. Furthermore, another modification example of the semiconductor light emitting device of the ninth embodiment is shown in FIG. 23A as a conceptual diagram of the end parts of the light emitting part and FIG. 23B as a conceptual diagram of the center part of the light emitting part. These modification examples correspond to the semiconductor light emitting device according to the (5-C)-th mode of the present invention. In this semiconductor light emitting device, the second compound semiconductor layer is composed of a 2B-th compound semiconductor layer in contact with the active layer and a 2A-th compound semiconductor layer provided on the 2B-th compound semiconductor layer, and the impurity for causing the 2B-th compound semiconductor layer to have the second conductivity type is such that the substitution site of the impurity in the 2B-th compound semiconductor layer does not compete with the substitution site of the impurity in the 2A-th compound semiconductor layer for causing the 2A-th compound semiconductor layer to have the second conductivity type, and does not compete with the substitution site of the impurity in the first compound semiconductor layer for causing the first compound semiconductor layer to have the first conductivity type. The impurity for causing the 2A-th compound semiconductor layer to have the second conductivity type is such that the substitution site of the impurity in the 2A-th compound semiconductor layer competes with the substitution site of the impurity in the third compound semiconductor layer for causing the third compound semiconductor layer to have the first conductivity type. Specifically, the substitution site of the impurity in the first compound semiconductor layer, the substitution site of the impurity in the 2A-th compound semiconductor layer, the substitution site of the impurity in the fourth compound semiconductor layer, and the substitution site of the impurity in the third compound semiconductor layer are the site occupied by a group III atom. The substitution site of the impurity in the 2B-th compound semiconductor layer is the site occupied by a group V atom. The substitution site of the impurity in the first burying layer is the site occupied by a group III atom. The substitution site of the impurity in the second burying layer is the site occupied by a group V atom.

The modification example of the semiconductor light emitting device of the ninth embodiment whose conceptual diagrams are shown in FIGS. 21A and 21B correspond to the semiconductor light emitting device according to the (5-C-1)-th mode of the present invention. In this semiconductor light emitting device, the impurity for causing the first compound semiconductor layer and the third compound semiconductor layer to be the n-type as the first conductivity type is a group IV impurity (specifically, Si), the impurity for causing the 2A-th compound semiconductor layer and the fourth compound semiconductor layer to be the p-type as the second conductivity type is a group II impurity (specifically, Zn), the impurity for causing the 2B-th compound semiconductor layer to be the p-type as the second conductivity type is carbon (C), and the impurity for causing the first burying layer to be the p-type as the second conductivity type is a group II impurity, and the impurity for causing the second burying layer to be the p-type as the second conductivity type is carbon (C).

More specifically, in this modification example of the semiconductor light emitting device of the ninth embodiment, the respective layers have the configuration shown in Table 9I shown below.

TABLE 9I (Configuration of light emitting part)

| | |
|---|---|
| 2B-th compound semiconductor layer | p-$Al_{0.4}Ga_{0.6}As$: Zn |
| 2A-th compound semiconductor layer | p-$Al_{0.4}Ga_{0.6}As$: C |
| Active layer | [Active layer-A] |
| First compound semiconductor layer (Current block layer) | n-$Al_{0.4}Ga_{0.6}As$: Si |
| Second burying layer | p-$Al_{0.47}Ga_{0.53}As$: C |
| First burying layer | p-$Al_{0.47}Ga_{0.53}As$: Zn |
| Third compound semiconductor layer | n-$Al_{0.47}Ga_{0.53}As$: Si |
| Fourth compound semiconductor layer | p-$Al_{0.47}Ga_{0.53}As$: Zn |
| Adjustment layer (Whole) | p-$Al_{0.47}Ga_{0.53}As$: Zn |
| Contact layer | p-GaAs: Zn (or C) |

Figure 23B:
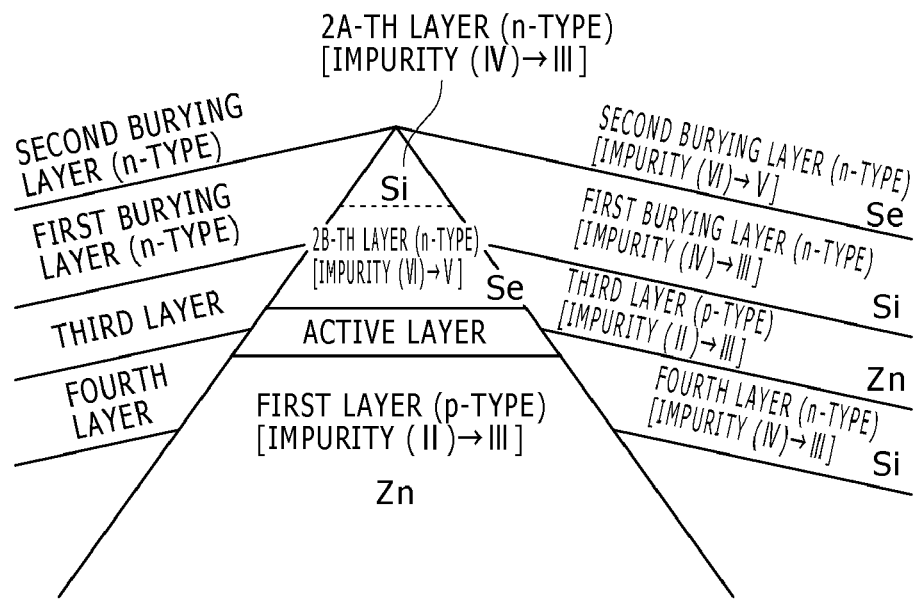
Figure 24A:
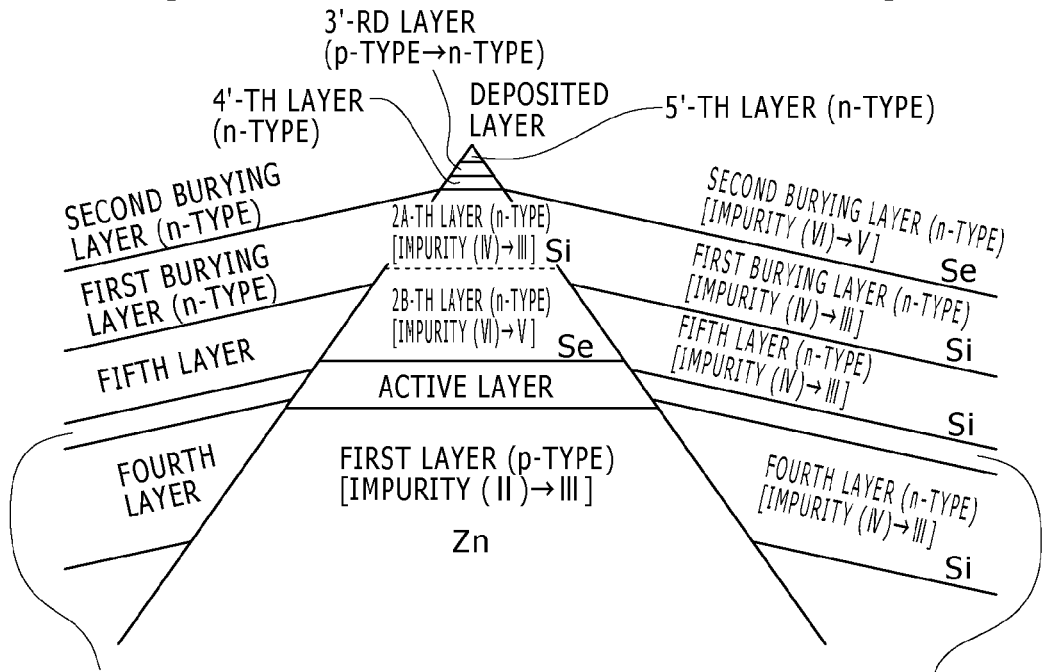
FIGS. 24A and 24B are conceptual diagrams of yet another modification example of the semiconductor light emitting device according to the ninth embodiment.
Figure 24B:
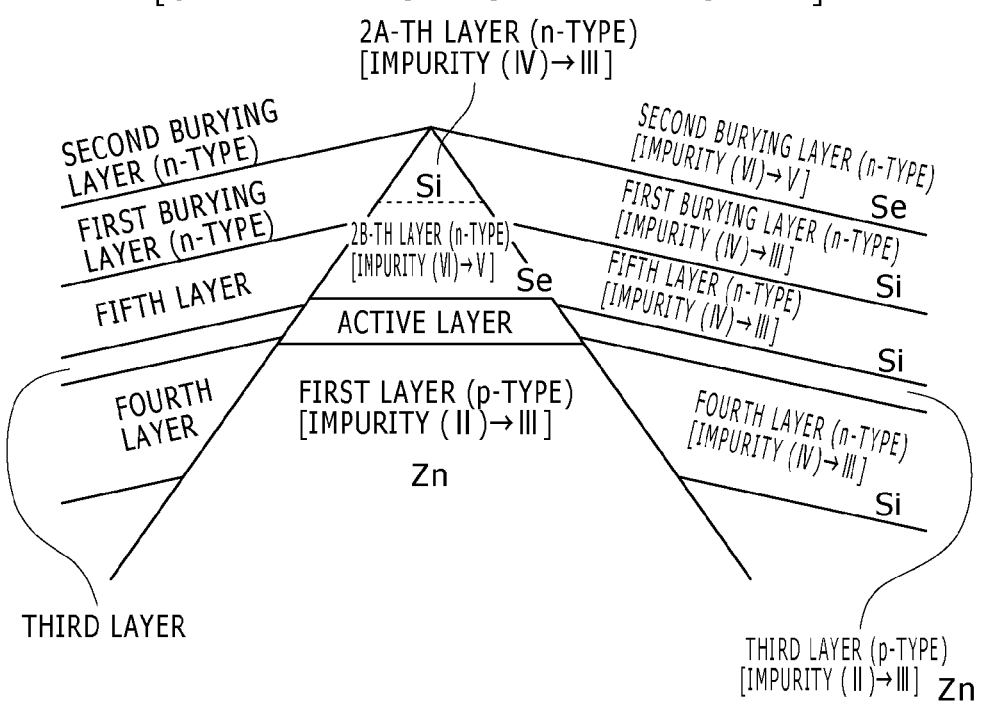

The modification example of the semiconductor light emitting device of the ninth embodiment whose conceptual diagrams are shown in FIGS. 23A and 23B correspond to the semiconductor light emitting device according to the (5-C-2)-th mode of the present invention. In this semiconductor light emitting device, the impurity for causing the first compound semiconductor layer and the third compound semiconductor layer to be the p-type as the first conductivity type is a group II impurity (specifically, Zn), the impurity for causing the 2A-th compound semiconductor layer and the fourth compound semiconductor layer to be the n-type as the second conductivity type is a group IV impurity (specifically, Si), the impurity for causing the 2B-th compound semiconductor layer to be the n-type as the second conductivity type is a group VI impurity (specifically, Se), and the impurity for causing the first burying layer to be the n-type as the second conductivity type is a group IV impurity, and the impurity for causing the second burying layer to be the n-type as the second conductivity type is a group VI impurity.

More specifically, in this modification example of the semiconductor light emitting device of the ninth embodiment, the respective layers have the configuration shown in Table 9J shown below.

TABLE 9J (Configuration of light emitting part)

| | |
|---|---|
| 2B-th compound semiconductor layer | n-$Al_{0.4}Ga_{0.6}As$: Si |
| 2A-th compound semiconductor layer | n-$Al_{0.4}Ga_{0.6}As$: Se |
| Active layer | [Active layer-B] |
| First compound semiconductor layer (Current block layer) | p-$Al_{0.4}Ga_{0.6}As$: Zn |
| Second burying layer | n-$Al_{0.47}Ga_{0.53}As$: Se |
| First burying layer | n-$Al_{0.47}Ga_{0.53}As$: Si |
| Third compound semiconductor layer | p-$Al_{0.47}Ga_{0.53}As$: Zn |

TABLE 9J-continued

| Fourth compound semiconductor layer | n-$Al_{0.47}Ga_{0.53}As$: Si |
|---|---|
| Adjustment layer (Whole) | n-$Al_{0.47}Ga_{0.53}As$: Se |
| Contact layer | p-GaAs: Zn (or C) |

Conceptual diagrams of further-modified examples of the modification examples of the semiconductor light emitting device of the ninth embodiment whose conceptual diagrams are shown in FIGS. 21A and 21B and FIGS. 23A and 23B are shown in FIGS. 22A and 22B and FIGS. 24A and 24B. In these further-modified examples, a fifth compound semiconductor layer of the second conductivity type is provided on the third compound semiconductor layer, the impurity for causing the fifth compound semiconductor layer to have the second conductivity type is such that the substitution site of the impurity in the fifth compound semiconductor layer competes with the substitution site of the impurity in the 2A-th compound semiconductor layer for causing the 2A-th compound semiconductor layer to have the second conductivity type (specifically, a group II impurity, Zn, in FIGS. 22A and 22B, and a group IV impurity, Si, in FIGS. 24A and 24B), and the fourth compound semiconductor layer is in contact with the side surface of the first compound semiconductor layer and the fifth compound semiconductor layer is in contact with the side surface of the second compound semiconductor layer (at least a part of the side surface of the 2A-th compound semiconductor layer and all of the side surface of the 2B-th compound semiconductor layer). The bypass channel is composed of the first compound semiconductor layer, the fourth compound semiconductor layer, the third compound semiconductor layer, the fifth compound semiconductor layer, and the second compound semiconductor layer (the 2A-th compound semiconductor layer and the 2B-th compound semiconductor layer). The pn junction interfaces are formed of the following three interfaces: the interface between the side surface of the first compound semiconductor layer and the fourth compound semiconductor layer; the interface between the fourth compound semiconductor layer and the third compound semiconductor layer; and the interface between the third compound semiconductor layer and the fifth compound semiconductor layer.

Figure 25A:
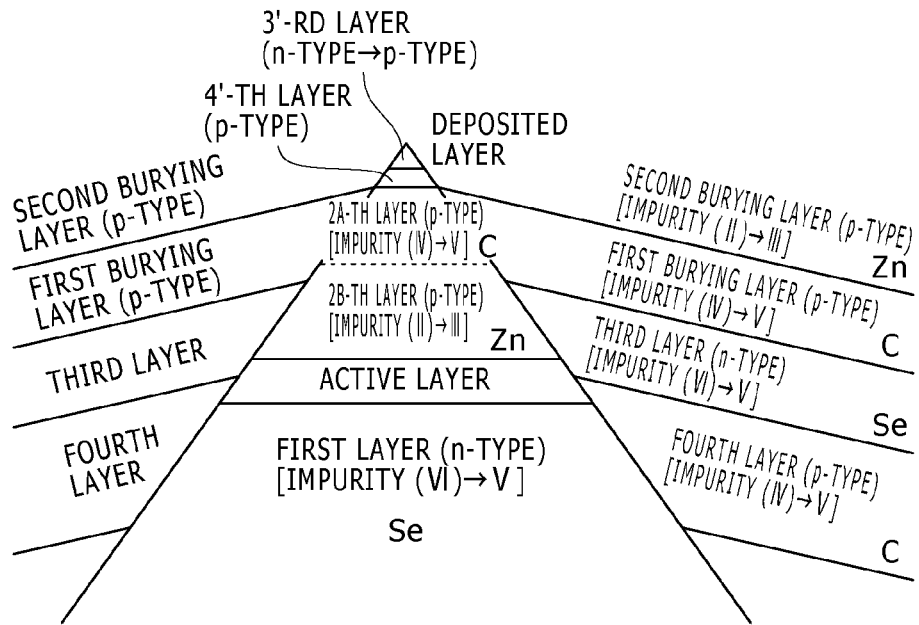
FIGS. 25A and 25B are conceptual diagrams of yet another modification example of the semiconductor light emitting device according to the ninth embodiment.
Figure 25B:
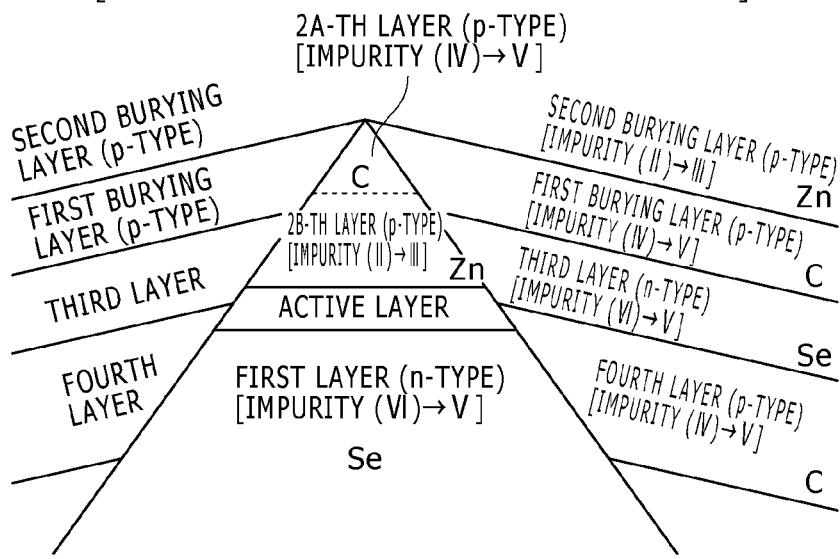
Figure 26A:
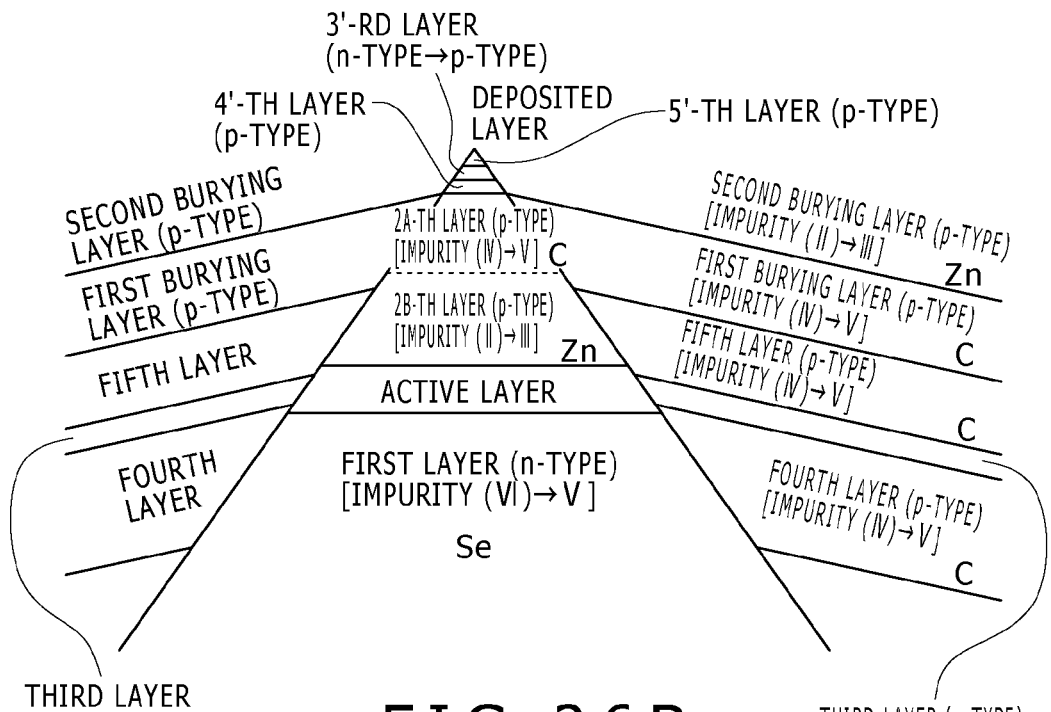
FIGS. 26A and 26B are conceptual diagrams of yet another modification example of the semiconductor light emitting device according to the ninth embodiment.
Figure 26B:
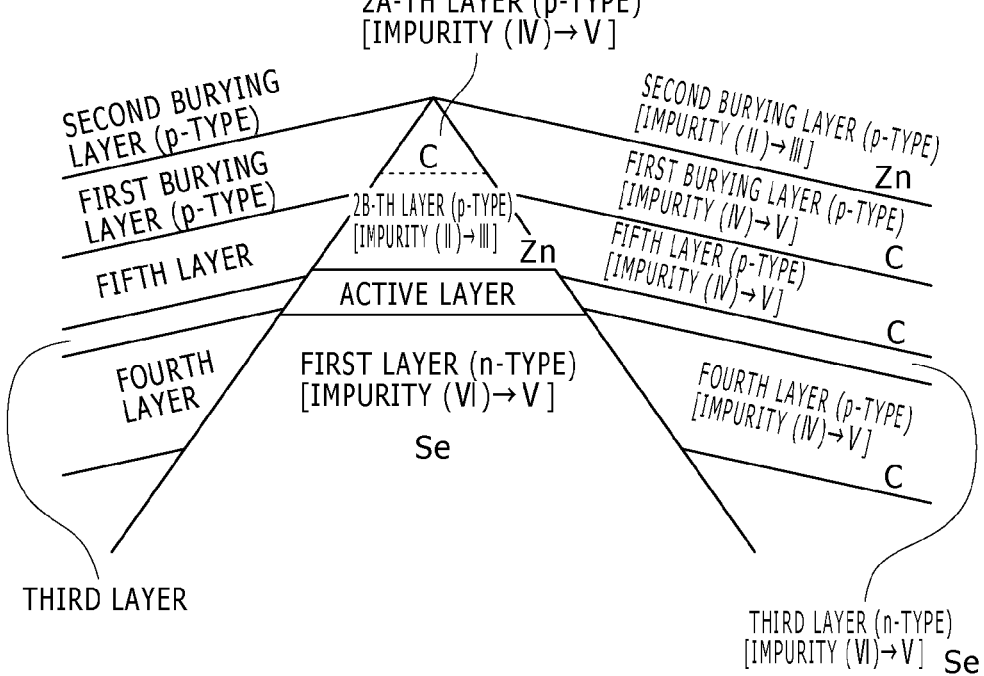
Figure 27A:
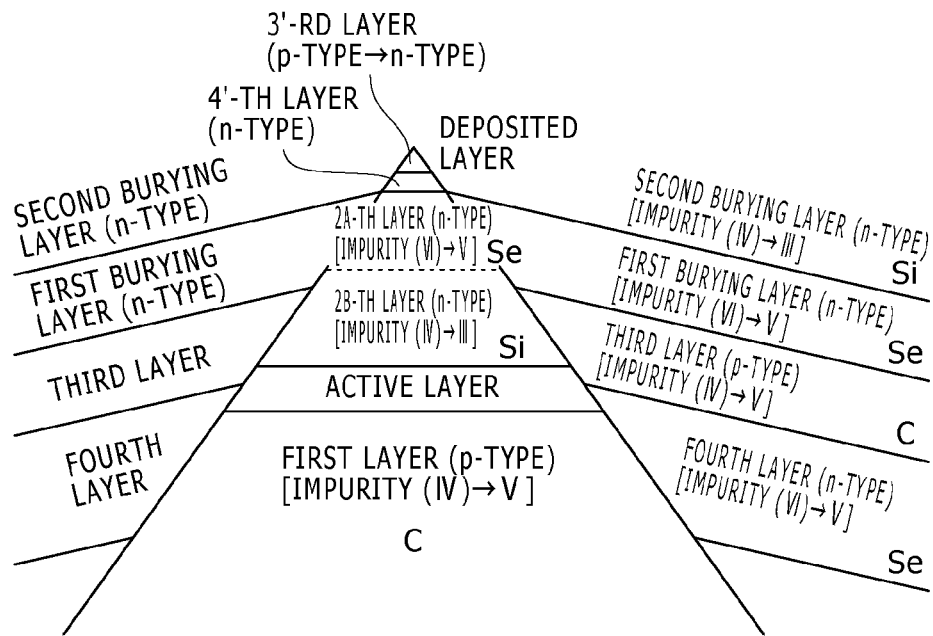
FIGS. 27A and 27B are conceptual diagrams of yet another modification example of the semiconductor light emitting device according to the ninth embodiment.

A modification example of the semiconductor light emitting device of the ninth embodiment is shown in FIG. 25A as a conceptual diagram of the end parts of the light emitting part and FIG. 25B as a conceptual diagram of the center part of the light emitting part. Furthermore, another modification example of the semiconductor light emitting device of the ninth embodiment is shown in FIG. 27A as a conceptual diagram of the end parts of the light emitting part and FIG. 27B as a conceptual diagram of the center part of the light emitting part. These modification examples correspond to the semiconductor light emitting device according to the (5-c)-th mode of the present invention. In this semiconductor light emitting device, the substitution site of the impurity in the first compound semiconductor layer, the substitution site of the impurity in the 2A-th compound semiconductor layer, the substitution site of the impurity in the fourth compound semiconductor layer, and the substitution site of the impurity in the third compound semiconductor layer are the site occupied by a group V atom. The substitution site of the impurity in the 2B-th compound semiconductor layer is the site occupied by a group III atom. The substitution site of the impurity in the first burying layer is the site occupied by a group V atom, and the substitution site of the impurity in the second burying layer is the site occupied by a group III atom.

The modification example of the semiconductor light emitting device of the ninth embodiment whose conceptual diagrams are shown in FIGS. 25A and 25B correspond to the semiconductor light emitting device according to the (5-c-1)-th mode of the present invention. In this semiconductor light emitting device, the impurity for causing the first compound semiconductor layer and the third compound semiconductor layer to be the n-type as the first conductivity type is a group VI impurity (specifically, Se), the impurity for causing the 2A-th compound semiconductor layer and the fourth compound semiconductor layer to be the p-type as the second conductivity type is carbon (C), the impurity for causing the 2B-th compound semiconductor layer to be the p-type as the second conductivity type is a group II impurity (specifically, Zn), and the impurity for causing the first burying layer to be the p-type as the second conductivity type is carbon (C), and the impurity for causing the second burying layer to be the p-type as the second conductivity type is a group II impurity.

More specifically, in this modification example of the semiconductor light emitting device of the ninth embodiment, the respective layers have the configuration shown in Table 9K shown below.

TABLE 9K

| (Configuration of light emitting part) | |
|---|---|
| 2A-th compound semiconductor layer | p-$Al_{0.4}Ga_{0.6}As$: C |
| 2B-th compound semiconductor layer | p-$Al_{0.4}Ga_{0.6}As$: Zn |
| Active layer | [Active layer-A] |
| First compound semiconductor layer (Current block layer) | n-$Al_{0.4}Ga_{0.6}As$: Se |
| Second burying layer | p-$Al_{0.47}Ga_{0.53}As$: Zn |
| First burying layer | p-$Al_{0.47}Ga_{0.53}As$: C |
| Third compound semiconductor layer | n-$Al_{0.47}Ga_{0.53}As$: Se |
| Fourth compound semiconductor layer | p-$Al_{0.47}Ga_{0.53}As$: C |
| Adjustment layer (Whole) | p-$Al_{0.47}Ga_{0.53}As$: Zn |
| Contact layer | p-GaAs: Zn (or C) |

Figure 27B:
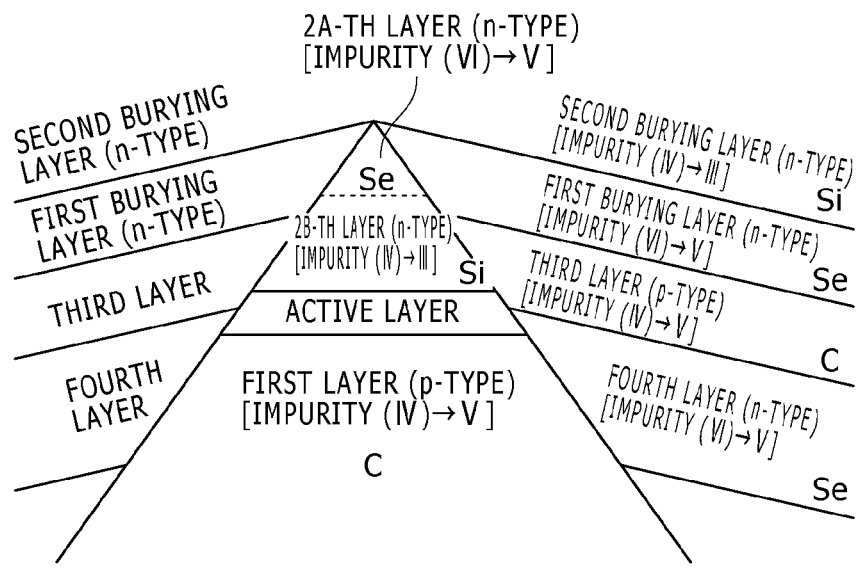
Figure 28A:
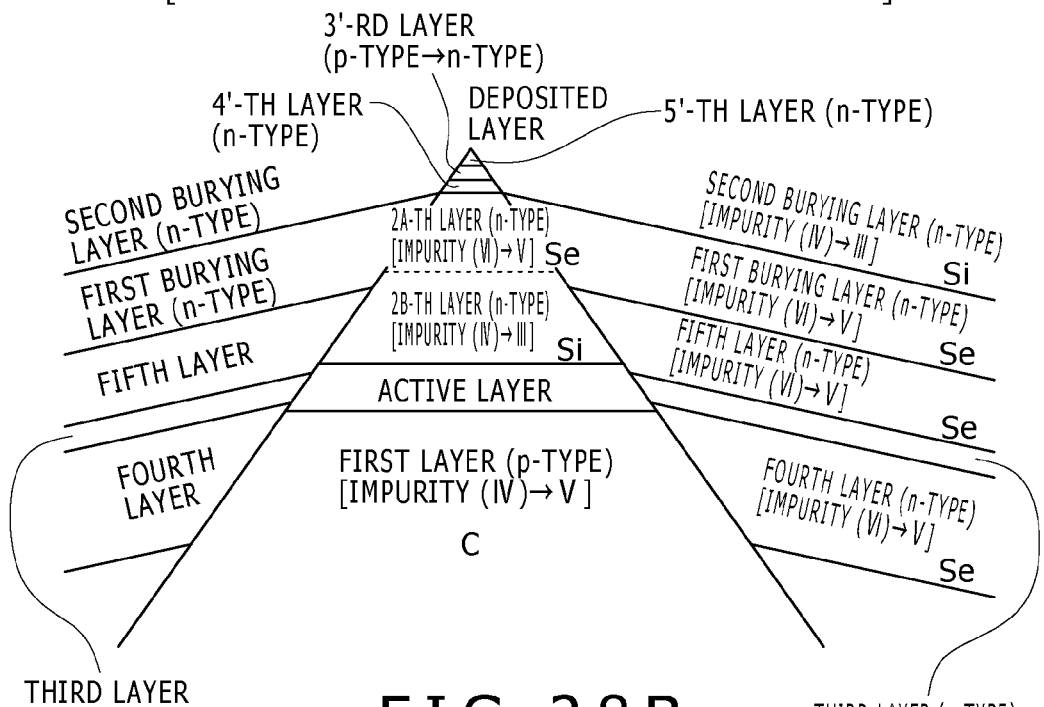
FIGS. 28A and 28B are conceptual diagrams of yet another modification example of the semiconductor light emitting device according to the ninth embodiment.
Figure 28B:
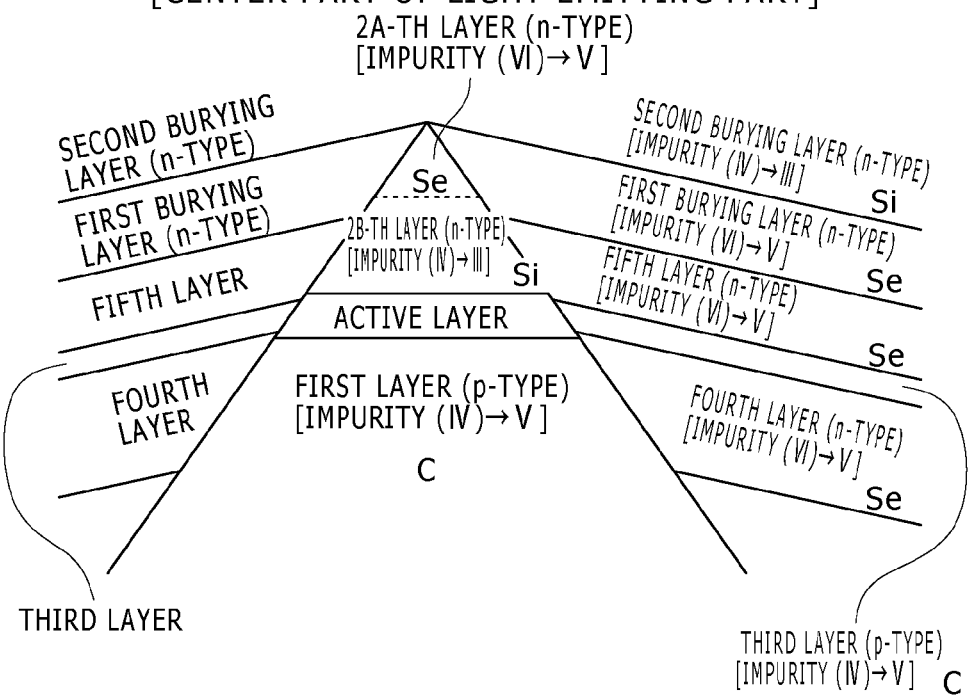

The modification example of the semiconductor light emitting device of the ninth embodiment whose conceptual diagrams are shown in FIGS. 27A and 27B correspond to the semiconductor light emitting device according to the (5-c-2)-th mode of the present invention. In this semiconductor light emitting device, the impurity for causing the first compound semiconductor layer and the third compound semiconductor layer to be the p-type as the first conductivity type is carbon (C), the impurity for causing the 2A-th compound semiconductor layer and the fourth compound semiconductor layer to be the n-type as the second conductivity type is a group VI impurity (specifically, Se), the impurity for causing the 2B-th compound semiconductor layer to be the n-type as the second conductivity type is a group IV impurity (specifically, Si), and the impurity for causing the first burying layer to be the n-type as the second conductivity type is a group VI impurity, and the impurity for causing the second burying layer to be the n-type as the second conductivity type is a group IV impurity.

More specifically, in this modification example of the semiconductor light emitting device of the ninth embodiment, the respective layers have the configuration shown in Table 9L shown below.

TABLE 9L (Configuration of light emitting part)

| 2A-th compound semiconductor layer | n-$Al_{0.4}Ga_{0.6}As$: Se |
|---|---|
| 2B-th compound semiconductor layer | n-$Al_{0.4}Ga_{0.6}As$: Si |
| Active layer | [Active layer-B] |
| First compound semiconductor layer | p-$Al_{0.4}Ga_{0.6}As$: C |
| (Current block layer) | |
| Second burying layer | n-$Al_{0.47}Ga_{0.53}As$: Si |
| First burying layer | n-$Al_{0.47}Ga_{0.53}As$: Se |
| Third compound semiconductor layer | p-$Al_{0.47}Ga_{0.53}As$: C |
| Fourth compound semiconductor layer | n-$Al_{0.47}Ga_{0.53}As$: Se |
| Adjustment layer | n-$Al_{0.47}Ga_{0.53}As$: Se |
| (Whole) | |
| Contact layer | p-GaAs: Zn (or C) |

Conceptual diagrams of further-modified examples of the modification examples of the semiconductor light emitting device of the ninth embodiment whose conceptual diagrams are shown in FIGS. 25A and 25B and FIGS. 27A and 27B are shown in FIGS. 26A and 26B and FIGS. 28A and 28B. Also in these further-modified examples, the fifth compound semiconductor layer of the second conductivity type is provided on the third compound semiconductor layer, the impurity for causing the fifth compound semiconductor layer to have the second conductivity type is such that the substitution site of the impurity in the fifth compound semiconductor layer competes with the substitution site of the impurity in the 2A-th compound semiconductor layer for causing the 2A-th compound semiconductor layer to have the second conductivity type (specifically, carbon in FIGS. 26A and 26B, and a group VI impurity, Se, in FIGS. 28A and 28B), and the fourth compound semiconductor layer is in contact with the side surface of the first compound semiconductor layer and the fifth compound semiconductor layer is in contact with the side surface of the second compound semiconductor layer (at least a part of the side surface of the 2A-th compound semiconductor layer and all of the side surface of the 2B-th compound semiconductor layer). The bypass channel is composed of the first compound semiconductor layer, the fourth compound semiconductor layer, the third compound semiconductor layer, the fifth compound semiconductor layer, and the second compound semiconductor layer (the 2A-th compound semiconductor layer and the 2B-th compound semiconductor layer). The pn junction interfaces are formed of the following three interfaces: the interface between the side surface of the first compound semiconductor layer and the fourth compound semiconductor layer; the interface between the fourth compound semiconductor layer and the third compound semiconductor layer; and the interface between the third compound semiconductor layer and the fifth compound semiconductor layer.

An impurity diffusion barrier layer may be provided in the current block layer. Specifically, in the fourth compound semiconductor layer that is included in the current block layer and has the second conductivity type, at least one impurity diffusion barrier layer having the second conductivity type (e.g. a seventh compound semiconductor layer) is provided. Furthermore, impurities are so selected that the substitution site of the impurity in the fourth compound semiconductor layer is different from that of the impurity in the impurity diffusion barrier layer (e.g. the seventh compound semiconductor layer if the number of impurity diffusion barrier layers is one). More specifically, e.g. in the structure shown in FIGS. 13A and 13B or FIGS. 14A and 14B, a configuration can be employed in which the impurity in the fourth compound semiconductor layer is zinc (Zn) and the impurity in the impurity diffusion barrier layer (the seventh compound semiconductor layer) of the second conductivity type provided in the fourth compound semiconductor layer is carbon (C). That is, the configuration including the following layers can be employed.

n-type third compound semiconductor layer (impurity: Si)
p-type fourth compound semiconductor layer (impurity: Zn)
p-type seventh compound semiconductor layer (impurity: C)
p-type fourth compound semiconductor layer (impurity: Zn)
In addition, e.g. in the structure shown in FIGS. 15A and 15B or FIGS. 16A and 16B, a configuration can be employed in which the impurity in the fourth compound semiconductor layer is silicon (Si) and the impurity in the impurity diffusion barrier layer (the seventh compound semiconductor layer) of the second conductivity type provided in the fourth compound semiconductor layer is selenium (Se). That is, the configuration including the following layers can be employed.

p-type third compound semiconductor layer (impurity: Zn)
n-type fourth compound semiconductor layer (impurity: Si)
n-type seventh compound semiconductor layer (impurity: Se)
n-type fourth compound semiconductor layer (impurity: Si)
In such a configuration, if a group VI impurity (Se) or carbon (C) diffuses from the 1B-th compound semiconductor layer into the current block layer (Zn-doped layer or Si-doped layer) for example, this diffused impurity can not diffuse in the seventh compound semiconductor layer including the impurity (carbon or selenium) whose substitution site competes with the substitution site of this diffused impurity. Thus, the current block layer having high reliability can be formed.

Similarly, in the third compound semiconductor layer that is included in the current block layer and has the first conductivity type, at least one impurity diffusion barrier layer having the first conductivity type (e.g. an eighth compound semiconductor layer) is provided. Furthermore, impurities are so selected that the substitution site of the impurity in the third compound semiconductor layer is different from that of the impurity in the impurity diffusion barrier layer (e.g. the eighth compound semiconductor layer if the number of impurity diffusion barrier layers is one). For example, in the structure shown in FIGS. 21A and 21B or FIGS. 22A and 22B, a configuration can be employed in which the impurity in the third compound semiconductor layer is silicon (Si) and the impurity in the impurity diffusion barrier layer (the eighth compound semiconductor layer) of the first conductivity type provided in the third compound semiconductor layer is selenium (Se). That is, the configuration including the following layers can be employed.

n-type third compound semiconductor layer (impurity: Si)
n-type eighth compound semiconductor layer (impurity: Se)
n-type third compound semiconductor layer (impurity: Si)
p-type fourth compound semiconductor layer (impurity: Zn)
In addition, in the structure shown in FIGS. 23A and 23B or FIGS. 24A and 24B, a configuration can be employed in which the impurity in the third compound semiconductor layer is zinc (Zn) and the impurity in the impurity diffusion barrier layer (the eighth compound semiconductor layer) of the first conductivity type provided in the third compound semiconductor layer is carbon (C). That is, the configuration including the following layers can be employed.

p-type third compound semiconductor layer (impurity: Zn)
p-type eighth compound semiconductor layer (impurity: C)
p-type third compound semiconductor layer (impurity: Zn)
n-type fourth compound semiconductor layer (impurity: Si)

Also in such a configuration, if carbon (C) or selenium (Se) diffuses from the 2B-th compound semiconductor layer into the current block layer (Si-doped layer or Zn-doped layer) for example, this diffused impurity can not diffuse in the eighth compound semiconductor layer including the impurity (group VI impurity, Se, or carbon) whose substitution site competes with the substitution site of this diffused impurity. Thus, the current block layer having high reliability can be formed.

The same feature can be employed also for other semiconductor light emitting devices in which the first compound semiconductor layer is composed of the 1A-th compound semiconductor layer and the 1B-th compound semiconductor layer and other semiconductor light emitting devices in which the second compound semiconductor layer is composed of the 2A-th compound semiconductor layer and the 2B-th compound semiconductor layer.

The effect of the impurity diffusion barrier in the form in which the impurity diffusion barrier layer (seventh compound semiconductor layer or eighth compound semiconductor layer) is provided is readily obtained in the structures of FIGS. 14A and 14B, 16A and 16B, 18A and 18B, 20A and 20B, 22A and 22B, 24A and 24B, 26A and 26B, and 28A and 28B in particular. Therefore, the examples are cited as above in which one seventh compound semiconductor layer or one eighth compound semiconductor layer as the impurity diffusion barrier layer is provided in the compound semiconductor layer (fourth compound semiconductor layer or third compound semiconductor layer) having the same conductivity type as that of the seventh compound semiconductor layer or the eighth compound semiconductor layer. However, the number of impurity diffusion barrier layers for the purpose of impurity diffusion barrier may be two or larger as long as the impurity diffusion barrier layers are formed of compound semiconductor layers having the same substitution site of the impurity as that of the impurity that diffuses into the current block layer from the first compound semiconductor layer (or the 1B-th compound semiconductor layer) or the second compound semiconductor layer (or the 2B-th compound semiconductor layer). Furthermore, the position of the impurity diffusion barrier layer is not limited to the inside of a compound semiconductor layer having the same conductivity type as that of the impurity diffusion barrier layer, but one or more impurity diffusion barrier layers may be provided in a compound semiconductor layer having the different conductivity type.

In addition, the current block layer may have a multilayer structure. Specifically, e.g. in the structure shown in FIGS. 14A and 14B, instead of using the current block layer having the multilayer structure of the n-type third compound semiconductor layer/the p-type fourth compound semiconductor layer/the n-type sixth compound semiconductor layer, the current block layer having the following five-layer structure may be used without changing the thickness of the entire current block layer.
(1) n-type third compound semiconductor layer (impurity: Si)
(2) p-type compound semiconductor layer (impurity: Zn)
(3) n-type compound semiconductor layer (impurity: Si)
(4) p-type fourth compound semiconductor layer (impurity: Zn)
(5) n-type sixth compound semiconductor layer (impurity: Si)

Alternatively, the current block layer having the following seven-layer structure may be used.
(1) n-type third compound semiconductor layer (impurity: Si)
(2) p-type compound semiconductor layer (impurity: Zn)
(3) n-type compound semiconductor layer (impurity: Si)
(4) p-type compound semiconductor layer (impurity: Zn)
(5) n-type compound semiconductor layer (impurity: Si)
(6) p-type fourth compound semiconductor layer (impurity: Zn)
(7) n-type sixth compound semiconductor layer (impurity: Si)

Alternatively, the current block layer having the following nine-layer structure may be used.
(1) n-type third compound semiconductor layer (impurity: Si)
(2) p-type compound semiconductor layer (impurity: Zn)
(3) n-type compound semiconductor layer (impurity: Si)
(4) p-type compound semiconductor layer (impurity: Zn)
(5) n-type compound semiconductor layer (impurity: Si)
(6) p-type compound semiconductor layer (impurity: Zn)
(7) n-type compound semiconductor layer (impurity: Si)
(8) p-type fourth compound semiconductor layer (impurity: Zn)
(9) n-type sixth compound semiconductor layer (impurity: Si)

Alternatively, the current block layer having the following eleven-layer structure may be used.
(1) n-type third compound semiconductor layer (impurity: Si)
(2) p-type compound semiconductor layer (impurity: Zn)
(3) n-type compound semiconductor layer (impurity: Si)
(4) p-type compound semiconductor layer (impurity: Zn)
(5) n-type compound semiconductor layer (impurity: Si)
(6) p-type compound semiconductor layer (impurity: Zn)
(7) n-type compound semiconductor layer (impurity: Si)
(8) p-type compound semiconductor layer (impurity: Zn)
(9) n-type compound semiconductor layer (impurity: Si)
(10) p-type fourth compound semiconductor layer (impurity: Zn)
(11) n-type sixth compound semiconductor layer (impurity: Si)

Figure 18A:
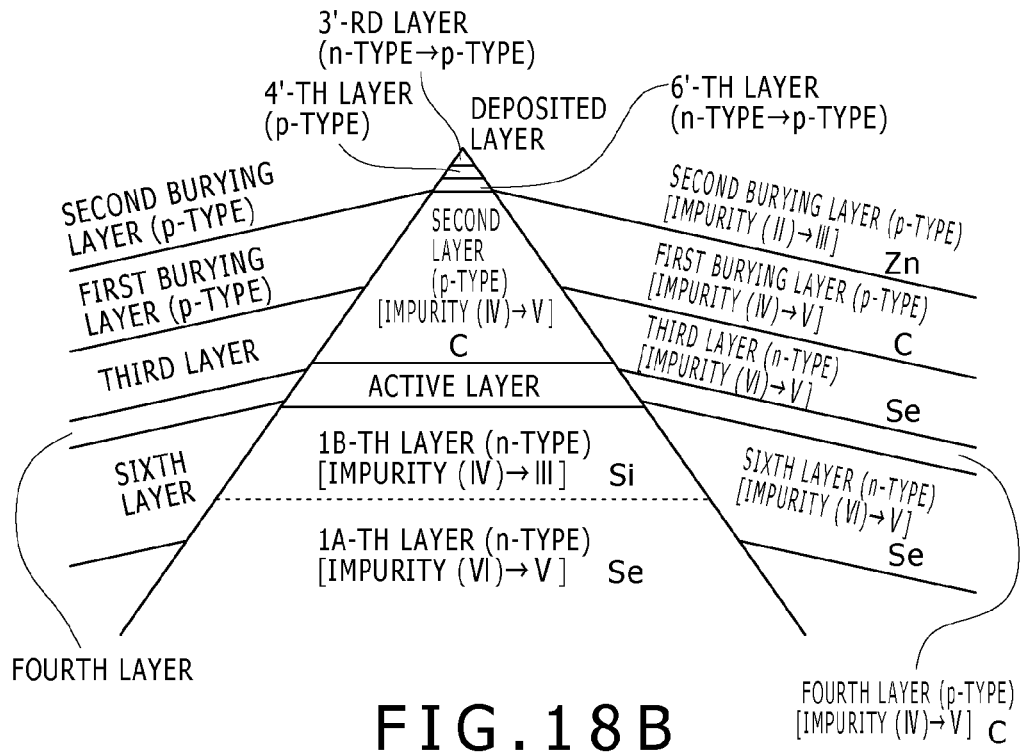
FIGS. 18A and 18B are conceptual diagrams of yet another modification example of the semiconductor light emitting device according to the ninth embodiment.
Figure 18B:
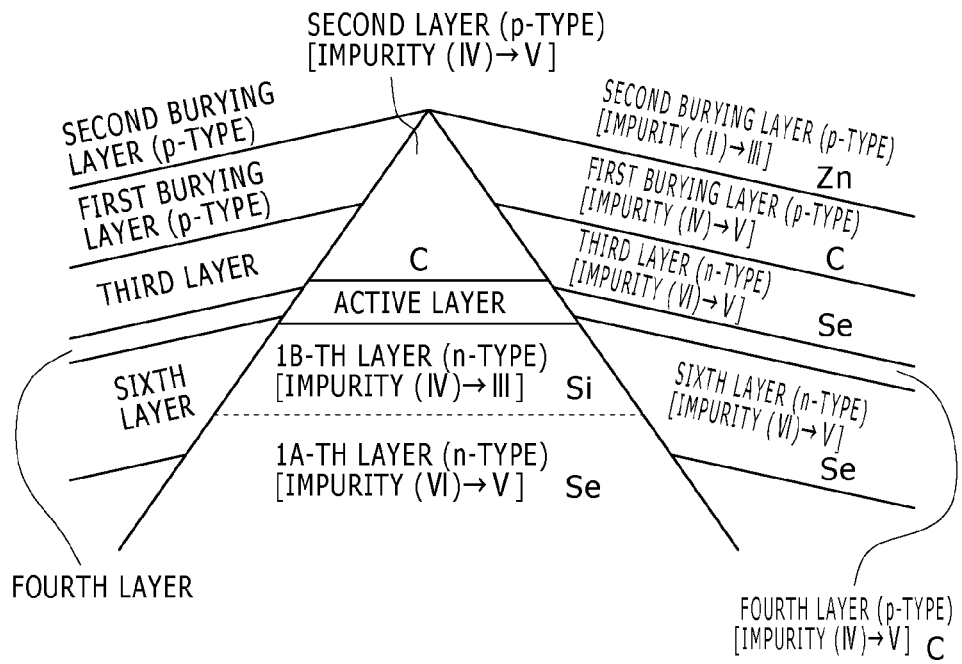

Similarly, in the structure shown in FIGS. 18A and 18B, instead of using the current block layer having the multilayer structure of the n-type third compound semiconductor layer/the p-type fourth compound semiconductor layer/the n-type sixth compound semiconductor layer, the current block layer having the following five-layer structure may be used without changing the thickness of the entire current block layer.
(1) n-type third compound semiconductor layer (impurity: Se)
(2) p-type compound semiconductor layer (impurity: C)
(3) n-type compound semiconductor layer (impurity: Se)
(4) p-type fourth compound semiconductor layer (impurity: C)
(5) n-type sixth compound semiconductor layer (impurity: Se)

Alternatively, the current block layer having the following seven-layer structure may be used.
(1) n-type third compound semiconductor layer (impurity: Se)
(2) p-type compound semiconductor layer (impurity: C)
(3) n-type compound semiconductor layer (impurity: Se)
(4) p-type compound semiconductor layer (impurity: C)
(5) n-type compound semiconductor layer (impurity: Se)
(6) p-type fourth compound semiconductor layer (impurity: C)
(7) n-type sixth compound semiconductor layer (impurity: Se)

Alternatively, the current block layer having the following nine-layer structure may be used.
(1) n-type third compound semiconductor layer (impurity: Se)
(2) p-type compound semiconductor layer (impurity: C)
(3) n-type compound semiconductor layer (impurity: Se)
(4) p-type compound semiconductor layer (impurity: C)
(5) n-type compound semiconductor layer (impurity: Se)
(6) p-type compound semiconductor layer (impurity: C)
(7) n-type compound semiconductor layer (impurity: Se)
(8) p-type fourth compound semiconductor layer (impurity: C)
(9) n-type sixth compound semiconductor layer (impurity: Se)

Alternatively, the current block layer having the following eleven-layer structure may be used.
(1) n-type third compound semiconductor layer (impurity: Se)
(2) p-type compound semiconductor layer (impurity: C)
(3) n-type compound semiconductor layer (impurity: Se)
(4) p-type compound semiconductor layer (impurity: C)
(5) n-type compound semiconductor layer (impurity: Se)
(6) p-type compound semiconductor layer (impurity: C)
(7) n-type compound semiconductor layer (impurity: Se)
(8) p-type compound semiconductor layer (impurity: C)
(9) n-type compound semiconductor layer (impurity: Se)
(10) p-type fourth compound semiconductor layer (impurity: C)
(11) n-type sixth compound semiconductor layer (impurity: Se)

Figure 16A:
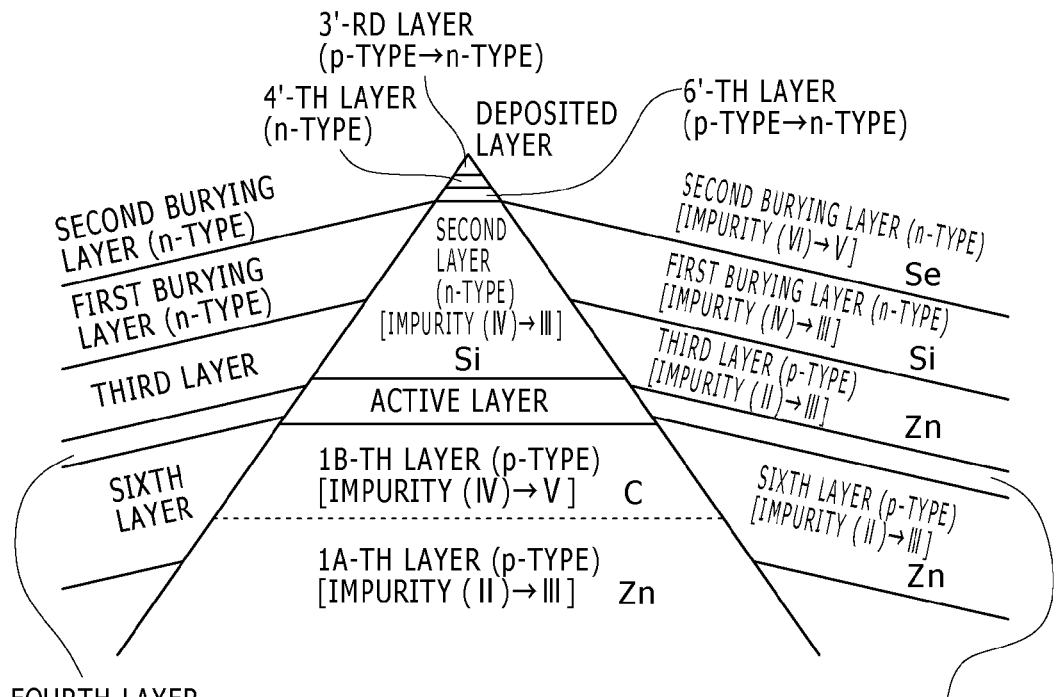
FIGS. 16A and 16B are conceptual diagrams of yet another modification example of the semiconductor light emitting device according to the ninth embodiment.
Figure 16B:
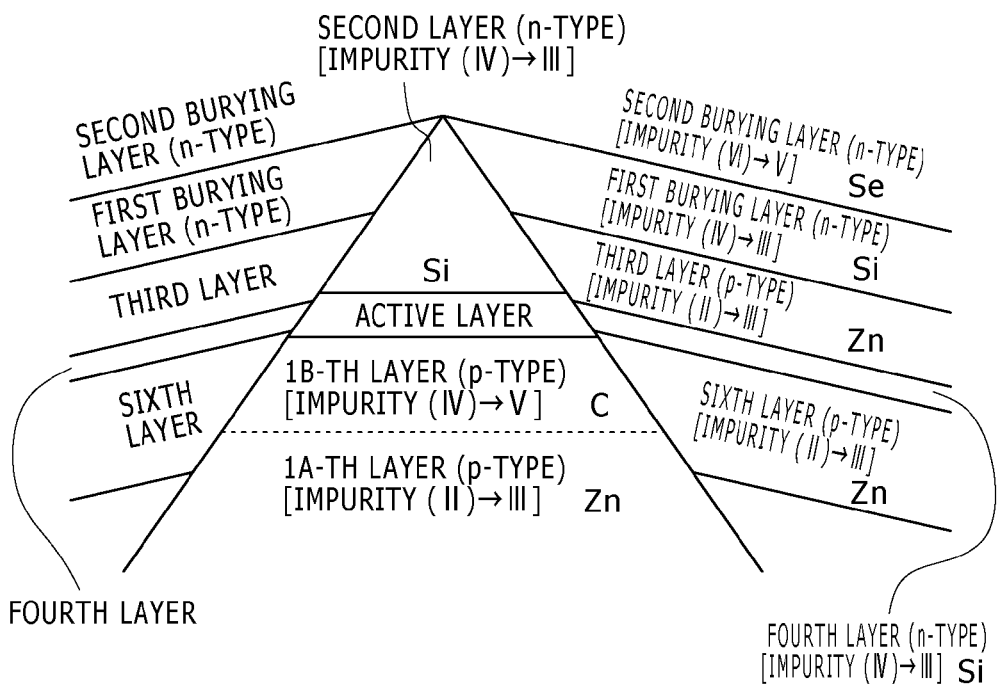

Furthermore, in the structure shown in FIGS. 16A and 16B, instead of using the current block layer having the multilayer structure of the p-type third compound semiconductor layer/the n-type fourth compound semiconductor layer/the p-type sixth compound semiconductor layer, the current block layer having the following five-layer structure may be used without changing the thickness of the entire current block layer.
(1) p-type third compound semiconductor layer (impurity: Zn)
(2) n-type compound semiconductor layer (impurity: Si)
(3) p-type compound semiconductor layer (impurity: Zn)
(4) n-type fourth compound semiconductor layer (impurity: Si)
(5) p-type sixth compound semiconductor layer (impurity: Zn)

Alternatively, the current block layer having the following seven-layer structure may be used.
(1) p-type third compound semiconductor layer (impurity: Zn)
(2) n-type compound semiconductor layer (impurity: Si)
(3) p-type compound semiconductor layer (impurity: Zn)
(4) n-type compound semiconductor layer (impurity: Si)
(5) p-type compound semiconductor layer (impurity: Zn)
(6) n-type fourth compound semiconductor layer (impurity: Si)
(7) p-type sixth compound semiconductor layer (impurity: Zn)

Alternatively, the current block layer having the following nine-layer structure may be used.
(1) p-type third compound semiconductor layer (impurity: Zn)
(2) n-type compound semiconductor layer (impurity: Si)
(3) p-type compound semiconductor layer (impurity: Zn)
(4) n-type compound semiconductor layer (impurity: Si)
(5) p-type compound semiconductor layer (impurity: Zn)
(6) n-type compound semiconductor layer (impurity: Si)
(7) p-type compound semiconductor layer (impurity: Zn)
(8) n-type fourth compound semiconductor layer (impurity: Si)
(9) p-type sixth compound semiconductor layer (impurity: Zn)

Alternatively, the current block layer having the following eleven-layer structure may be used.
(1) p-type third compound semiconductor layer (impurity: Zn)
(2) n-type compound semiconductor layer (impurity: Si)
(3) p-type compound semiconductor layer (impurity: Zn)
(4) n-type compound semiconductor layer (impurity: Si)
(5) p-type compound semiconductor layer (impurity: Zn)
(6) n-type compound semiconductor layer (impurity: Si)
(7) p-type compound semiconductor layer (impurity: Zn)
(8) n-type compound semiconductor layer (impurity: Si)
(9) p-type compound semiconductor layer (impurity: Zn)
(10) n-type fourth compound semiconductor layer (impurity: Si)
(11) p-type sixth compound semiconductor layer (impurity: Zn)

Figure 20A:
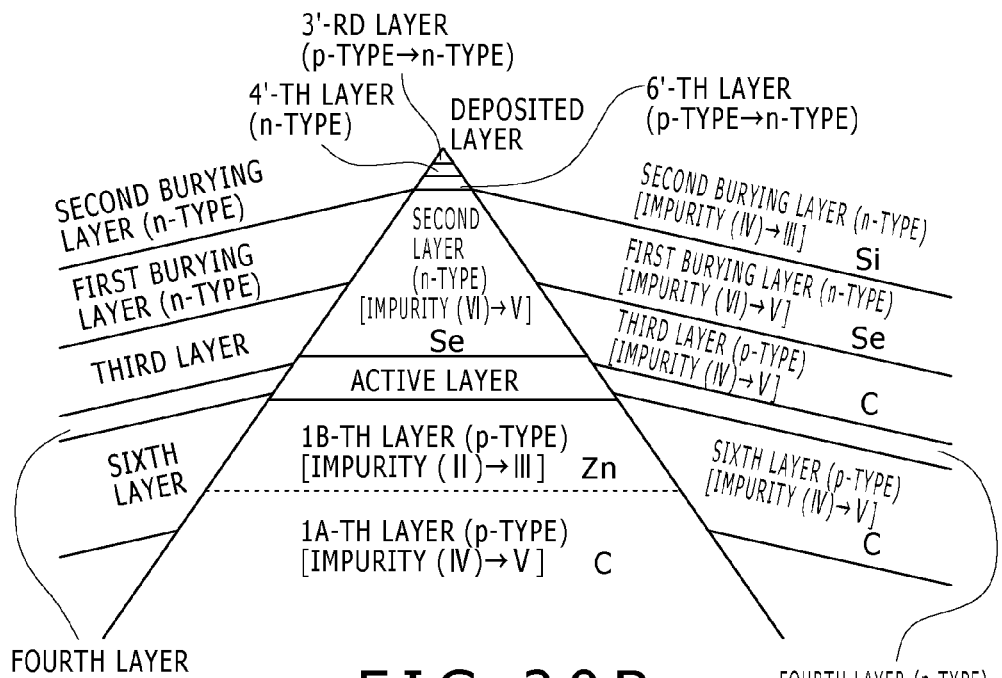
FIGS. 20A and 20B are conceptual diagrams of yet another modification example of the semiconductor light emitting device according to the ninth embodiment.
Figure 20B:
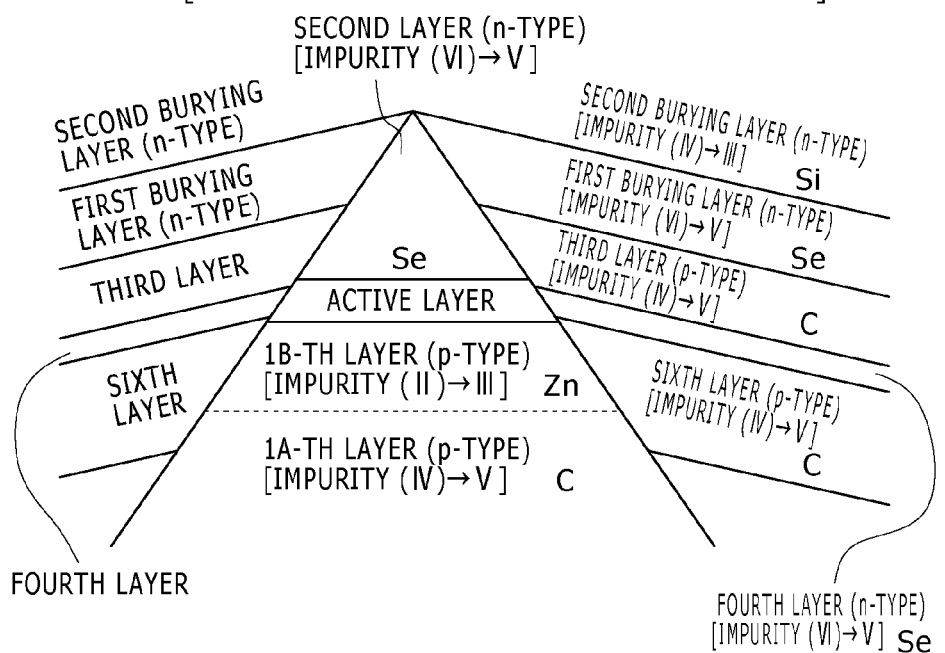

Similarly, in the structure shown in FIGS. 20A and 20B, instead of using the current block layer having the multilayer structure of the p-type third compound semiconductor layer/the n-type fourth compound semiconductor layer/the p-type sixth compound semiconductor layer, the current block layer having the following five-layer structure may be used without changing the thickness of the entire current block layer.
(1) p-type third compound semiconductor layer (impurity: C)
(2) n-type compound semiconductor layer (impurity: Se)
(3) p-type compound semiconductor layer (impurity: C)
(4) n-type fourth compound semiconductor layer (impurity: Se)
(5) p-type sixth compound semiconductor layer (impurity: C)

Alternatively, the current block layer having the following seven-layer structure may be used.
(1) p-type third compound semiconductor layer (impurity: C)
(2) n-type compound semiconductor layer (impurity: Se)
(3) p-type compound semiconductor layer (impurity: C)
(4) n-type compound semiconductor layer (impurity: Se)
(5) p-type compound semiconductor layer (impurity: C)
(6) n-type fourth compound semiconductor layer (impurity: Se)
(7) p-type sixth compound semiconductor layer (impurity: C)

Alternatively, the current block layer having the following nine-layer structure may be used.
(1) p-type third compound semiconductor layer (impurity: C)
(2) n-type compound semiconductor layer (impurity: Se)
(3) p-type compound semiconductor layer (impurity: C)
(4) n-type compound semiconductor layer (impurity: Se)
(5) p-type compound semiconductor layer (impurity: C)
(6) n-type compound semiconductor layer (impurity: Se)
(7) p-type compound semiconductor layer (impurity: C)
(8) n-type fourth compound semiconductor layer (impurity: Se)
(9) p-type sixth compound semiconductor layer (impurity: C)

Alternatively, the current block layer having the following eleven-layer structure may be used.
(1) p-type third compound semiconductor layer (impurity: C)
(2) n-type compound semiconductor layer (impurity: Se)
(3) p-type compound semiconductor layer (impurity: C)
(4) n-type compound semiconductor layer (impurity: Se)
(5) p-type compound semiconductor layer (impurity: C)
(6) n-type compound semiconductor layer (impurity: Se)
(7) p-type compound semiconductor layer (impurity: C)
(8) n-type compound semiconductor layer (impurity: Se)
(9) p-type compound semiconductor layer (impurity: C)

(10) n-type fourth compound semiconductor layer (impurity: Se)

(11) p-type sixth compound semiconductor layer (impurity: C)

By thus employing the current block layer having a multilayer structure without increasing the total thickness of the current block layer, it is possible to select the design in which the thicknesses of the respective compound semiconductor layers included in the current block layer (at least one compound semiconductor layer of all the above-described compound semiconductor layers from the third compound semiconductor layer to the sixth compound semiconductor layer, or at least one compound semiconductor layer of all of the compound semiconductor layers from the fifth compound semiconductor layer to the fourth compound semiconductor layer in the structures of FIGS. 22A and 22B, FIGS. 24A and 24B, FIGS. 26A and 26B, and FIGS. 28A and 28B similarly to the above description) are set small optionally. Thus, the contact area of the surface in contact with the side surface of the light emitting part per one layer included in the current block layer can be decreased. If the thicknesses of the respective compound semiconductor layers included in the current block layer are so adjusted that the contact area of the contact surface is further decreased, it becomes possible to avoid the state in which the entire side surface of the active layer (or well layer) is covered by the contact surface of only one layer included in the current block layer, which allows further-ensured prevention of the phenomenon that a current leakage path from the bypass channel is formed.

In the ninth embodiment, it is also possible to employ the configuration that includes both the first compound semiconductor layer composed of the 1A-th compound semiconductor layer and the 1B-th compound semiconductor layer and the second compound semiconductor layer composed of the 2A-th compound semiconductor layer and the 2B-th compound semiconductor layer.

This is the end of the description of preferred embodiments of the present invention. The invention however is not limited to these embodiments.

The structure of the first compound semiconductor layer in the first embodiment (see FIGS. 1A and 1B) may be combined with the structure of the second compound semiconductor layer in the second embodiment (see FIGS. 2A and 2B). The structure of the second compound semiconductor layer in the first embodiment (see FIGS. 1A and 1B) may be combined with the structure of the first compound semiconductor layer in the second embodiment (see FIGS. 2A and 2B). The structure of the first compound semiconductor layer in the third embodiment (see FIGS. 3A and 3B) may be combined with the structure of the second compound semiconductor layer in the fourth embodiment (see FIGS. 4A and 4B). The structure of the second compound semiconductor layer in the third embodiment (see FIGS. 3A and 3B) may be combined with the structure of the first compound semiconductor layer in the fourth embodiment (see FIGS. 4A and 4B). Furthermore, the structure of the first compound semiconductor layer in the fifth embodiment (see FIGS. 5A and 5B) may be combined with the structure of the second compound semiconductor layer in the sixth embodiment (see FIGS. 6A and 6B). The structure of the second compound semiconductor layer in the fifth embodiment (see FIGS. 5A and 5B) may be combined with the structure of the first compound semiconductor layer in the sixth embodiment (see FIGS. 6A and 6B). The structure of the first compound semiconductor layer in the seventh embodiment (see FIGS. 7A and 7B) may be combined with the structure of the second compound semiconductor layer in the eighth embodiment (see FIGS. 8A and 8B). The structure of the second compound semiconductor layer in the seventh embodiment (see FIGS. 7A and 7B) may be combined with the structure of the first compound semiconductor layer in the eighth embodiment (see FIGS. 8A and 8B).

Furthermore, it is also possible for the semiconductor light emitting devices described for the first to eighth embodiments to have the following configuration. Specifically, the current block layer 40 further includes a fifth compound semiconductor layer of the second conductivity type, the third compound semiconductor layer 43 is sandwiched by the fourth compound semiconductor layer 44 and the fifth compound semiconductor layer, and the impurity for causing the third compound semiconductor layer 43 to have the first conductivity type is such that the substitution site of the impurity in the third compound semiconductor layer 43 competes with the substitution site of the impurity in the fifth compound semiconductor layer for causing the fifth compound semiconductor layer to have the second conductivity type.

In the first, second, fifth, and sixth embodiments, it is also possible to regard the first burying layer 31A as the fifth compound semiconductor layer, although depending on the stacking state of the third compound semiconductor layer 43 and the fourth compound semiconductor layer 44. This applies also to the third, fourth, seventh, and eighth embodiments.

In addition, it is also possible for the semiconductor light emitting devices described for the first to eighth embodiments to have the following configuration. Specifically, the current block layer 40 further includes a sixth compound semiconductor layer of the first conductivity type, the fourth compound semiconductor layer 44 is sandwiched by the third compound semiconductor layer 43 and the sixth compound semiconductor layer, and the impurity for causing the fourth compound semiconductor layer 44 to have the second conductivity type is such that the substitution site of the impurity in the fourth compound semiconductor layer 44 competes with the substitution site of the impurity in the sixth compound semiconductor layer for causing the sixth compound semiconductor layer to have the first conductivity type.

In the first, second, fifth, and sixth embodiments, it is possible for the current block layer 40 to have a three-layer structure arising from the stacking in the order of the third compound semiconductor layer 43 (n-type)/the fourth compound semiconductor layer 44 (p-type)/the sixth compound semiconductor layer (n-type). In addition, it is possible for the current block layer 40 to have a three-layer structure arising from the stacking in the order of the sixth compound semiconductor layer (n-type)/the fourth compound semiconductor layer 44 (p-type)/the third compound semiconductor layer 43 (n-type). Furthermore, also in the third, fourth, seventh, and eighth embodiments, it is possible for the current block layer 40 to have a three-layer structure arising from the stacking in the order of the third compound semiconductor layer 43 (p-type)/the fourth compound semiconductor layer 44 (n-type)/the sixth compound semiconductor layer (p-type). In addition, it is possible for the current block layer 40 to have a three-layer structure arising from the stacking in the order of the sixth compound semiconductor layer (p-type)/the fourth compound semiconductor layer 44 (n-type)/the third compound semiconductor layer 43 (p-type).

In the first, third, fifth, and seventh embodiments, the second compound semiconductor layer has the two-layer structure composed of the second compound semiconductor layer 22A and the second compound semiconductor layer 22B stacked in that order from the active layer side. In the second, fourth, sixth, and eighth embodiments, the second compound semiconductor layer has the two-layer structure composed of the 2A-th compound semiconductor layer and the 2B-th compound semiconductor layer stacked in that order from the active layer side. In the former case, the second compound semiconductor layer of the two-layer structure is defined based on the change of the band gap (or the refractive index) In the latter case, the second compound semiconductor layer of the two-layer structure is defined based on the change of the impurity substitution site. Therefore, regarding the multilayer structure of the second compound semiconductor layer described for the respective embodiments, if the second compound semiconductor layer has the two-layer structure composed of the 2A-th compound semiconductor layer and the 2B-th compound semiconductor layer in particular, the 2A-th compound semiconductor layer can be regarded as the second compound semiconductor layer 22A and the 2B-th compound semiconductor layer can be regarded as the second compound semiconductor layer 22B. In addition, for example, it is also possible that the 2A-th compound semiconductor layer is formed of the multilayer structure composed of the second compound semiconductor layers 22A and 22B, and it is also possible that the 2B-th compound semiconductor layer is formed of the multilayer structure composed of the second compound semiconductor layers 22A and 22B.

It should be understood by those skilled in the art that various modifications, combinations, sub-combinations and alterations may occur depending on design requirements and other factor in so far as they are within the scope of the appended claims or the equivalents thereof.

What is claimed is:

1. A semiconductor light emitting device comprising:
   (A) a light emitting part configured to be formed of a multilayer structure arising from sequential stacking of a first compound semiconductor layer of a first conductivity type, an active layer, and a second compound semiconductor layer of a second conductivity type;
   (B) a current block layer configured to be provided in contact with a side surface of the light emitting part; and
   (C) a burying layer configured to be formed over the current block layer and the light emitting part, wherein
   a planar shape of the active layer is a strip shape in which a width of a center part is smaller than a width of both end parts,
   the current block layer is composed of a third compound semiconductor layer of the first conductivity type and a fourth compound semiconductor layer of the second conductivity type in contact with the third compound semiconductor layer,
   the burying layer has the second conductivity type and is formed of a multilayer structure arising from sequential stacking of a first burying layer and a second burying layer, and
   in the burying layer located above the current block layer, an impurity for causing the second burying layer to have the second conductivity type is such that a substitution site of the impurity in the second burying layer does not compete with a substitution site of an impurity in the third compound semiconductor layer for causing the third compound semiconductor layer to have the first conductivity type.

2. The semiconductor light emitting device according to claim 1, wherein
   in the burying layer located above the current block layer, an impurity for causing the first burying layer to have the second conductivity type is such that a substitution site of the impurity in the first burying layer competes with the substitution site of the impurity in the third compound semiconductor layer for causing the third compound semiconductor layer to have the first conductivity type.

3. The semiconductor light emitting device according to claim 1, wherein
   an impurity for causing the first compound semiconductor layer to have the first conductivity type is such that a substitution site of the impurity in the first compound semiconductor layer does not compete with a substitution site of an impurity in the second compound semiconductor layer for causing the second compound semiconductor layer to have the second conductivity type, and
   the impurity for causing the third compound semiconductor layer to have the first conductivity type is such that the substitution site of the impurity in the third compound semiconductor layer competes with a substitution site of an impurity in the fourth compound semiconductor layer for causing the fourth compound semiconductor layer to have the second conductivity type.

4. The semiconductor light emitting device according to claim 3, wherein
   the first compound semiconductor layer, the second compound semiconductor layer, the third compound semiconductor layer, the fourth compound semiconductor layer, the first burying layer, and the second burying layer are composed of a III-V compound semiconductor,
   the substitution site of the impurity in the first compound semiconductor layer is a site occupied by a group V atom,
   the substitution site of the impurity in the second compound semiconductor layer is a site occupied by a group III atom,
   the substitution site of the impurity in the third compound semiconductor layer and the substitution site of the impurity in the fourth compound semiconductor layer are a site occupied by a group III atom,
   a substitution site of an impurity in the first burying layer is a site occupied by a group III atom, and
   the substitution site of the impurity in the second burying layer is a site occupied by a group V atom.

5. The semiconductor light emitting device according to claim 3, wherein
   the first compound semiconductor layer, the second compound semiconductor layer, the third compound semiconductor layer, the fourth compound semiconductor layer, the first burying layer, and the second burying layer are composed of a III-V compound semiconductor,
   the first compound semiconductor layer is composed of a 1A-th compound semiconductor layer and a 1B-th compound semiconductor layer that is provided on the 1A-th compound semiconductor layer and is in contact with the active layer,
   the second compound semiconductor layer is composed of a 2B-th compound semiconductor layer in contact with the active layer and a 2A-th compound semiconductor layer provided on the 2B-th compound semiconductor layer,
   a substitution site of an impurity in the 1A-th compound semiconductor layer is a site occupied by a group III atom,
   a substitution site of an impurity in the 1B-th compound semiconductor layer is a site occupied by a group V atom, a substitution site of an impurity in the 2B-th compound semiconductor layer is a site occupied by a group III atom, a substitution site of an impurity in the 2A-th compound semiconductor layer is a site occupied by a group V atom, the substitution site of the impurity in the third compound semiconductor layer and the substitution site of the impurity in the fourth compound semiconductor layer are a site occupied by a group III atom, a substitution site of an impurity in the first burying layer is a site occupied by a group III atom, and the substitution site of the impurity in the second burying layer is a site occupied by a group V atom.

6. The semiconductor light emitting device according to claim 3, wherein the first compound semiconductor layer, the second compound semiconductor layer, the third compound semiconductor layer, the fourth compound semiconductor layer, the first burying layer, and the second burying layer are composed of a III-V compound semiconductor, the substitution site of the impurity in the first compound semiconductor layer is a site occupied by a group V atom, the substitution site of the impurity in the second compound semiconductor layer is a site occupied by a group III atom, the substitution site of the impurity in the third compound semiconductor layer and the substitution site of the impurity in the fourth compound semiconductor layer are a site occupied by a group V atom, a substitution site of an impurity in the first burying layer is a site occupied by a group V atom, and the substitution site of the impurity in the second burying layer is a site occupied by a group III atom.

7. The semiconductor light emitting device according to claim 3, wherein the first compound semiconductor layer, the second compound semiconductor layer, the third compound semiconductor layer, the fourth compound semiconductor layer, the first burying layer, and the second burying layer are composed of a III-V compound semiconductor, the first compound semiconductor layer is composed of a 1A-th compound semiconductor layer and a 1B-th compound semiconductor layer that is provided on the 1A-th compound semiconductor layer and is in contact with the active layer, the second compound semiconductor layer is composed of a 2B-th compound semiconductor layer in contact with the active layer and a 2A-th compound semiconductor layer provided on the 2B-th compound semiconductor layer, a substitution site of an impurity in the 1A-th compound semiconductor layer is a site occupied by a group III atom, a substitution site of an impurity in the 1B-th compound semiconductor layer is a site occupied by a group V atom, a substitution site of an impurity in the 2B-th compound semiconductor layer is a site occupied by a group III atom, a substitution site of an impurity in the 2A-th compound semiconductor layer is a site occupied by a group V atom, the substitution site of the impurity in the third compound semiconductor layer and the substitution site of the impurity in the fourth compound semiconductor layer are a site occupied by a group V atom, a substitution site of an impurity in the first burying layer is a site occupied by a group V atom, and the substitution site of the impurity in the second burying layer is a site occupied by a group III atom.

8. The semiconductor light emitting device according to claim 3, wherein the first compound semiconductor layer, the second compound semiconductor layer, the third compound semiconductor layer, the fourth compound semiconductor layer, the first burying layer, and the second burying layer are composed of a III-V compound semiconductor, the substitution site of the impurity in the first compound semiconductor layer is a site occupied by a group III atom, the substitution site of the impurity in the second compound semiconductor layer is a site occupied by a group V atom, the substitution site of the impurity in the third compound semiconductor layer and the substitution site of the impurity in the fourth compound semiconductor layer are a site occupied by a group V atom, a substitution site of an impurity in the first burying layer is a site occupied by a group V atom, and the substitution site of the impurity in the second burying layer is a site occupied by a group III atom.

9. The semiconductor light emitting device according to claim 3, wherein the first compound semiconductor layer, the second compound semiconductor layer, the third compound semiconductor layer, the fourth compound semiconductor layer, the first burying layer, and the second burying layer are composed of a III-V compound semiconductor, the first compound semiconductor layer is composed of a 1A-th compound semiconductor layer and a 1B-th compound semiconductor layer that is provided on the 1A-th compound semiconductor layer and is in contact with the active layer, the second compound semiconductor layer is composed of a 2B-th compound semiconductor layer in contact with the active layer and a 2A-th compound semiconductor layer provided on the 2B-th compound semiconductor layer, a substitution site of an impurity in the 1A-th compound semiconductor layer is a site occupied by a group V atom, a substitution site of an impurity in the 1B-th compound semiconductor layer is a site occupied by a group III atom, a substitution site of an impurity in the 2B-th compound semiconductor layer is a site occupied by a group V atom, a substitution site of an impurity in the 2A-th compound semiconductor layer is a site occupied by a group III atom, the substitution site of the impurity in the third compound semiconductor layer and the substitution site of the impurity in the fourth compound semiconductor layer are a site occupied by a group V atom, a substitution site of an impurity in the first burying layer is a site occupied by a group V atom, and the substitution site of the impurity in the second burying layer is a site occupied by a group III atom.

10. The semiconductor light emitting device according to claim 3, wherein the first compound semiconductor layer, the second compound semiconductor layer, the third compound semiconductor layer, the fourth compound semiconductor layer, the first burying layer, and the second burying layer are composed of a III-V compound semiconductor, the substitution site of the impurity in the first compound semiconductor layer is a site occupied by a group III atom, the substitution site of the impurity in the second compound semiconductor layer is a site occupied by a group V atom, the substitution site of the impurity in the third compound semiconductor layer and the substitution site of the impurity in the fourth compound semiconductor layer are a site occupied by a group III atom, a substitution site of an impurity in the first burying layer is a site occupied by a group III atom, and the substitution site of the impurity in the second burying layer is a site occupied by a group V atom.

11. The semiconductor light emitting device according to claim 3, wherein the first compound semiconductor layer, the second compound semiconductor layer, the third compound semiconductor layer, the fourth compound semiconductor layer, the first burying layer, and the second burying layer are composed of a III-V compound semiconductor, the first compound semiconductor layer is composed of a 1A-th compound semiconductor layer and a 1B-th compound semiconductor layer that is provided on the 1A-th compound semiconductor layer and is in contact with the active layer, the second compound semiconductor layer is composed of a 2B-th compound semiconductor layer in contact with the active layer and a 2A-th compound semiconductor layer provided on the 2B-th compound semiconductor layer, a substitution site of an impurity in the 1A-th compound semiconductor layer is a site occupied by a group V atom, a substitution site of an impurity in the 1B-th compound semiconductor layer is a site occupied by a group III atom, a substitution site of an impurity in the 2B-th compound semiconductor layer is a site occupied by a group V atom, a substitution site of an impurity in the 2A-th compound semiconductor layer is a site occupied by a group III atom, the substitution site of the impurity in the third compound semiconductor layer and the substitution site of the impurity in the fourth compound semiconductor layer are a site occupied by a group III atom, a substitution site of an impurity in the first burying layer is a site occupied by a group III atom, and the substitution site of the impurity in the second burying layer is a site occupied by a group V atom.

12. The semiconductor light emitting device according to claim 1, wherein the first compound semiconductor layer, the second compound semiconductor layer, the third compound semiconductor layer, the fourth compound semiconductor layer, the first burying layer, and the second burying layer are composed of a III-V compound semiconductor, an impurity for causing the first compound semiconductor layer to be an n-type as the first conductivity type is selenium (Se), tellurium (Te), or sulfur (S), the impurity for causing the third compound semiconductor layer to be the n-type as the first conductivity type is silicon (Si) or tin (Sn), an impurity for causing the first burying layer to be a p-type as the second conductivity type is zinc (Zn), magnesium (Mg), beryllium (Be), or manganese (Mn), and the impurity for causing the second burying layer to be the p-type as the second conductivity type is carbon (C).

13. The semiconductor light emitting device according to claim 1, wherein the first compound semiconductor layer, the second compound semiconductor layer, the third compound semiconductor layer, the fourth compound semiconductor layer, the first burying layer, and the second burying layer are composed of a III-V compound semiconductor, the first compound semiconductor layer is composed of a 1A-th compound semiconductor layer and a 1B-th compound semiconductor layer that is provided on the 1A-th compound semiconductor layer and is in contact with the active layer, the second compound semiconductor layer is composed of a 2B-th compound semiconductor layer in contact with the active layer and a 2A-th compound semiconductor layer provided on the 2B-th compound semiconductor layer, an impurity for causing the 1A-th compound semiconductor layer to be an n-type as the first conductivity type is silicon (Si) or tin (Sn), an impurity for causing the 1B-th compound semiconductor layer to be the n-type as the first conductivity type is selenium (Se), tellurium (Te), or sulfur (S), an impurity for causing the 2B-th compound semiconductor layer to be a p-type as the second conductivity type is zinc (Zn), magnesium (Mg), beryllium (Be), or manganese (Mn), an impurity for causing the 2A-th compound semiconductor layer to be the p-type as the second conductivity type is carbon (C), the impurity for causing the third compound semiconductor layer to be the n-type as the first conductivity type is silicon (Si) or tin (Sn), an impurity for causing the fourth compound semiconductor layer to be the p-type as the second conductivity type is zinc (Zn), magnesium (Mg), beryllium (Be), or manganese (Mn), an impurity for causing the first burying layer to be the p-type as the second conductivity type is zinc (Zn), magnesium (Mg), beryllium (Be), or manganese (Mn), and the impurity for causing the second burying layer to be the p-type as the second conductivity type is carbon (C).

14. The semiconductor light emitting device according to claim 1, wherein the first compound semiconductor layer, the second compound semiconductor layer, the third compound semiconductor layer, the fourth compound semiconductor layer, the first burying layer, and the second burying layer are composed of a III-V compound semiconductor, an impurity for causing the first compound semiconductor layer to be a p-type as the first conductivity type is zinc (Zn), magnesium (Mg), beryllium (Be), or manganese (Mn), the impurity for causing the third compound semiconductor layer to be the p-type as the first conductivity type is carbon (C), an impurity for causing the first burying layer to be an n-type as the second conductivity type is selenium (Se), tellurium (Te), or sulfur (S), and the impurity for causing the second burying layer to be the n-type as the second conductivity type is silicon (Si) or tin (Sn).

15. The semiconductor light emitting device according to claim 1, wherein the first compound semiconductor layer, the second compound semiconductor layer, the third compound semiconductor layer, the fourth compound semiconductor layer, the first burying layer, and the second burying layer are composed of a III-V compound semiconductor, the first compound semiconductor layer is composed of a 1A-th compound semiconductor layer and a 1B-th compound semiconductor layer that is provided on the 1A-th compound semiconductor layer and is in contact with the active layer, the second compound semiconductor layer is composed of a 2B-th compound semiconductor layer in contact with the active layer and a 2A-th compound semiconductor layer provided on the 2B-th compound semiconductor layer, an impurity for causing the 1A-th compound semiconductor layer to be a p-type as the first conductivity type is carbon (C), an impurity for causing the 1B-th compound semiconductor layer to be the p-type as the first conductivity type is zinc (Zn), magnesium (Mg), beryllium (Be), or manganese (Mn), an impurity for causing the 2B-th compound semiconductor layer to be an n-type as the second conductivity type is selenium (Se), tellurium (Te), or sulfur (S), an impurity for causing the 2A-th compound semiconductor layer to be the n-type as the second conductivity type is silicon (Si) or tin (Sn), the impurity for causing the third compound semiconductor layer to be the p-type as the first conductivity type is carbon (C), an impurity for causing the fourth compound semiconductor layer to be the n-type as the second conductivity type is selenium (Se), tellurium (Te), or sulfur (S), an impurity for causing the first burying layer to be the n-type as the second conductivity type is selenium (Se), tellurium (Te), or sulfur (S), and the impurity for causing the second burying layer to be the n-type as the second conductivity type is silicon (Si) or tin (Sn).

16. The semiconductor light emitting device according to claim 1, wherein the first compound semiconductor layer, the second compound semiconductor layer, the third compound semiconductor layer, the fourth compound semiconductor layer, the first burying layer, and the second burying layer are composed of a III-V compound semiconductor, an impurity for causing the second compound semiconductor layer to be a p-type as the second conductivity type is zinc (Zn), magnesium (Mg), beryllium (Be), or manganese (Mn), an impurity for causing the fourth compound semiconductor layer to be the p-type as the second conductivity type is carbon (C), an impurity for causing the first burying layer to be the p-type as the second conductivity type is carbon (C), and the impurity for causing the second burying layer to be the p-type as the second conductivity type is zinc (Zn), magnesium (Mg), beryllium (Be), or manganese (Mn).

17. The semiconductor light emitting device according to claim 1, wherein the first compound semiconductor layer, the second compound semiconductor layer, the third compound semiconductor layer, the fourth compound semiconductor layer, the first burying layer, and the second burying layer are composed of a III-V compound semiconductor, the first compound semiconductor layer is composed of a 1A-th compound semiconductor layer and a 1B-th compound semiconductor layer that is provided on the 1A-th compound semiconductor layer and is in contact with the active layer, the second compound semiconductor layer is composed of a 2B-th compound semiconductor layer in contact with the active layer and a 2A-th compound semiconductor layer provided on the 2B-th compound semiconductor layer, an impurity for causing the 1A-th compound semiconductor layer to be an n-type as the first conductivity type is silicon (Si) or tin (Sn), an impurity for causing the 1B-th compound semiconductor layer to be the n-type as the first conductivity type is selenium (Se), tellurium (Te), or sulfur (S), an impurity for causing the 2B-th compound semiconductor layer to be a p-type as the second conductivity type is zinc (Zn), magnesium (Mg), beryllium (Be), or manganese (Mn), an impurity for causing the 2A-th compound semiconductor layer to be the p-type as the second conductivity type is carbon (C), the impurity for causing the third compound semiconductor layer to be the n-type as the first conductivity type is selenium (Se), tellurium (Te), or sulfur (S), an impurity for causing the fourth compound semiconductor layer to be the p-type as the second conductivity type is carbon (C), an impurity for causing the first burying layer to be the p-type as the second conductivity type is carbon (C), and the impurity for causing the second burying layer to be the p-type as the second conductivity type is zinc (Zn), magnesium (Mg), beryllium (Be), or manganese (Mn).

18. The semiconductor light emitting device according to claim 1, wherein the first compound semiconductor layer, the second compound semiconductor layer, the third compound semiconductor layer, the fourth compound semiconductor layer, the first burying layer, and the second burying layer are composed of a III-V compound semiconductor, an impurity for causing the second compound semiconductor layer to be an n-type as the second conductivity type is selenium (Se), tellurium (Te), or sulfur (S), an impurity for causing the fourth compound semiconductor layer to be the n-type as the second conductivity type is silicon (Si) or tin (Sn), an impurity for causing the first burying layer to be the n-type as the second conductivity type is silicon (Si) or tin (Sn), and the impurity for causing the second burying layer to be the n-type as the second conductivity type is selenium (Se), tellurium (Te), or sulfur (S).

19. The semiconductor light emitting device according to claim 1, wherein the first compound semiconductor layer, the second compound semiconductor layer, the third compound semiconductor layer, the fourth compound semiconductor layer, the first burying layer, and the second burying layer are composed of a III-V compound semiconductor, the first compound semiconductor layer is composed of a 1A-th compound semiconductor layer and a 1B-th compound semiconductor layer that is provided on the 1A-th compound semiconductor layer and is in contact with the active layer, the second compound semiconductor layer is composed of a 2B-th compound semiconductor layer in contact with the active layer and a 2A-th compound semiconductor layer provided on the 2B-th compound semiconductor layer, an impurity for causing the 1A-th compound semiconductor layer to be a p-type as the first conductivity type is carbon (C), an impurity for causing the 1B-th compound semiconductor layer to be the p-type as the first conductivity type is zinc (Zn), magnesium (Mg), beryllium (Be), or manganese (Mn), an impurity for causing the 2B-th compound semiconductor layer to be an n-type as the second conductivity type is selenium (Se), tellurium (Te), or sulfur (S), an impurity for causing the 2A-th compound semiconductor layer to be the n-type as the second conductivity type is silicon (Si) or tin (Sn), the impurity for causing the third compound semiconductor layer to be the p-type as the first conductivity type is zinc (Zn), magnesium (Mg), beryllium (Be), or manganese (Mn), an impurity for causing the fourth compound semiconductor layer to be the n-type as the second conductivity type is silicon (Si) or tin (Sn), an impurity for causing the first burying layer to be the n-type as the second conductivity type is silicon (Si) or tin (Sn), and the impurity for causing the second burying layer to be the n-type as the second conductivity type is selenium (Se), tellurium (Te), or sulfur (S).

20. The semiconductor light emitting device according to claim 1, wherein
an impurity for causing the first compound semiconductor layer to have the first conductivity type is different from the impurity for causing the third compound semiconductor layer to have the first conductivity type.

21. The semiconductor light emitting device according to claim 1, wherein
an impurity for causing the second compound semiconductor layer to have the second conductivity type is different from an impurity for causing the fourth compound semiconductor layer to have the second conductivity type.

22. The semiconductor light emitting device according to claim 1, wherein
the current block layer is formed of a multilayer structure arising from sequential stacking of at least the fourth compound semiconductor layer of the second conductivity type and the third compound semiconductor layer of the first conductivity type, an impurity for causing the fourth compound semiconductor layer to have the second conductivity type is such that a substitution site of the impurity in the fourth compound semiconductor layer competes with the substitution site of the impurity in the third compound semiconductor layer for causing the third compound semiconductor layer to have the first conductivity type, and competes with a substitution site of an impurity in the first compound semiconductor layer for causing the first compound semiconductor layer to have the first conductivity type, an impurity for causing the second compound semiconductor layer to have the second conductivity type is such that a substitution site of the impurity in the second compound semiconductor layer competes with the substitution site of the impurity in the third compound semiconductor layer for causing the third compound semiconductor layer to have the first conductivity type, and if a bypass channel that passes through the first compound semiconductor layer, the current block layer, and the second compound semiconductor layer is assumed, at least three pn junction interfaces formed of interfaces between the compound semiconductor layers exist in the bypass channel.

23. The semiconductor light emitting device according to claim 22, wherein
the first compound semiconductor layer is composed of a 1A-th compound semiconductor layer and a 1B-th compound semiconductor layer that is provided on the 1A-th compound semiconductor layer and is in contact with the active layer, and an impurity for causing the 1B-th compound semiconductor layer to have the first conductivity type is such that a substitution site of the impurity in the 1B-th compound semiconductor layer does not compete with a substitution site of an impurity in the 1A-th compound semiconductor layer for causing the 1A-th compound semiconductor layer to have the first conductivity type, and does not compete with the substitution site of the impurity in the second compound semiconductor layer for causing the second compound semiconductor layer to have the second conductivity type.

24. The semiconductor light emitting device according to claim 22, wherein
the second compound semiconductor layer is composed of a 2B-th compound semiconductor layer in contact with the active layer and a 2A-th compound semiconductor layer provided on the 2B-th compound semiconductor layer, and an impurity for causing the 2B-th compound semiconductor layer to have the second conductivity type is such that a substitution site of the impurity in the 2B-th compound semiconductor layer does not compete with a substitution site of an impurity in the 2A-th compound semiconductor layer for causing the 2A-th compound semiconductor layer to have the second conductivity type, and does not compete with the substitution site of the impurity in the first compound semiconductor layer for causing the first compound semiconductor layer to have the first conductivity type.

25. The semiconductor light emitting device according to claim 22, wherein
at least a compound semiconductor layer of the first conductivity type and a compound semiconductor layer of the second conductivity type are further sequentially stacked between the fourth compound semiconductor layer and the third compound semiconductor layer.

* * * * *